US012448403B2

(12) United States Patent
Lee et al.

(10) Patent No.: US 12,448,403 B2
(45) Date of Patent: Oct. 21, 2025

(54) ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

(71) Applicant: Samsung Electronics Co., Ltd., Suwon-si (KR)

(72) Inventors: Kum Hee Lee, Suwon-si (KR); Byungjoon Kang, Seoul (KR); Seungyeon Kwak, Suwon-si (KR); Sangdong Kim, Seongnam-si (KR); Sungmin Kim, Incheon (KR); Yong Joo Lee, Suwon-si (KR); Jeoungin Yi, Seoul (KR); Byoungki Choi, Hwaseong-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 820 days.

(21) Appl. No.: 17/592,639

(22) Filed: Feb. 4, 2022

(65) Prior Publication Data

US 2022/0259237 A1 Aug. 18, 2022

(30) Foreign Application Priority Data

Feb. 10, 2021 (KR) ........................ 10-2021-0019354
Feb. 4, 2022 (KR) ........................ 10-2022-0014726

(51) Int. Cl.

| | |
|---|---|
| ***C07F 15/00*** | (2006.01) |
| ***H10K 85/30*** | (2023.01) |
| *H10K 50/12* | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.

CPC ....... *C07F 15/0033* (2013.01); *H10K 85/342* (2023.02); *H10K 50/12* (2023.02); *H10K 50/15* (2023.02); *H10K 50/16* (2023.02); *H10K 50/171* (2023.02); *H10K 50/18* (2023.02)

(58) Field of Classification Search

None
See application file for complete search history.

(56) References Cited

U.S. PATENT DOCUMENTS

| | | | | |
|---|---|---|---|---|
| 9,478,756 | B2 | 10/2016 | Lee et al. | |
| 2016/0141522 | A1 | 5/2016 | Ma et al. | |
| 2018/0097185 | A1* | 4/2018 | Su | H10K 85/654 |
| 2020/0048290 | A1 | 2/2020 | Tsai et al. | |
| 2020/0287144 | A1* | 9/2020 | Hwang | C07F 15/0033 |
| 2021/0083205 | A1 | 3/2021 | Hwang et al. | |
| 2021/0104691 | A1 | 4/2021 | Lee et al. | |
| 2021/0399237 | A1* | 12/2021 | Dyatkin | C09K 11/06 |
| 2022/0246866 | A1 | 8/2022 | Park et al. | |
| 2022/0259237 | A1 | 8/2022 | Lee et al. | |
| 2023/0389409 | A1 | 11/2023 | Hwang et al. | |

FOREIGN PATENT DOCUMENTS

| | | | | |
|---|---|---|---|---|
| CN | 110862417 | A * | 3/2020 | C07F 15/0033 |
| EP | 3517540 | A1 | 7/2019 | |
| EP | 3771717 | A1 | 2/2021 | |
| EP | 3792270 | A1 | 3/2021 | |
| EP | 3798225 | A1 | 3/2021 | |
| EP | 3943499 | A2 | 1/2022 | |
| EP | 3988557 | A1 | 4/2022 | |
| EP | 4059942 | A1 | 9/2022 | |
| EP | 4099413 | A1 | 12/2022 | |
| KR | 20120114030 | A | 10/2012 | |
| KR | 20130110934 | A | 10/2013 | |
| KR | 20180020878 | A * | 2/2018 | C07F 15/00 |
| KR | 1020180020878 | A | 2/2018 | |
| KR | 20210031395 | A | 3/2021 | |
| KR | 1020210031395 | A | 3/2021 | |
| KR | 20210036829 | A | 4/2021 | |

OTHER PUBLICATIONS

Machine translation of KR-20180020878-A, translation generated Nov. 2024, 38 pages. (Year: 2024).*
Kim, Hee Un, et al. "Green phosphorescent homoleptic iridium (III) complexes for highly efficient organic light-emitting diodes." Dyes and Pigments 156 (2018): 395-402. (Year: 2018).*
Machine translation of CN-110862417-A, translation generated Nov. 2024, 11 pages. (Year: 2024).*
English Translation of Office Action dated Feb. 14, 2024, issued in corresponding KR Patent Application No. 10-2022-0014726, 9 pp.
Office Action dated Feb. 14, 2024, issued in corresponding KR Patent Application No. 10-2022-0014726, 10 pp.
EP Office Action mailed Mar. 15, 2023 of EP Patent Application No. 22155118.7.
Extended European Search Report issued Jun. 23, 2022 of EP Patent Application No. 22155118.7.

* cited by examiner

*Primary Examiner* — Robert S Loewe
(74) *Attorney, Agent, or Firm* — CANTOR COLBURN LLP

(57) ABSTRACT

An organometallic compound represented by Formula 1, an organic light-emitting device including the organometallic compound, and an electronic apparatus including the organic light-emitting device:

$$M(L_1)_{n1}(L_2)_{n2} \quad \text{Formula 1}$$

wherein, in Formula 1,
M is a transition metal,
$L_1$ is a ligand represented by Formula 2-1,
$L_2$ is a ligand represented by Formula 2-2,
n1 and n2 are each independently 1 or 2, with the proviso that when n1 is 2, the $L_1$ ligands are identical to or different from each other, and when n2 is 2, the $L_2$ ligands are identical to or different from each other, and $L_1$ is different from $L_2$.

21 Claims, 1 Drawing Sheet

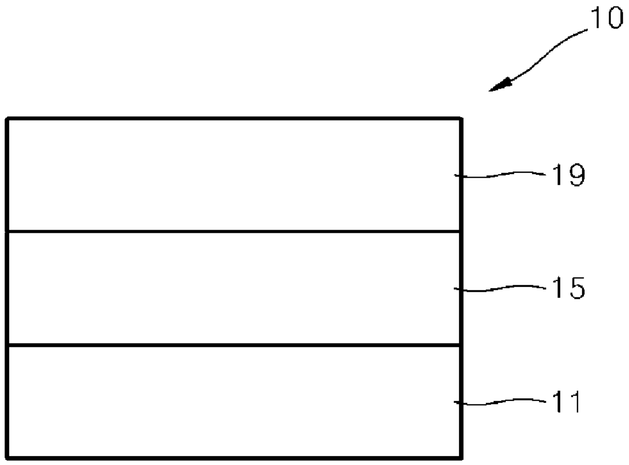
10
19
15
11

ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

CROSS-REFERENCE TO RELATED APPLICATION

This application is based on and claims priority and all benefits under 35 U.S.C. § 119, to Korean Patent Applications No. 10-2021-0019354, filed on Feb. 10, 2021, and No. 10-2022-0014726, filed on Feb. 4, 2022, in the Korean Intellectual Property Office, the disclosures of which are incorporated by reference herein in their entirety.

BACKGROUND

1. Field

The present disclosure relates to an organometallic compound, an organic light-emitting device including the organometallic compound, and an electronic apparatus including the organic light-emitting device.

2. Description of the Related Art

Organic light-emitting devices (OLEDs) are self-emissive devices which produce full-color images. In addition, OLEDs have wide viewing angles and exhibit excellent driving voltage and response speed characteristics.

OLEDs include an anode, a cathode, and an organic layer between the anode and the cathode and including an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transition from an excited state to a ground state, thus generating light.

SUMMARY

Provided are a novel organometallic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments of the disclosure.

According to an aspect of an embodiment, an organometallic compound may be represented by Formula 1.

$$M(L_1)_{n1}(L_2)_{n2} \qquad \text{Formula 1}$$

In Formula 1,

M may be a transition metal, $L_1$ may be a ligand represented by Formula 2-1, $L_2$ may be a ligand represented by Formula 2-2, n1 and n2 may each independently be 1 or 2, with the proviso that when n1 is 2, the $L_1$ ligands may be identical to or different from each other, and when n2 is 2, the $L_2$ ligands may be identical to or different from each other, and $L_1$ may be different from $L_2$.

Formula 2-1

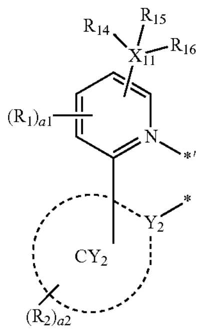

Formula 2-2

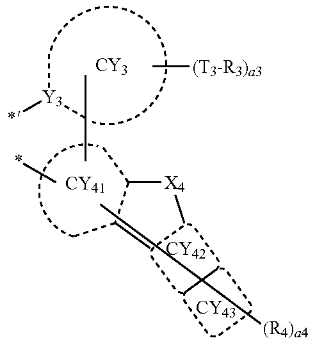

In Formulae 2-1 and 2-2, $Y_2$ and $Y_3$ may each independently be C or N, ring $CY_2$, ring $CY_3$, and ring $CY_{41}$ to ring $CY_{43}$ may each independently be a $C_5$-$C_{30}$ carbocyclic group or a $C_1$-$C_{30}$ heterocyclic group, $X_{11}$ may be Si or Ge, $T_3$ may be a single bond, a $C_1$-$C_{20}$ alkylene group unsubstituted or substituted with at least one $R_{10a}$, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_4$ may be O, S, Se, $N(R_{48})$, $C(R_{48})(R_{49})$, or $Si(R_{48})(R_{49})$, $R_1$ to $R_4$, $R_{14}$ to $R_{16}$, $R_{48}$, and $R_{49}$ may each independently be hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —Si $(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a1 may be an integer from 0 to 3, a2 to a4 may each independently be an integer from 0 to 20, when a1 is 2 or greater, at least two of the $R_1$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, when a2 is 2 or greater, at least two of the $R_2$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, when a3 is 2 or greater, at least two of the $R_3$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, when a4 is 2 or greater, at least two of the $R_4$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two of $R_1$ to $R_4$ may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ has a same definition as $R_2$,

* and *' each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group may be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{10}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof, —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or any combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

According to an aspect of an embodiment, an organic light-emitting device may include a first electrode, a second electrode, and an organic layer between the first electrode and the second electrode, wherein the organic layer may include an emission layer and the organometallic compound.

The organometallic compound may be included in the emission layer, and the organometallic compound included in the emission layer may serve as a dopant.

According to an aspect of an embodiment, an electronic apparatus may include the organic light-emitting device.

BRIEF DESCRIPTION OF THE DRAWING

The above and other aspects, features, and advantages of certain embodiments of the disclosure will be more apparent from the following description taken in conjunction with the FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

An organometallic compound may be represented by Formula 1:

$$M(L_1)_{n1}(L_2)_{n2} \qquad \text{Formula 1}$$

wherein, in Formula 1, M may be a transition metal.

In some embodiments, M may be a first-row transition metal, a second-row transition metal, or a third-row transition metal.

In some embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, M may be Ir, Pt, Os, or Rh.

$L_1$ in Formula 1 may be a ligand represented by Formula 2-1, and $L_2$ may be a ligand represented by Formula 2-2:

Formula 2-1

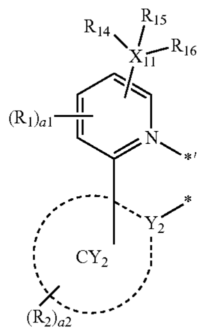

Formula 2-2

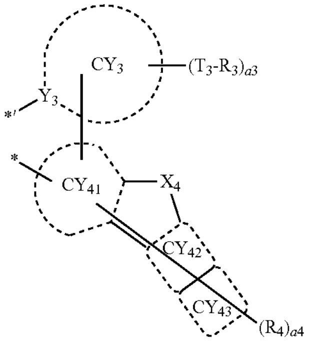

wherein, Formulae 2-1 and 2-2 may each be understood by referring to the descriptions of Formulae 2-1 and 2-2 provided herein.

n1 and n2 in Formula 1 may respectively indicate the number of $L_1$ ligands and $L_2$ ligands, and n1 and n2 may each independently be 1 or 2. When n1 is 2, two $L_1$ ligands may be identical to or different from each other, and when n2 is 2, two $L_2$ ligands may be identical to or different from each other.

For example, in Formula 1, i) n1 may be 2, and n2 may be 1, or ii) n1 may be 1, and n2 may be 2.

In an embodiment, in Formula 1, i) M may be Ir or Os, and a sum of n1 and n2 may be 3 or 4, or ii) M may be Pt, and a sum of n1 and n2 may be 2.

$L_1$ and $L_2$ in Formula 1 may be different from each other.

In Formulae 2-1 and 2-2, $Y_2$ and $Y_3$ may each independently be C or N.

In some embodiments, $Y_2$ in Formula 2-1 may be C, and $Y_3$ in Formula 2-2 may be N.

In Formulae 2-1 and 2-2, ring $CY_2$, ring $CY_3$, and ring $CY_{41}$ to ring $CY_{43}$ may each independently be a $C_5$-$C_{30}$ carbocyclic group or a $C_1$-$C_{30}$ heterocyclic group.

In some embodiments, ring $CY_2$, ring $CY_3$, and ring $CY_{41}$ to ring $CY_{43}$ may each independently be i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In an embodiment, ring $CY_2$, ring $CY_3$, and ring $CY_{41}$ to ring $CY_{43}$ may each independently be a cyclopentane group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline, an adamantane group, a norbornane group, or a norbornene group.

In one or more embodiments, in Formula 2-1, ring $CY_2$ may be a benzene group, a naphthalene group, an anthracene group, a phenanthrene group, a 1,2,3,4-tetrahydronaphthalene group, a benzene group condensed with a norbornane group, a carbazole group, a fluorene group, a dibenzosilole group, a dibenzothiophene group, a dibenzofuran group, a dibenzoselenophene group, a pyridine group, a benzoxazole group, or a benzothiazole group.

In one or more embodiments, in Formula 2-2, ring $CY_3$ may be a pyridine group, a pyrimidine group, a triazine group, a quinoline group, an isoquinoline group, a quinoxaline group, a benzoquinoline group, a benzoisoquinoline group, a benzoquinoxaline group, a naphthoquinoline group, a naphthoisoquinoline group, a naphthoquinoxaline group, a pyridoquinoline group, a pyridoisoquinoline group, a pyridoquinoxaline group, a pyridine group condensed with a cyclohexane group, a pyridine group condensed with a norbornane group, an imidazole group, a benzimidazole group, a naphthoimidazole group, a phenanthrenoimidazole group, a pyridoimidazole group, an oxazole group, a benzoxazole group, a naphthooxazole group, a phenanthrenooxazole group, a pyridooxazole group, a thiazole group, a benzothiazole group, a naphthothiazole group, a phenanthrenothiazole group, or a pyridothiazole group.

In one or more embodiments, in Formula 2-2, ring $CY_{41}$ to ring $CY_{43}$ may each independently be i) A group, ii) a polycyclic group in which at least two A groups are condensed, or iii) a polycyclic group in which at least one A group and at least one B group are condensed, wherein A group may be a benzene group, a pyridine group, a pyrimidine group, a pyridazine group, a pyrazine group, or a triazine group, and B group may be a cyclohexane group, a norbornane group, a furan group, a thiophene group, a selenophene group, a pyrrole group, a cyclopentadiene group, or a silole group.

In one or more embodiments, in Formula 2-2, ring $CY_{41}$ and ring $CY_{42}$ may each independently be a benzene group, a naphthalene group, a benzene group condensed with a cyclohexane group, or a benzene group condensed with a norbornane group.

In one or more embodiments, in Formula 2-2, ring $CY_{43}$ may be:

a benzene group, a naphthalene group, a phenanthrene group, an anthracene group, or a chrysene group; or a benzene group, a naphthalene group, a phenanthrene group, an anthracene group, or a chrysene group, each condensed with a cyclohexane group, a norbornane group, or any combination thereof.

In one or more embodiments, a carbon atom in ring $CY_{41}$ in Formula 2-2 may be bound to M in Formula 1 via a covalent bond.

$X_{11}$ in Formula 2-1 may be Si or Ge.

$T_3$ in Formula 2-2 may be a single bond, a $C_1$-$C_{20}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In some embodiments, $T_3$ in Formula 2-2 may be:

a single bond; or a $C_1$-$C_{20}$ alkylene group, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$.

In an embodiment, $T_3$ in Formula 2-2 may be:

a single bond; or a benzene group unsubstituted or substituted with at least one $R_{10a}$.

In one or more embodiments, $T_3$ in Formula 2-2 may be:

a single bond; or a $C_1$-$C_{20}$ alkylene group, a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In Formula 2-2, $X_4$ may be O, S, Se, $N(R_{48})$, $C(R_{48})(R_{49})$, or $Si(R_{48})(R_{49})$.

In Formulae 2-1 and 2-2, $R_1$ to $R_4$, $R_{14}$ to $R_{16}$, $R_{48}$, and $R_{49}$ may each independently be hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q)$, or —$P(Q_8)(Q)$. $Q_1$ to $Q_9$ may respectively be understood by referring to the descriptions of $Q_1$ to $Q_9$ provided herein.

In an embodiment, in Formulae 2-1 and 2-2, $R_1$ to $R_4$, $R_{14}$ to $R_{16}$, $R_{48}$, and $R_{49}$ may each independently be:

hydrogen, deuterium, —F, —Cl, —Br, —I, a hydroxyl group, a cyano group, a nitro group, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{2o}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, $—Si(Q_{33})(Q_{34})(Q_{35})$, $—Ge(Q_{33})(Q_{34})(Q_{35})$, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $Q_1$ to $Q_9$ and $Q_{33}$ to $Q_{35}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or any combination thereof.

In one or more embodiments, $R_1$ to $R_4$, $R_{48}$, and $R_{49}$ may each independently be:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, —$Si(Q_{33})(Q_{34})(Q_{35})$, —$Ge(Q_{33})(Q_{34})(Q_{35})$, or any combination thereof.

In one or more embodiments, $R_{14}$ to $R_{16}$ may each independently be a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In one or more embodiments, in Formula 2-1, $R_{14}$ to $R_{16}$ may each independently be —$CH_3$, —$CH_2CH_3$, —$CD_3$, —$CD_2H$, —$CDH_2$, —$CH_2CD_3$, or —$CD_2CH_3$.

In one or more embodiments, in Formula 2-1, $R_{14}$ to $R_{16}$ may be identical to or different from each other.

In one or more embodiments, in Formulae 2-1 and 2-2, $R_1$ to $R_4$, $R_{14}$ to $R_{16}$, $R_{48}$, and $R_{49}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, —$Si(Q_3)(Q_4)(Q_5)$, or —$Ge(Q_3)(Q_4)(Q_5)$, wherein $Q_3$ to $Q_5$ may respectively be understood by referring to the descriptions of $Q_3$ to $Q_5$ provided herein.

In one or more embodiments, at least one of the $R_1$ moieties (the number a1 representing a count of the $R_1$ moieties) in Formula 2-1 (e.g., $R_{11}$ in Formula CY1-1) may be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F:

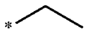
9-1

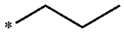
9-2

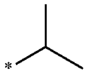
9-3

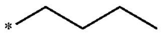
9-4

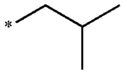
9-5

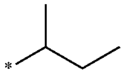
9-6

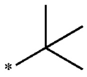
9-7

9-8

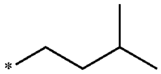
9-9

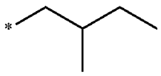
9-10

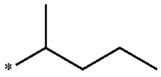
9-11

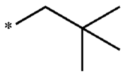
9-12

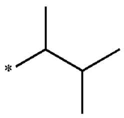
9-13

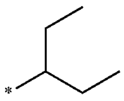
9-14

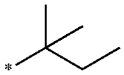
9-15

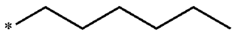
9-16

-continued
9-17
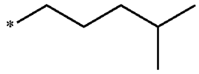
9-18
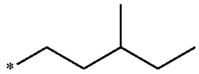
9-19
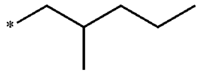
9-20
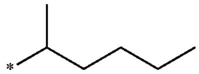
9-21
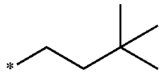
9-22
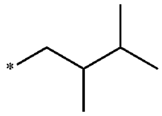
9-23
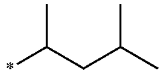
9-24
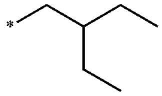
9-25
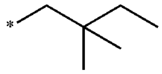
9-26
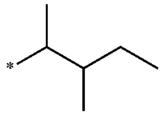
9-27
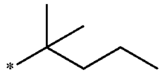
9-28
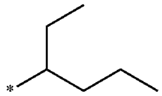
9-29
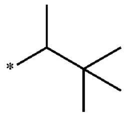
9-30
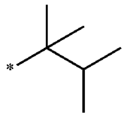
9-31
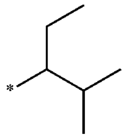
-continued
9-32
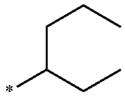
9-33
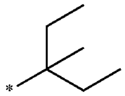
9-34
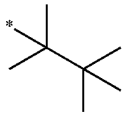
9-35
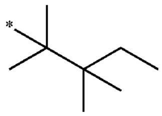
9-36
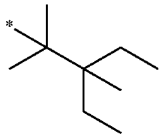
9-37
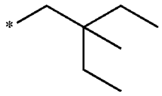
9-38
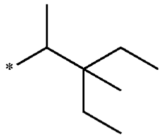
9-39
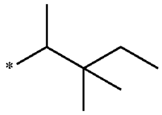
9-201
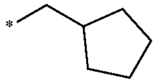
9-202
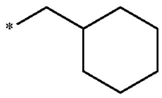
9-203
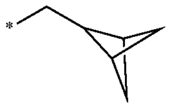
9-204
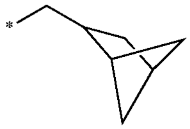
9-205
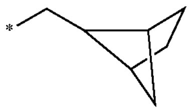

-continued
9-206
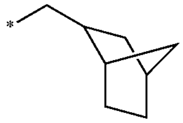
9-207
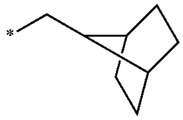
9-208
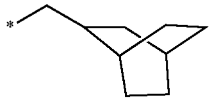
9-209
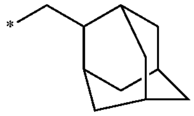
9-210
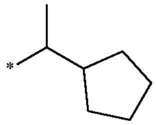
9-211
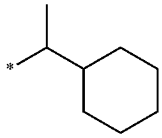
9-212
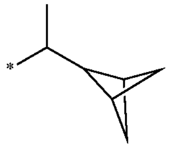
9-213
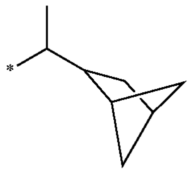
9-214
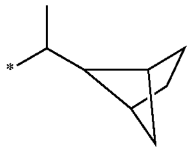
9-215
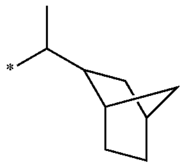
-continued
9-216
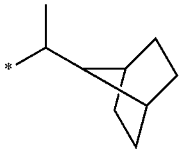
9-217
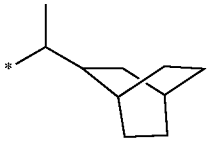
9-218
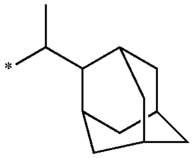
9-219
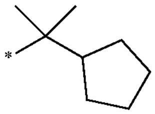
9-220
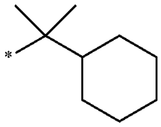
9-221
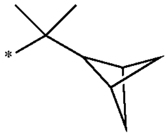
9-222
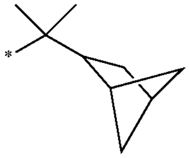
9-223
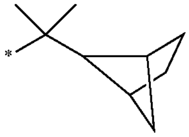
9-224
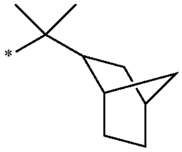
9-225
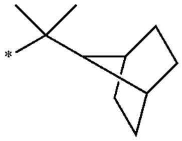

-continued
9-226
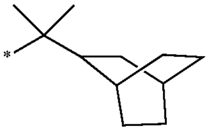
9-227
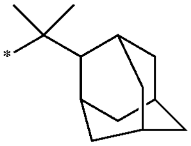
9-228
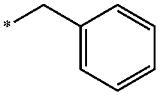
9-229
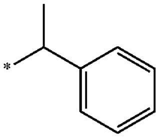
9-230
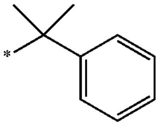
10-1
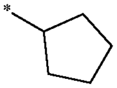
10-2
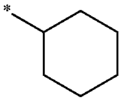
10-3
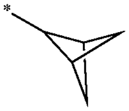
10-4
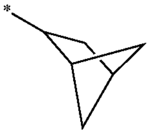
10-5
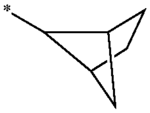
10-6
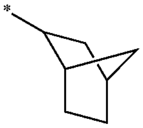
10-7
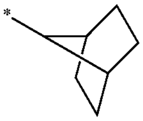
-continued
10-8
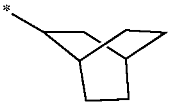
10-9
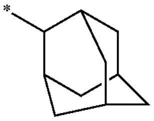
10-10
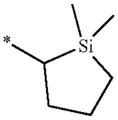
10-11
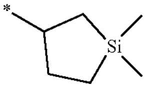
10-12
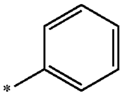
10-13
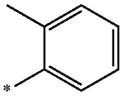
10-14
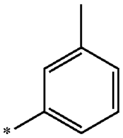
10-15
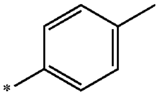
10-16
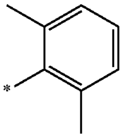
10-17
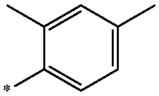
10-18
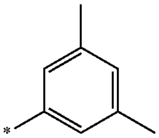
10-19
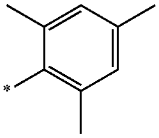

-continued
10-20
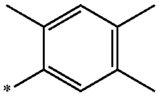
10-21
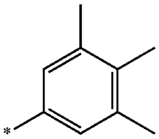
10-22
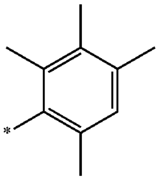
10-23
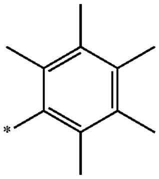
10-24
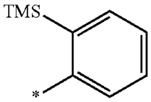
10-25
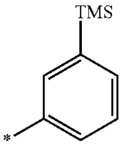
10-26
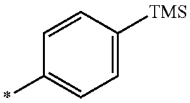
10-27
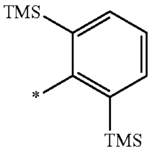
10-28
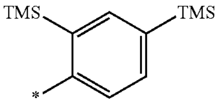
10-29
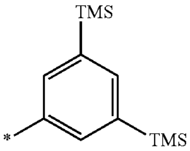
10-30
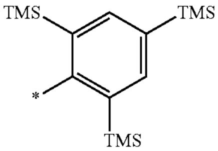
-continued
10-31
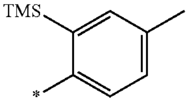
10-32
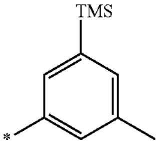
10-33
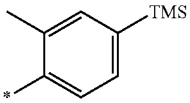
10-34
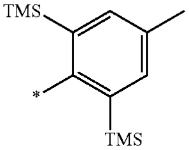
10-35
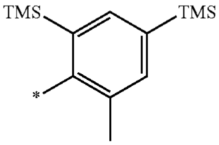
10-36
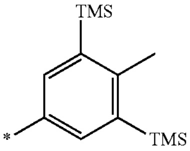
10-37
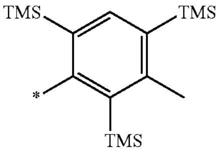
10-38
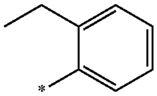
10-39
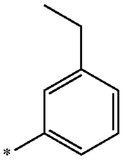
10-40
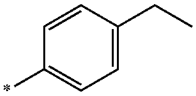
10-41
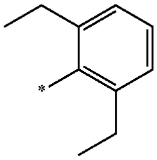

-continued
10-42
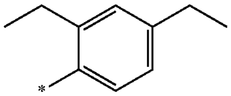
10-43
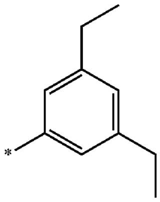
10-44
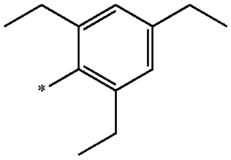
10-45
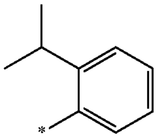
10-46
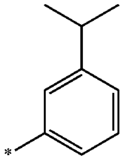
10-47
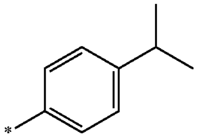
10-48
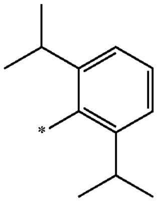
10-49
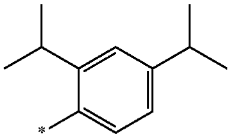
10-50
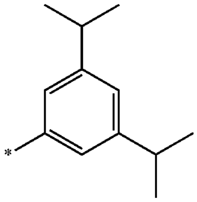
-continued
10-51
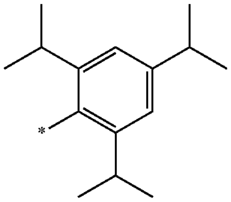
10-52
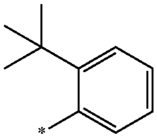
10-53
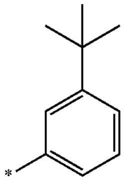
10-54
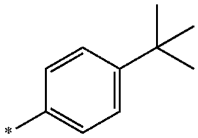
10-55
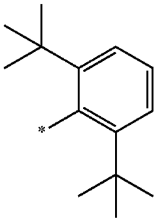
10-56
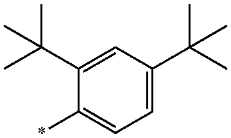
10-57
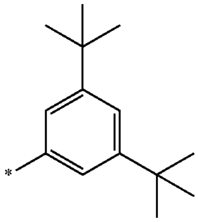
10-58
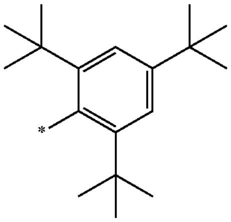

-continued
10-59
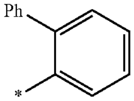
10-60
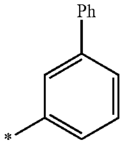
10-61
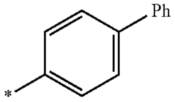
10-62
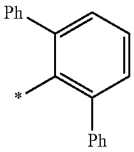
10-63
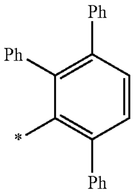
10-64
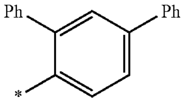
10-65
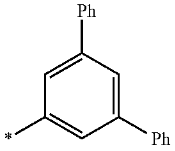
10-66
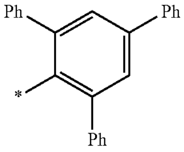
10-67
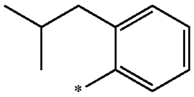
10-68
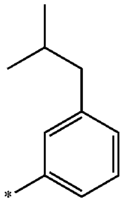
10-69
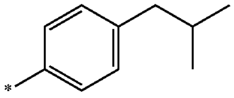
-continued
10-70
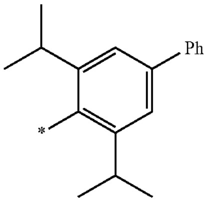
10-71
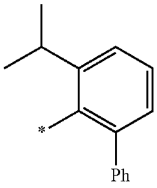
10-72
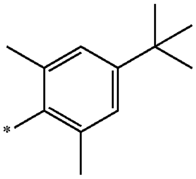
10-73
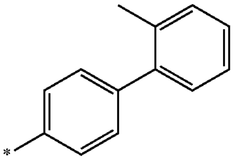
10-74
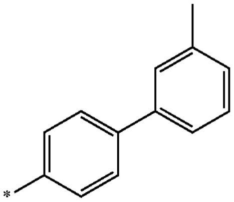
10-75
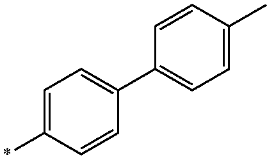
10-76
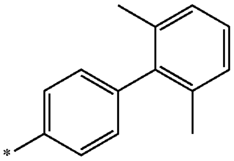
10-77
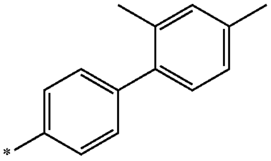

-continued
10-78
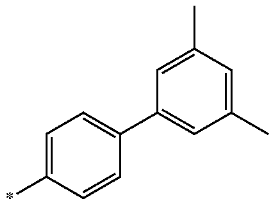
10-79
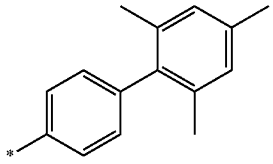
10-80
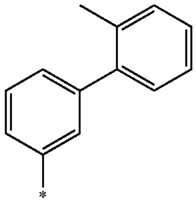
10-81
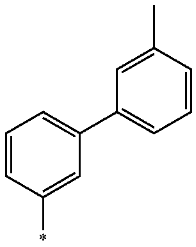
10-82
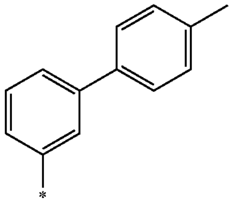
10-83
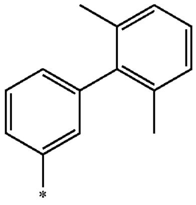
10-84
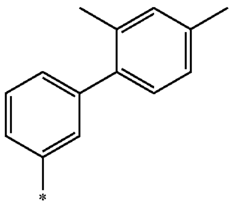
-continued
10-85
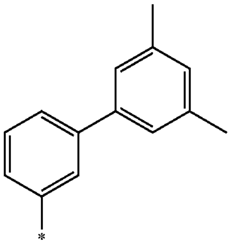
10-86
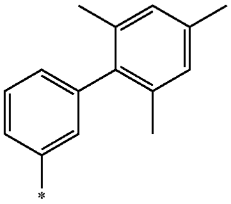
10-87
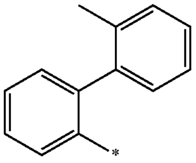
10-88
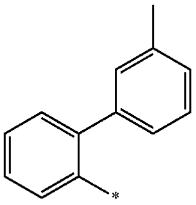
10-89
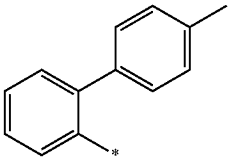
10-90
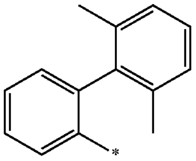
10-91
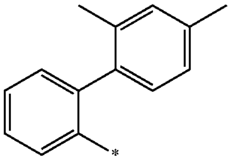
10-92
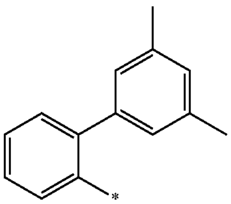

-continued
10-93
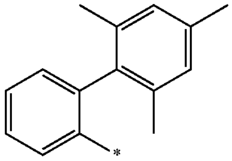
10-94
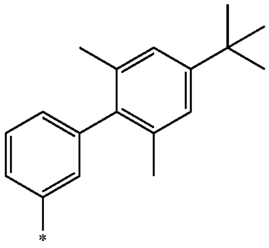
10-95
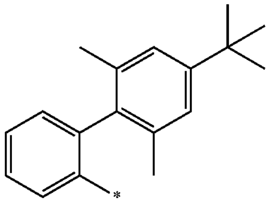
10-96
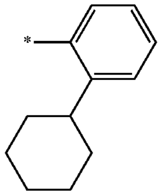
10-97
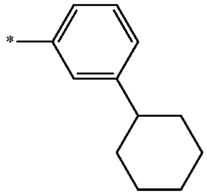
10-98
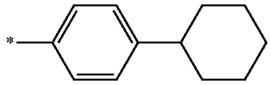
10-99
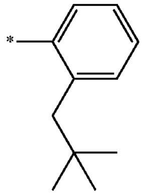
10-100
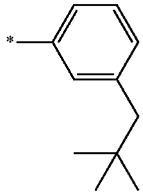
10-101
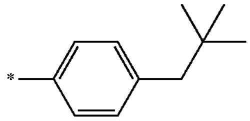
10-102
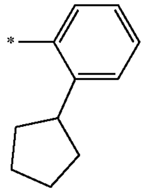
10-103
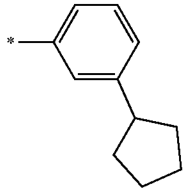
10-104
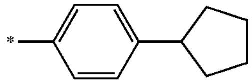
10-105
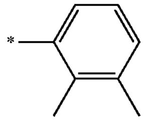
10-106
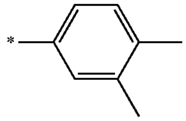
10-107
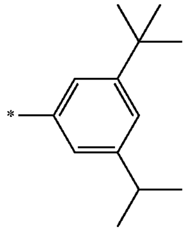
10-108
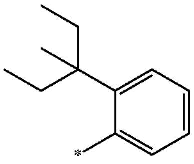
10-109
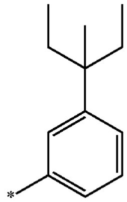

-continued
10-110
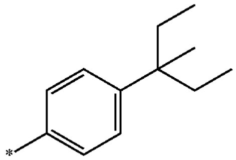
10-111
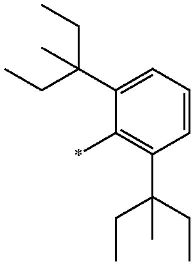
10-112
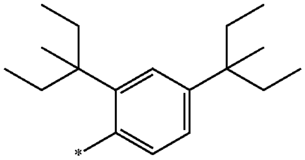
10-113
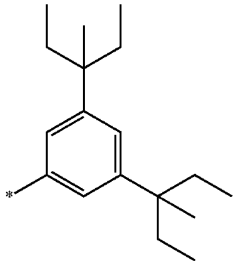
10-114
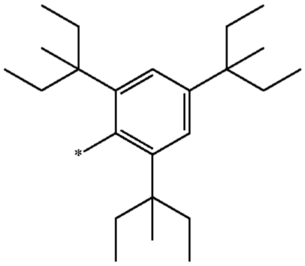
10-115
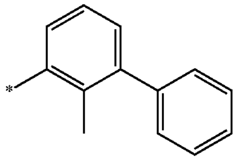
10-116
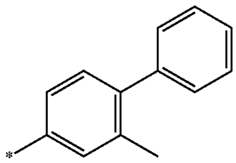
-continued
10-117
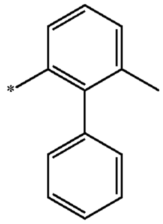
10-118
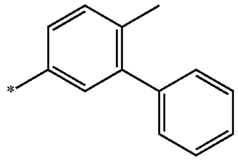
10-119
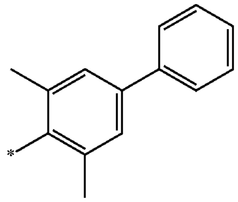
10-120
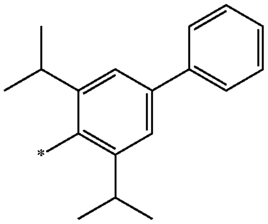
10-121
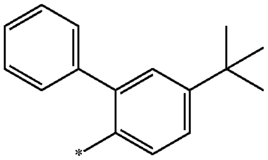
10-122
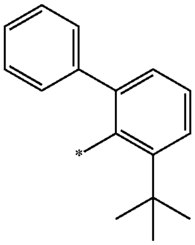
10-123
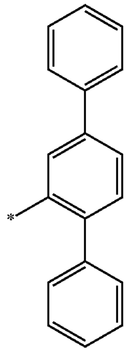

-continued
10-124
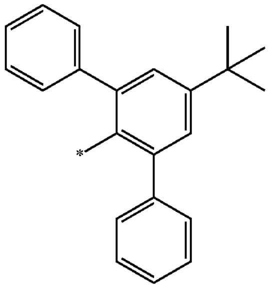
10-125
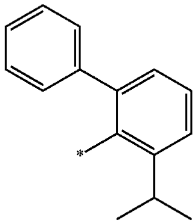
10-126
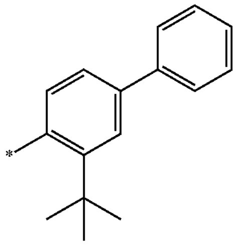
10-127
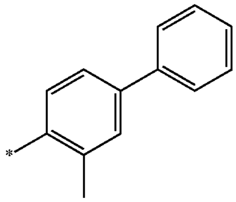
10-128
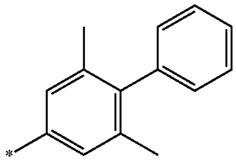
10-129
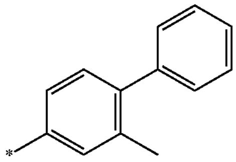
10-130
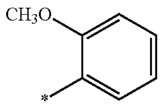
10-131
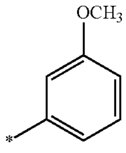
-continued
10-132
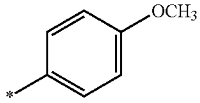
10-133
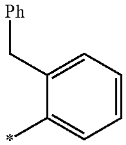
10-134
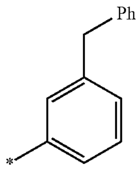
10-135
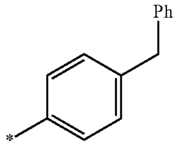
10-136
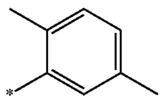
10-137
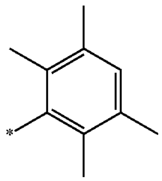
10-138
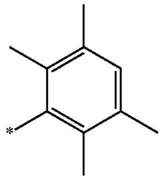
10-139
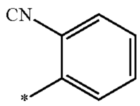
10-140
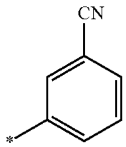
10-141
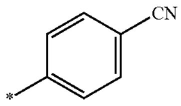

-continued
10-142
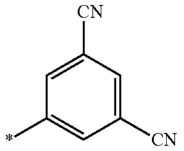
10-143
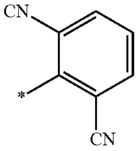
10-144
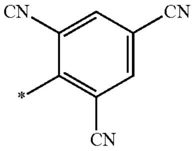
10-145
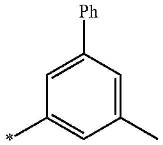
10-201
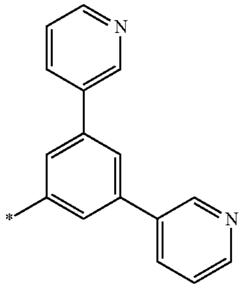
10-202
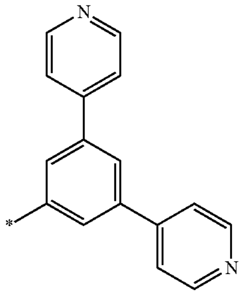
10-203
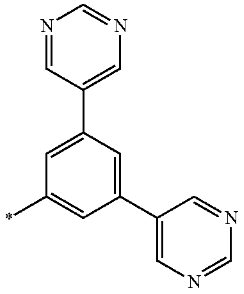
-continued
10-204
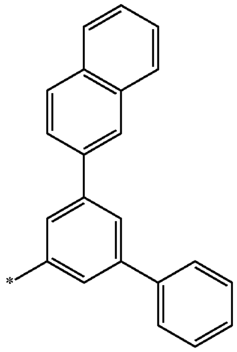
10-205
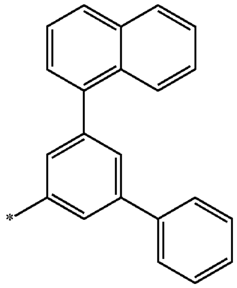
10-206
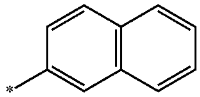
10-207
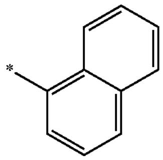
10-208
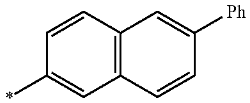
10-209
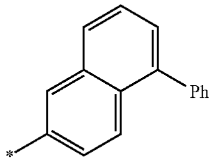
10-210
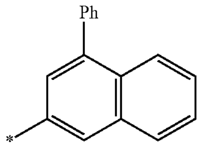
10-211
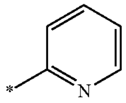
10-212
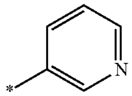

-continued
10-213
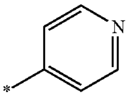
10-214
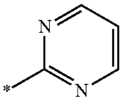
10-215
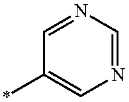
10-216
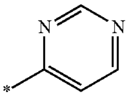
10-217
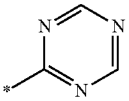
10-218
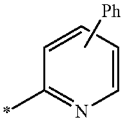
10-219
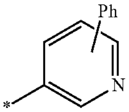
10-220
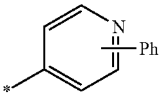
10-221
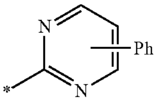
10-222
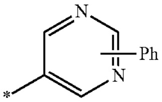
10-223
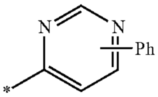
10-224
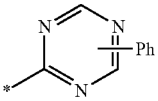
10-225
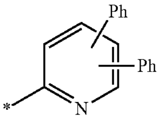
-continued
10-226
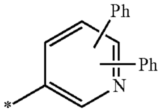
10-227
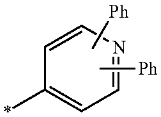
10-228
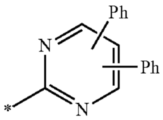
10-229
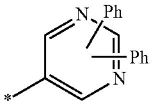
10-230
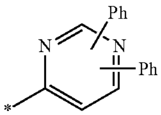
10-231
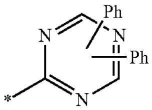
10-232
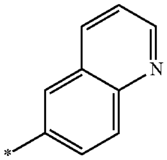
10-233
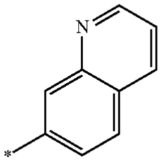
10-234
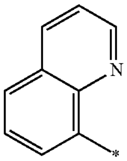
10-235
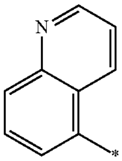

-continued
10-236
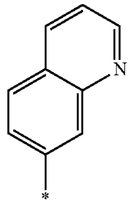
10-237
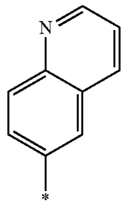
10-238
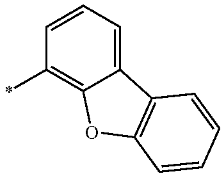
10-239
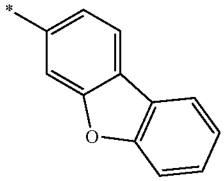
10-240
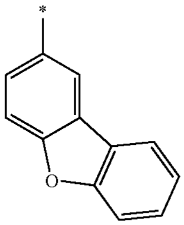
10-241
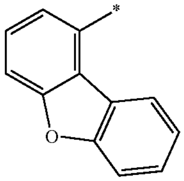
10-242
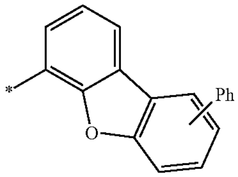
10-243
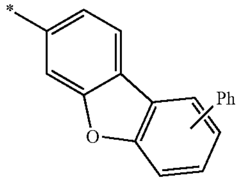
-continued
10-244
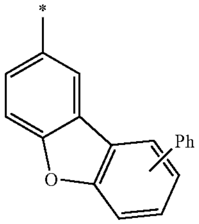
10-245
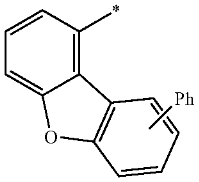
10-246
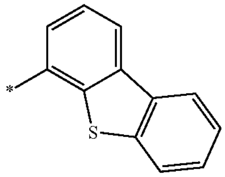
10-247
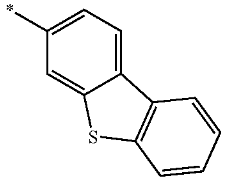
10-248
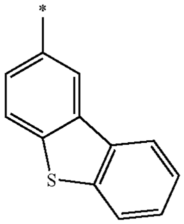
10-249
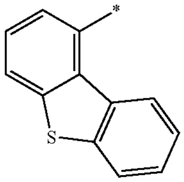
10-250
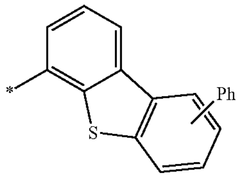
10-251
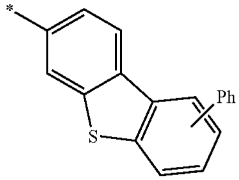

-continued
10-252
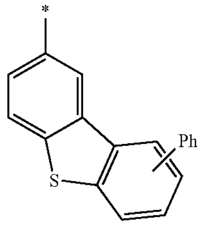
10-253
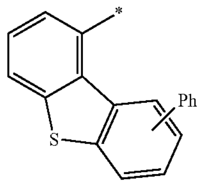
10-254
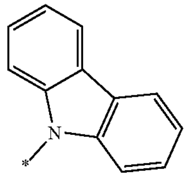
10-255
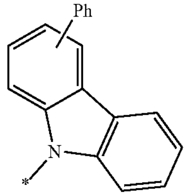
10-256
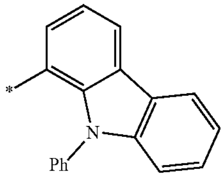
10-257
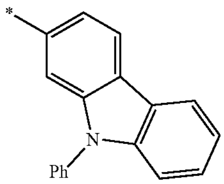
10-258
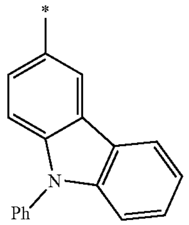
10-259
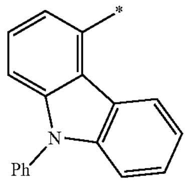
-continued
10-260
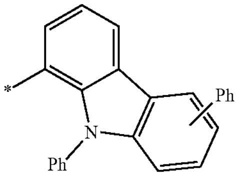
10-261
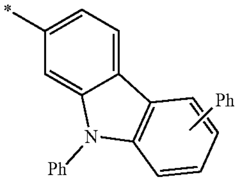
10-262
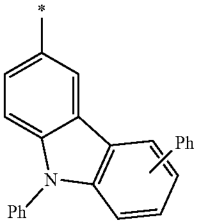
10-263
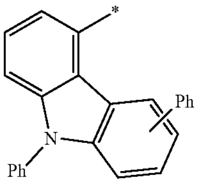
10-264
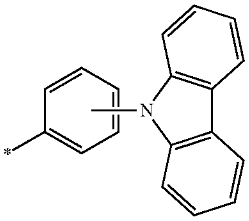
10-265
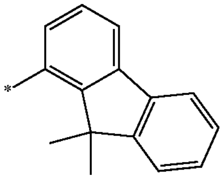
10-266
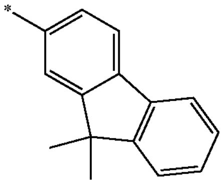

-continued
10-267
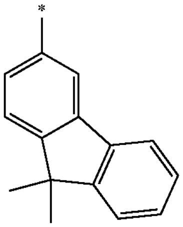
10-268
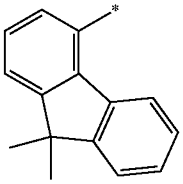
10-269
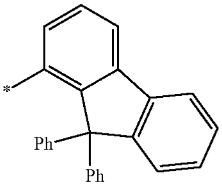
10-270
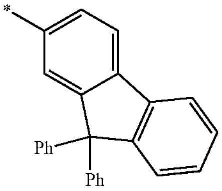
10-271
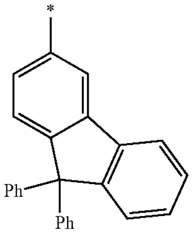
10-272
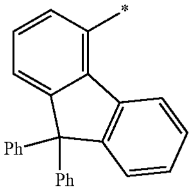
10-273
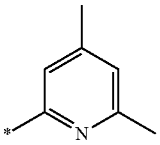
10-274
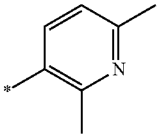
-continued
10-275
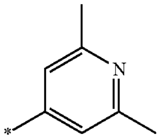
10-276
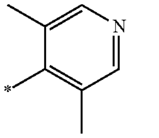
10-277
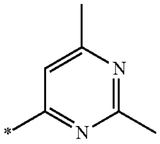
10-278
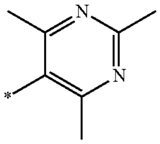
10-279
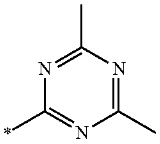
10-280
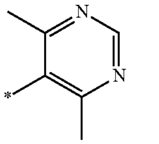
10-281
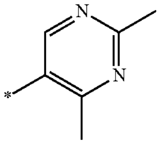
10-282
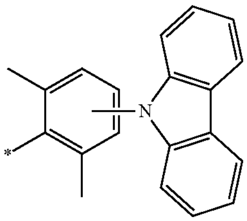
10-283
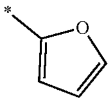
10-284
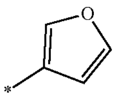

-continued
10-285
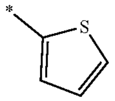
10-286
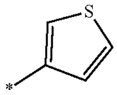
10-287
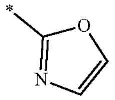
10-288
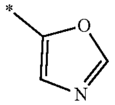
10-289
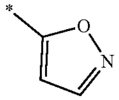
10-290
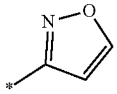
10-291
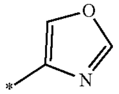
10-292
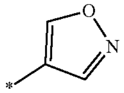
10-293
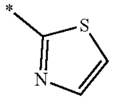
10-294
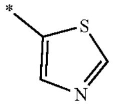
10-295
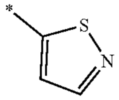
10-296
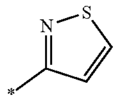
10-297
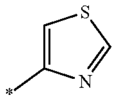
-continued
10-298
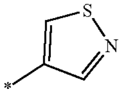
10-299
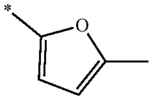
10-300
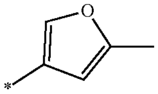
10-301
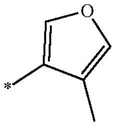
10-302
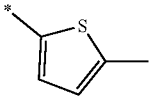
10-303
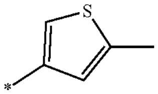
10-304
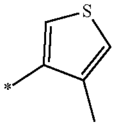
10-305
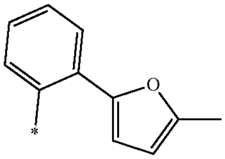
10-306
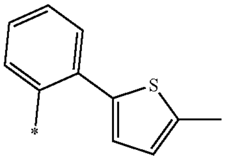
10-307
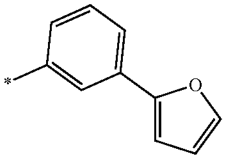
10-308
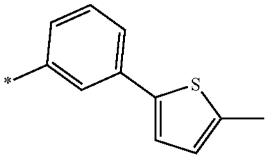

-continued
10-309
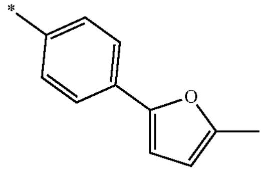
10-310
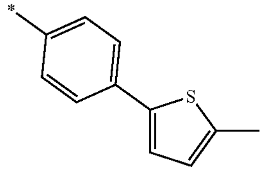
10-311
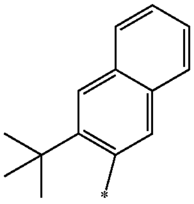
10-312
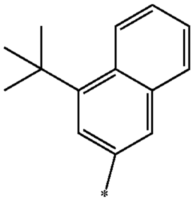
10-313
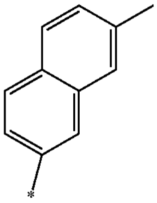
10-314
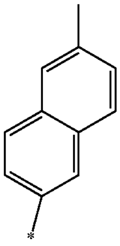
10-315
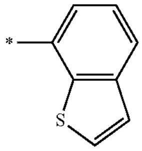
-continued
10-316
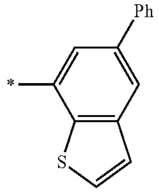
10-317
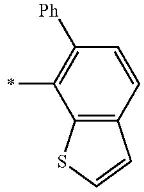
10-318
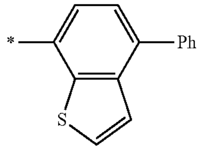
10-319
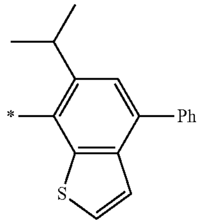
10-320
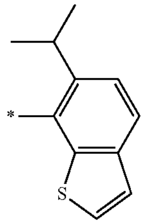
10-321
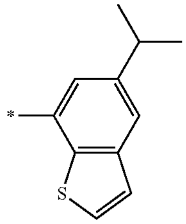
10-322
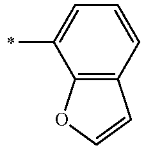
10-323
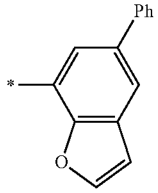

-continued
10-324
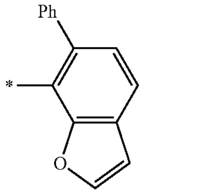
10-325
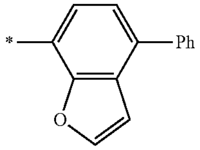
10-326
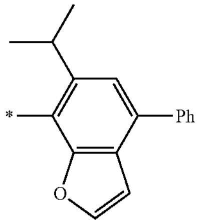
10-327
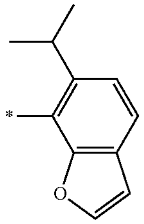
10-328
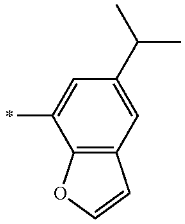
10-329
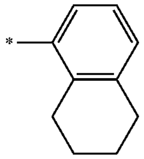
10-330
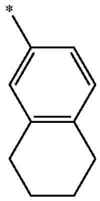
-continued
10-331
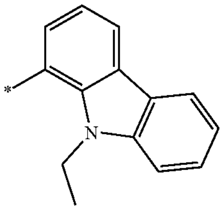
10-332
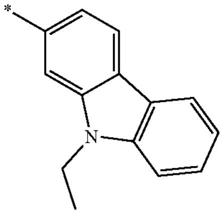
10-333
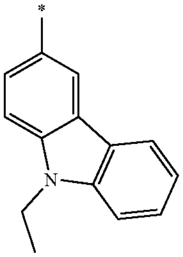
10-334
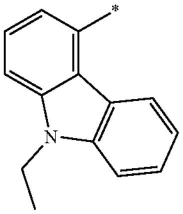
10-335
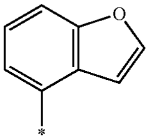
10-336
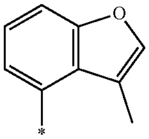
10-337
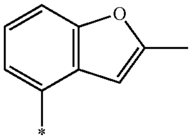
10-338
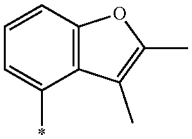

-continued 10-339

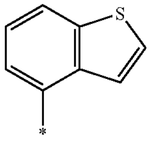

10-340

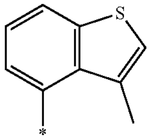

10-341

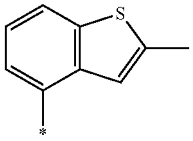

10-342

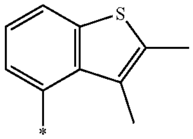

10-343

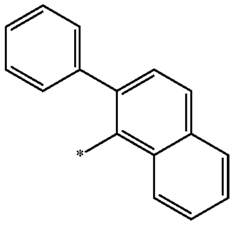

10-344

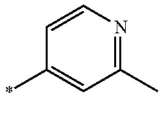

10-345

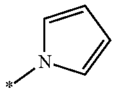

10-346

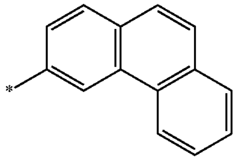

10-347

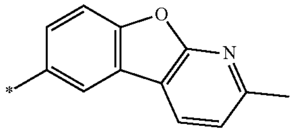

10-348

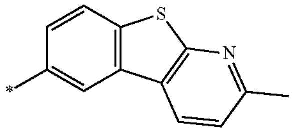

-continued 10-349

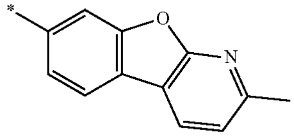

10-350

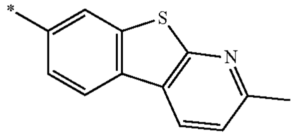

10-351

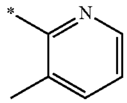

10-352

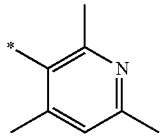

10-353

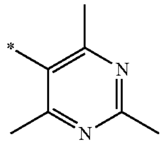

10-354

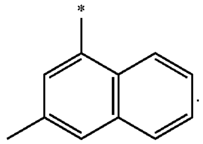

In Formulae 9-1 to 9-39, 9-201 to 9-230, 10-1 to 10-145, and 10-201 to 10-354, * indicates a binding site to an adjacent atom, “Ph” represents a phenyl group, “TMS” represents a trimethylsilyl group, “TMG” represents a trimethylgermyl group, and “OMe” represents a methoxy group.

The “group represented by one of Formulae 9-1 to 9-39 in which at least one hydrogen is substituted with deuterium” and the “group represented by one of Formulae 9-201 to 9-230 in which at least one hydrogen is substituted with deuterium” as used herein may each be, for example, a group represented by one of Formulae 9-501 to 9-514 and 9-601 to 9-637:

9-501

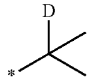

9-502

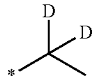

9-503

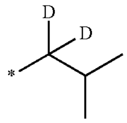

-continued
9-504
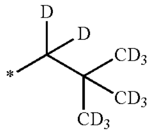
9-505
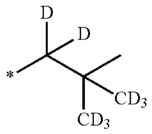
9-506
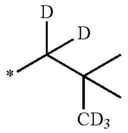
9-507
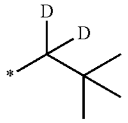
9-508
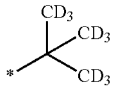
9-509
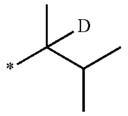
9-510
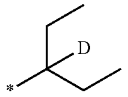
9-511
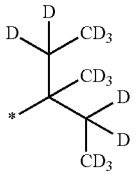
9-512
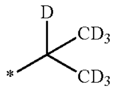
9-513
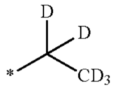
9-514
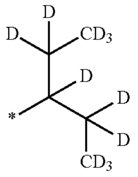
-continued
9-601
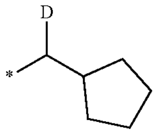
9-602
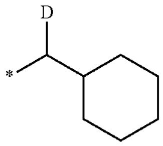
9-603
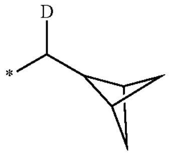
9-604
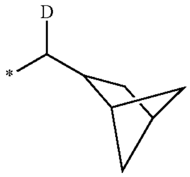
9-605
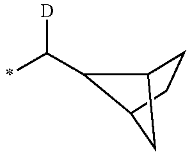
9-606
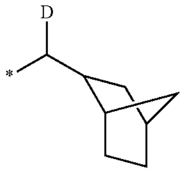
9-607
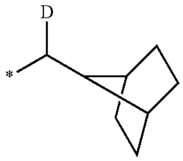
9-608
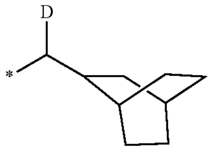
9-609
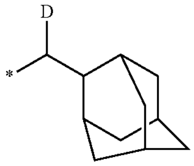

-continued
9-610
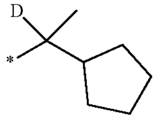
9-611
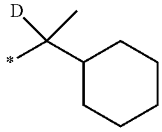
9-612
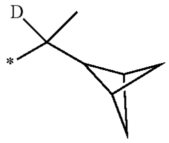
9-613
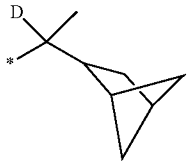
9-614
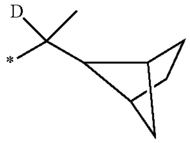
9-615
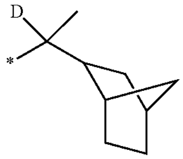
9-616
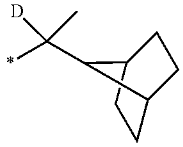
9-617
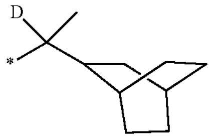
9-618
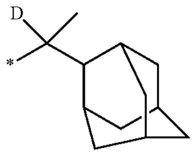
9-619
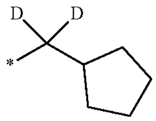
-continued
9-620
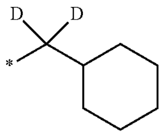
9-621
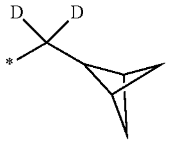
9-622
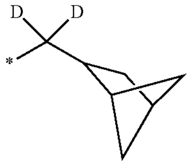
9-623
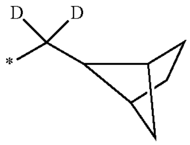
9-624
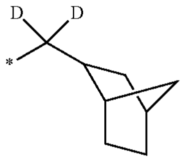
9-625
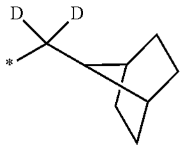
9-626
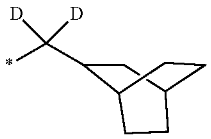
9-627
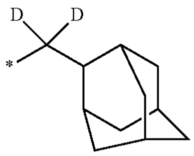
9-628
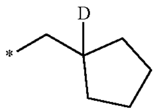
9-629
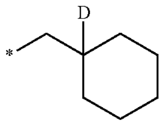

-continued 9-630

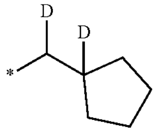

9-631

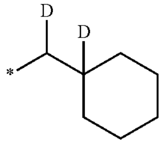

9-632

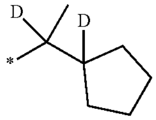

9-633

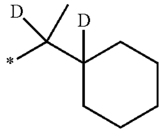

9-634

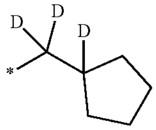

9-635

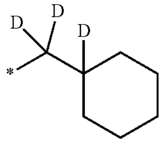

9-636

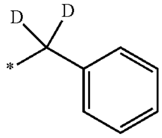

9-637

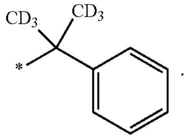

The "group represented by one of Formulae 9-1 to 9-39 in which at least one hydrogen is substituted with —F" and the "group represented by one of Formulae 9-201 to 9-230 in which at least one hydrogen is substituted with —F" as used herein may each be, for example, a group represented by one of Formulae 9-701 to 9-710:

9-701

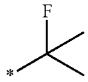

9-702

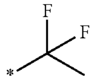

-continued 9-703

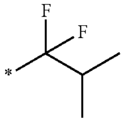

9-704

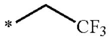

9-705

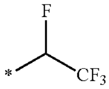

9-706

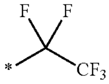

9-707

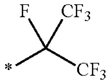

9-708

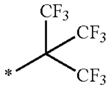

9-709

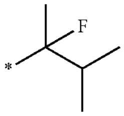

9-710

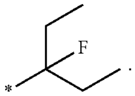

The "group represented by one of Formulae 10-1 to 10-145 in which at least one hydrogen is substituted with deuterium" and the "group represented by one of Formulae 10-201 to 10-354 in which at least one hydrogen is substituted with deuterium" as used herein may each be, for example, a group represented by one of Formulae 10-501 to 10-553:

10-501

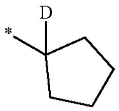

10-502

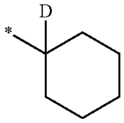

10-503

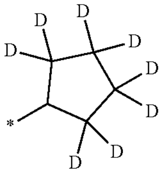

-continued
10-504
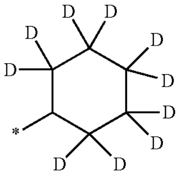
10-505
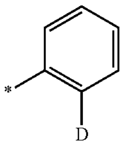
10-506
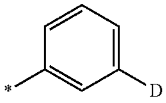
10-507
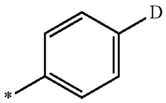
10-508
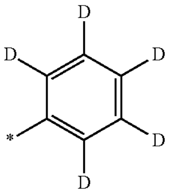
10-509
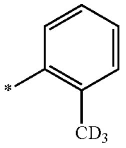
10-510
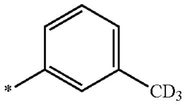
10-511
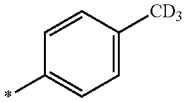
10-512
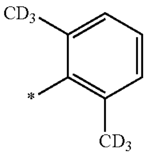
10-513
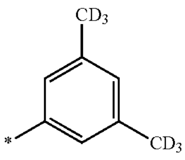
-continued
10-514
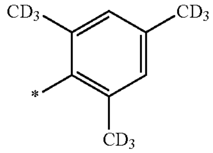
10-515
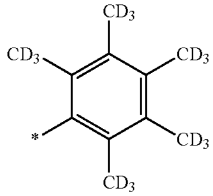
10-516
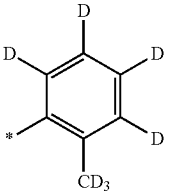
10-517
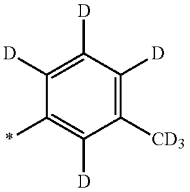
10-518
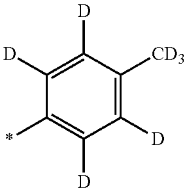
10-519
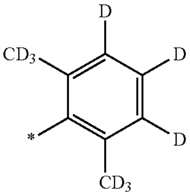
10-520
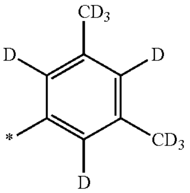
10-521
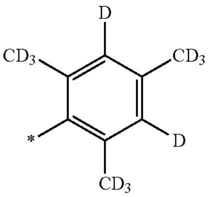

-continued
10-522
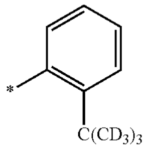
10-523
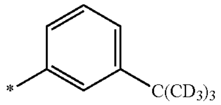
10-524
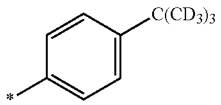
10-525
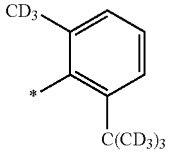
10-526
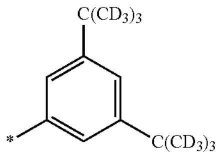
10-527
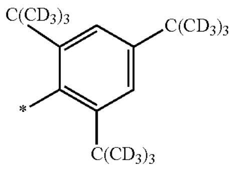
10-528
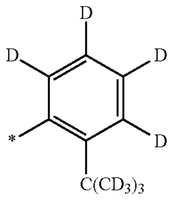
10-529
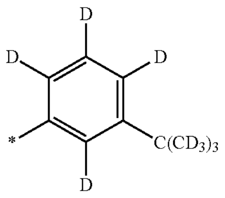
10-530
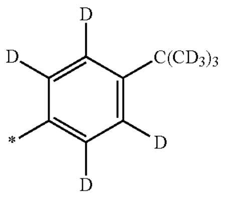
-continued
10-531
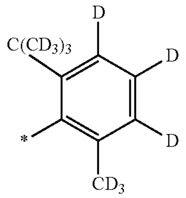
10-532
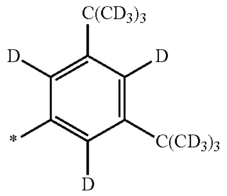
10-533
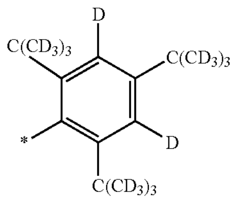
10-534
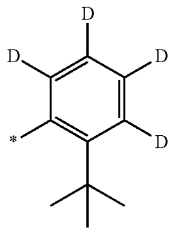
10-535
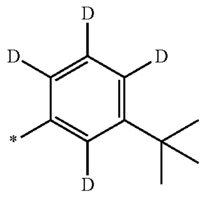
10-536
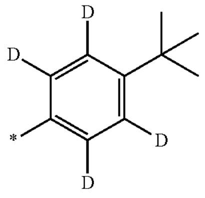
10-537
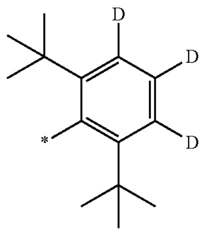

-continued
10-538
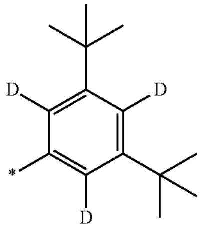
10-540
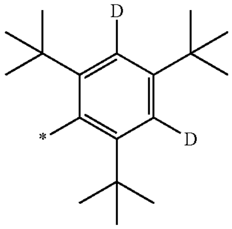
10-541
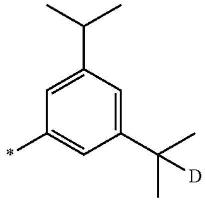
10-542
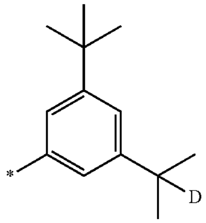
10-543
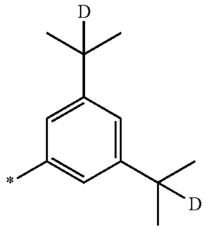
10-544
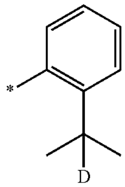
10-545
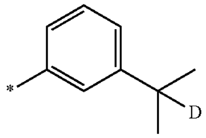
-continued
10-546
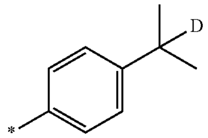
10-547
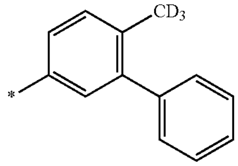
10-548
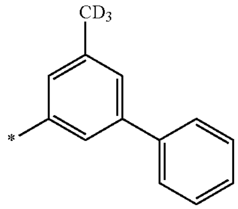
10-549
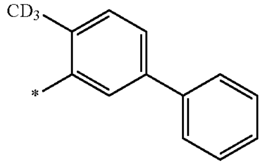
10-550
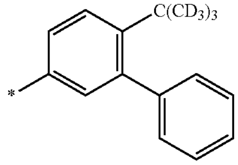
10-551
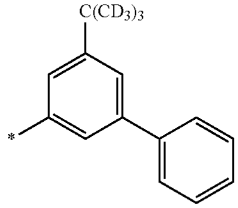
10-552
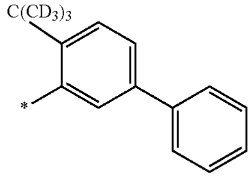
10-553
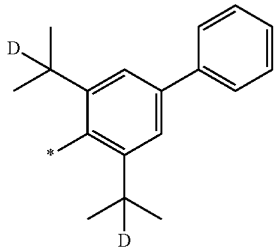
The "group represented by one of Formulae 10-1 to 10-145 in which at least one hydrogen is substituted with —F" and the "group represented by one of Formulae 10-201 to 10-354 in which at least one hydrogen is substituted with —F" as used herein may each be, for example, a group represented by one of Formulae 10-601 to 10-636:
10-601
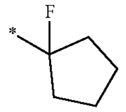
10-602
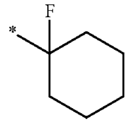
10-603
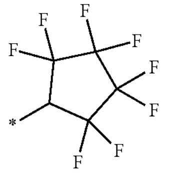
10-604
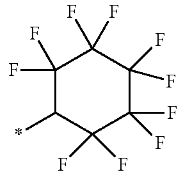
10-605
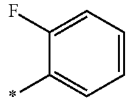
10-606
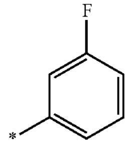
10-607
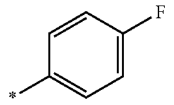
10-608
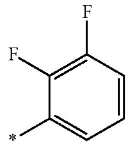
10-609
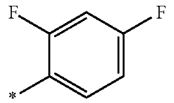
10-610
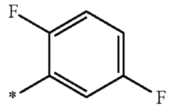
-continued
10-611
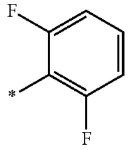
10-612
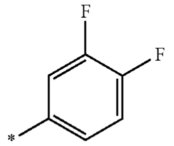
10-613
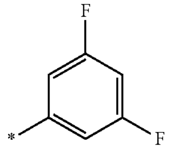
10-614
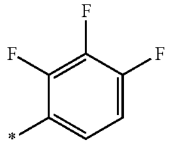
10-615
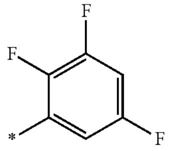
10-616
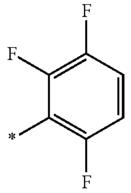
10-617
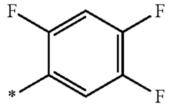
10-618
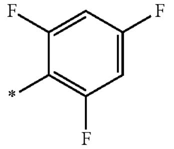
10-619
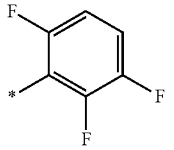
10-620
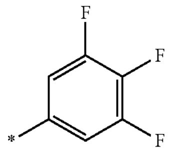

-continued 10-621

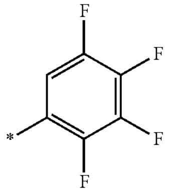

10-622

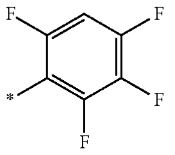

10-623

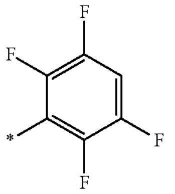

10-624

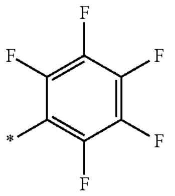

10-625

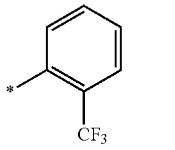

10-626

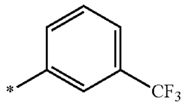

10-627

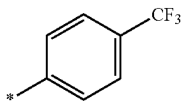

10-628

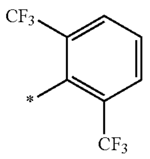

10-629

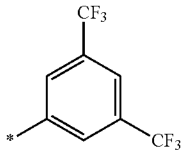

-continued 10-630

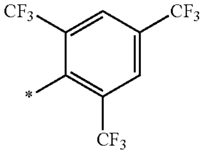

10-631

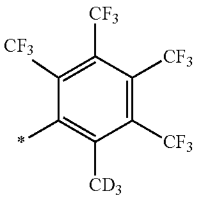

10-632

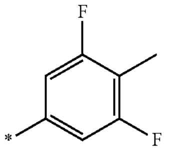

10-633

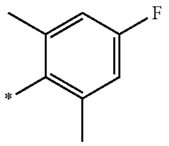

10-634

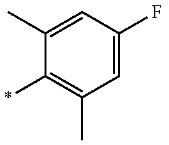

10-635

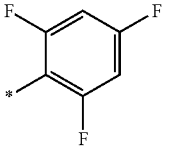

10-636

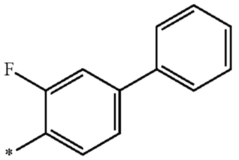

.

In Formulae 2-1 and 2-2, a1 to a4 may respectively indicate the number of $R_1$ moieties to $R_4$ moieties, a1 may be an integer from 0 to 3, and a2 to a4 may each independently be an integer from 0 to 20 (e.g., an integer from 0 to 10). When a1 is 2 or greater, at least two $R_1$ moieties may be identical to or different from each other, when a2 is 2 or greater, at least two $R_2$ moieties may be identical to or different from each other, when a3 is 2 is or greater, at least two $R_3$ moieties may be identical to or different from each other, and when a4 is 2 is or greater, at least two $R_4$ moieties may be identical to or different from each other.

In one or more embodiments, the organometallic compound represented by Formula 1 may include deuterium, a fluoro group, or any combination thereof.

In one or more embodiments, the organometallic compound represented by Formula 1 may satisfy at least one of Conditions 1 to 8:

Condition 1 at least one of the $R_1$ moieties (the number a1 representing a count of the $R_1$ moieties) may not be hydrogen and may include at least one deuterium, Condition 2 at least one of the $R_2$ moieties (the number a2 representing a count of the $R_2$ moieties) may not be hydrogen and may include at least one deuterium, Condition 3 at least one of the *-$T_3$-$R_3$ moieties (the number a3 representing a count of the *-$T_3$-$R_3$ moieties) may not be hydrogen and may include at least one deuterium, Condition 4 at least one of the $R_4$ moieties (the number a4 representing a count of the $R_4$ moieties) may not be hydrogen and may include at least one deuterium, Condition 5 at least one of the $R_1$ moieties (the number a1 representing a count of the $R_1$ moieties) may not be hydrogen and may include at least one fluoro group, Condition 6 at least one of the $R_2$ moieties (the number a2 representing a count of the $R_2$ moieties) may not be hydrogen and may include at least one fluoro group, Condition 7 at least one of the *-$T_3$-$R_3$ moieties (the number a3 representing a count of the *-$T_3$-$R_3$ moieties) may not be hydrogen and may include at least one fluoro group, and Condition 8 at least one of $R_4$ (moieties) (the number a4 representing a count of the $R_4$ moieties) may not be hydrogen and may include at least one fluoro group.

In Formulae 2-1 and 2-2, i) at least two $R_1$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) at least two $R_2$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) at least two $R_3$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iv) at least two $R_4$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and v) at least two of the $R_1$ moieties to $R_4$ moieties may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ used herein may be understood by referring to the description of $R_2$ provided herein. For example, $R_{10a}$ may be understood by referring to the description of $R_2$ provided herein, and $R_{10a}$ may not be hydrogen.

In Formulae 2-1 to 2-2, * and *' each indicate a binding site to an adjacent atom.

In an embodiment, a group represented by

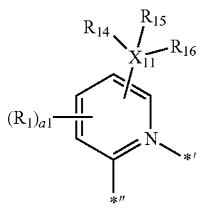

in Formula 2-1 may be represented by one of Formulae CY1-1 to CY1-3:

CY1-1

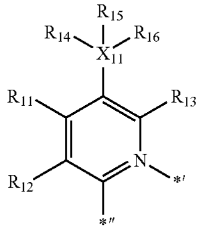

CY1-2

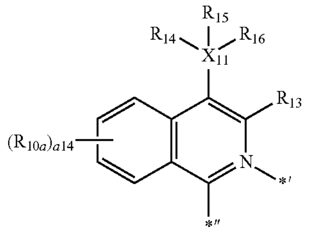

CY1-3

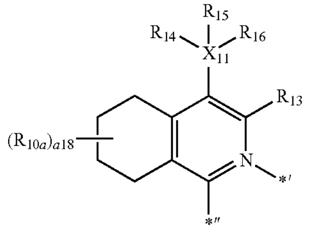

wherein, in Formulae CY1-1 to CY1-3, $X_{11}$, $R_{14}$ to $R_{16}$, and $R_{10a}$ may respectively be understood by referring to the descriptions of $X_{11}$, $R_{14}$ to $R_{16}$, and $R_{10a}$ provided herein, $R_{11}$ to $R_{13}$ may each be understood by referring to the description of $R_1$ provided herein, a14 may be an integer from 0 to 4, a18 may be an integer from 0 to 8,

*' indicates a binding site to M in Formula 1, and

*" indicates a binding site to an adjacent atom in Formula 2-1.

For example, in Formula CY1-1, $R_{11}$ may not be hydrogen.

In an embodiment, in Formula CY1-1, $R_{11}$ may not be hydrogen and a methyl group.

In one or more embodiments, in Formula CY1-1, $R_{11}$ may not be hydrogen, a methyl group, and a cyano group.

In one or more embodiments, in Formula CY1-1, $R_{11}$ may not be hydrogen, and $R_{12}$ and $R_{13}$ may each be hydrogen.

In one or more embodiments, in Formula CY1-1, $R_{11}$ may have at least two, three, or four carbon atoms.

In one or more embodiments, in Formula CY1-1, $R_{11}$ may be:

a methyl group substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof; or a $C_2$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

In one or more embodiments, a group represented by

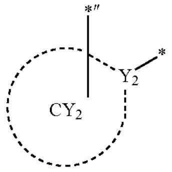

in Formula 2-1 may be represented by one of Formulae CY2-1 to CY2-33:

CY2-1

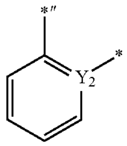

CY2-2

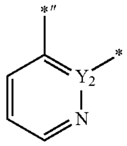

CY2-3

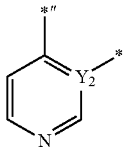

-continued

CY2-4

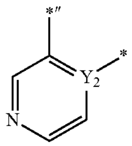

CY2-5

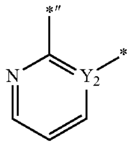

CY2-6

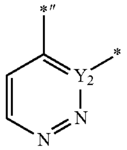

CY2-7

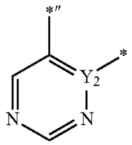

CY2-8

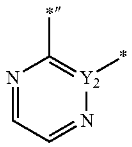

CY2-9

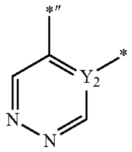

CY2-10

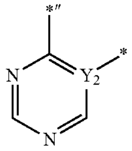

CY2-11

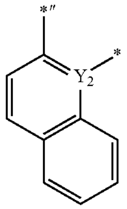

CY2-12

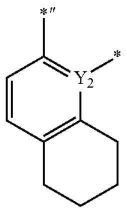

-continued
CY2-13
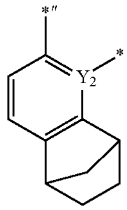
CY2-14
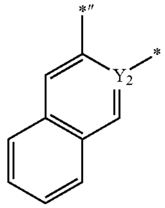
CY2-15
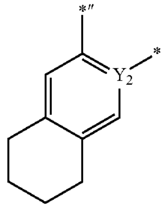
CY2-16
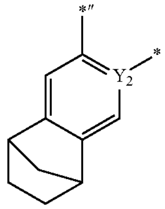
CY2-17
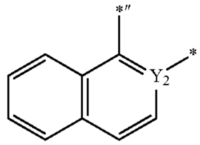
CY2-18
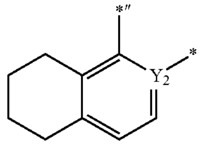
CY2-19
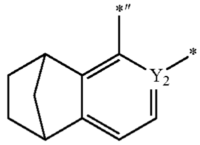
CY2-20
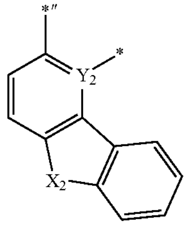
-continued
CY2-21
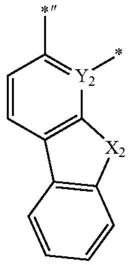
CY2-22
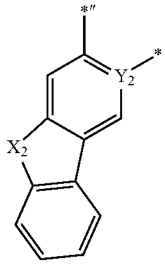
CY2-23
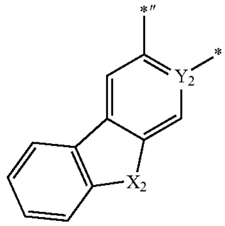
CY2-24
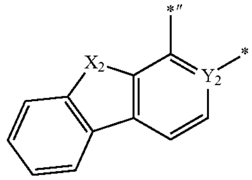
CY2-25
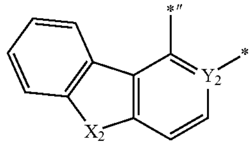
CY2-26
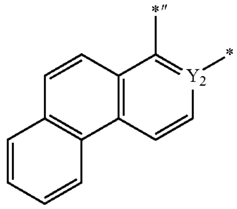
CY2-27
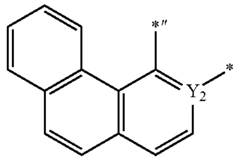

-continued

CY2-28

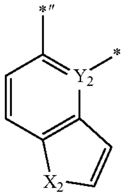

CY2-29

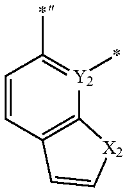

CY2-30

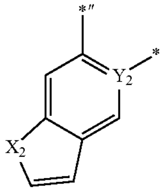

CY2-31

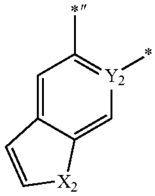

CY2-32

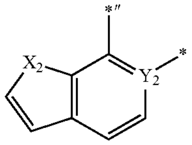

CY2-33

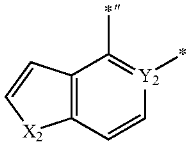

wherein, in Formulae CY2-1 to CY2-33, $Y_2$ may be understood by referring to the description of $Y_2$ provided herein, $X_2$ may be O, S, Se, $N(R_{28})$, $C(R_{28})(R_{29})$, or $Si(R_{28})(R_{29})$, $R_{28}$ and $R_{29}$ may each be understood by referring to the description of $R_2$ provided herein,

*" indicates a binding site to an adjacent atom in Formula 2-1, and

* in indicates a binding site to M in Formula 1.

In one or more embodiments, a group represented by

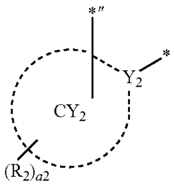

in Formula 2-1 may be represented by one of Formulae CY2(1) to CY2(56):

CY2(1)

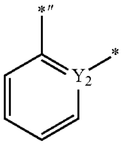

CY2(2)

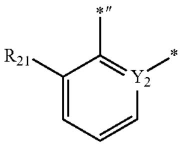

CY2(3)

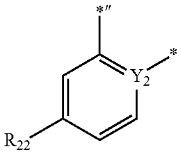

CY2(4)

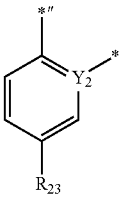

CY2(5)

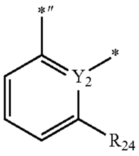

CY2(6)

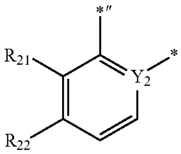

CY2(7)

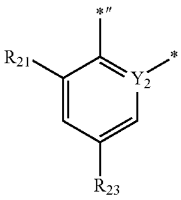

-continued
CY2(8)
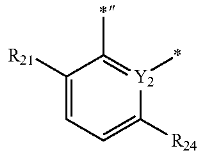
CY2(9)
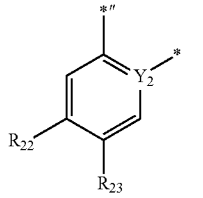
CY2(10)
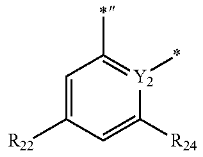
CY2(11)
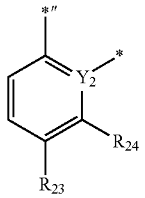
CY2(12)
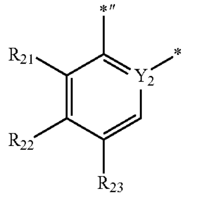
CY2(13)
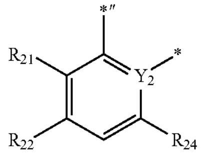
CY2(14)
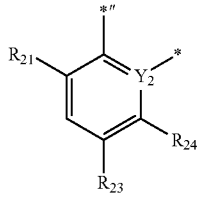
CY2(15)
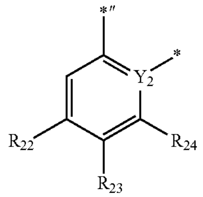
-continued
CY2(16)
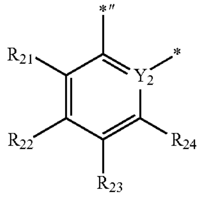
CY2(17)
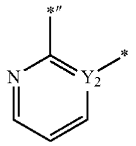
CY2(18)
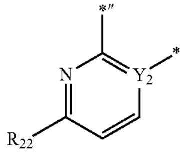
CY2(19)
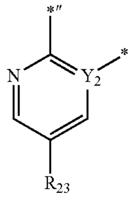
CY2(20)
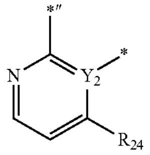
CY2(21)
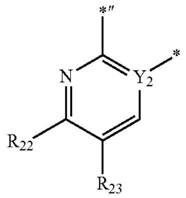
CY2(22)
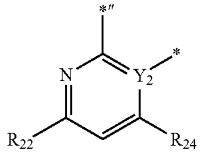
CY2(23)
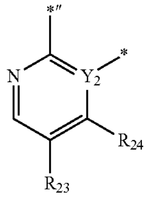

-continued
CY2(24)
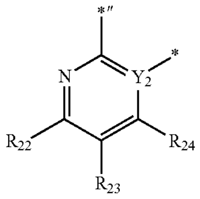
CY2(25)
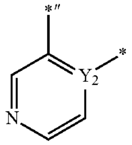
CY2(26)
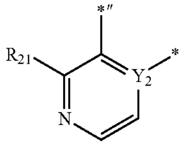
CY2(27)
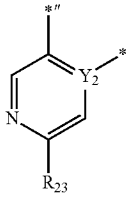
CY2(28)
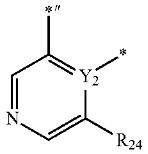
CY2(29)
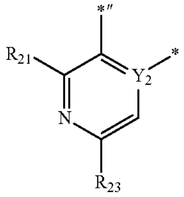
CY2(30)
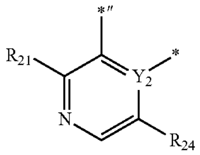
CY2(31)
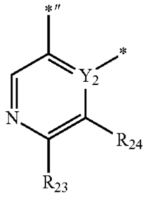
-continued
CY2(32)
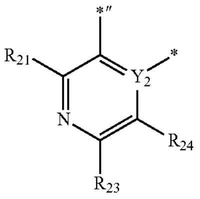
CY2(33)
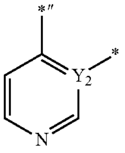
CY2(34)
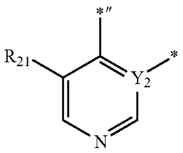
CY2(35)
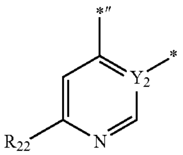
CY2(36)
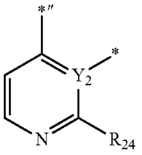
CY2(37)
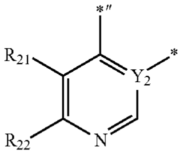
CY2(38)
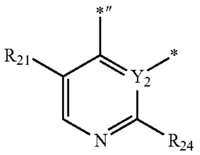
CY2(39)
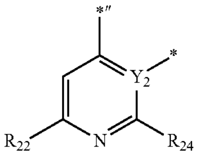
CY2(40)
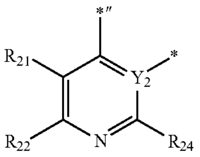

-continued

CY2(41)

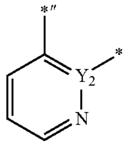

CY2(42)

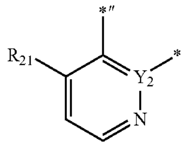

CY2(43)

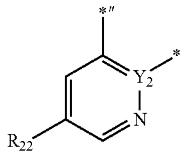

CY2(44)

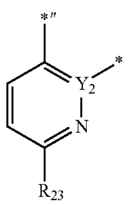

CY2(45)

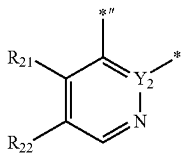

CY2(46)

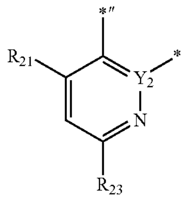

CY2(47)

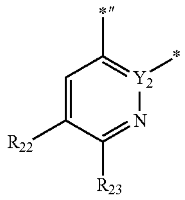

CY2(48)

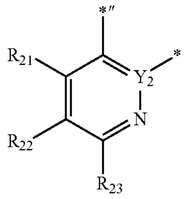

CY2(49)

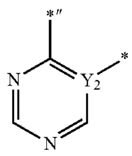

-continued

CY2(50)

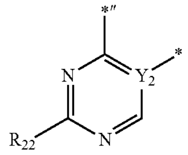

CY2(51)

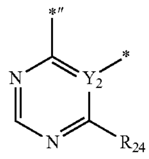

CY2(52)

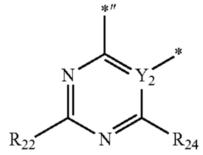

CY2(53)

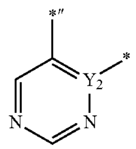

CY2(54)

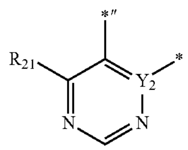

CY2(55)

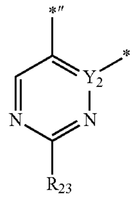

CY2(56)

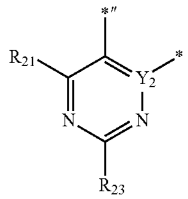

wherein, in Formulae CY2(1) to CY2(56), $Y_2$ may be understood by referring to the description of $Y_2$ provided herein, $R_{21}$ to $R_{24}$ may each be understood by referring to the description of $R_2$ provided herein, wherein $R_{21}$ to $R_{24}$ may not each be hydrogen,

*" indicates a binding site to an adjacent atom in Formula 2-1, and

* in indicates a binding site to M in Formula 1.

In one or more embodiments, a group represented by
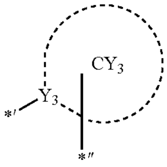
in Formula 2-2 may be represented by one of Formulae CY3-1 to CY3-48:
CY3-1
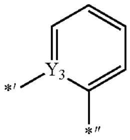
CY3-2
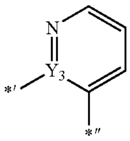
CY3-3
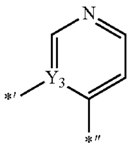
CY3-4
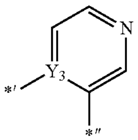
CY3-5
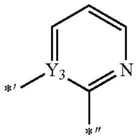
CY3-6
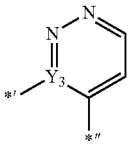
CY3-7
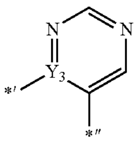
CY3-8
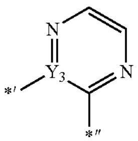
-continued
CY3-9
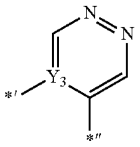
CY3-10
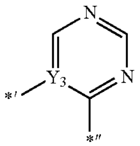
CY3-11
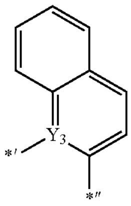
CY3-12
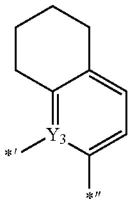
CY3-13
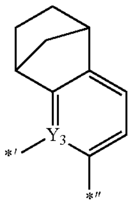
CY3-14
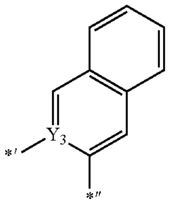
CY3-15
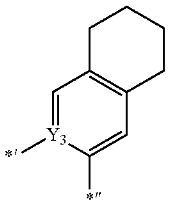
CY3-16
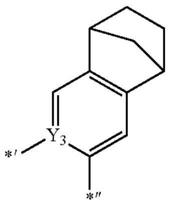

-continued
CY3-17
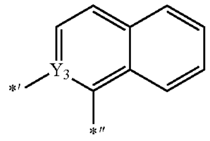
CY3-18
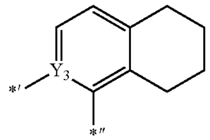
CY3-19
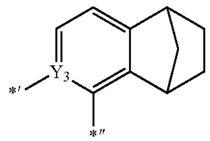
CY3-20
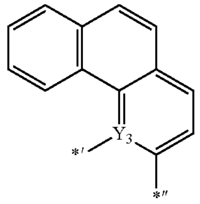
CY3-21
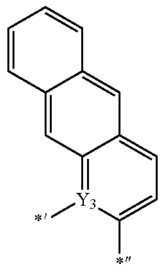
CY3-22
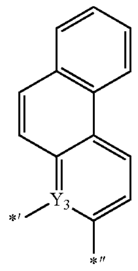
CY3-23
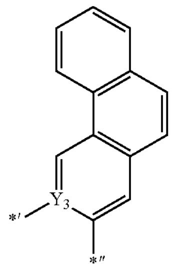
-continued
CY3-24
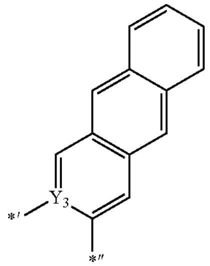
CY3-25
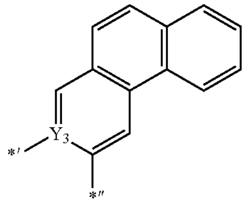
CY3-26
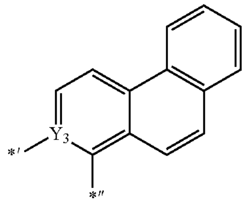
CY3-27
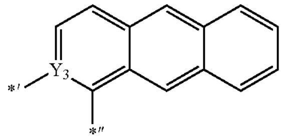
CY3-28
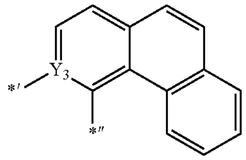
CY3-29
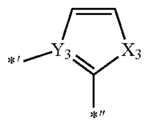
CY3-30
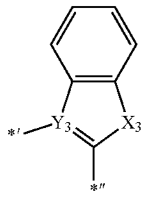
CY3-31
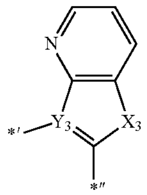

-continued
CY3-32
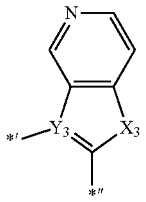
CY3-33
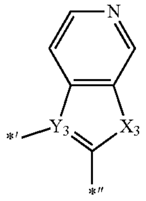
CY3-34
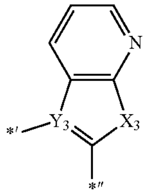
CY3-35
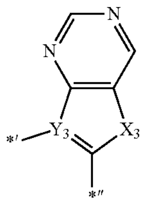
CY3-36
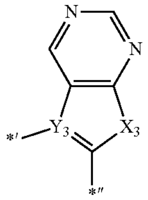
CY3-37
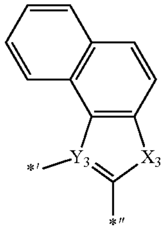
CY3-38
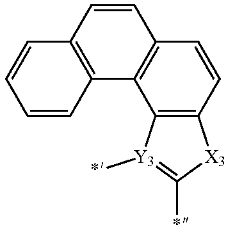
-continued
CY3-39
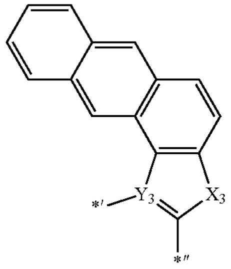
CY3-40
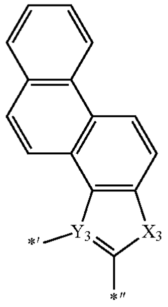
CY3-41
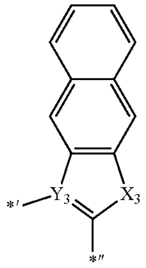
CY3-42
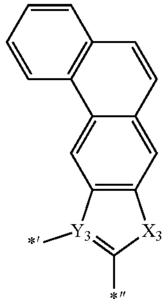
CY3-43
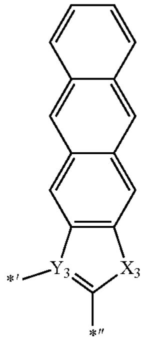

-continued

CY3-44

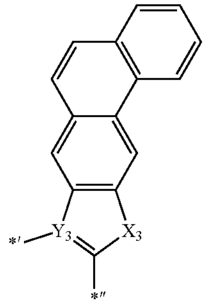

CY3-45

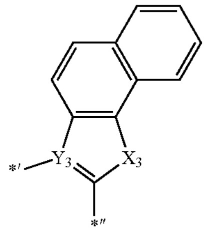

CY3-46

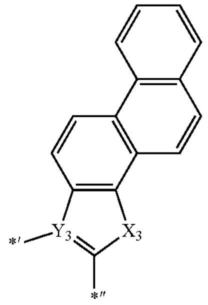

CY3-47

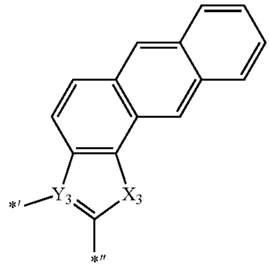

CY3-48

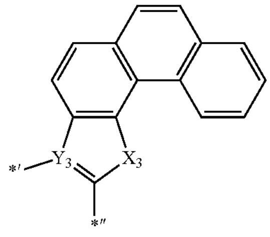

wherein, in Formulae CY3-1 to CY3-48, $X_3$ may be O, S, or $N(T_3\text{-}R_3)$, $Y_3$, $T_3$, and $R_3$ may respectively be understood by referring to the descriptions of $Y_3$, $T_3$, and $R_3$ provided herein,

*' indicates a binding site to M in Formula 1, and

*" indicates a binding site to an adjacent atom in Formula 2-2.

In some embodiments, in Formulae CY3-29 to CY3-48, i) $X_3$ may be $N(T_3\text{-}R_3)$, and ii) at least one of Condition A and Condition B may be satisfied:

Condition A $T_3$ may be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and Condition B $R_3$ may be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, a group represented by

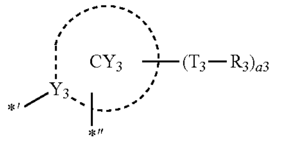

in Formula 2-2 may be represented by one of Formulae CY3(1) to CY3(16):

CY3(1)

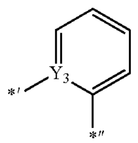

CY3(2)

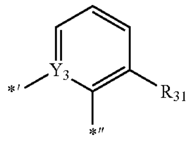

CY3(3)

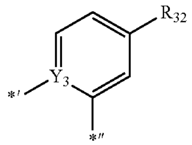

CY3(4)

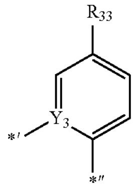

CY3(5)

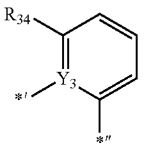

CY3(6)

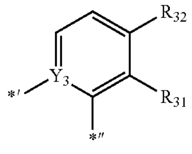

-continued

CY3(7)

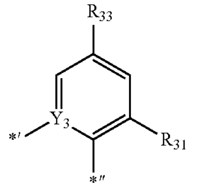

CY3(8)

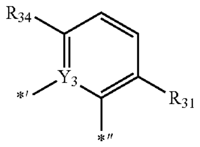

CY3(9)

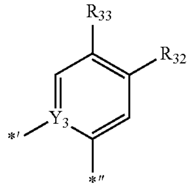

CY3(10)

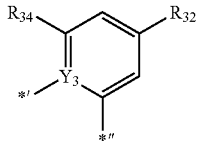

CY3(11)

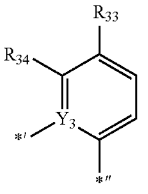

CY3(12)

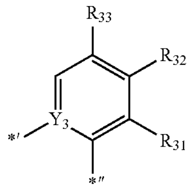

CY3(13)

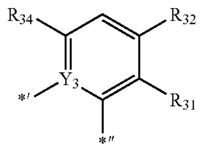

CY3(14)

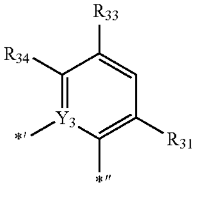

-continued

CY3(15)

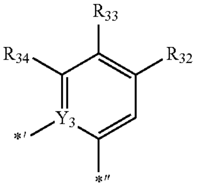

CY3(16)

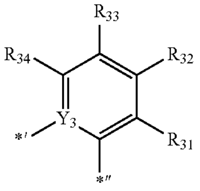

wherein, in Formulae CY3(1) to CY3(16), $Y_3$ may be understood by referring to the description of $Y_3$ provided herein, $R_{31}$ to $R_{34}$ may each be understood by referring to the description of $R_3$ provided herein, wherein $R_{31}$ to $R_{34}$ may not each be hydrogen,

*' indicates a binding site to M in Formula 1, and

*" indicates a binding site to an adjacent atom in Formula 2-2.

In one or more embodiments, a group represented by

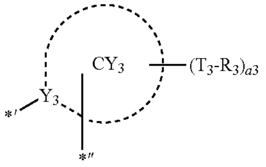

in Formula 2-2 may be represented by one of Formulae CY3-29 to CY3-48 (wherein $X_3$ may be $N(T_3-R_3)$).

In one or more embodiments, a group represented by

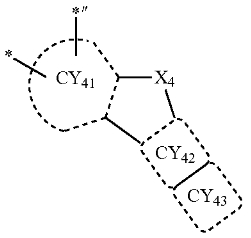

in Formula 2-2 may be represented by one of Formulae CY4-1 to CY4-6:

CY4-1

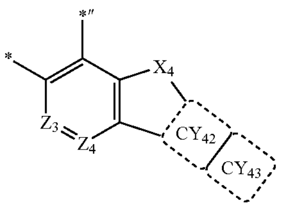

-continued

CY4-2

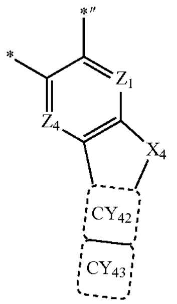

CY4-3

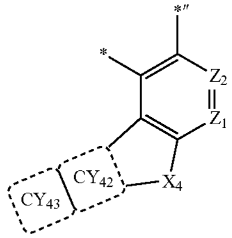

CY4-4

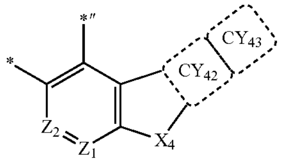

CY4-5

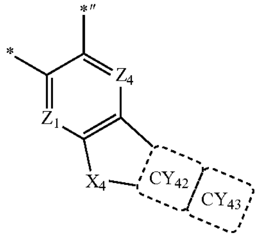

CY4-6

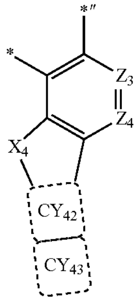

wherein, in Formulae CY4-1 to CY4-6, $X_4$, ring CY42, and ring CY43 may respectively be understood by referring to the descriptions of $X_4$, ring CY42, and ring CY43 provided herein, $Z_1$ to $Z_4$ may each independently be N or C,

* indicates a binding site to M in Formula 1, and

*" indicates a binding site to ring CY3 in Formula 2-2.

In one or more embodiments, a group represented by

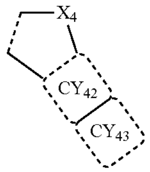

in

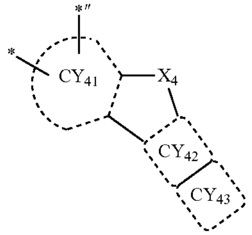

in Formula 2-2 may be represented by one of Formulae CY401 to CY412:

CY401

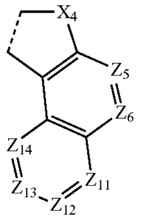

CY402

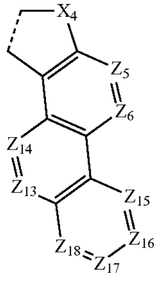

CY403

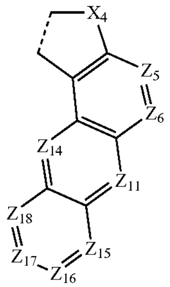

-continued

CY404

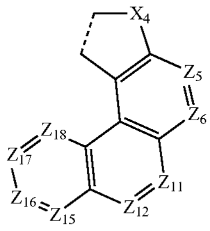

CY405

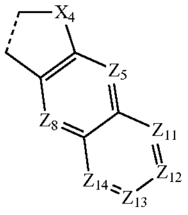

CY406

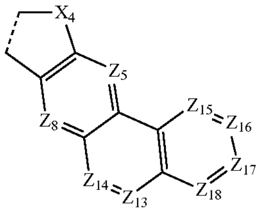

CY407

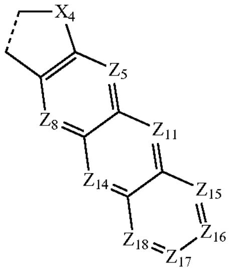

CY408

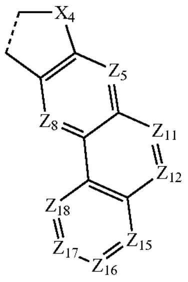

CY409

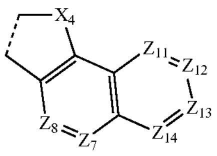

CY410

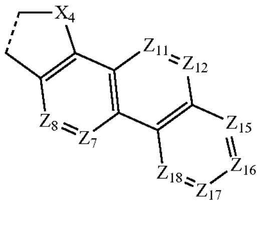

-continued

CY411

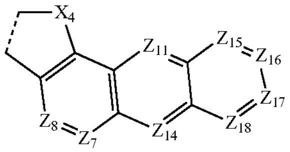

CY412

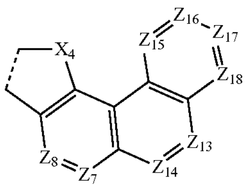

wherein, in Formulae CY401 to CY412, $X_4$ may be understood by referring to the description of $X_4$ provided herein, $Z_5$ to $Z_8$ and $Z_{11}$ to $Z_{18}$ may each independently be N or C, and an $X_4$-containing 5-membered ring may be condensed to an adjacent ring $CY_{41}$.

In one or more embodiments, the organometallic compound represented by Formula 1 may include deuterium, a fluoro group, or any combination thereof.

In one or more embodiments, the organometallic compound may emit red light or green light, e.g., red light or green light having a maximum emission wavelength of about 500 nanometers (nm) or greater, e.g., about 500 nm to about 850 nm. In some embodiments, the organometallic compound may emit green light. In some embodiments, the organometallic compound may emit a light (for example, a green light) having a maximum emission wavelength of about 515 nm to about 550 nm, or about 520 nm to about 540 nm.

In one or more embodiments, $L_1$ in Formula 1 may be a ligand represented by one of Formulae A1 to A310:

A1

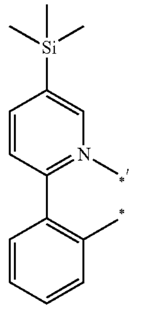

A2

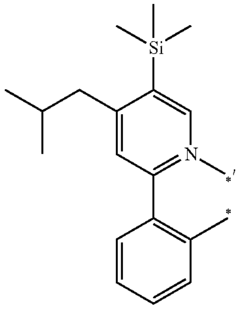

-continued
A3
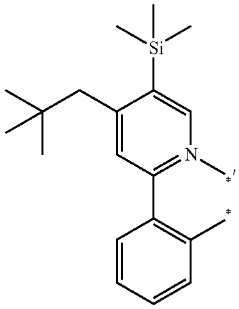
A4
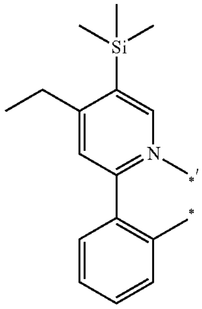
A5
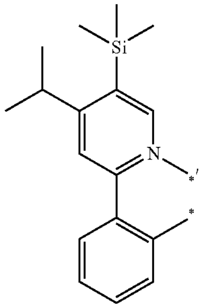
A6
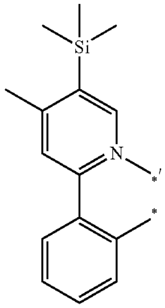
A7
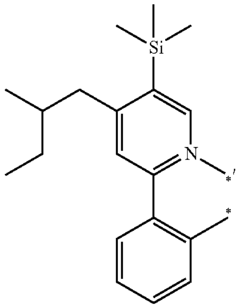
-continued
A8
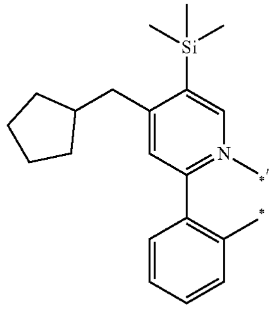
A9
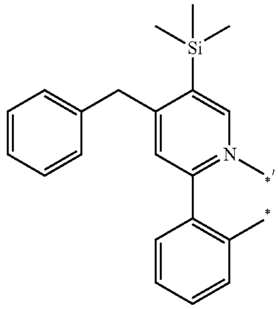
A10
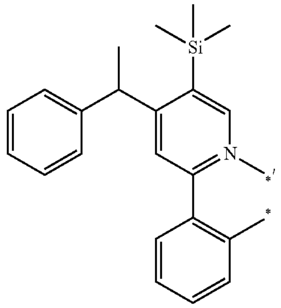
A11
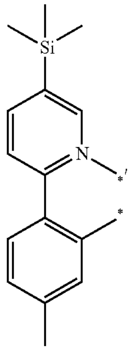
A12
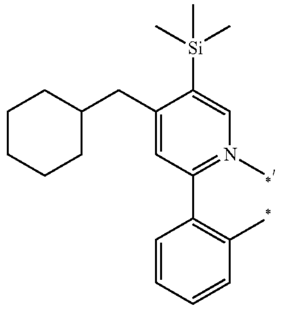

-continued
A13
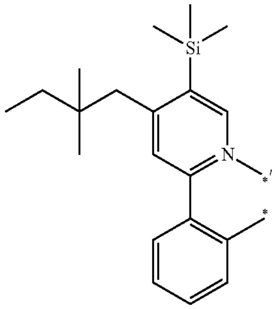
A14
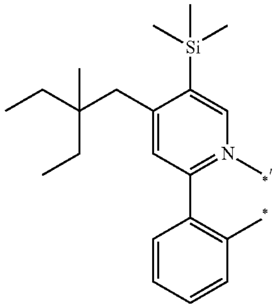
A15
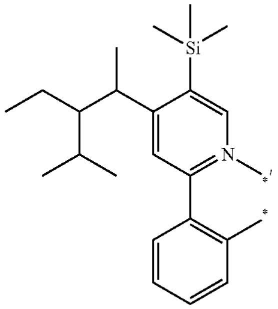
A16
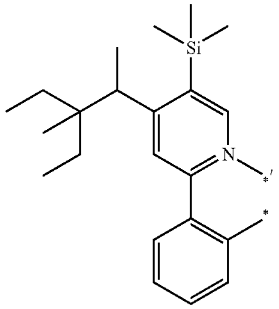
A17
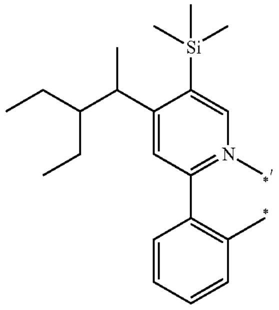
-continued
A18
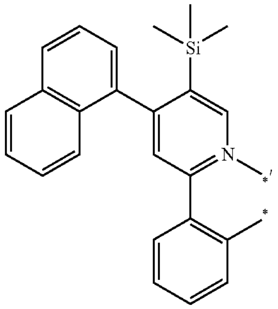
A19
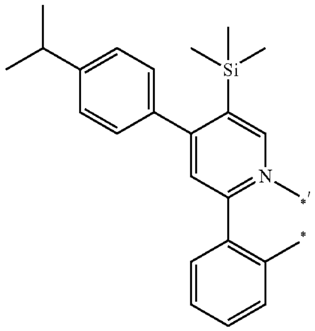
A20
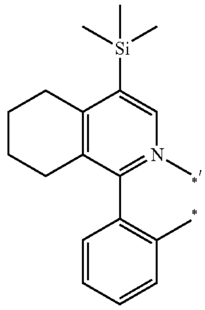
A21
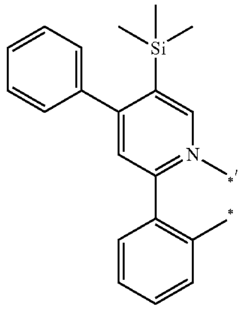
A22
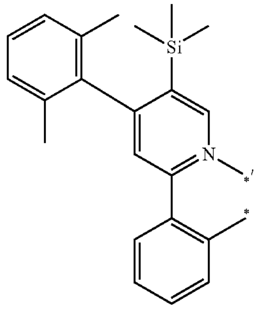

-continued
A23
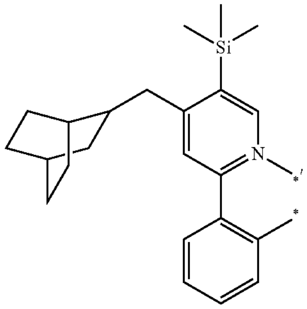
A24
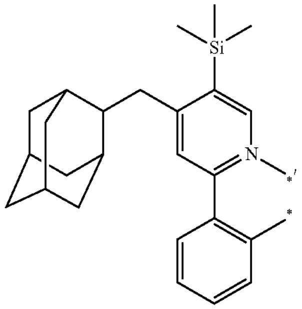
A25
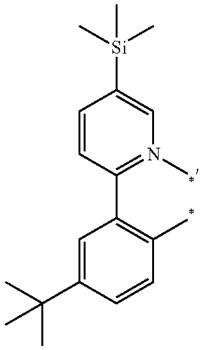
A26
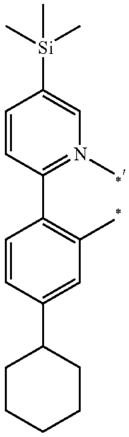
-continued
A27
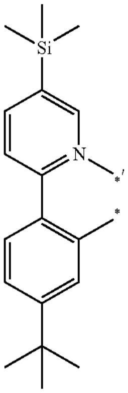
A28
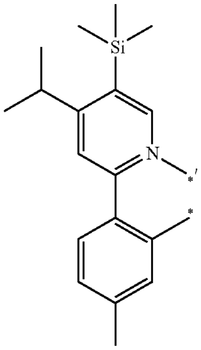
A29
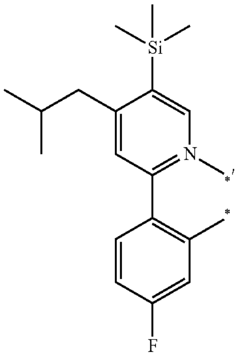
A30
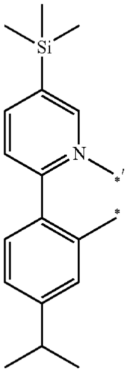

-continued
A31
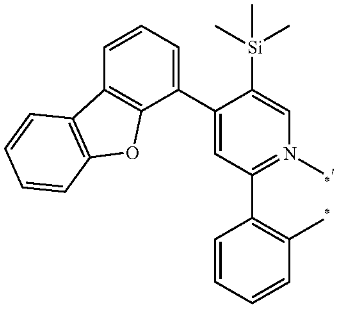
A32
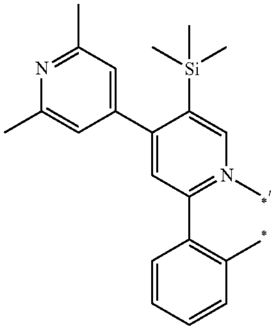
A33
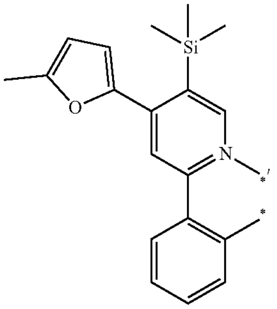
A34
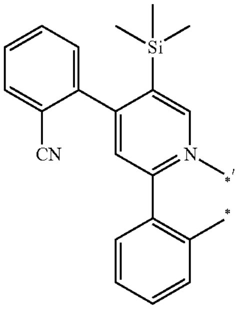
A35
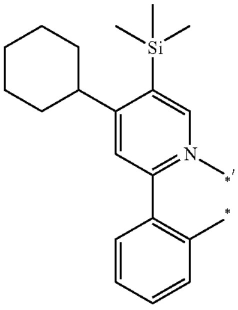
-continued
A36
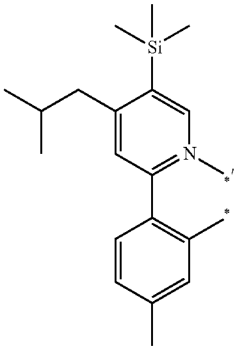
A37
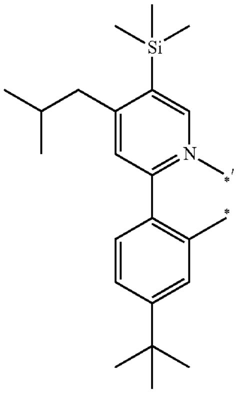
A38
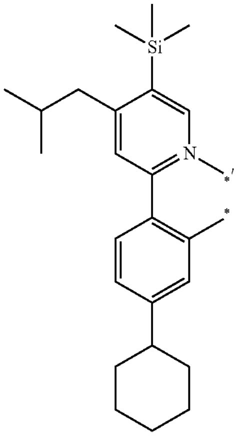
A39
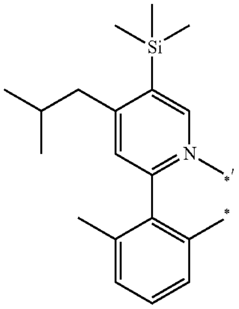

A40
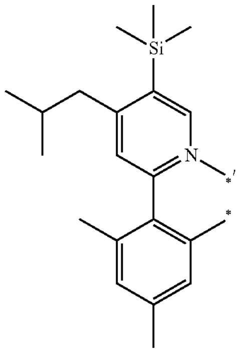
A41
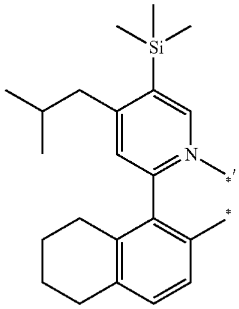
A42
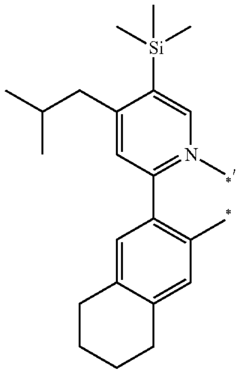
A43
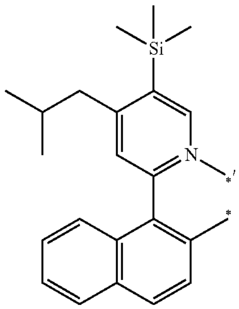
A44
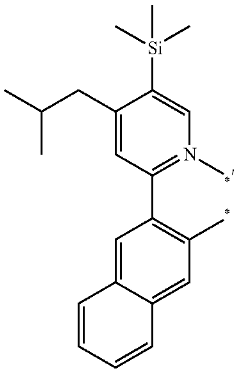
A45
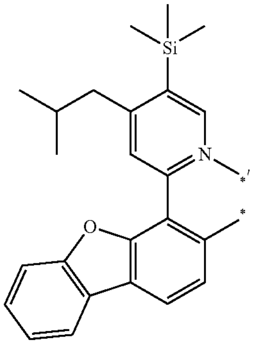
A46
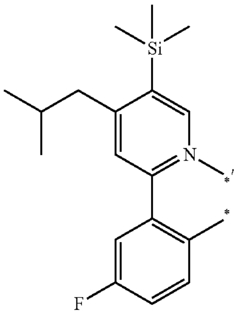
A47
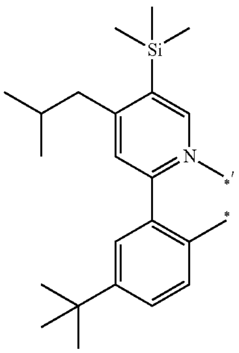

-continued
A48
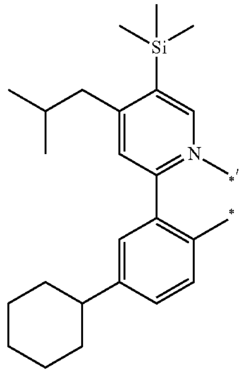
A49
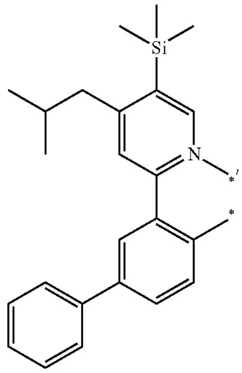
A50
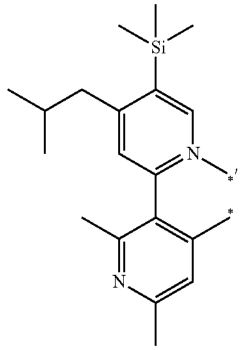
A51
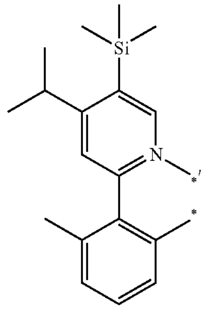
-continued
A52
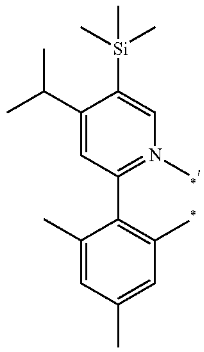
A53
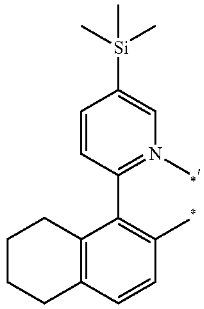
A54
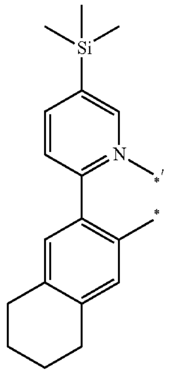
A55
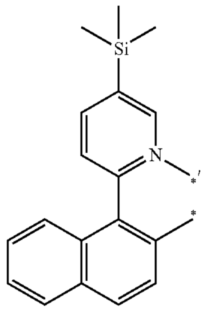

A56
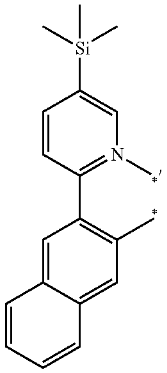
A57
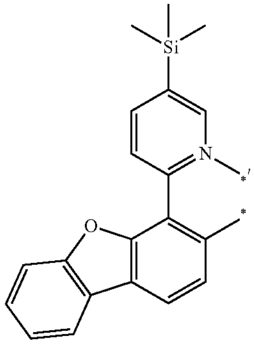
A58
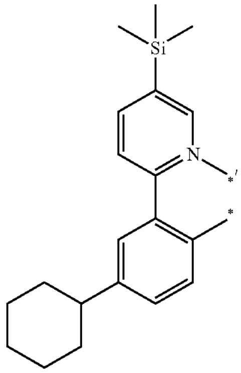
A59
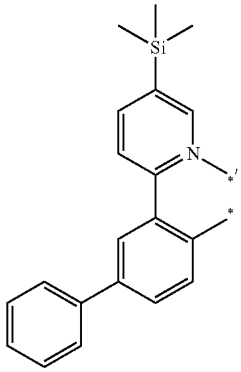
A60
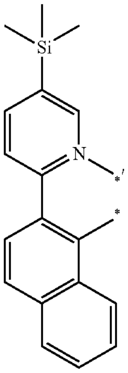
A61
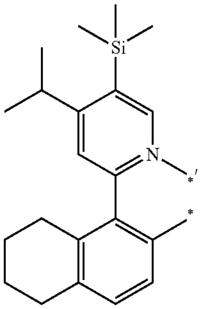
A62
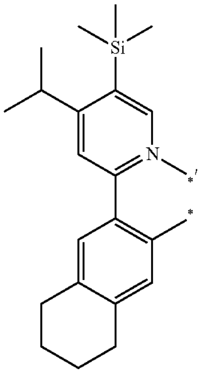
A63
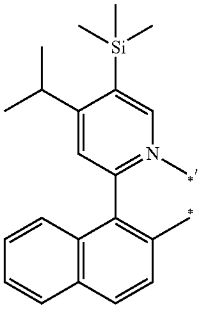

-continued
A64
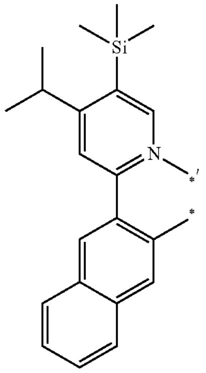
A65
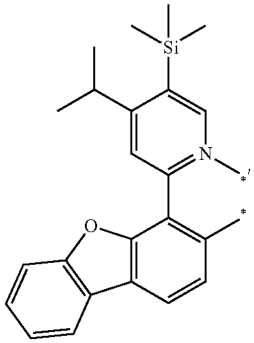
A66
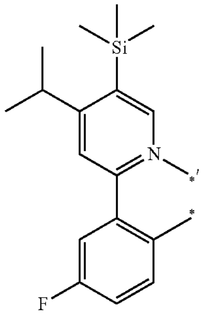
A67
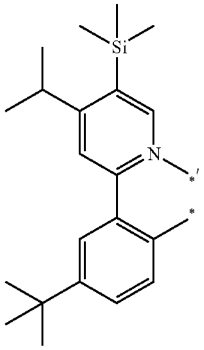
-continued
A68
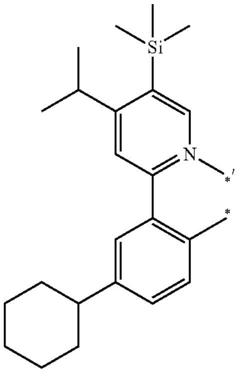
A69
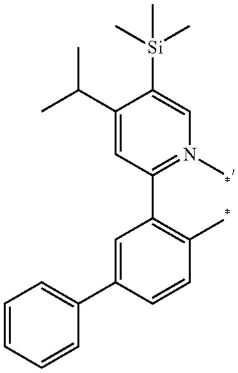
A70
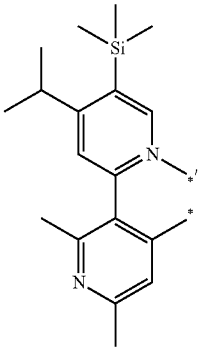
A71
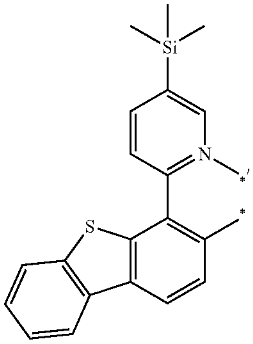

-continued
A72
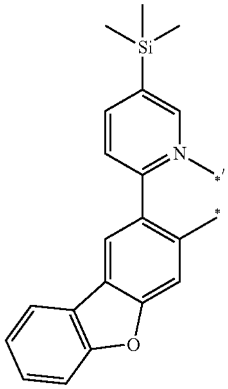
A73
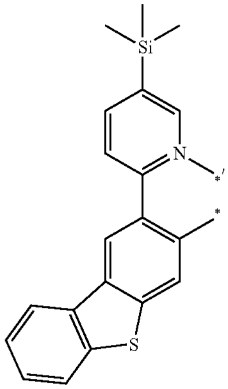
A74
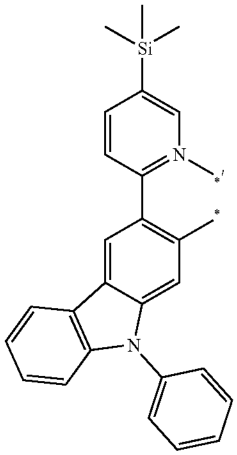
A75
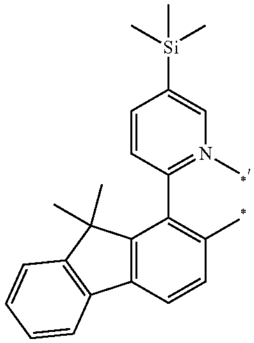
-continued
A76
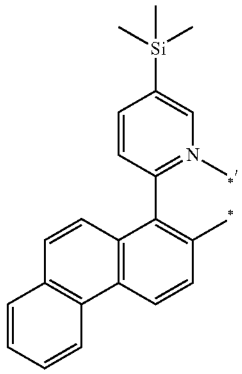
A77
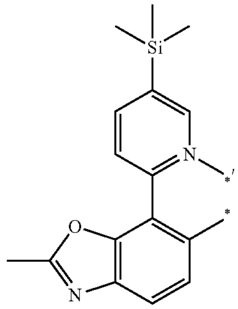
A78
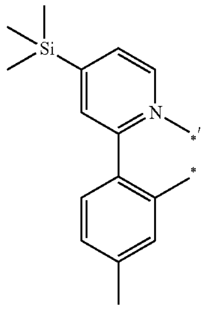
A79
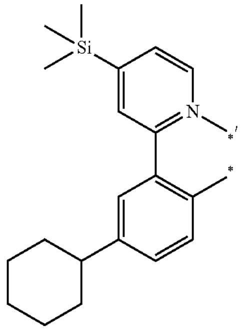

A80
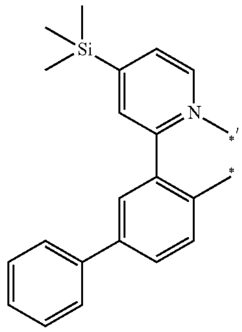
A81
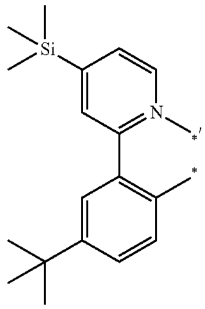
A82
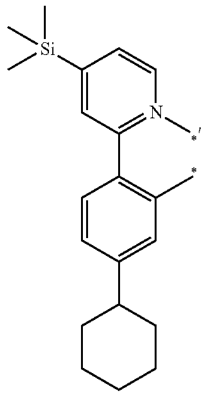
A83
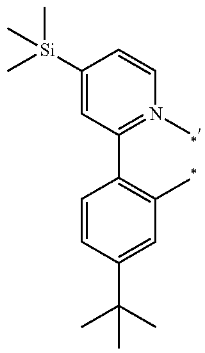
A84
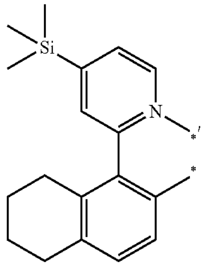
A85
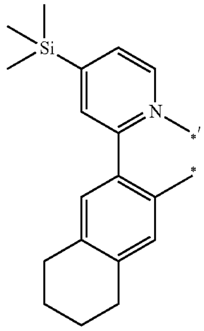
A86
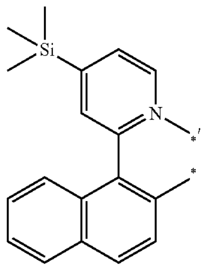
A87
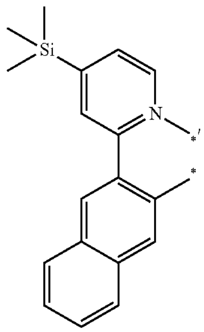
A88
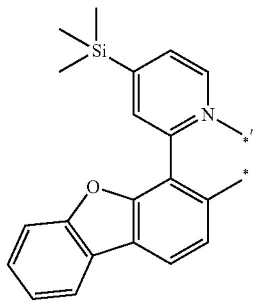

-continued
A89
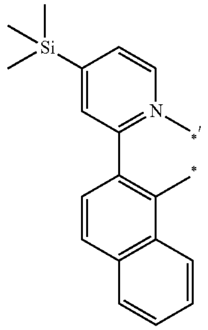
A90
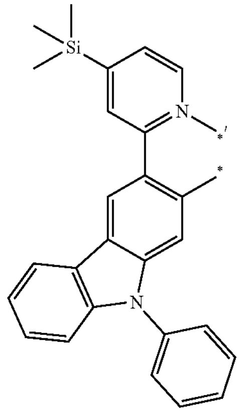
A91
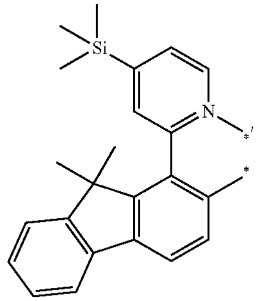
A92
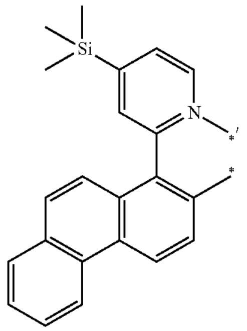
-continued
A93
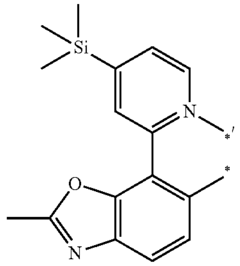
A94
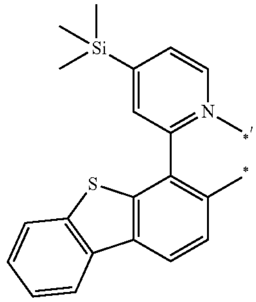
A95
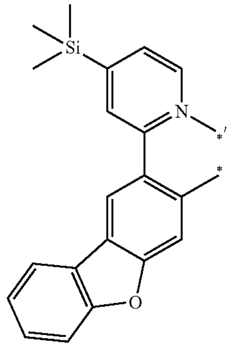
A96
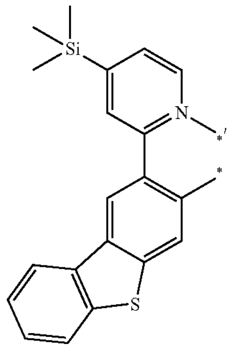

-continued
A97
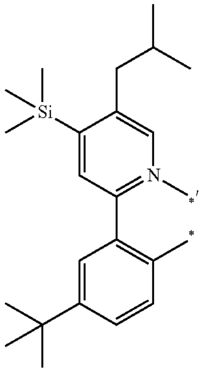
A98
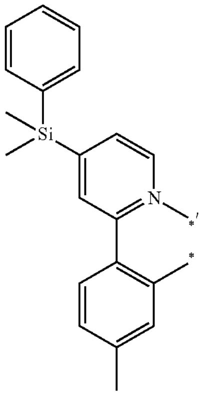
A99
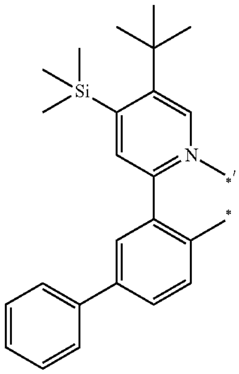
A100
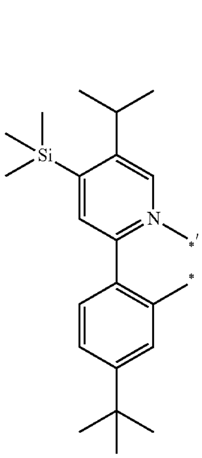
-continued
A101
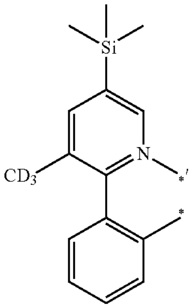
A102
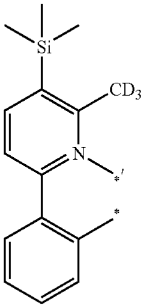
A103
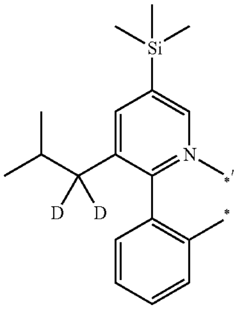
A104
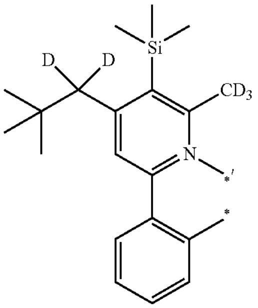
A105
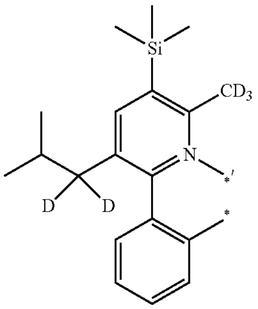

-continued
A106
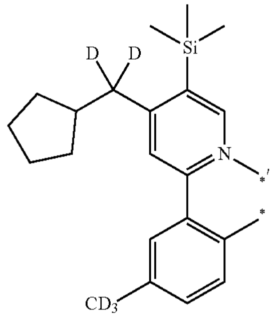
A107
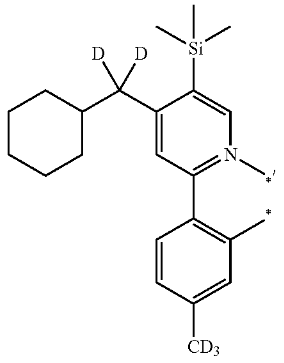
A108
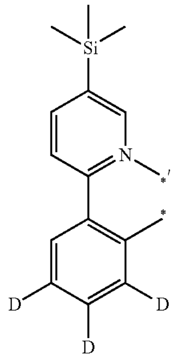
A109
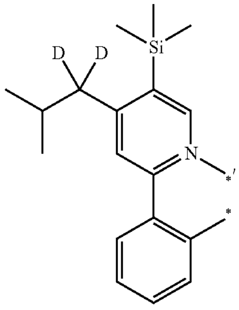
-continued
A110
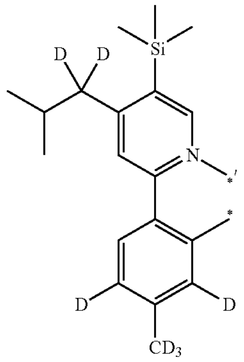
A111
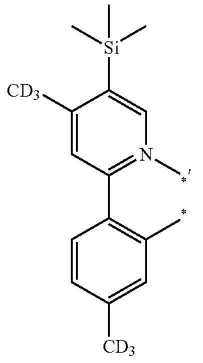
A112
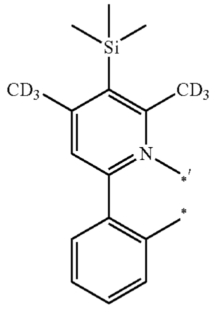
A113
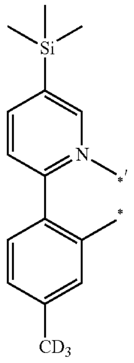

-continued
A114
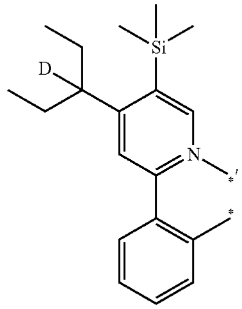
A115
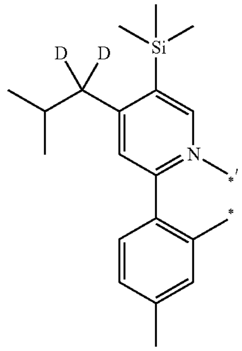
A116
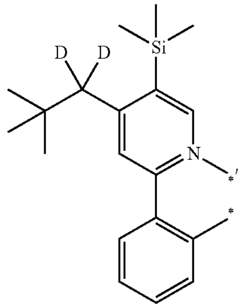
A117
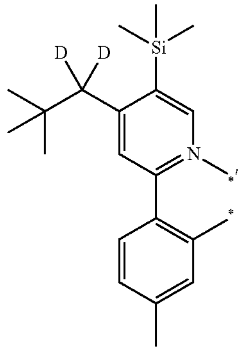
-continued
A118
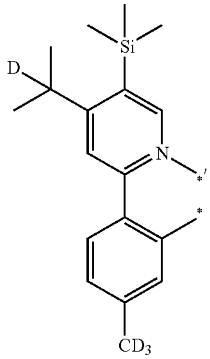
A119
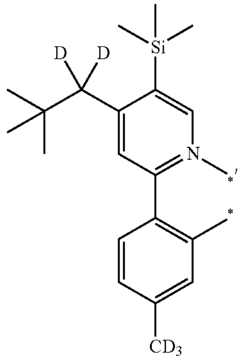
A120
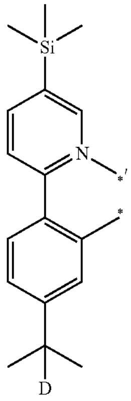
A121
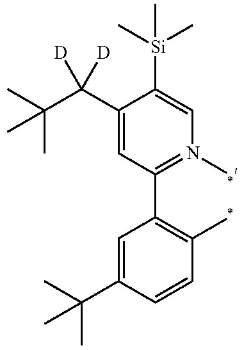

-continued
A122
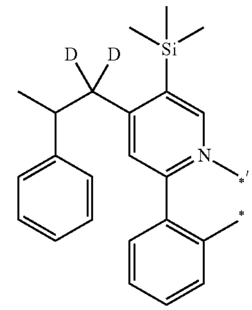
A123
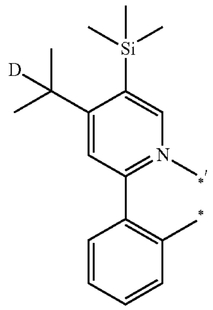
A124
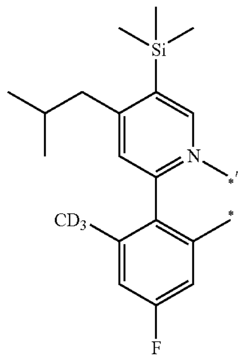
A125
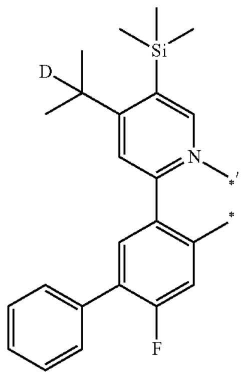
-continued
A126
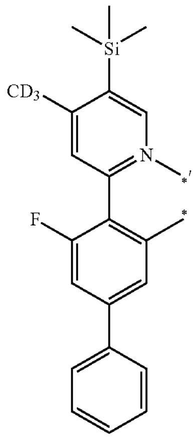
A127
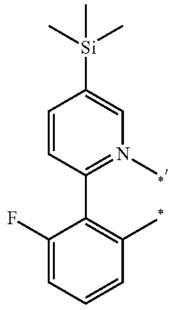
A128
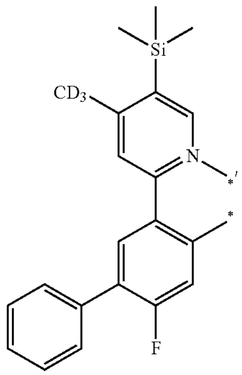
A129
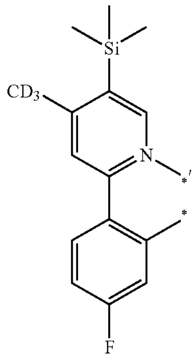

-continued
A130
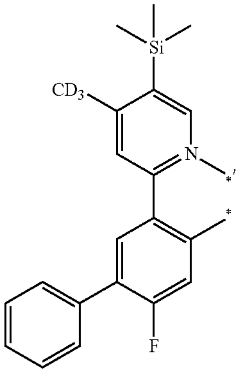
A131
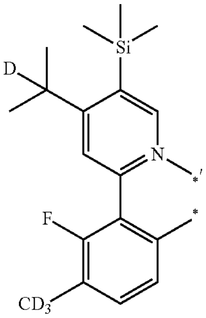
A132
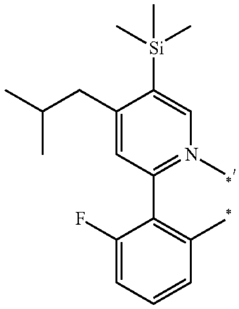
A133
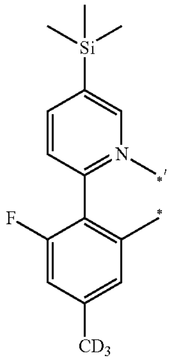
-continued
A134
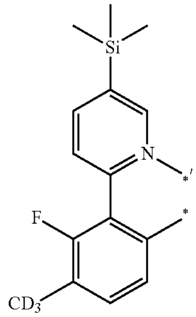
A135
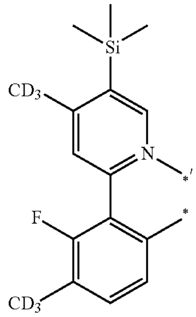
A136
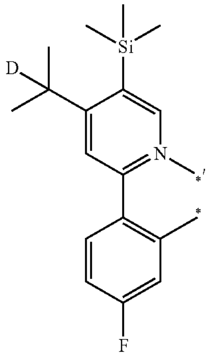
A137
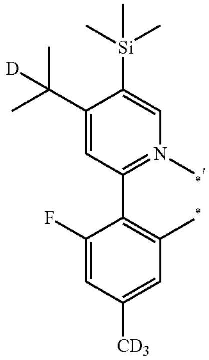

-continued
A138
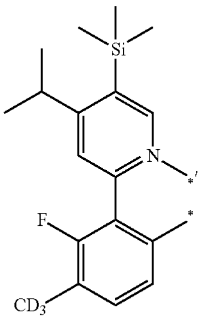
A139
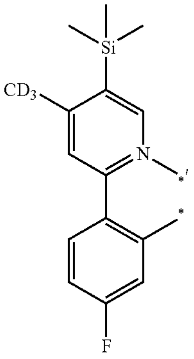
A140
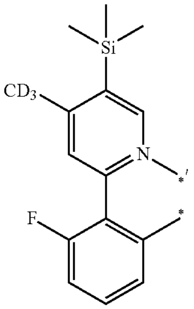
A141
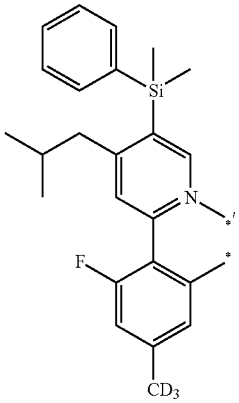
-continued
A142
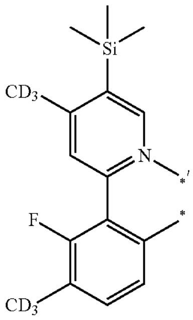
A143
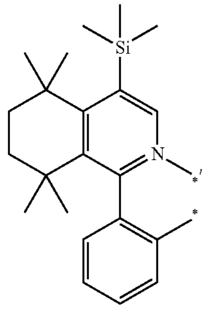
A144
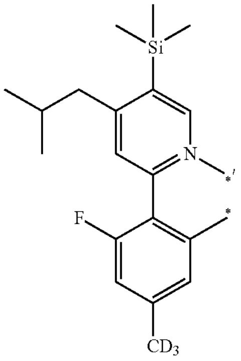
A145
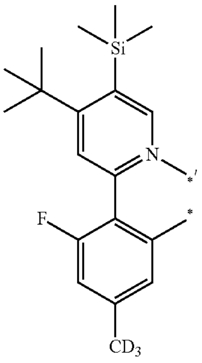

-continued
A146
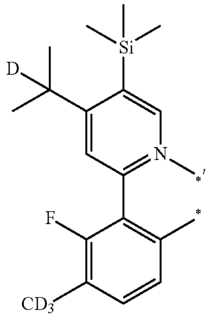
A147
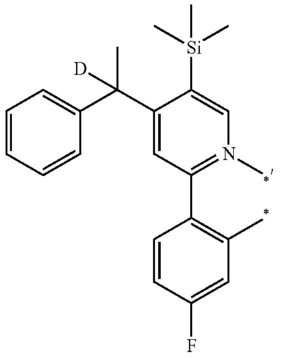
A148
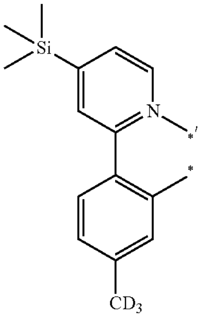
A149
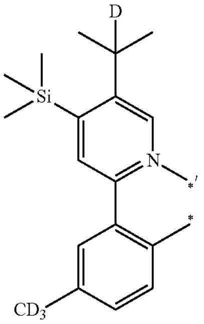
-continued
A150
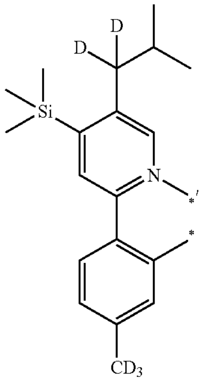
A151
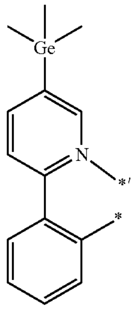
A152
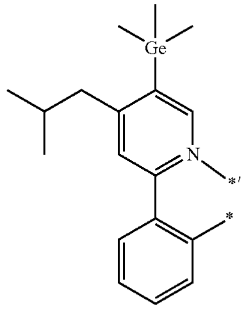
A153
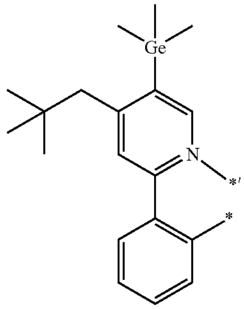

A154
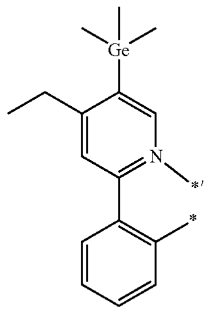
A155
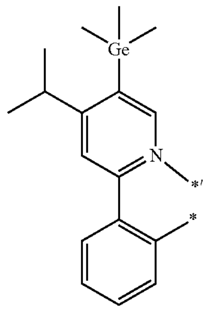
A156
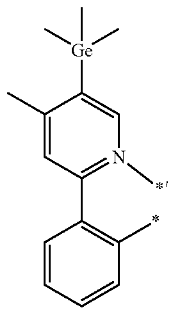
A157
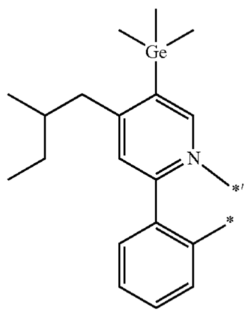
A158
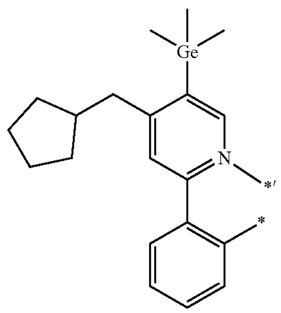
A159
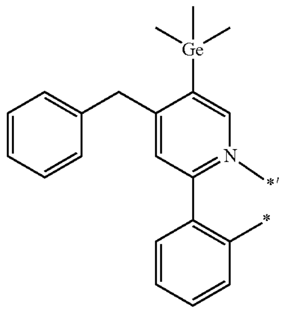
A160
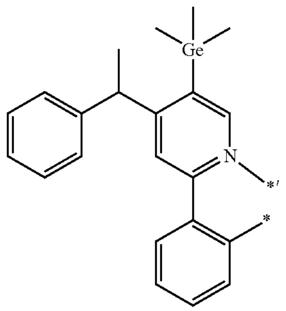
A161
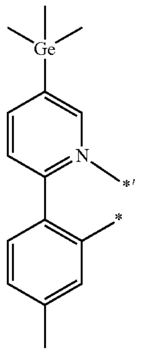
A162
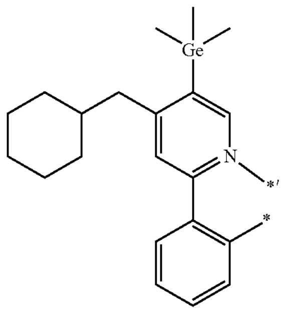
A163
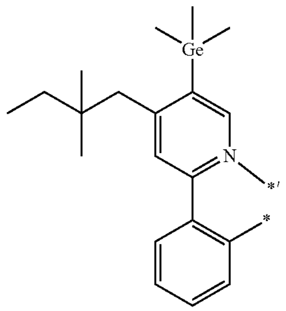

-continued
A164
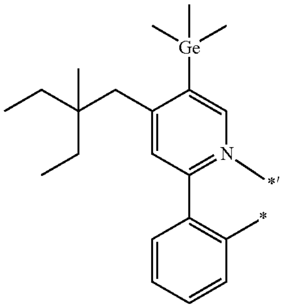
A165
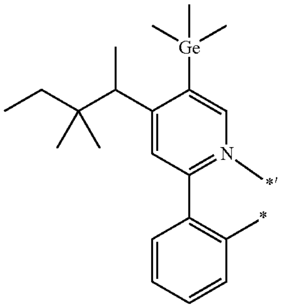
A166
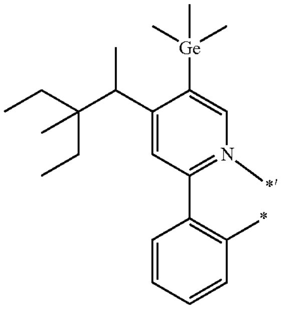
A167
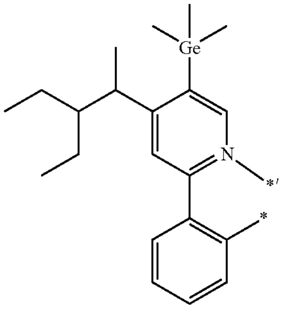
A168
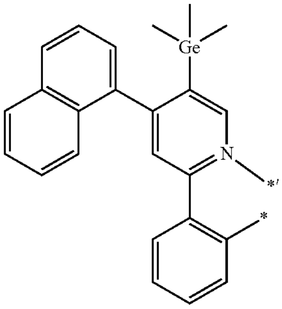
-continued
A169
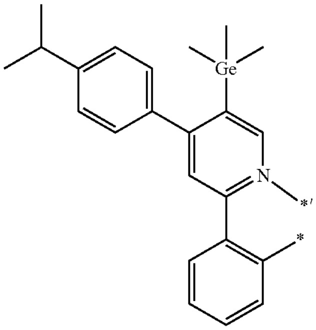
A170
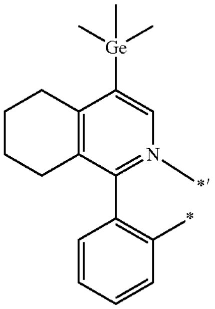
A171
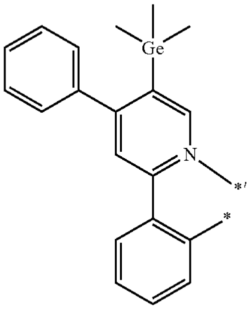
A172
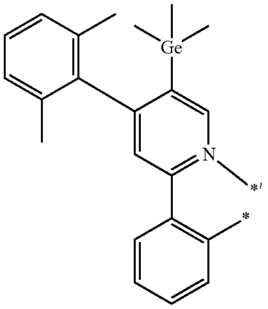
A173
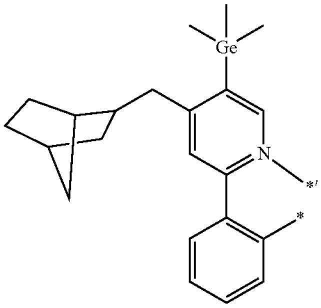

-continued
A174
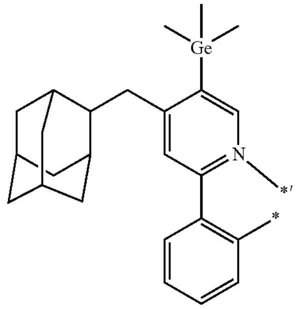
A175
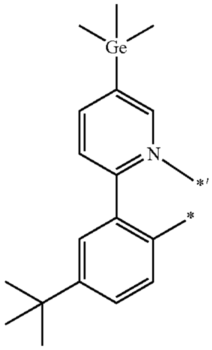
A176
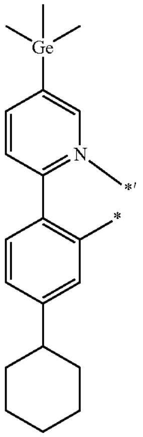
A177
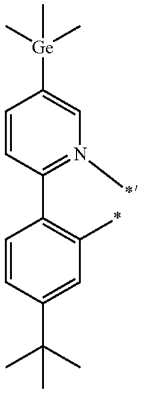
-continued
A178
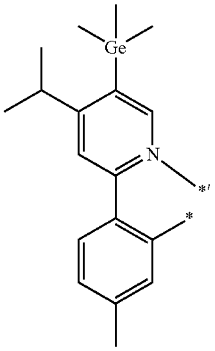
A179
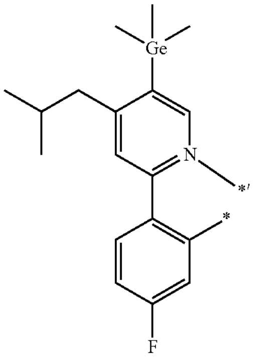
A180
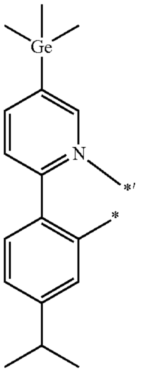
A181
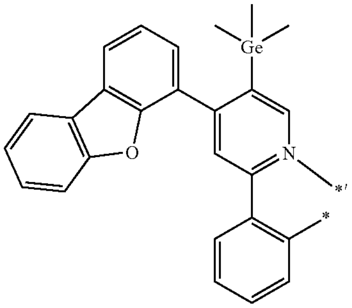

-continued
A182
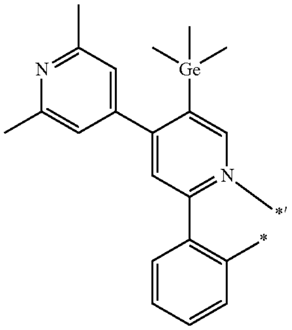
A183
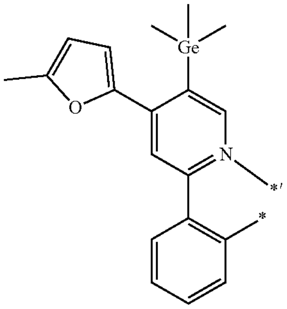
A184
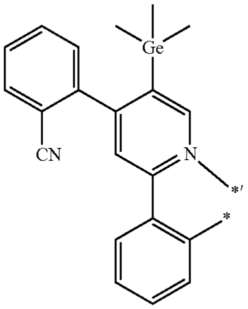
A185
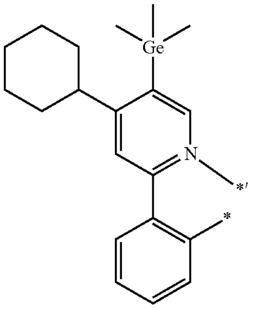
A186
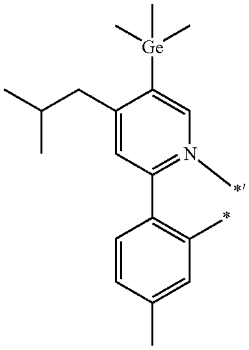
-continued
A187
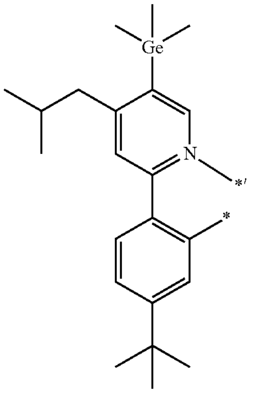
A188
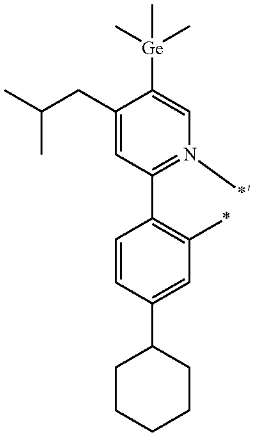
A189
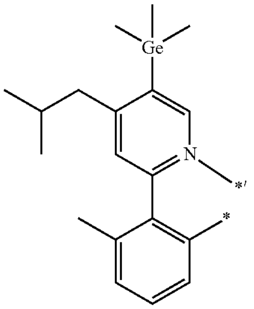
A190
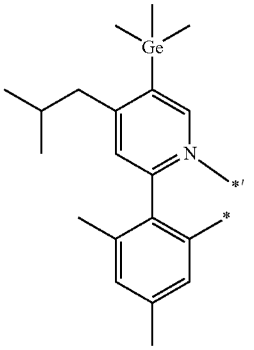

-continued
A191
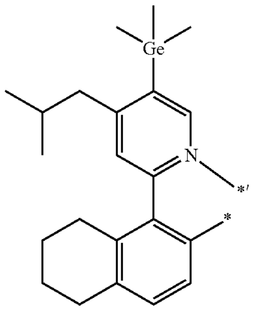
A192
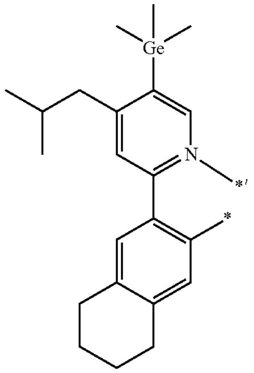
A193
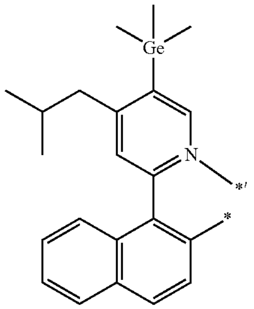
A194
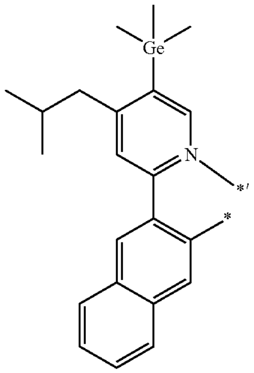
-continued
A195
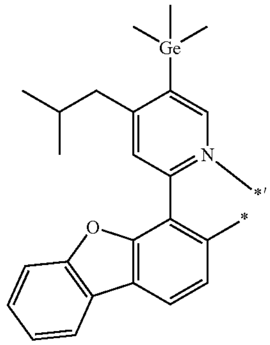
A196
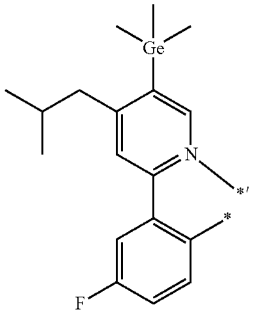
A197
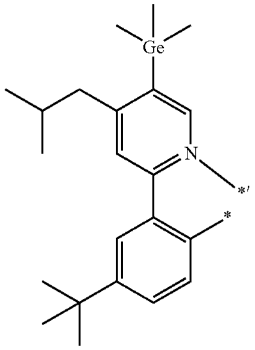
A198
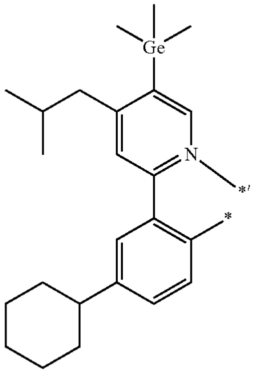

-continued
A199
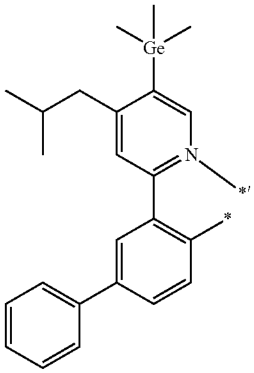
A200
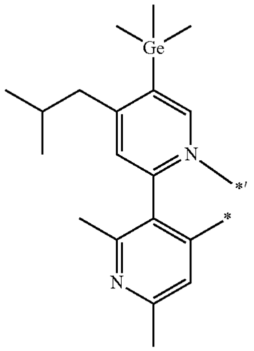
A201
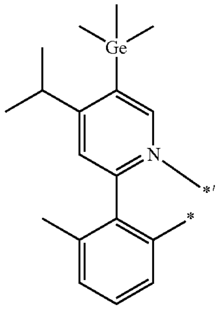
A202
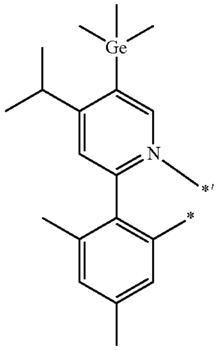
-continued
A203
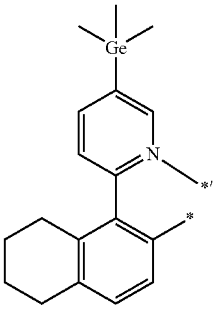
A204
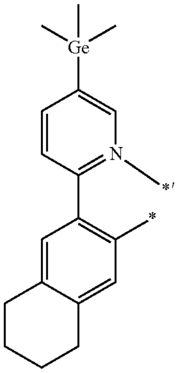
A205
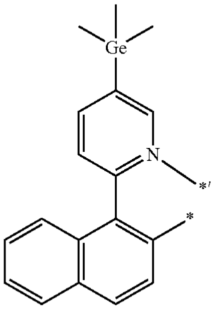
A206
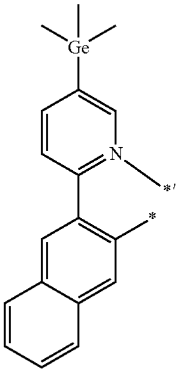

-continued
A207
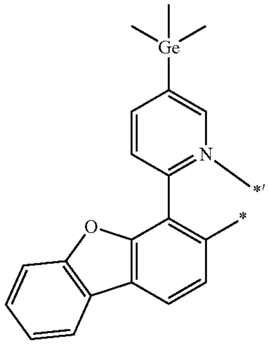
A208
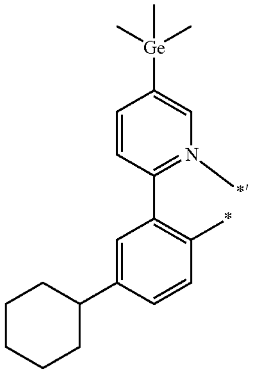
A209
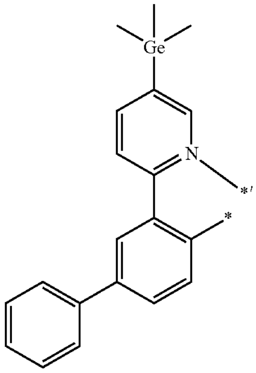
A210
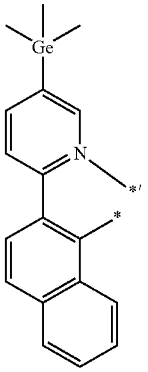
-continued
A211
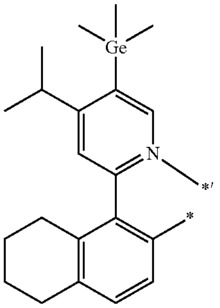
A212
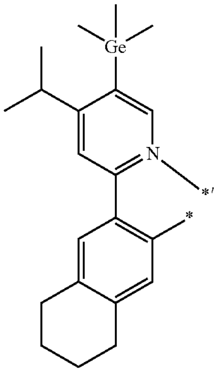
A213
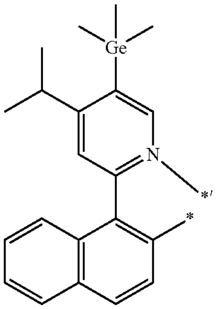
A214
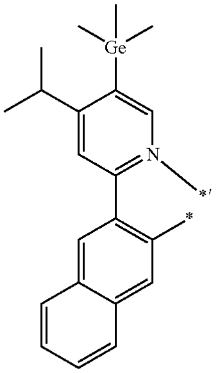

-continued
A215
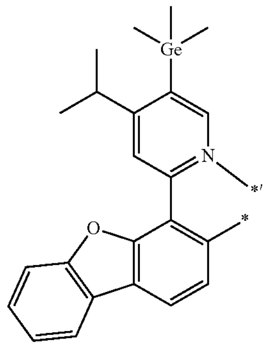
A216
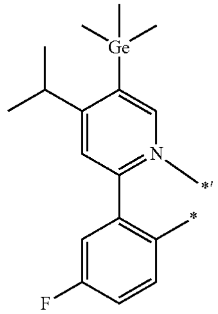
A217
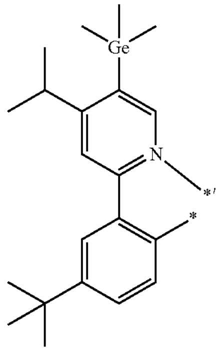
A218
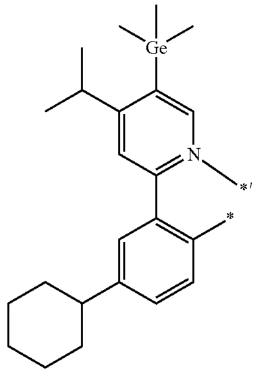
-continued
A219
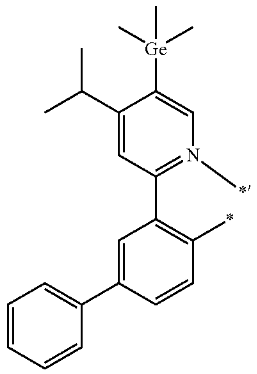
A220
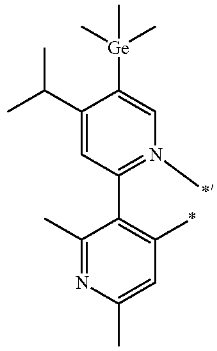
A221
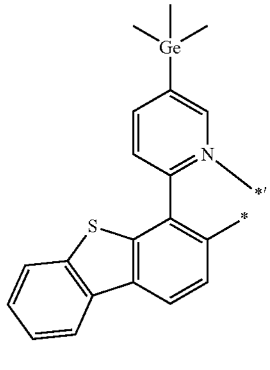
A222
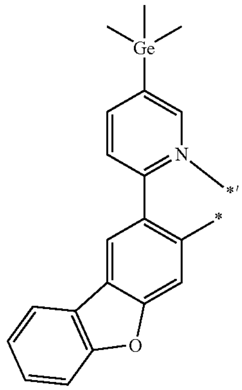

-continued
A223
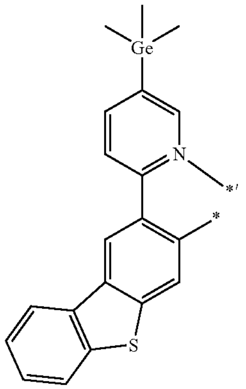
A224
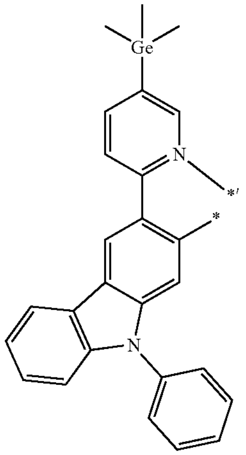
A225
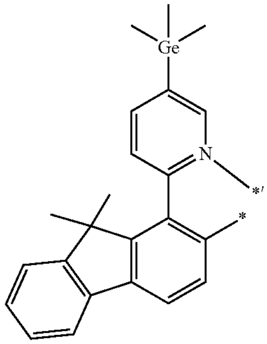
A226
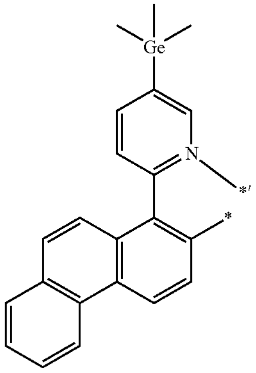
-continued
A227
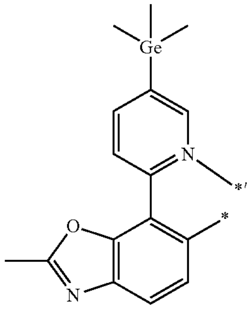
A228
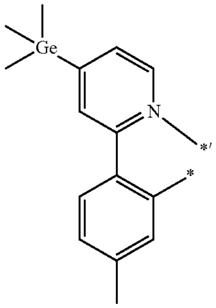
A229
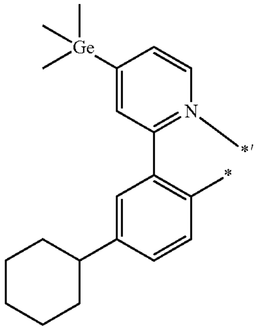
A230
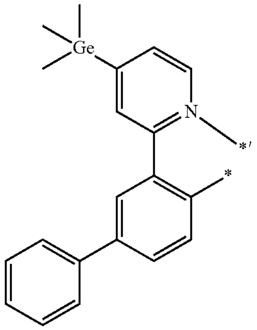
A231
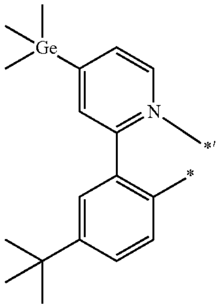

-continued
A232
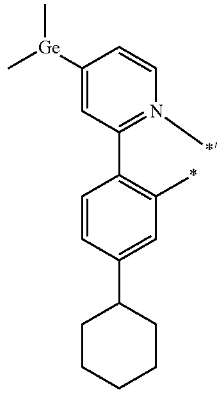
A233
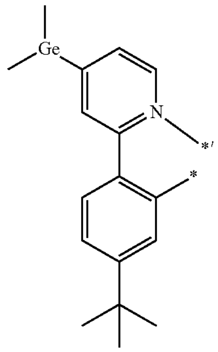
A234
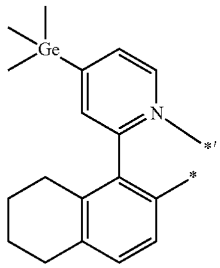
A235
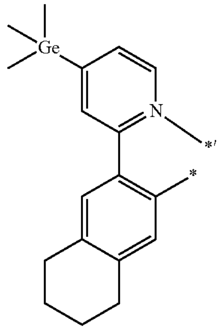
A236
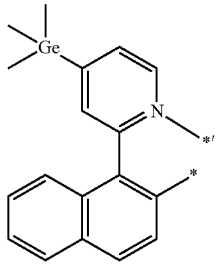
-continued
A237
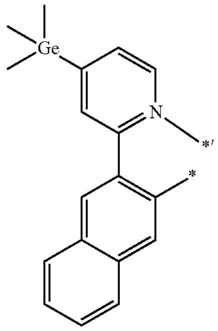
A238
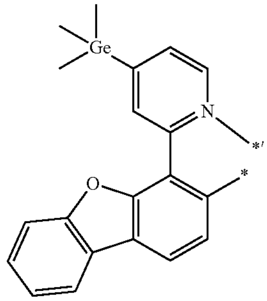
A239
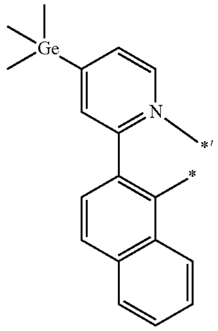
A240
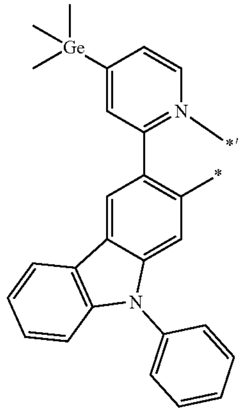

-continued
A241
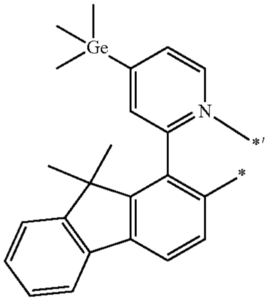
A242
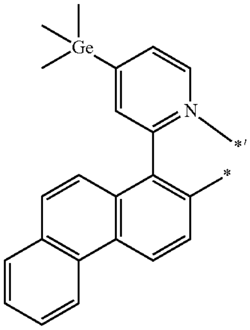
A243
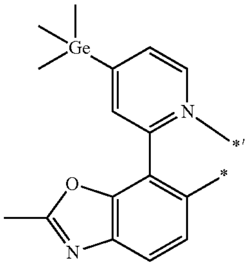
A244
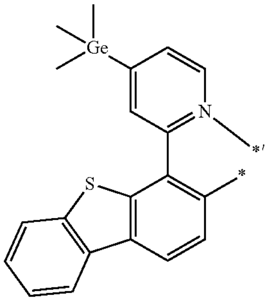
A245
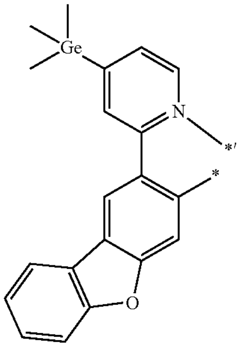
-continued
A246
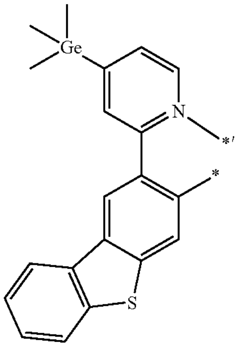
A247
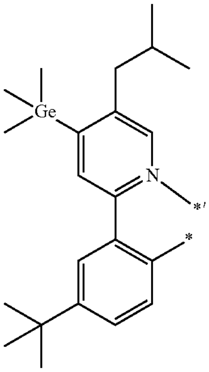
A248
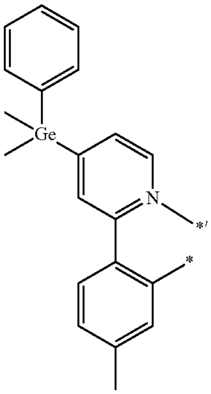
A249
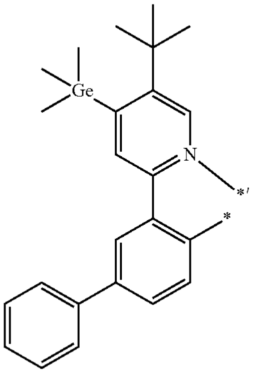

-continued
A250
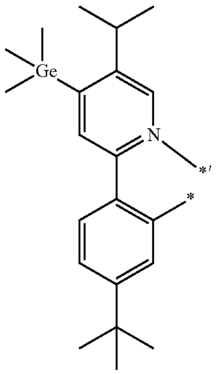
A251
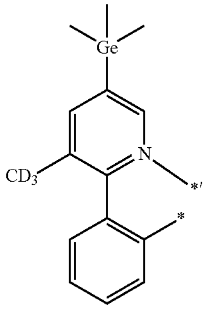
A252
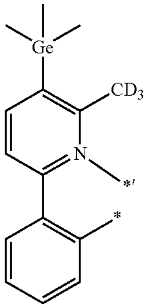
A253
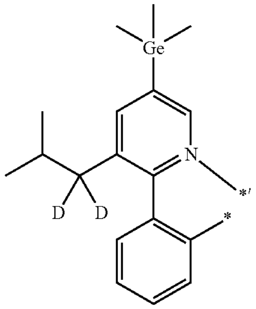
A254
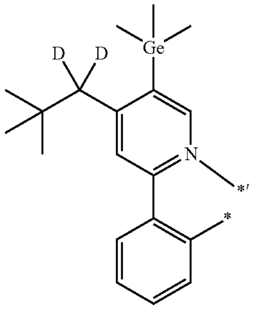
-continued
A255
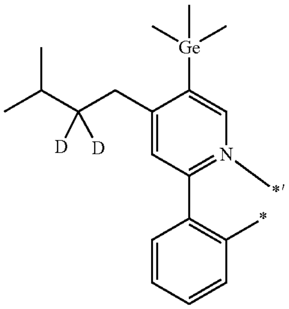
A256
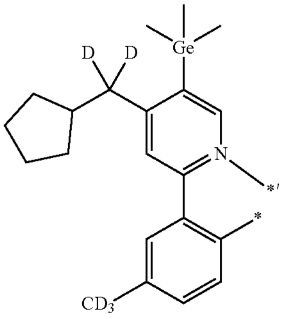
A257
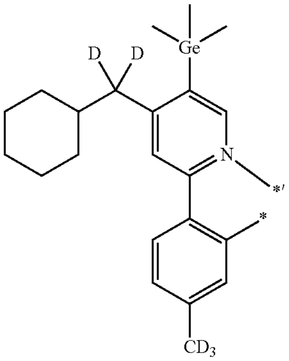
A258
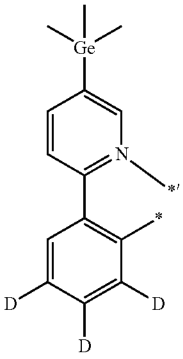

A259
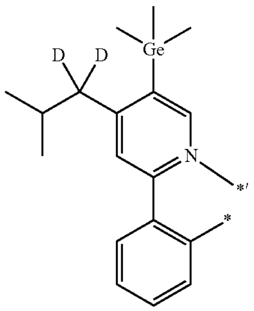
A260
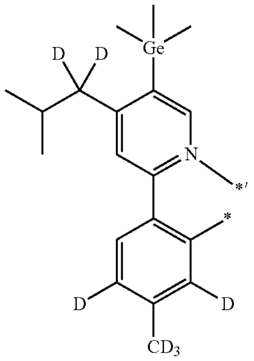
A261
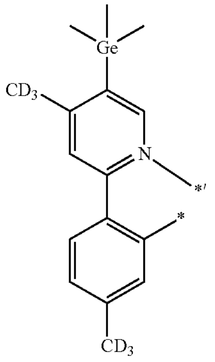
A262
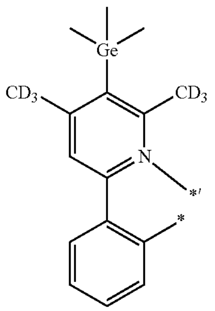
A263
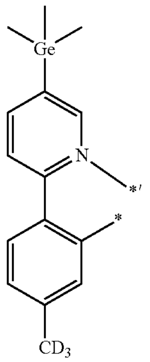
A264
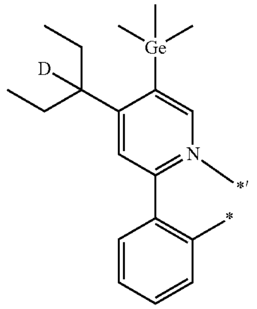
A265
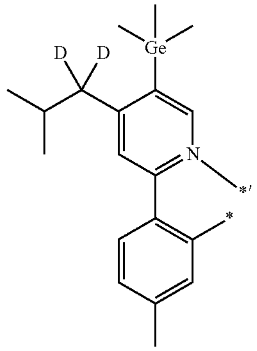
A266
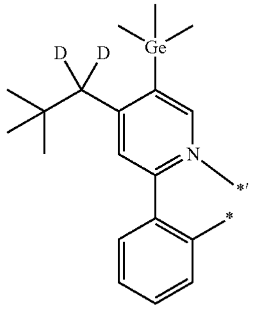

A267
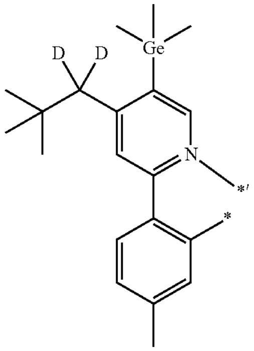
A268
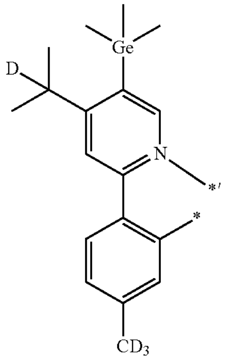
A269
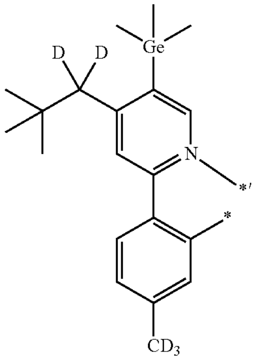
A270
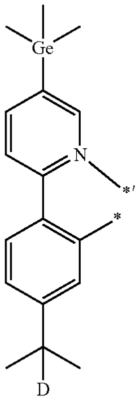
A271
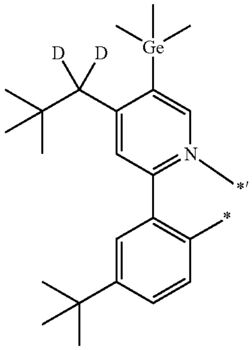
A272
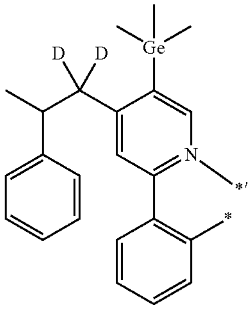
A273
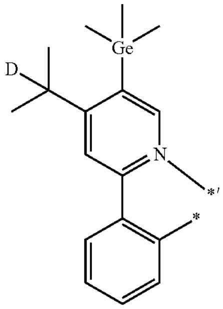
A274
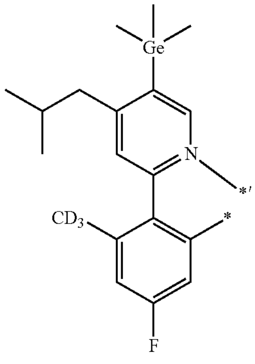

-continued
A275
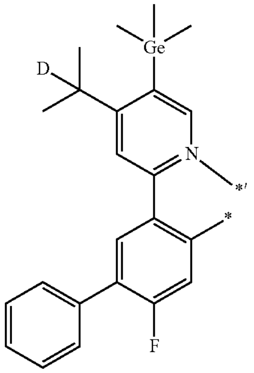
A276
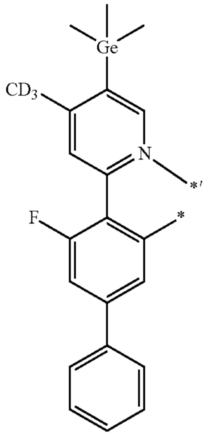
A277
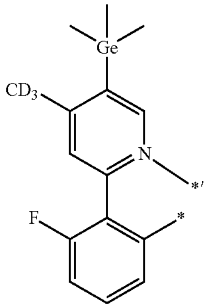
A278
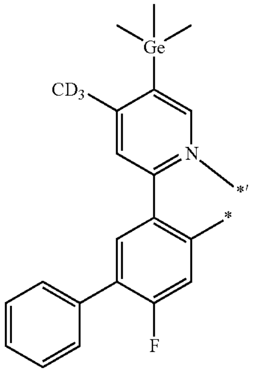
-continued
A279
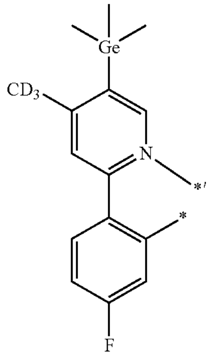
A280
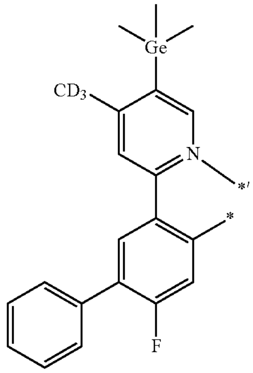
A281
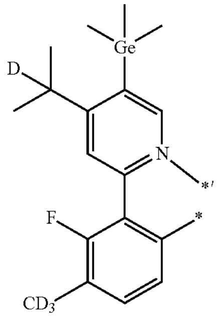
A282
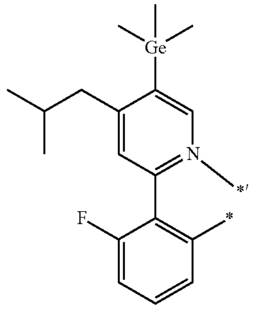

-continued
A283
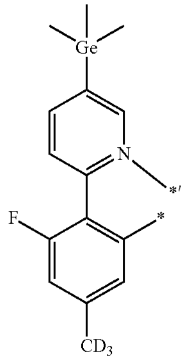
A284
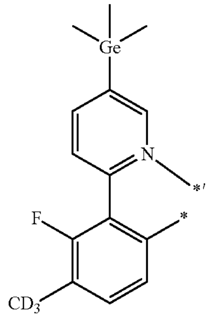
A285
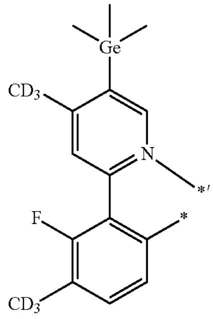
A286
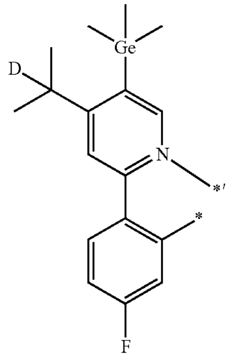
-continued
A287
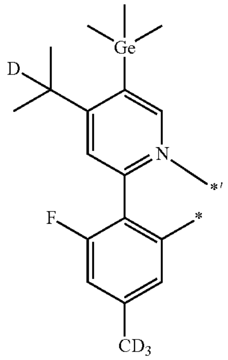
A288
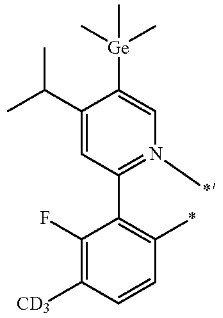
A289
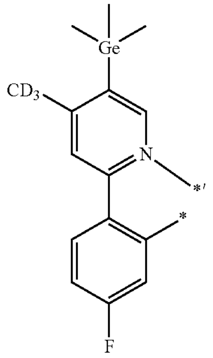
A290
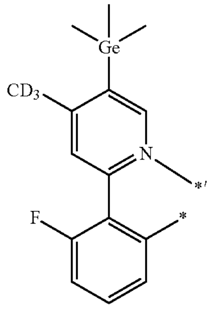

-continued
A291
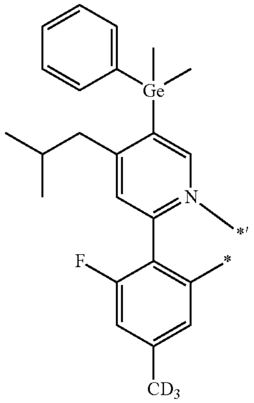
A292
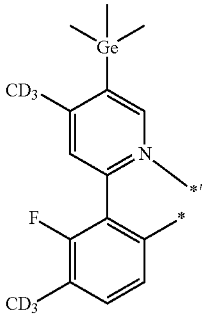
A293
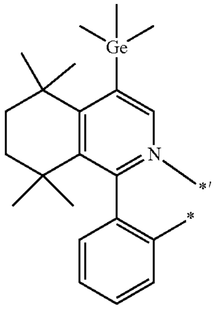
A294
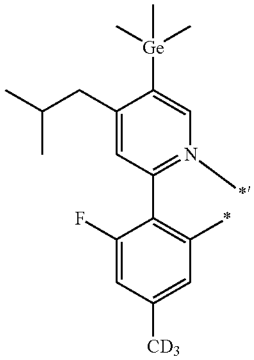
-continued
A295
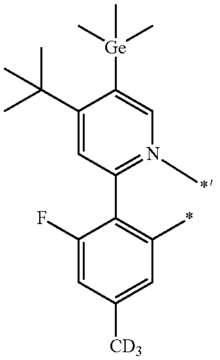
A296
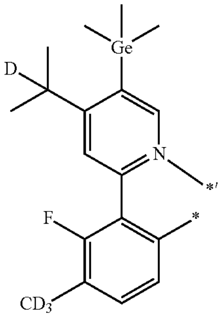
A297
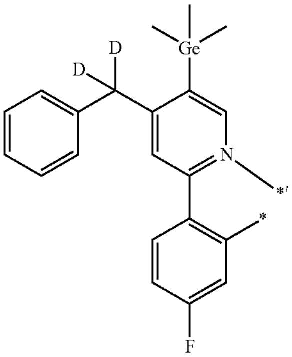
A298
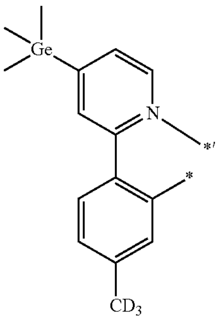

-continued
A299
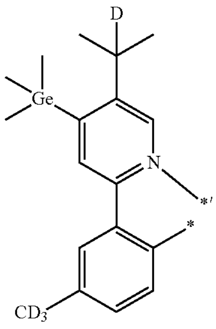
A300
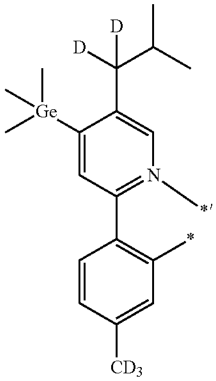
A301
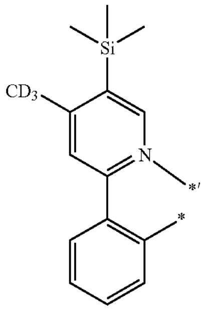
A302
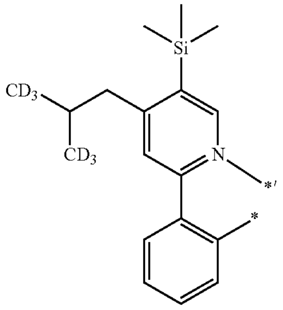
-continued
A303
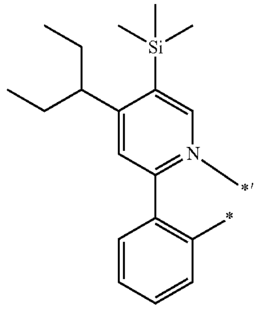
A304
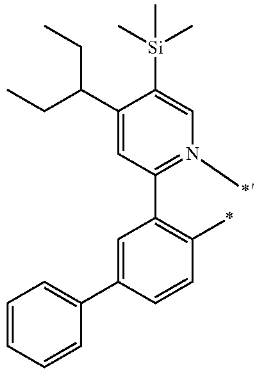
A305
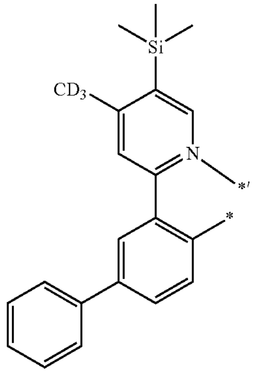
A306
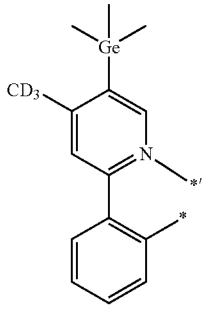

-continued
A307
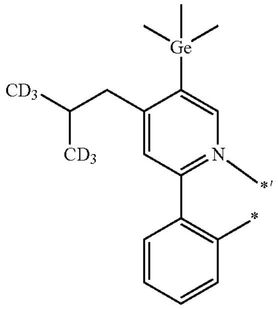
A308
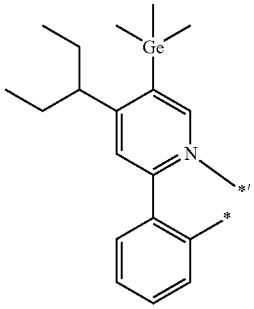
A309
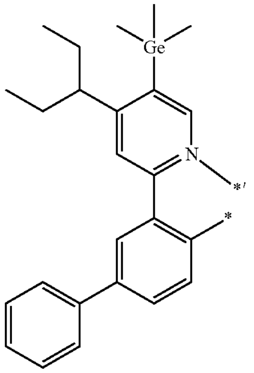
A310
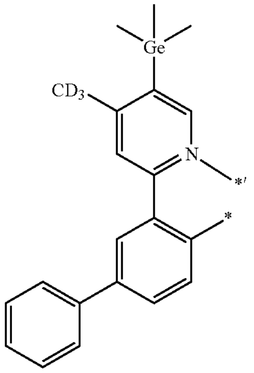
wherein, in Formulae A1 to A310, * and *' each indicate a binding site to M in Formula 1.
In one or more embodiments, $L_2$ in Formula 1 may be a ligand represented by one of Formulae B1 to B660:
B1
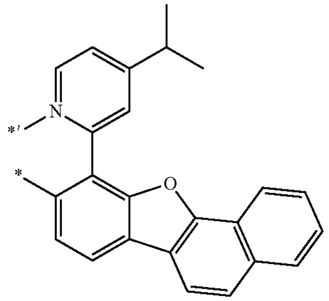
B2
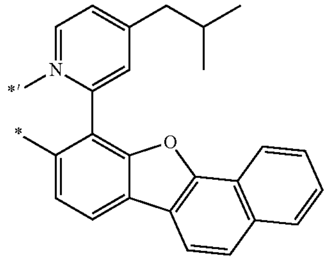
B3
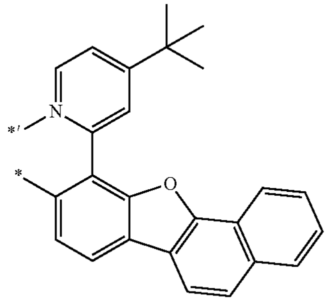
B4
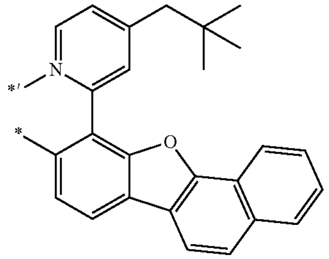
B5
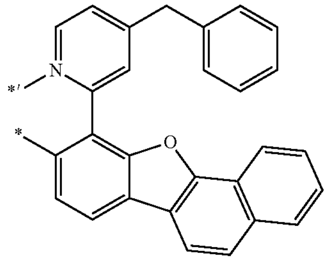

-continued
B6
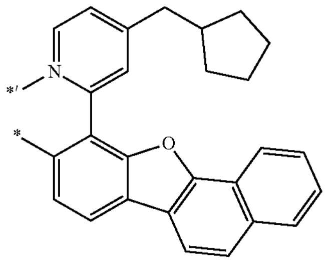
B7
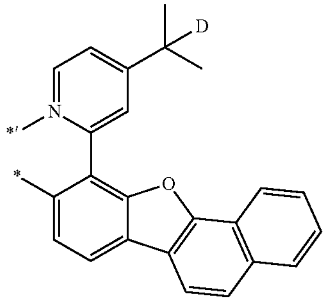
B8
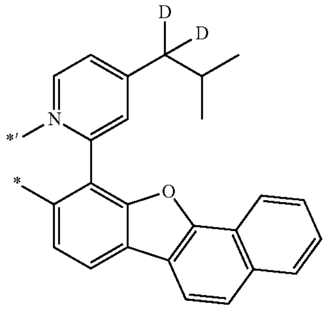
B9
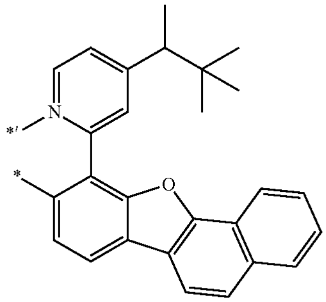
B10
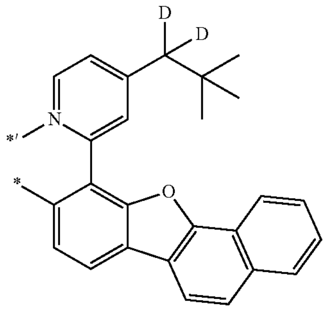
-continued
B11
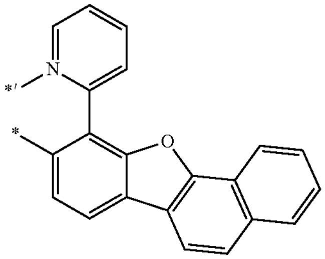
B12
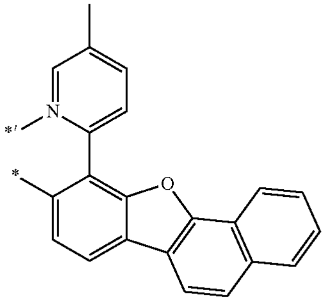
B13
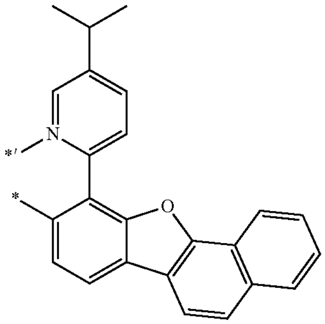
B14
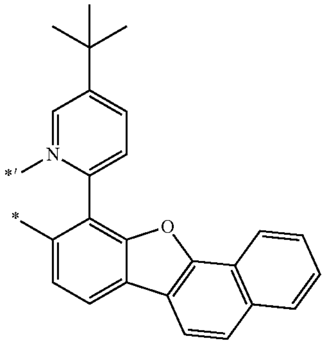
B15
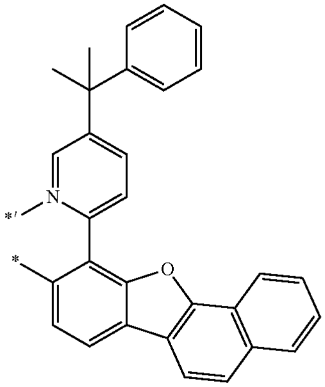

-continued
B16
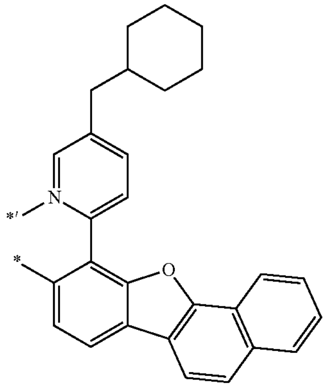
B17
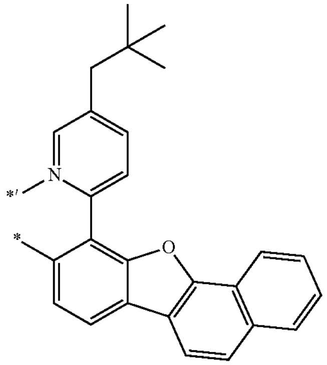
B18
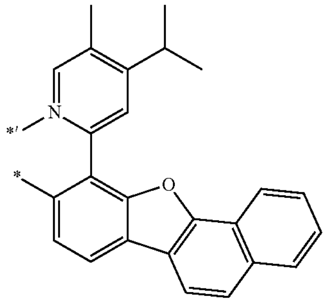
B19
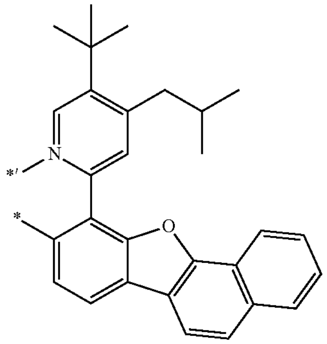
-continued
B20
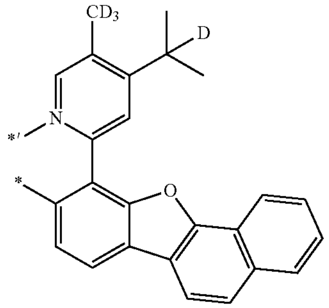
B21
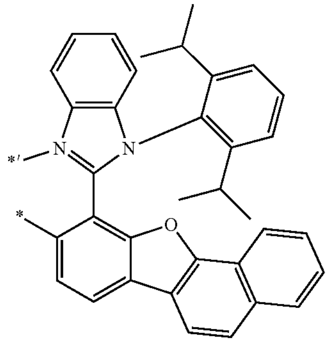
B22
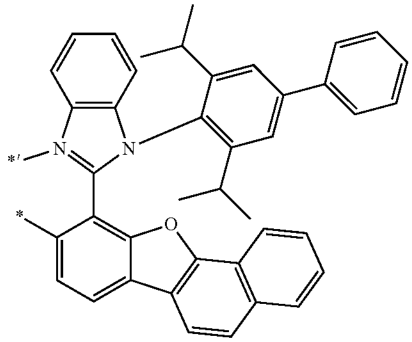
B23
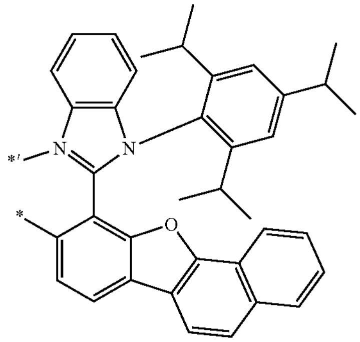

B24
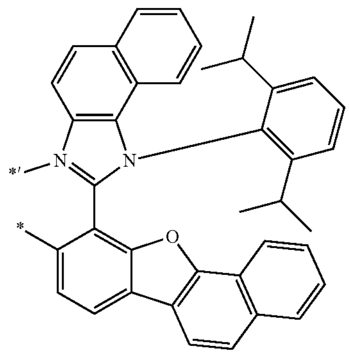
B25
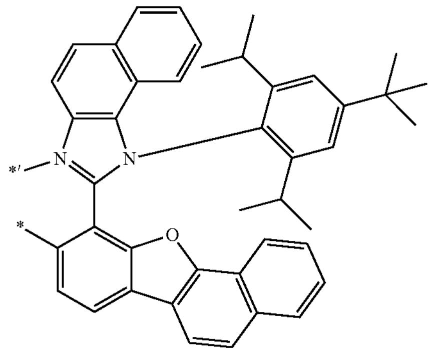
B26
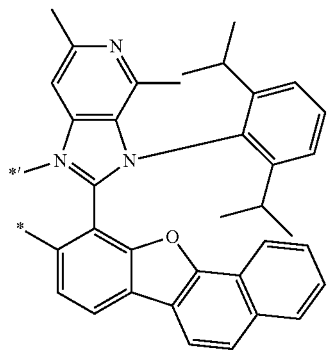
B27
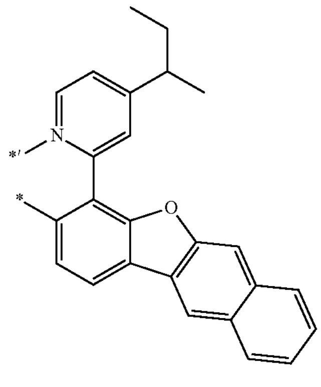
B28
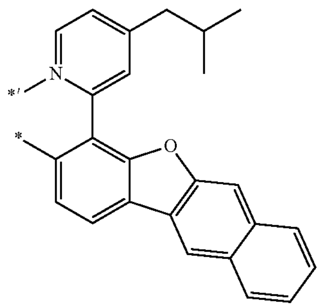
B29
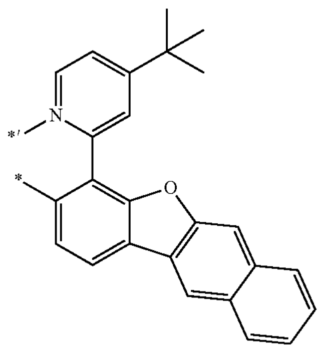
B30
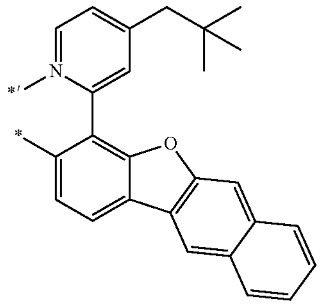
B31
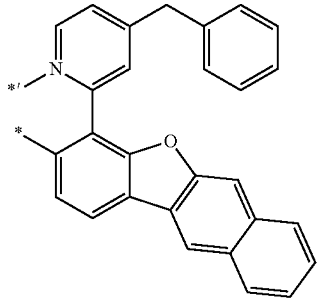
B32
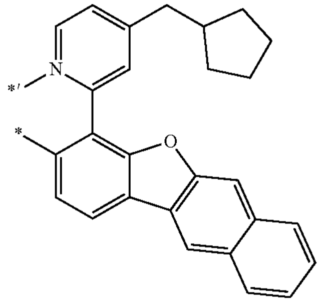

-continued
B33
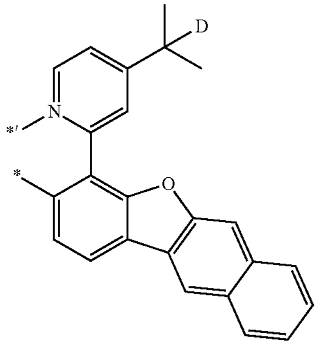
B34
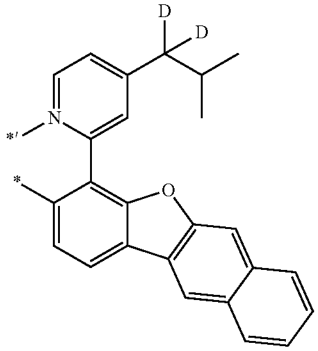
B35
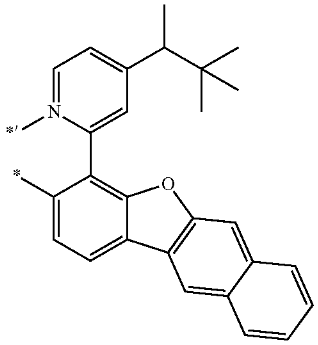
B36
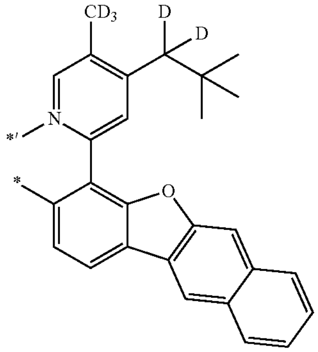
-continued
B37
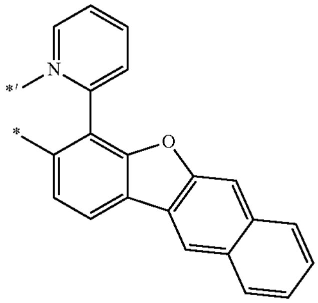
B38
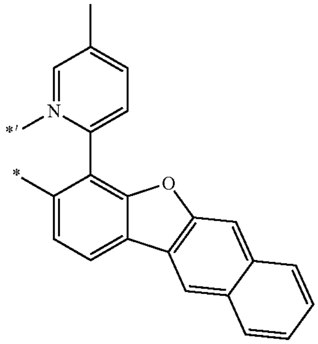
B39
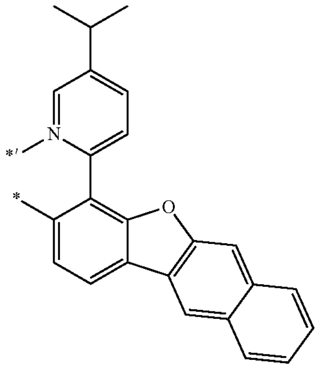
B40
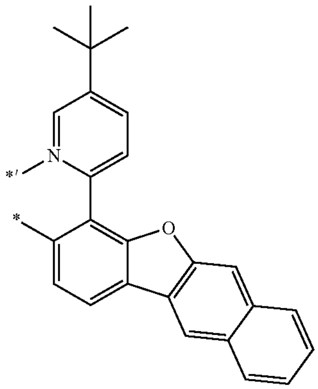

-continued
B41
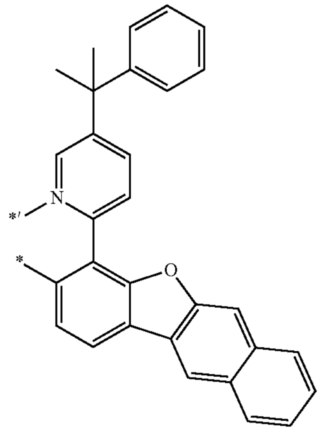
B42
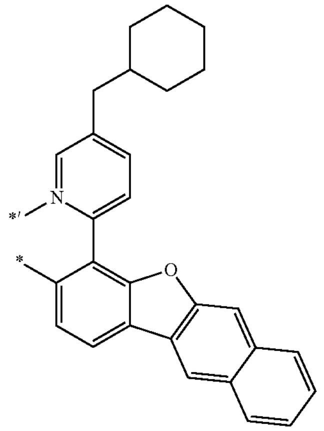
B43
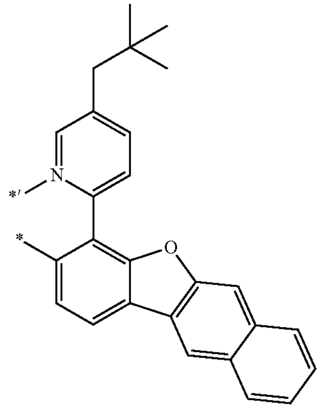
B44
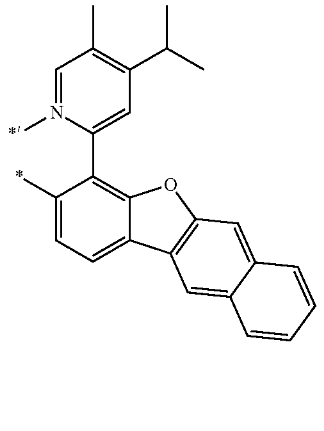
-continued
B45
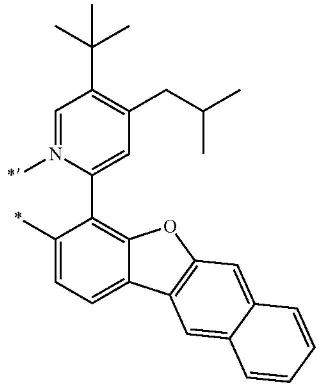
B46
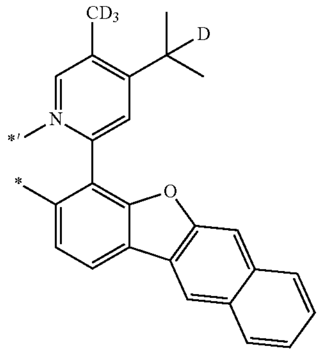
B47
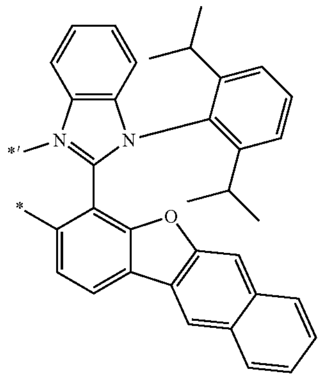
B48
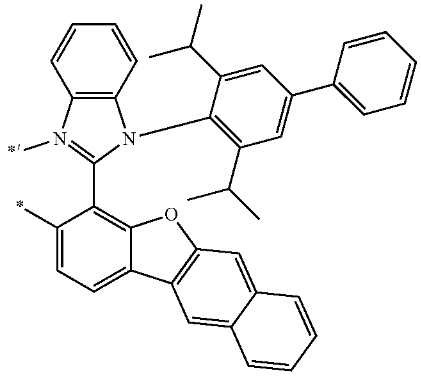

-continued
B49
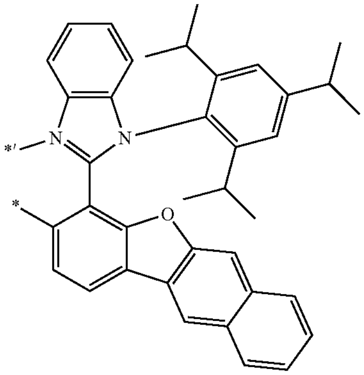
B50
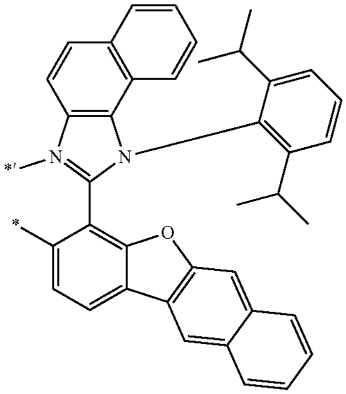
B51
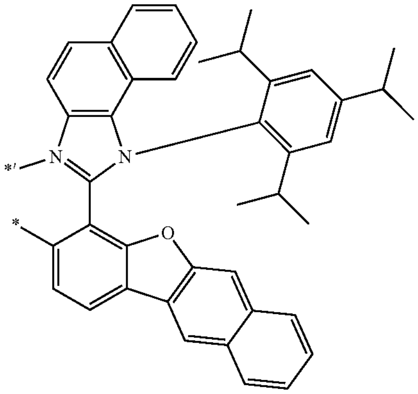
B52
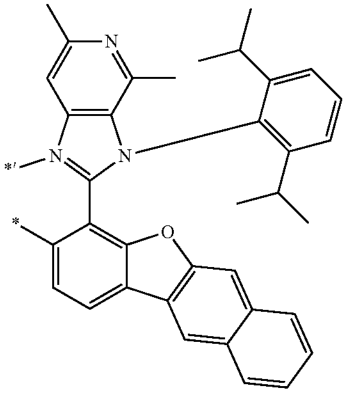
-continued
B53
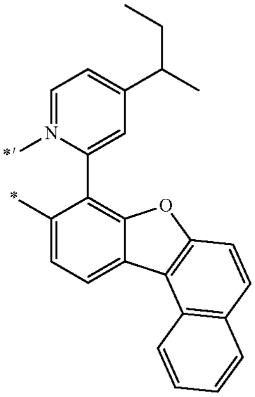
B54
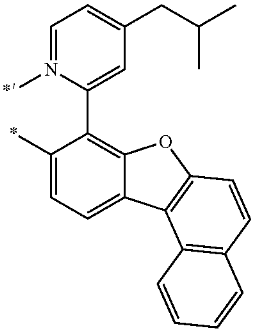
B55
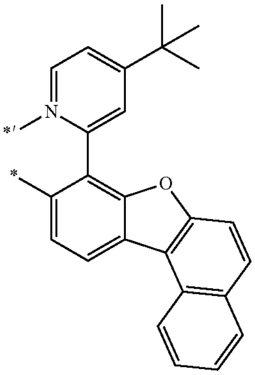
B56
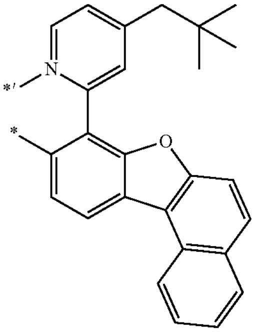

-continued
B57
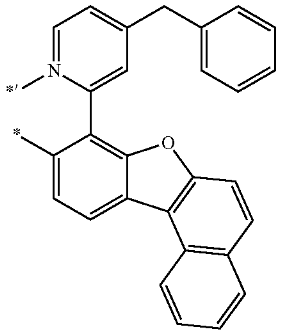
B58
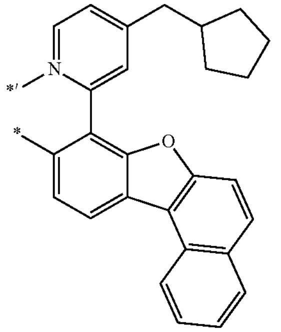
B59
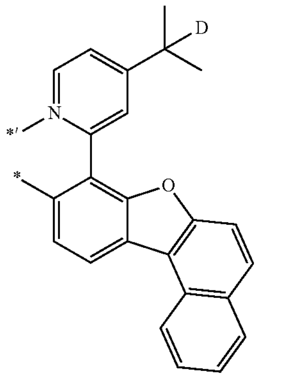
B60
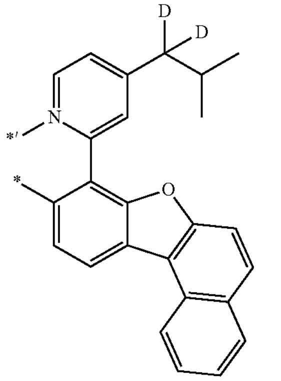
-continued
B61
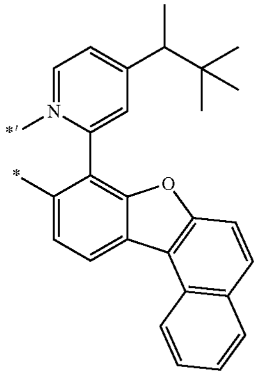
B62
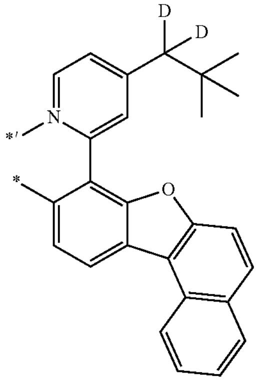
B63
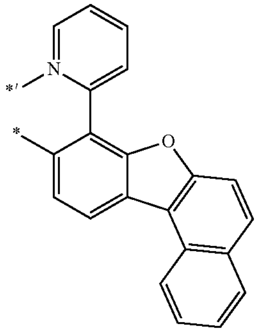
B64
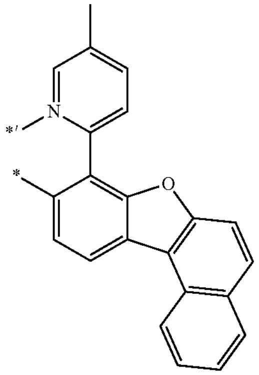

-continued
B65
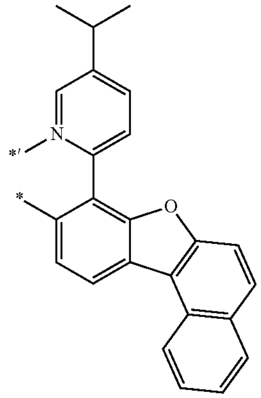
B66
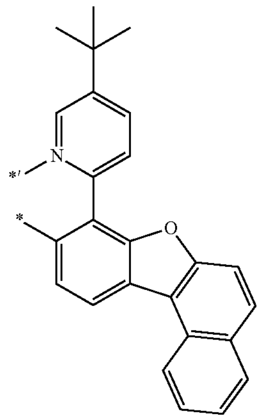
B67
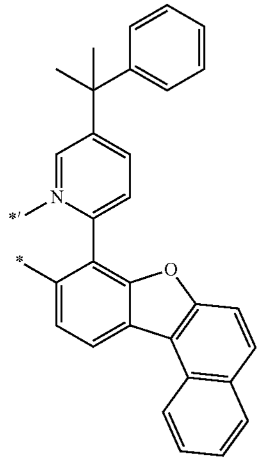
-continued
B68
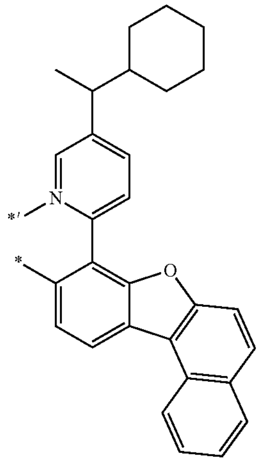
B69
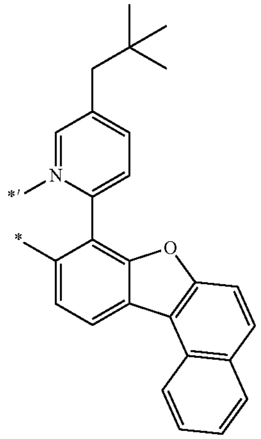
B70
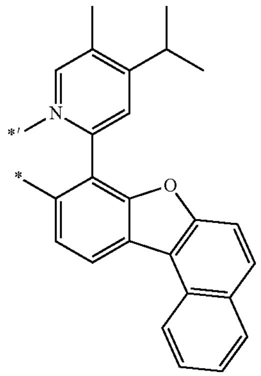

-continued
B71
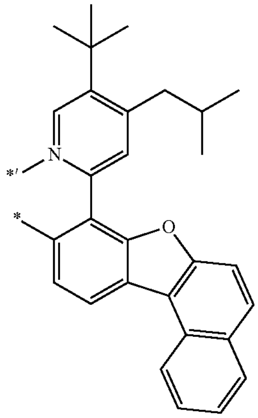
B72
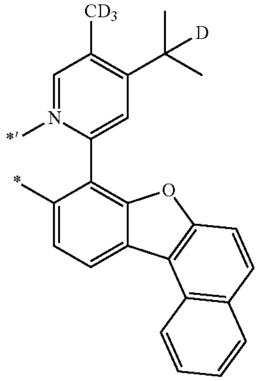
B73
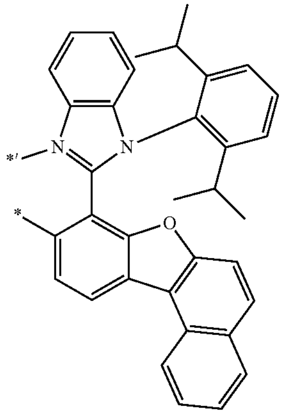
B74
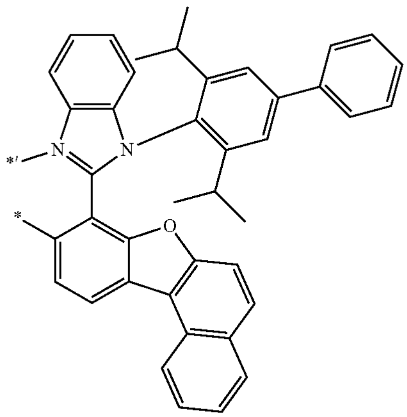
-continued
B75
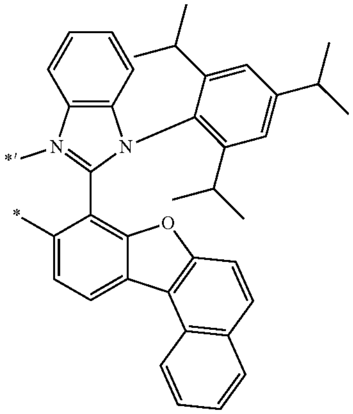
B76
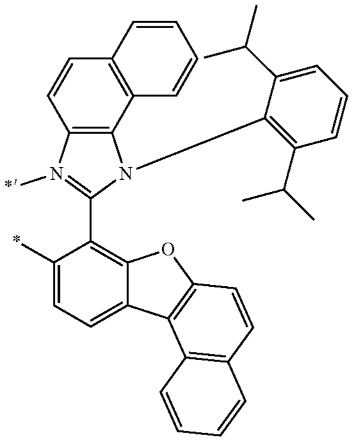
B77
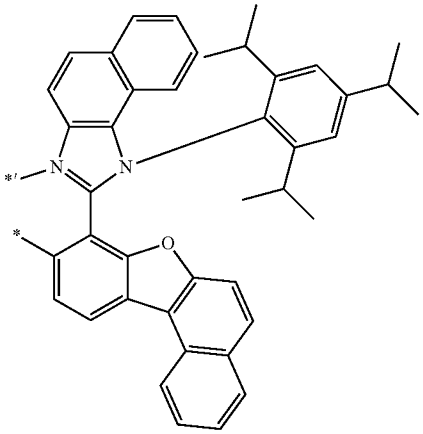

-continued
B78
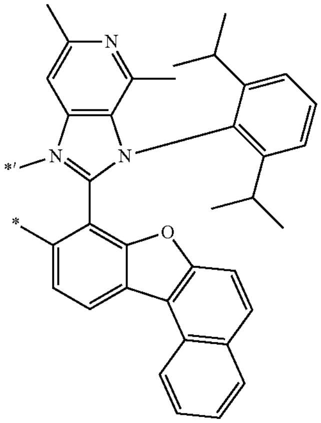
B79
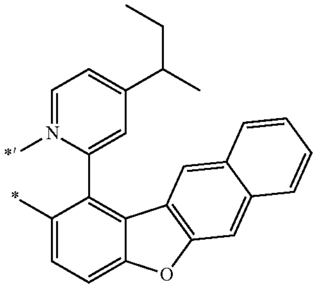
B80
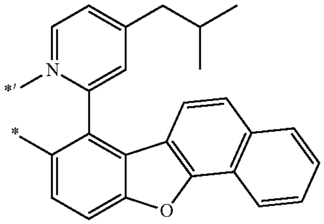
B81
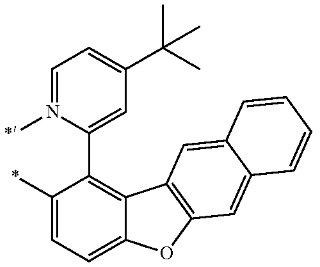
B82
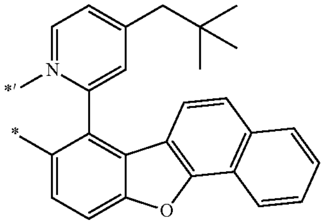
-continued
B83
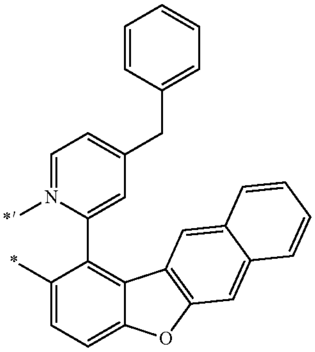
B84
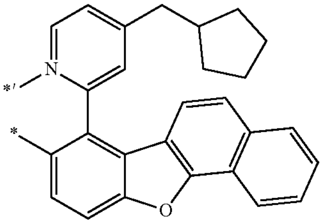
B85
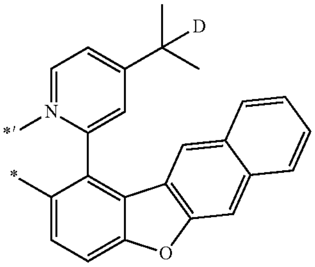
B86
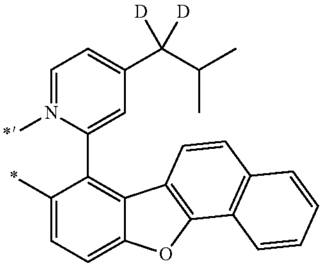
B87
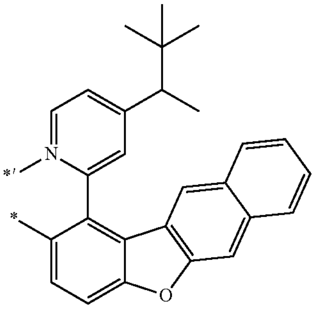

-continued
B88
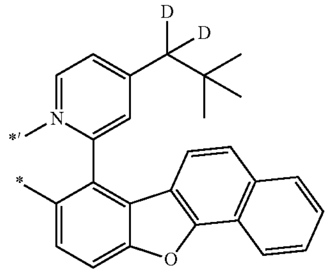
B89
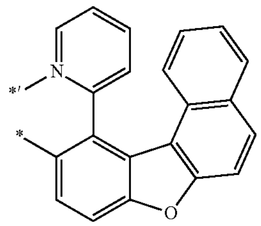
B90
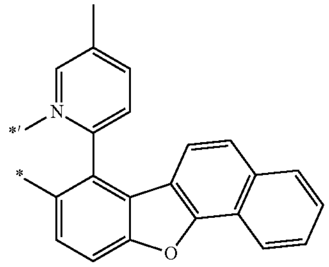
B91
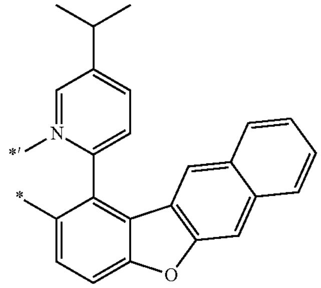
B92
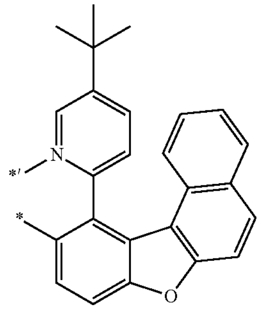
-continued
B93
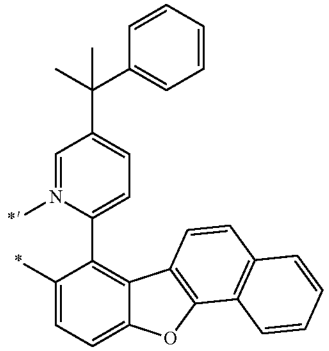
B94
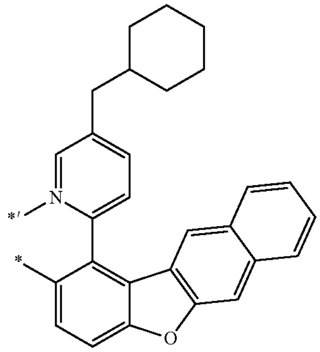
B95
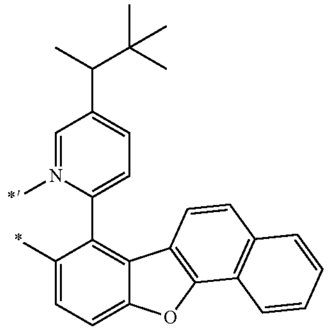
B96
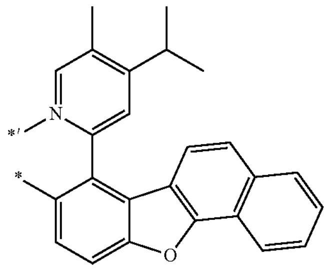
B97
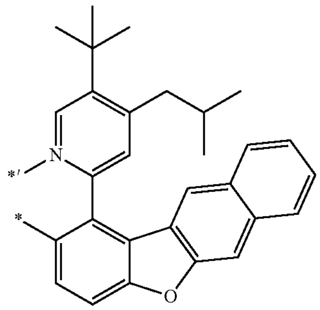

-continued
B98
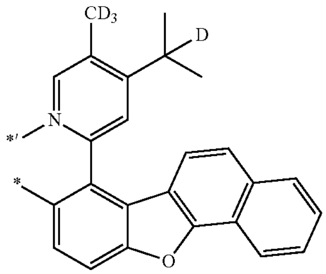
B99
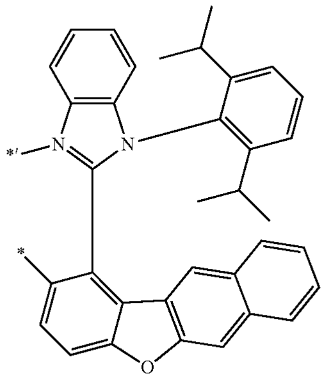
B100
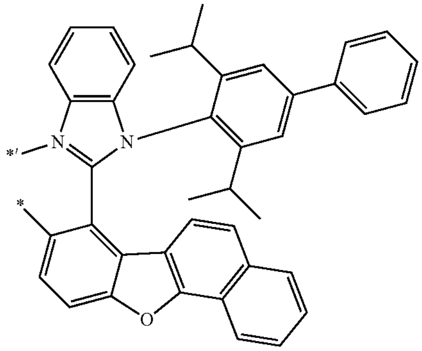
B101
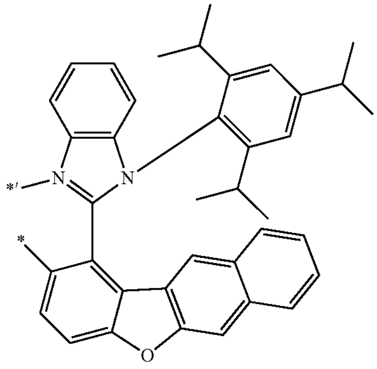
-continued
B102
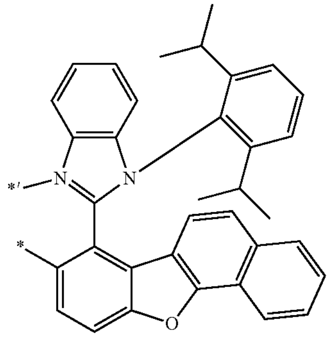
B103
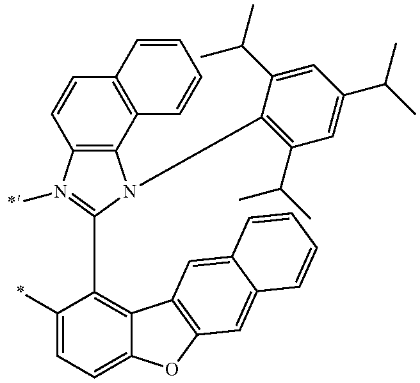
B104
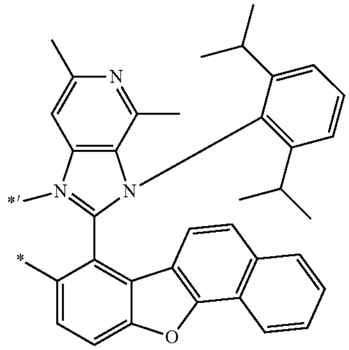
B105
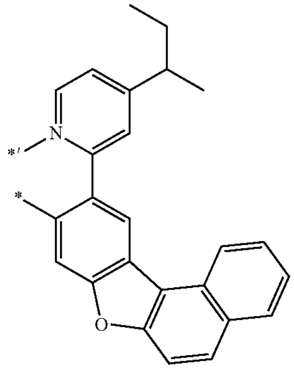

-continued
B106
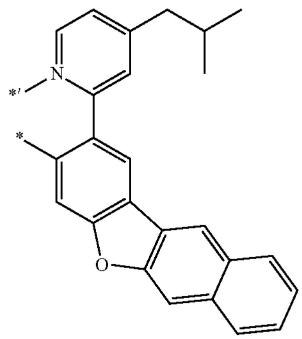
B107
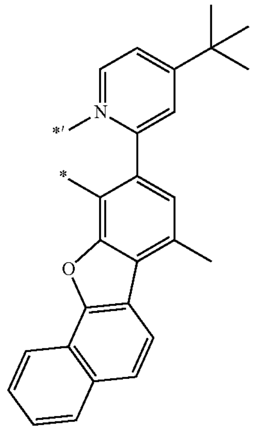
B108
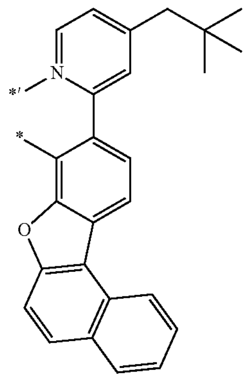
B109
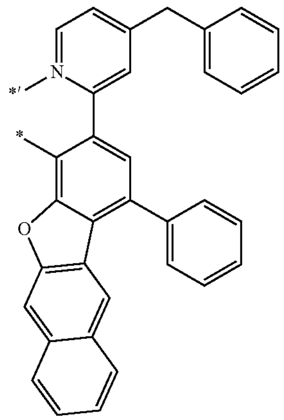
-continued
B110
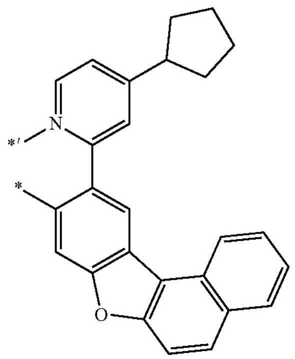
B111
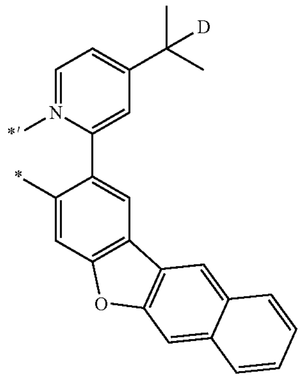
B112
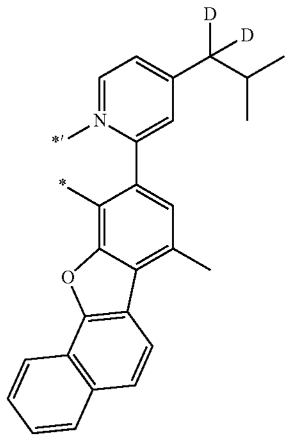
B113
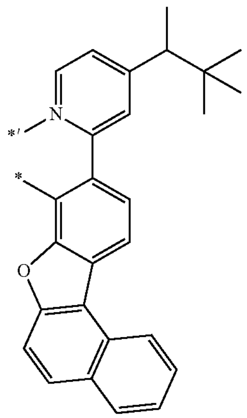

-continued
B114
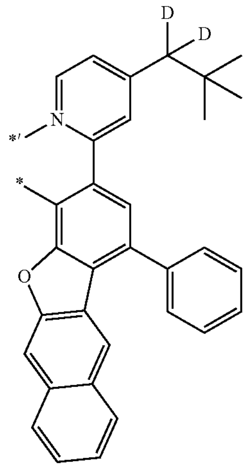
B115
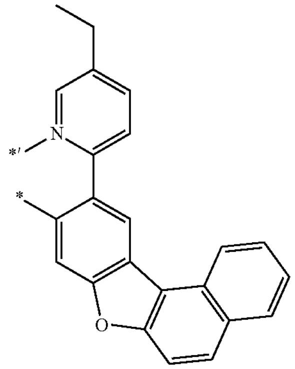
B116
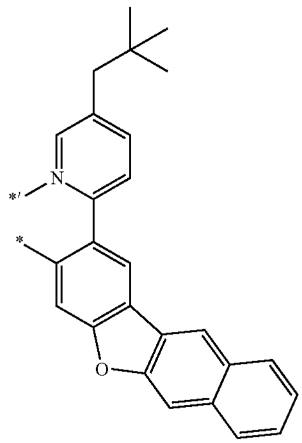
-continued
B117
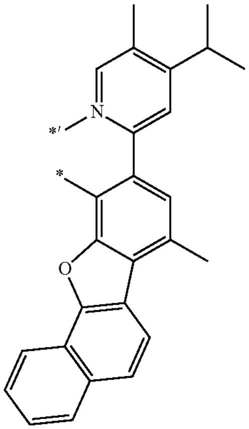
B118
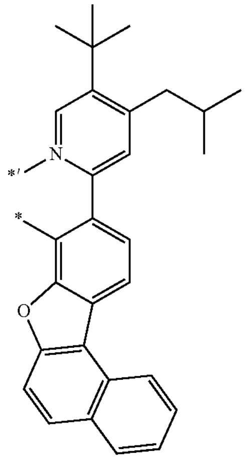
B119
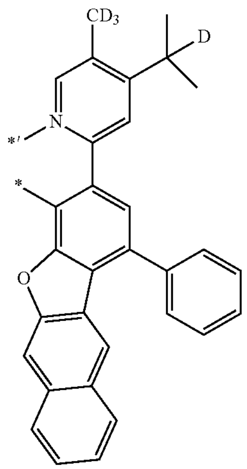

-continued
B120
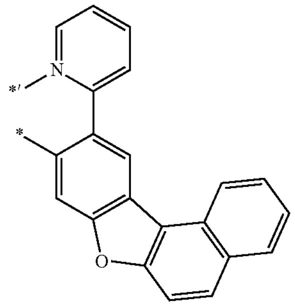
B121
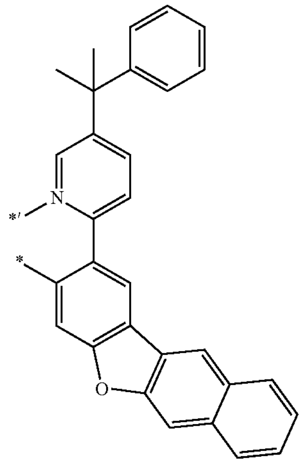
B122
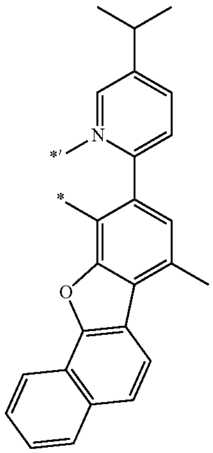
-continued
B123
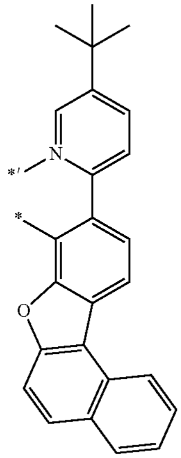
B124
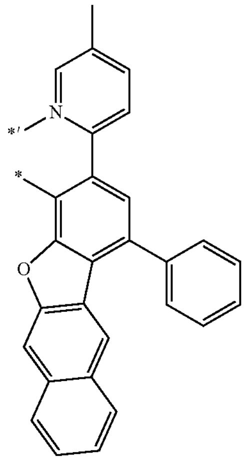
B125
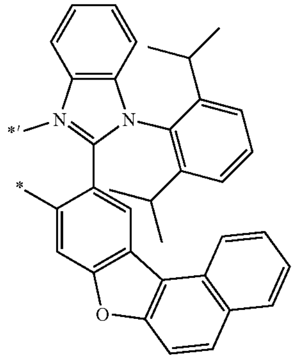

B126
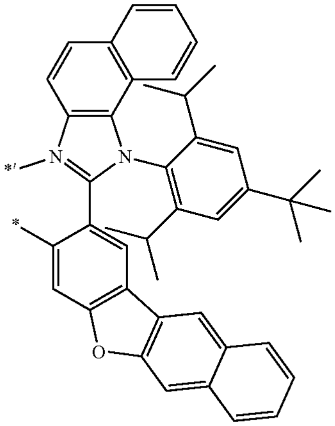
B127
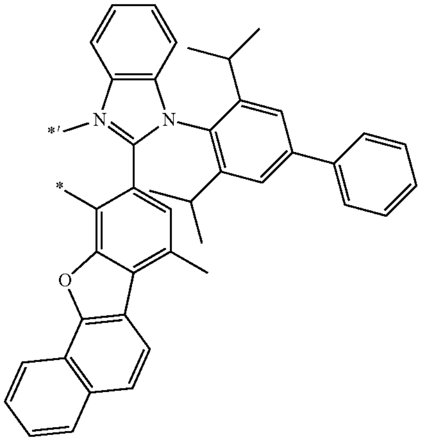
B128
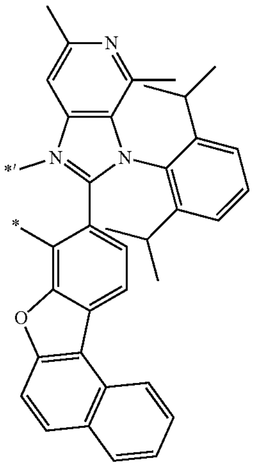
B129
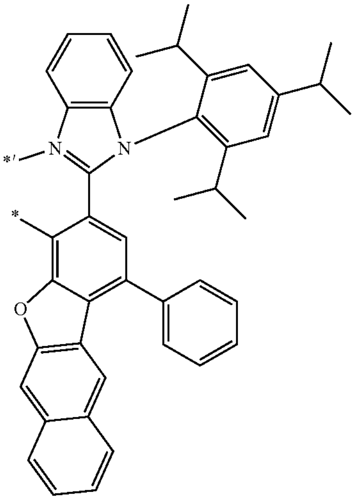
B130
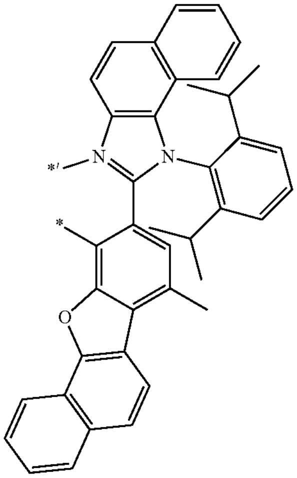
B131
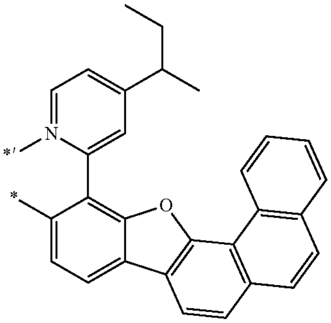
B132
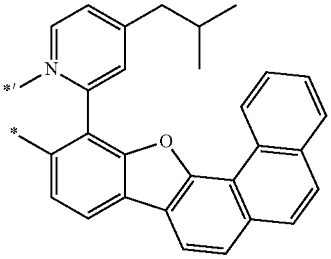

-continued
B133
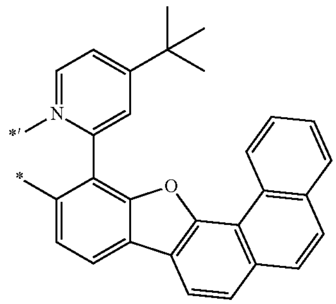
B135
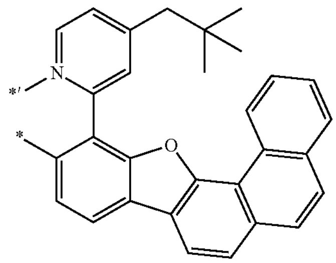
B135
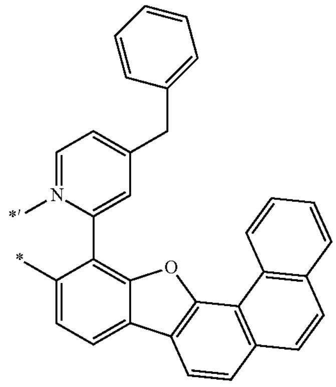
B136
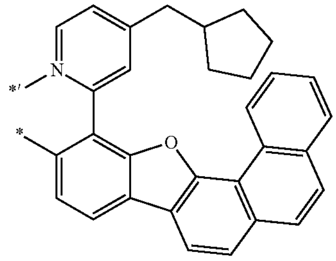
B137
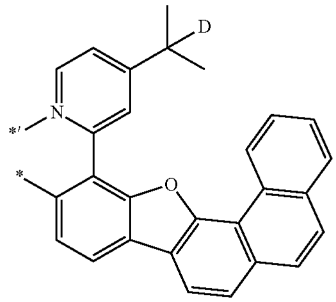
-continued
B138
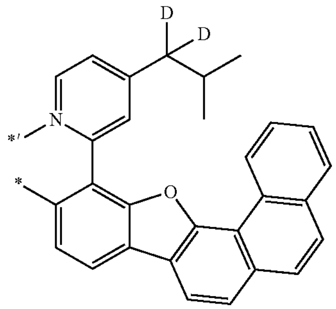
B139
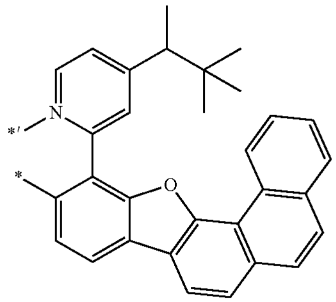
B140
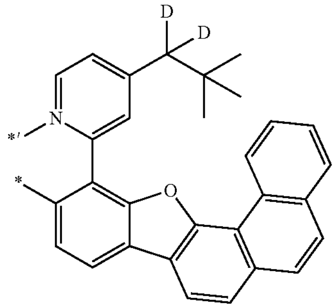
B141
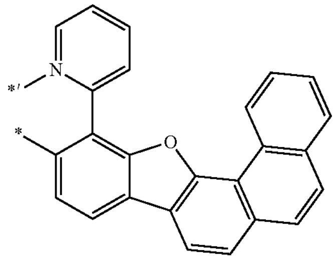
B142
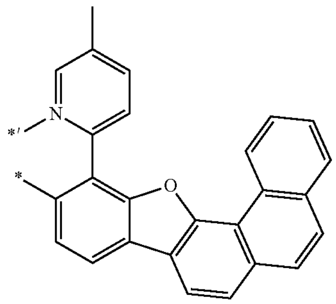

-continued
B143
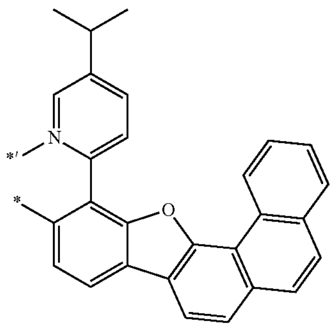
B144
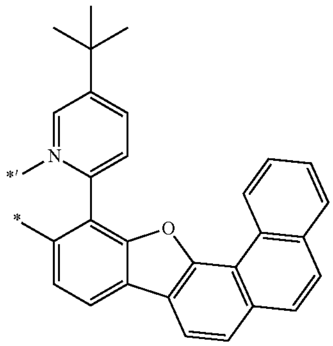
B145
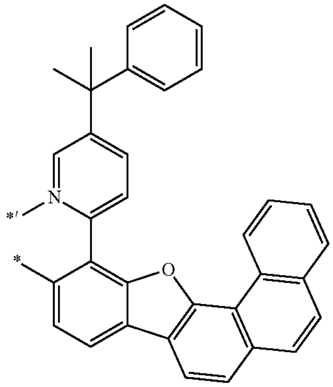
B146
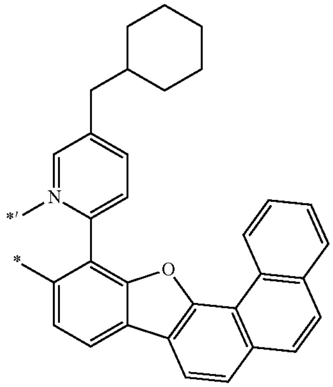
-continued
B147
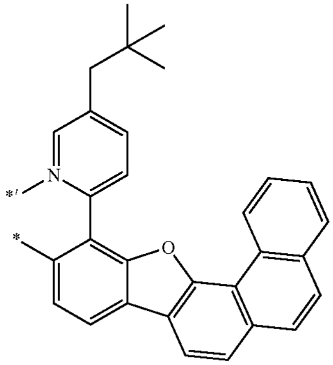
B148
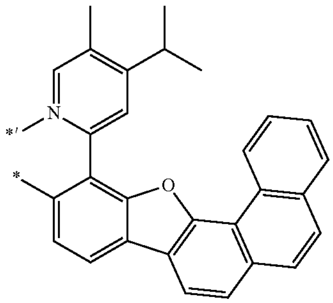
B149
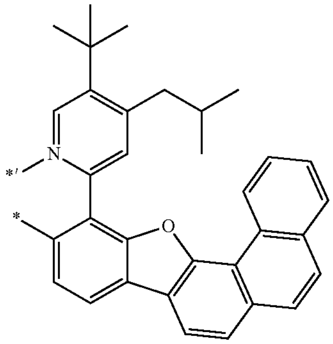
B150
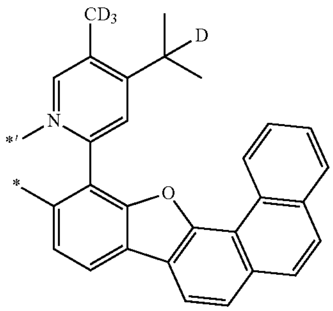

-continued
B151
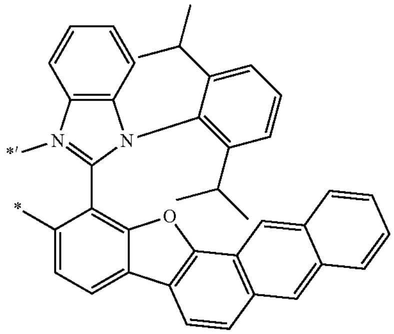
B152
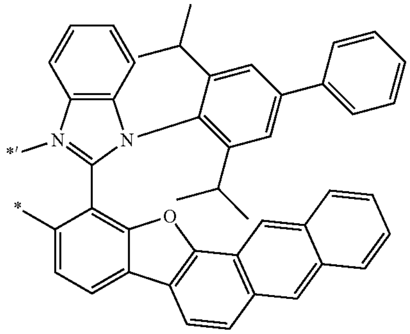
B153
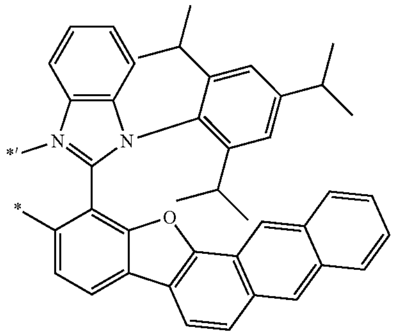
B154
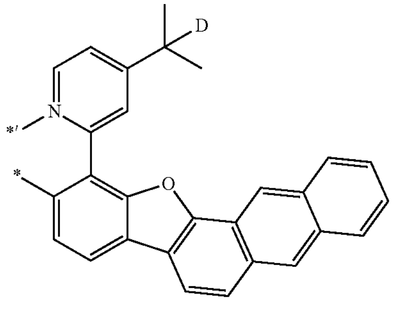
-continued
B155
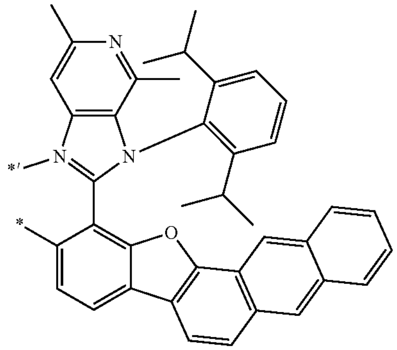
B156
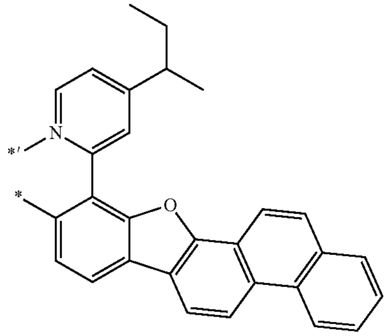
B157
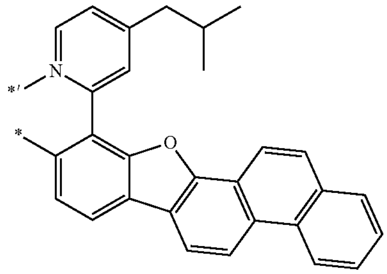
B158
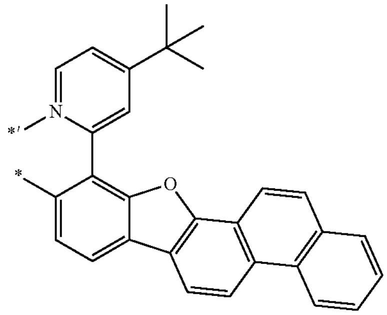
B159
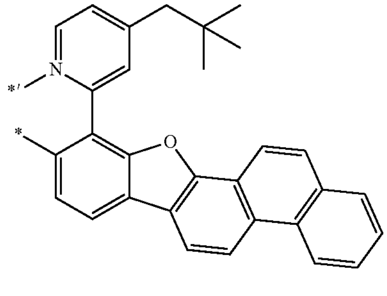

-continued
B160
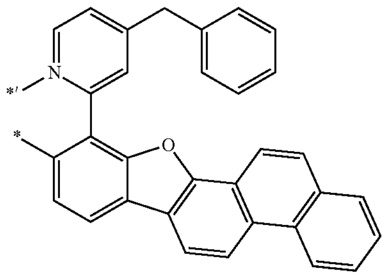
B161
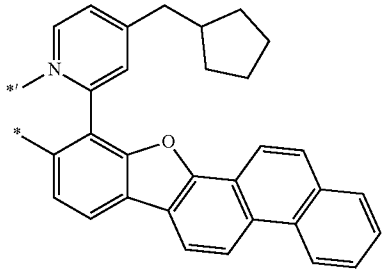
B162
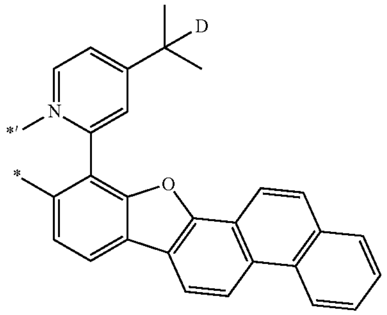
B163
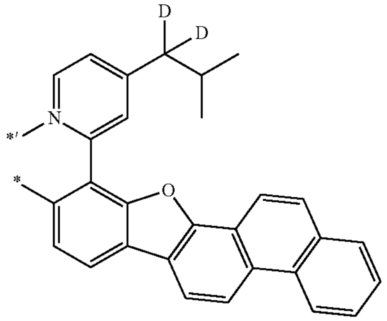
B164
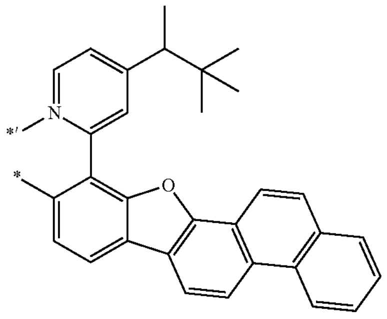
-continued
B165
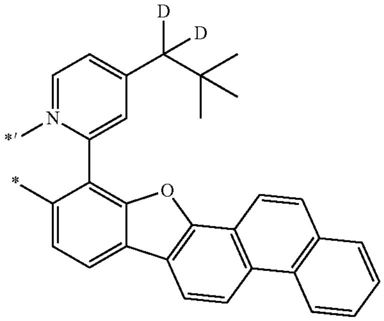
B166
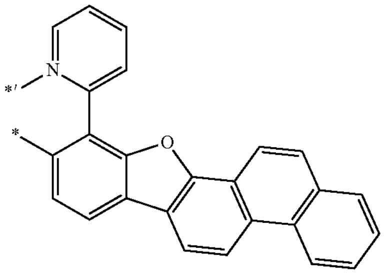
B167
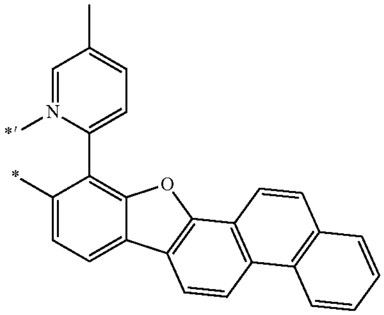
B168
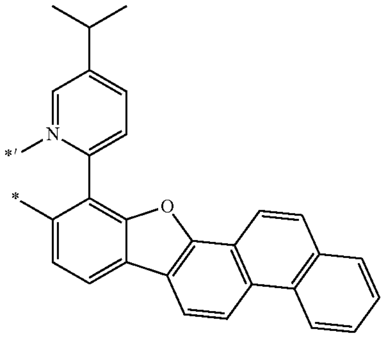
B169
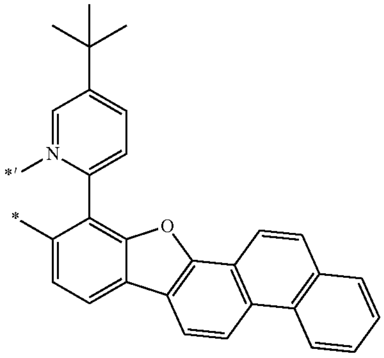

-continued
B170
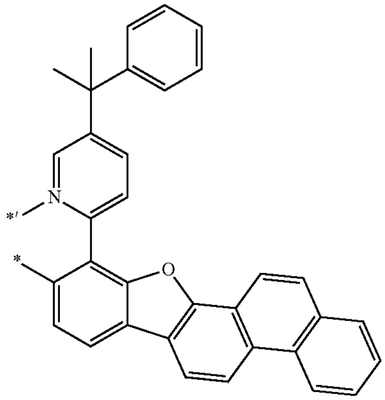
B171
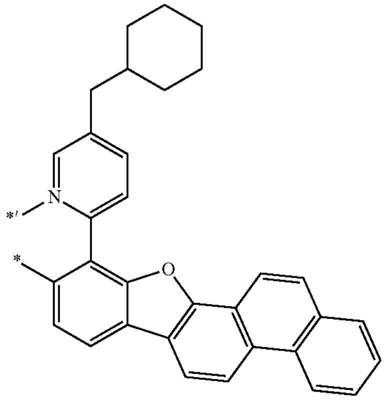
B172
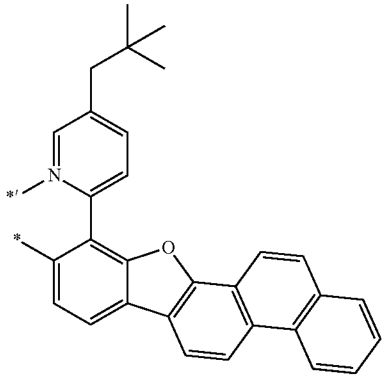
B173
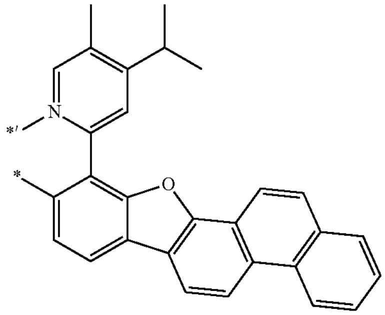
-continued
B174
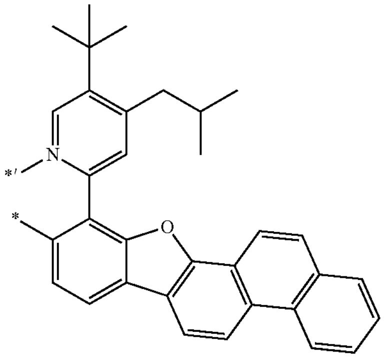
B175
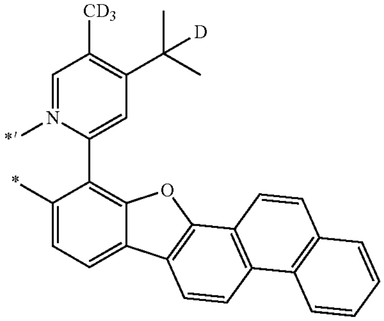
B176
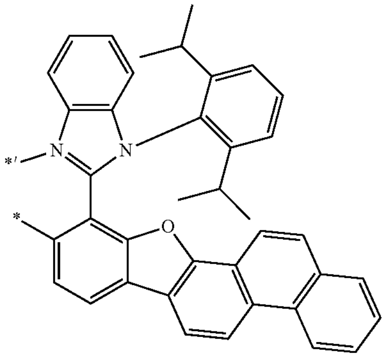
B177
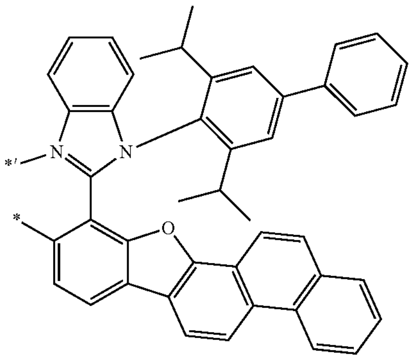

-continued
B178
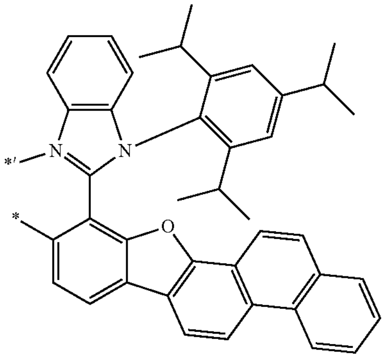
B179
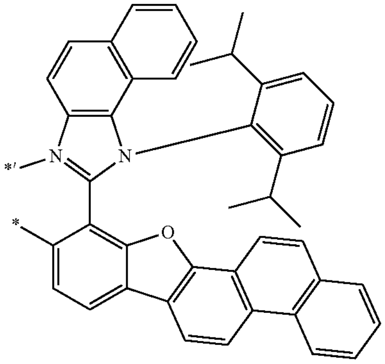
B180
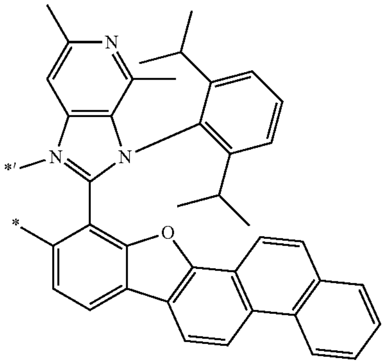
B181
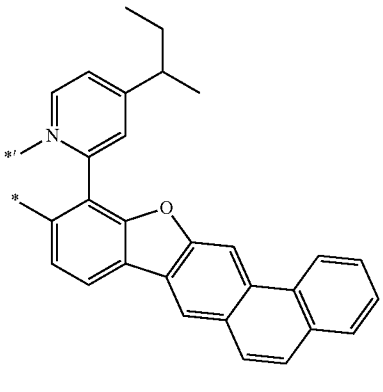
-continued
B182
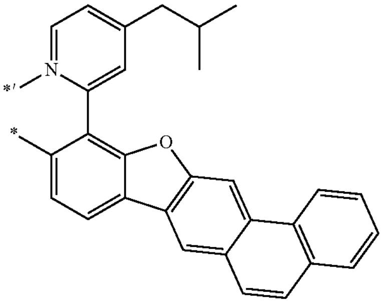
B183
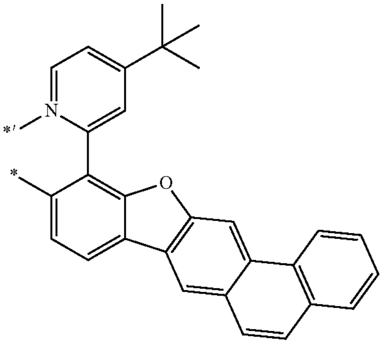
B184
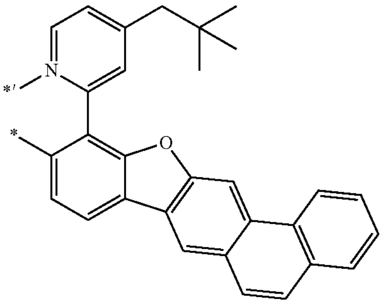
B185
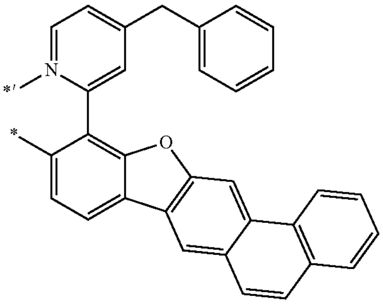
B186
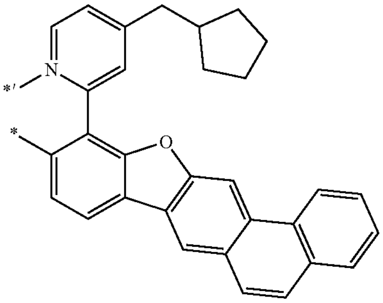

-continued
B187
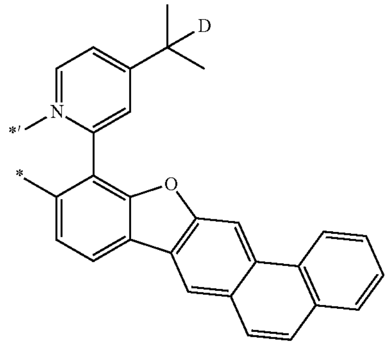
B188
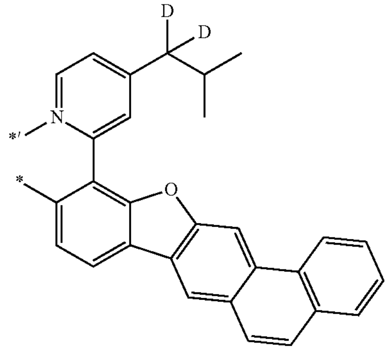
B189
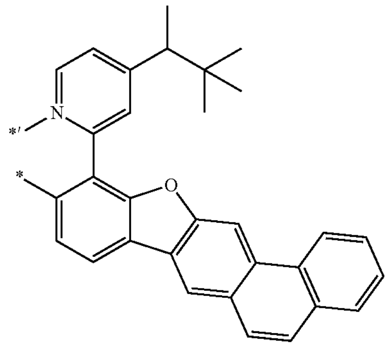
B190
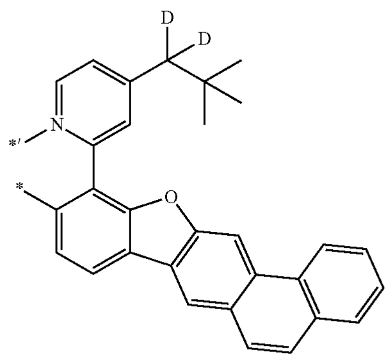
-continued
B191
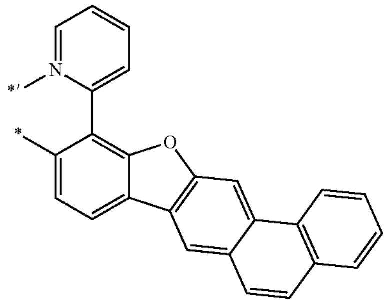
B192
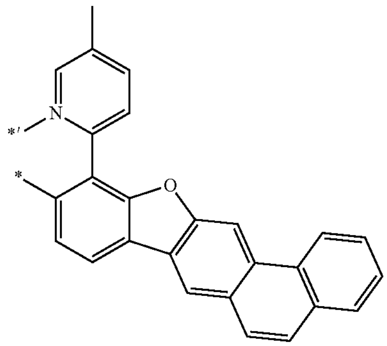
B193
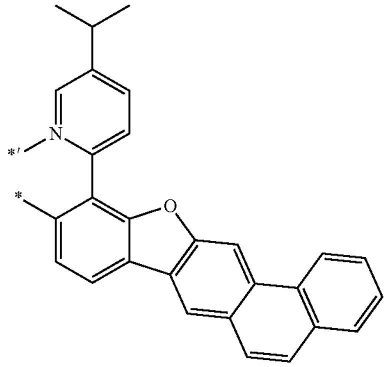
B194
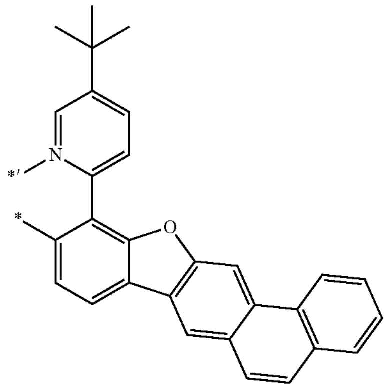

-continued
B195
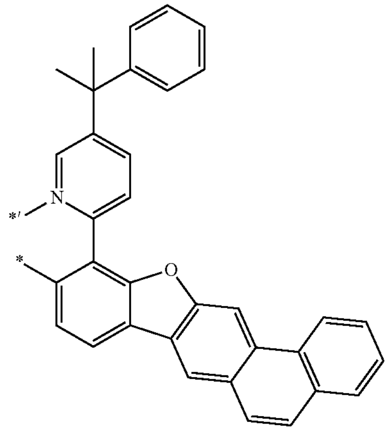
B196
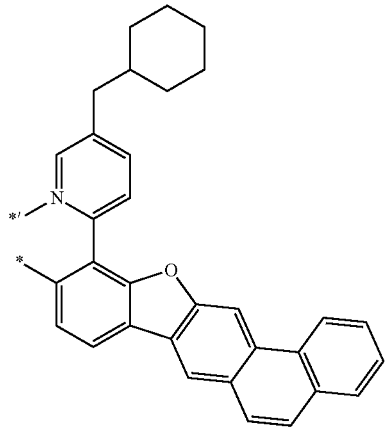
B197
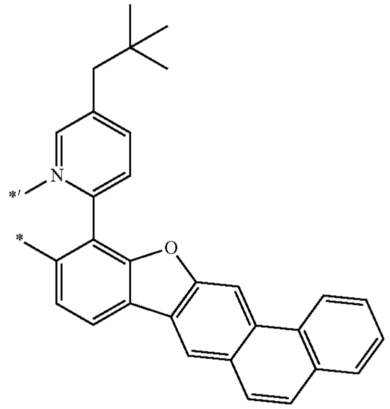
B198
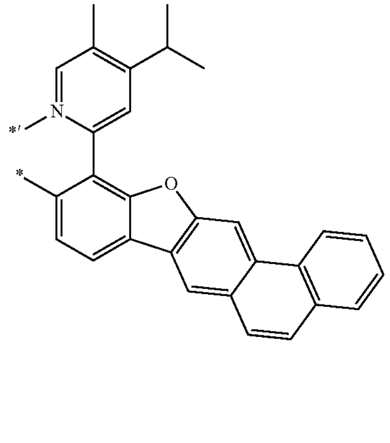
-continued
B199
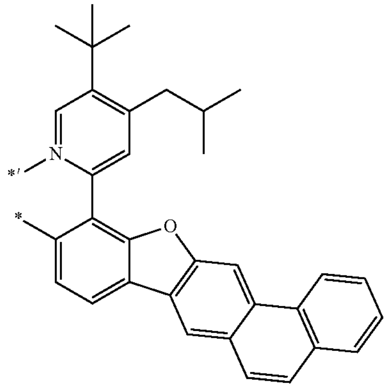
B200
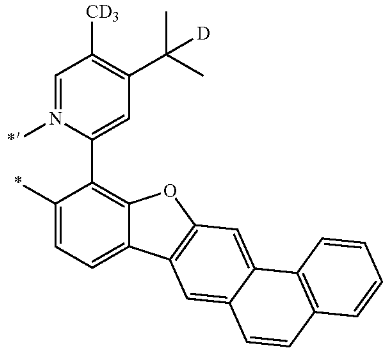
B201
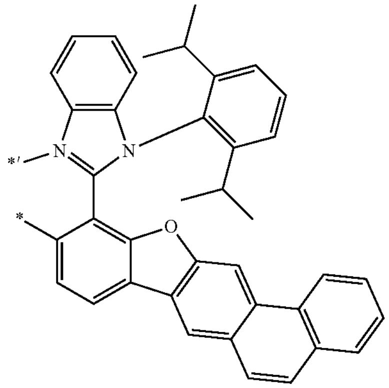
B202
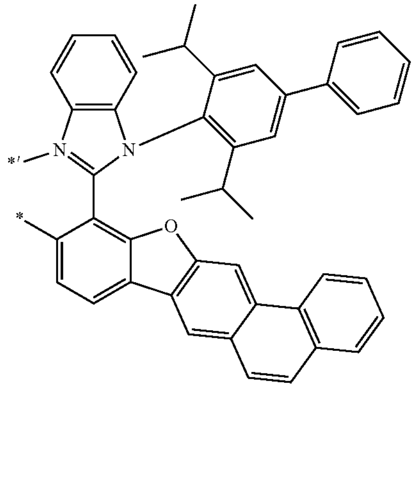

-continued
B203
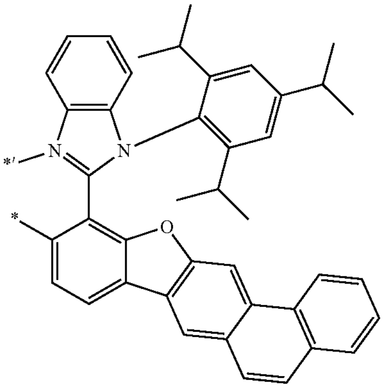
B204
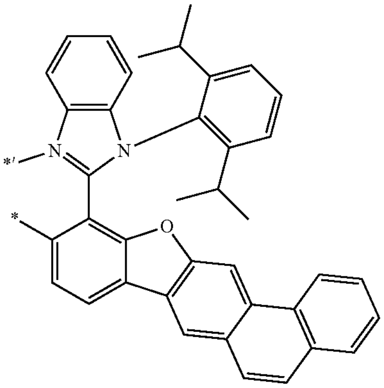
B205
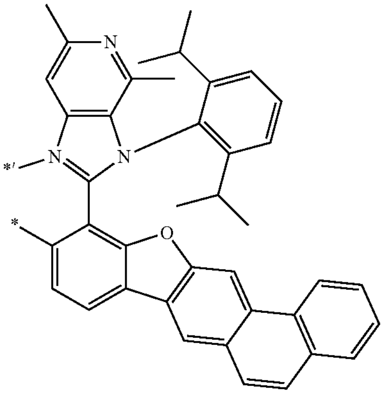
B236
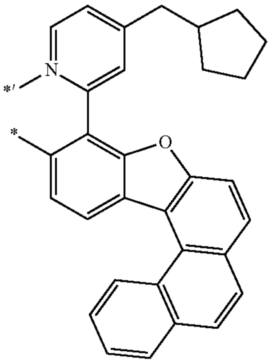
-continued
B237
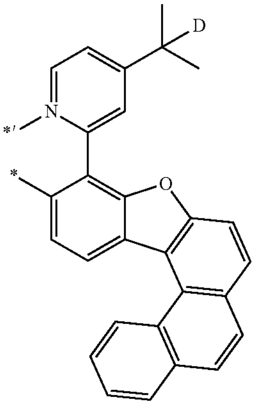
B238
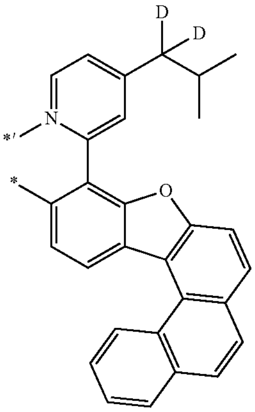
B239
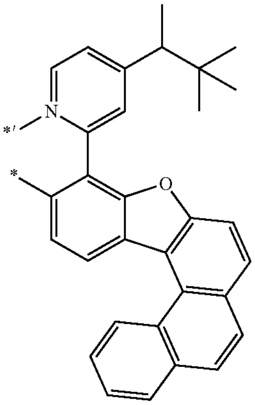
B240
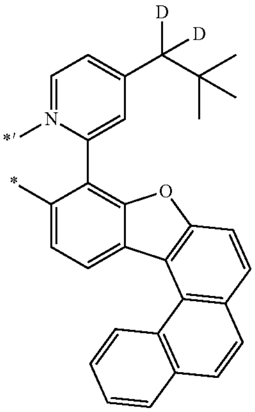

-continued
B241
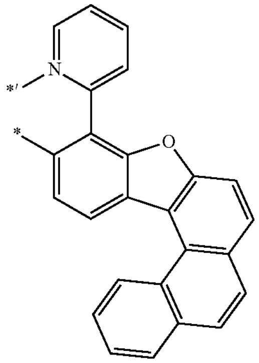
B242
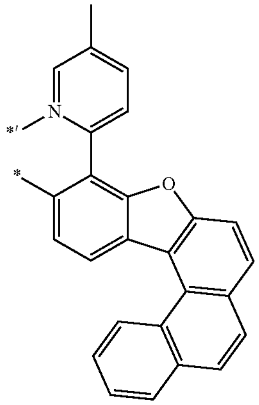
B243
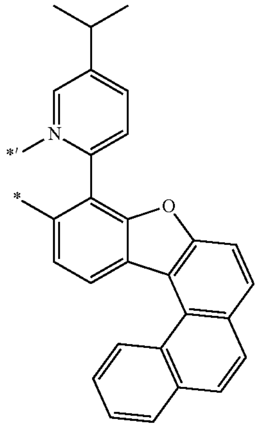
B244
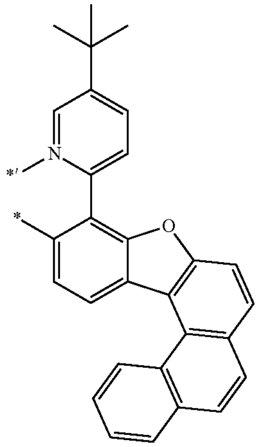
-continued
B245
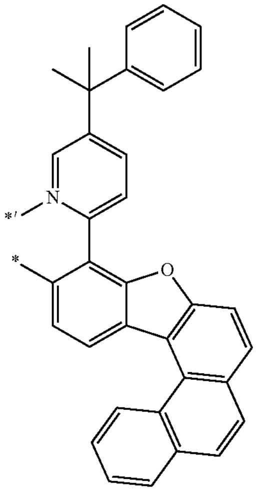
B246
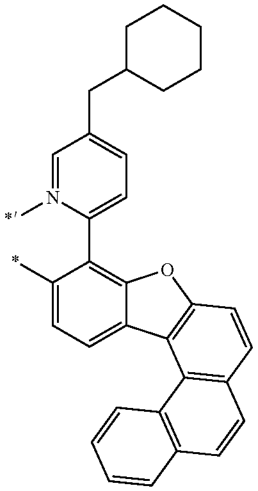
B247
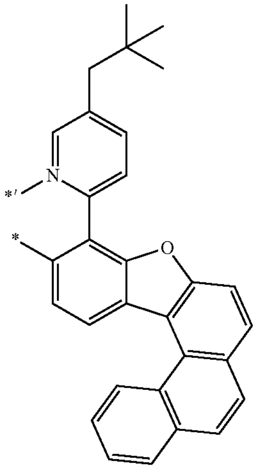

-continued
B248
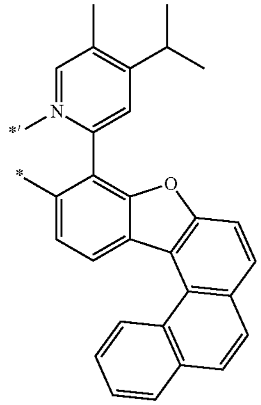
B249
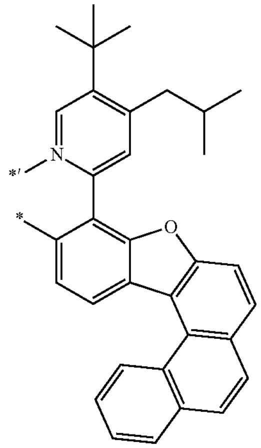
B250
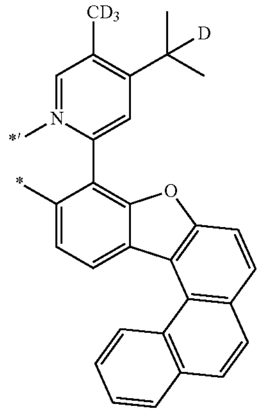
-continued
B251
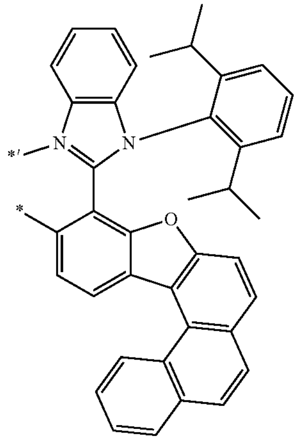
B252
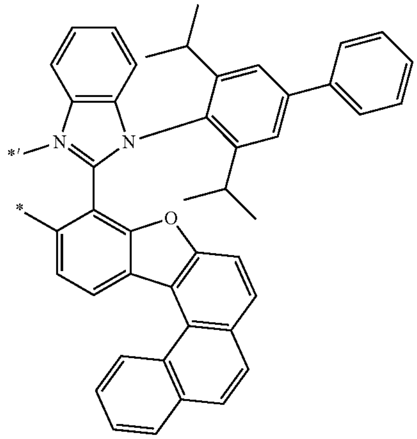
B253
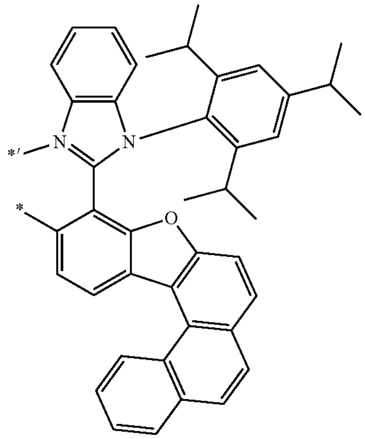

-continued
B254
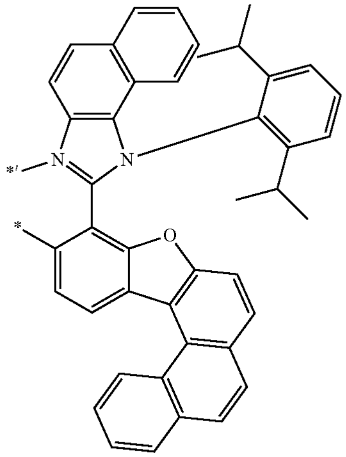
B255
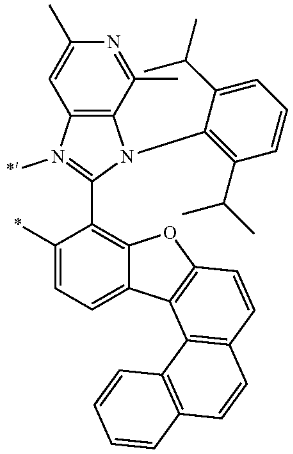
B256
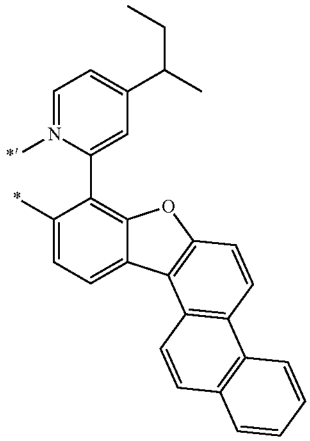
-continued
B257
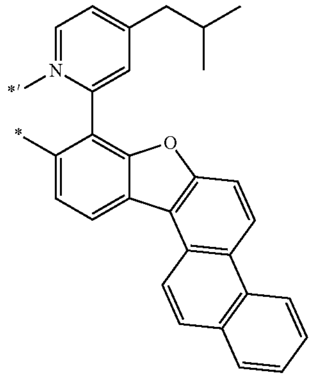
B258
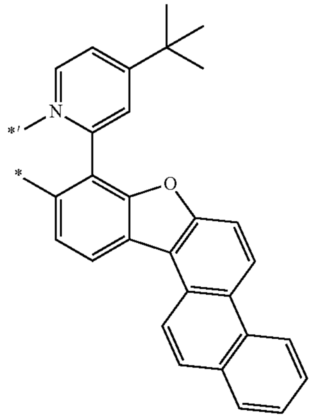
B259
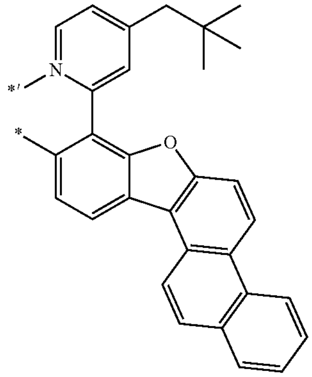
B260
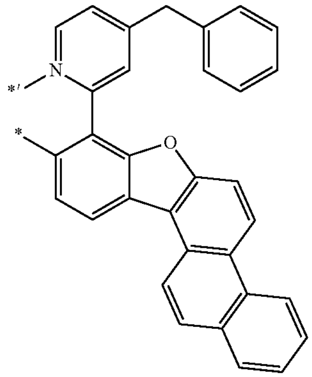

-continued
B261
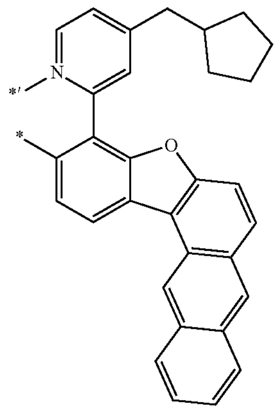
B262
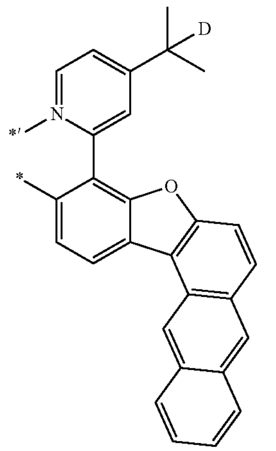
B263
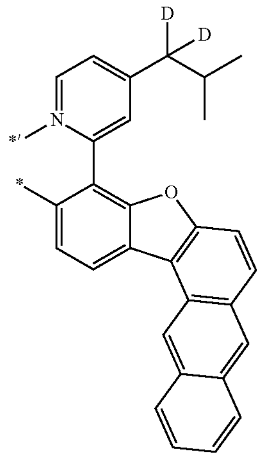
-continued
B264
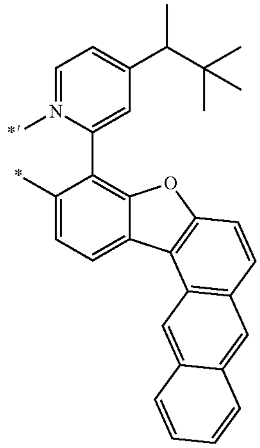
B265
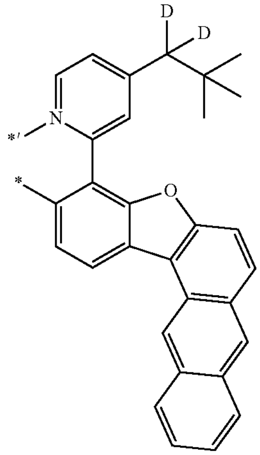
B266
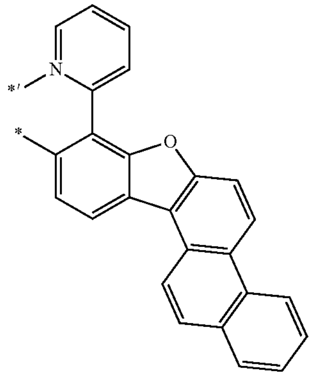

-continued
B267
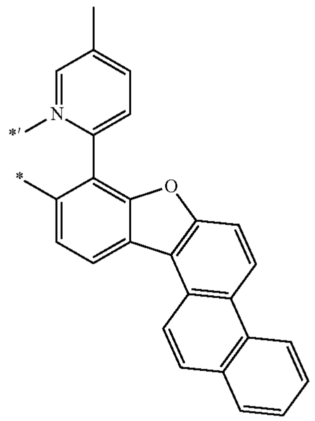
B268
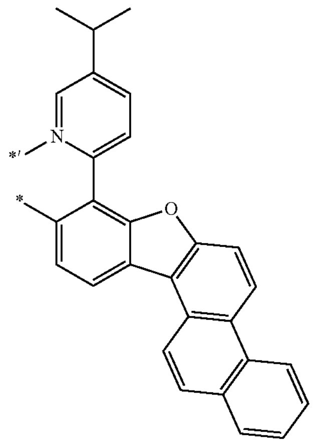
B269
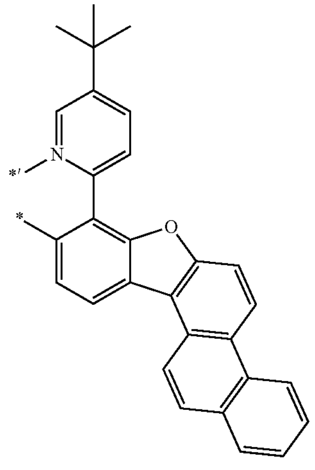
-continued
B270
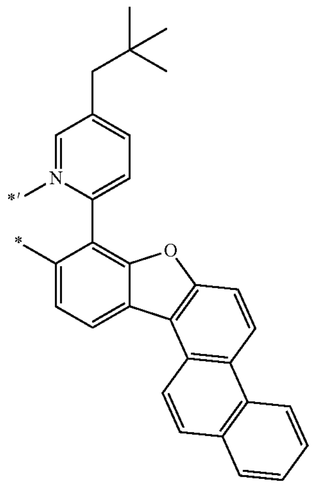
B271
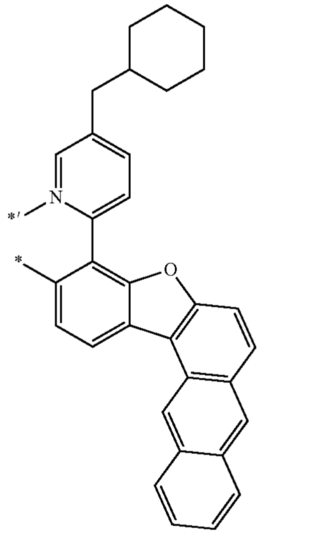
B272
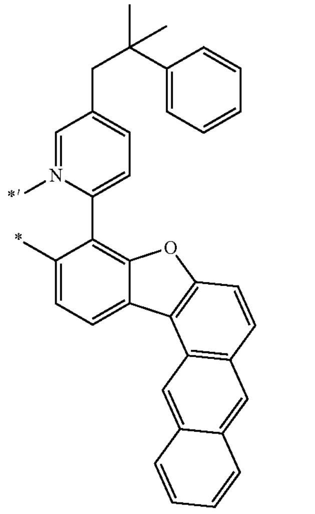

-continued
B273
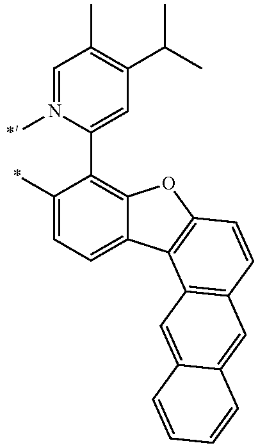
B74
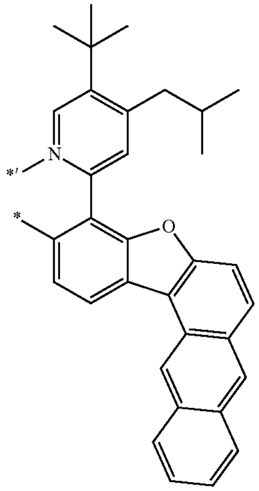
B275
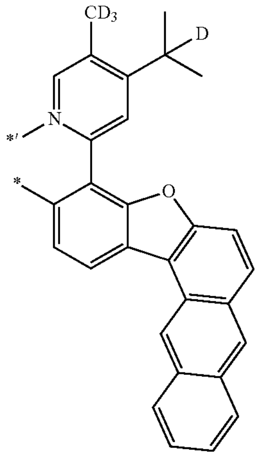
-continued
B276
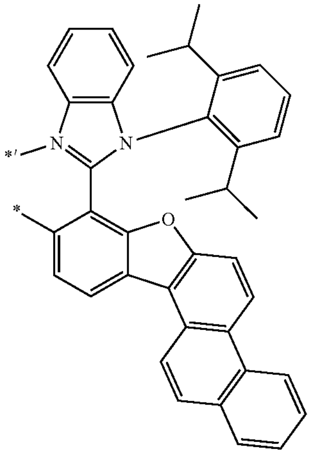
B277
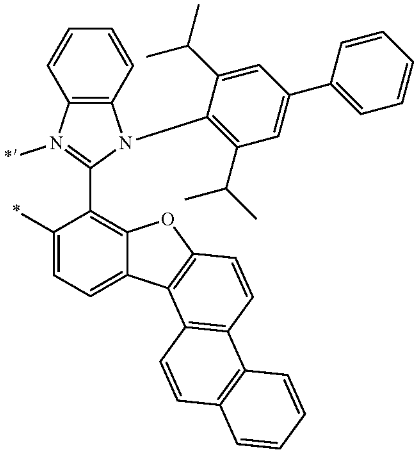
B278
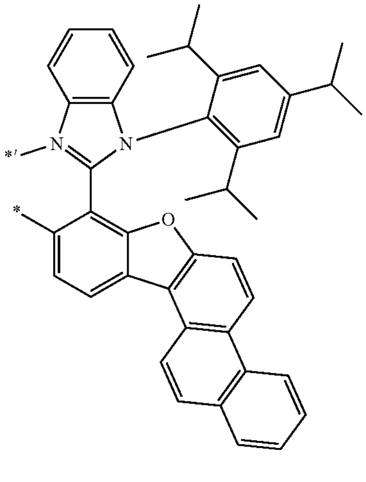

-continued
B279
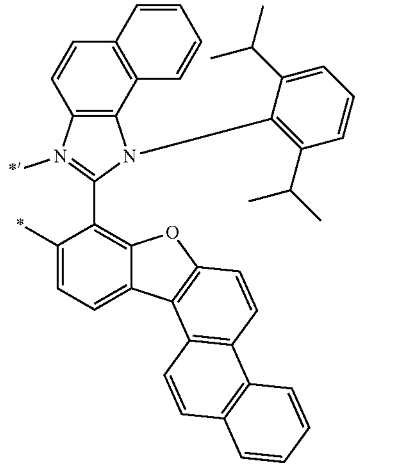
B280
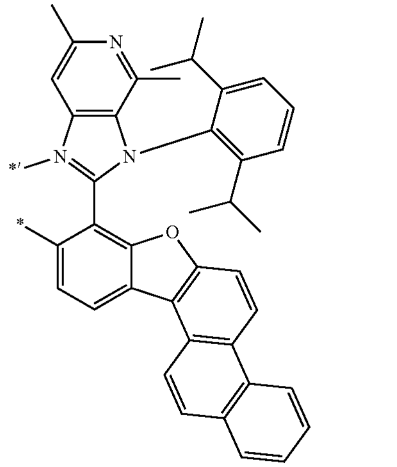
B281
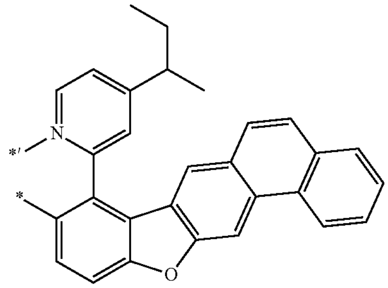
B282
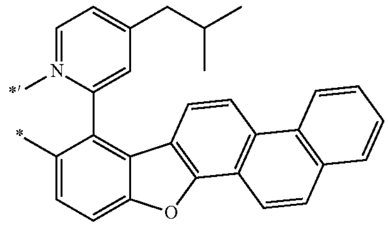
-continued
B283
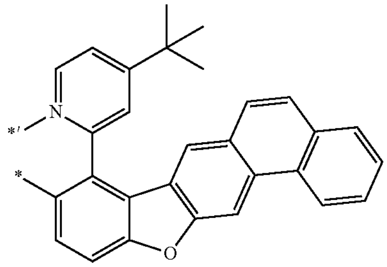
B284
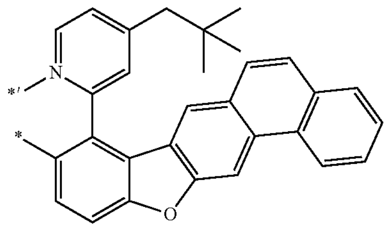
B285
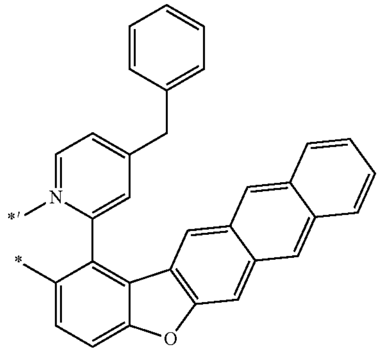
B286
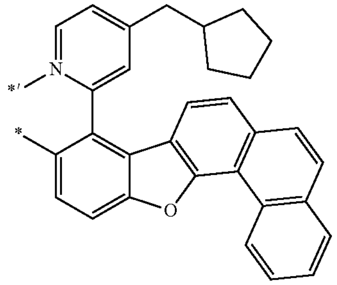
B287
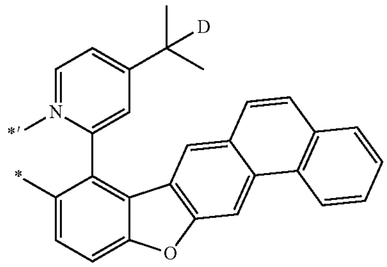

-continued
B288
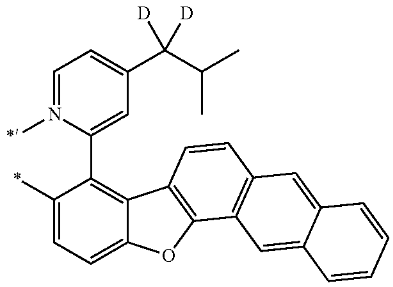
B289
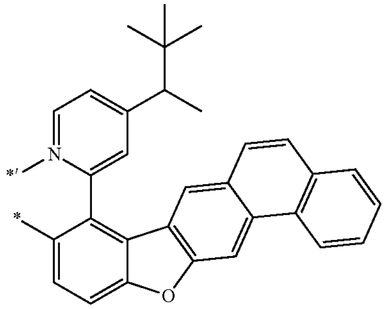
B290
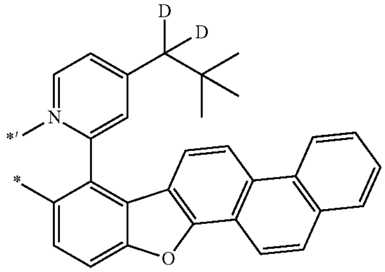
B291
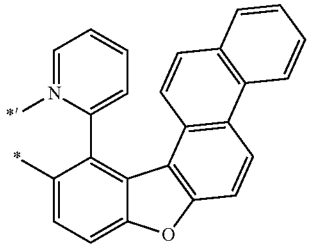
B292
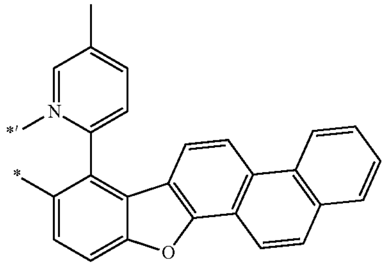
-continued
B293
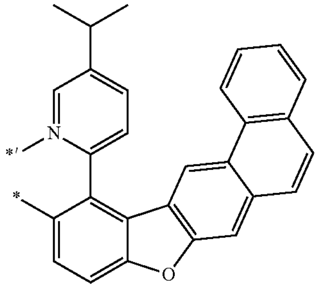
B294
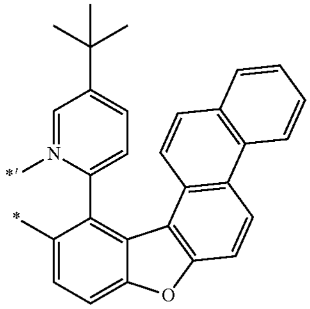
B295
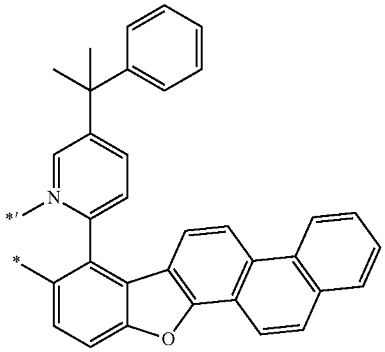
B296
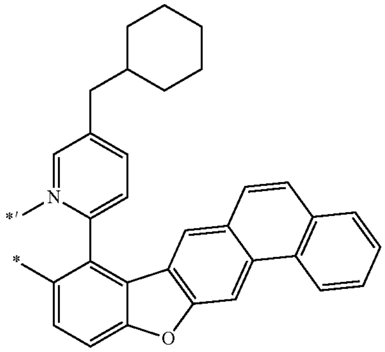
B297
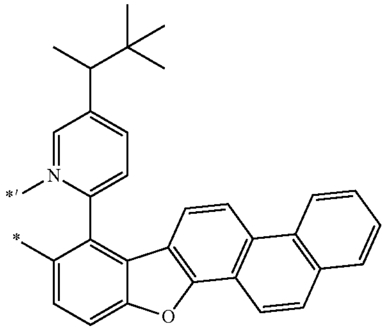

-continued
B298
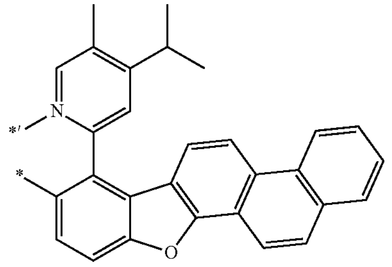
B299
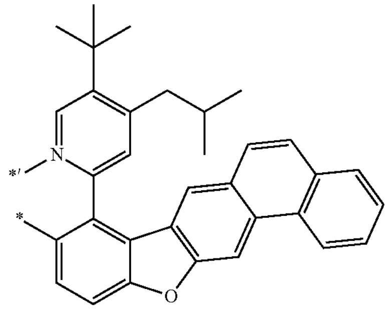
B300
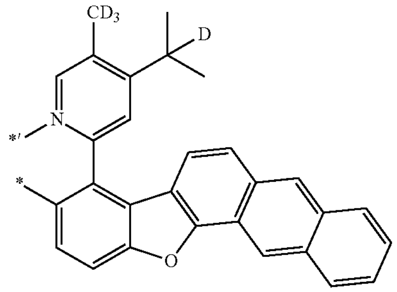
B301
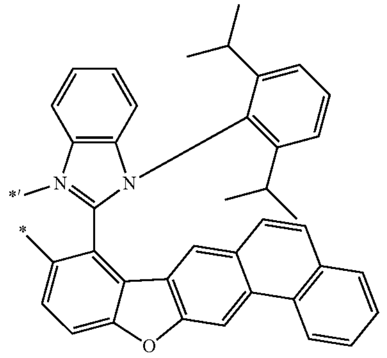
B302
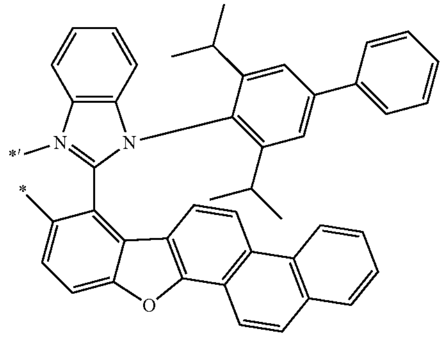
-continued
B303
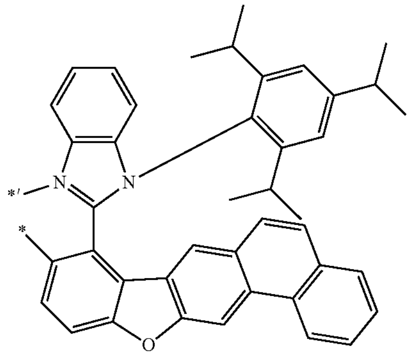
B304
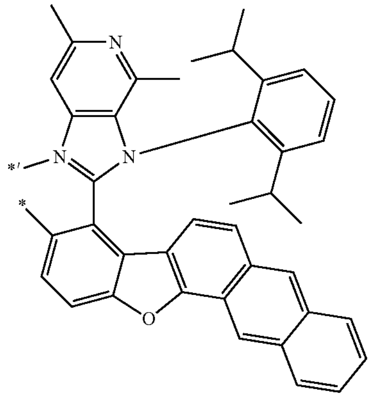
B305
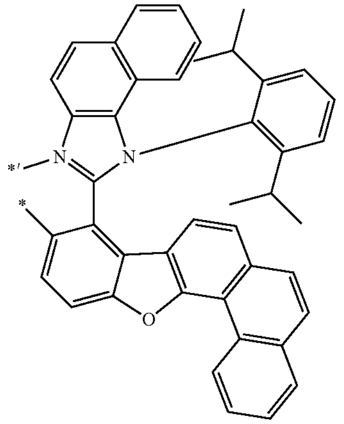
B306
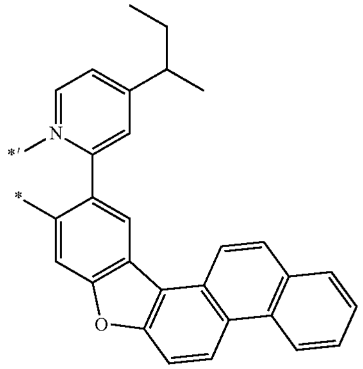

-continued
B307
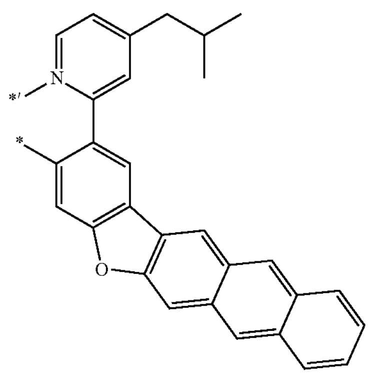
B308
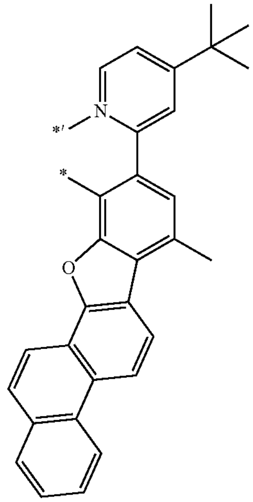
B309
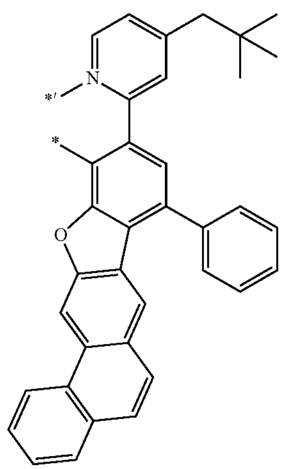
-continued
B310
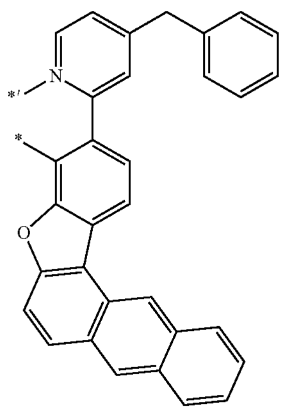
B311
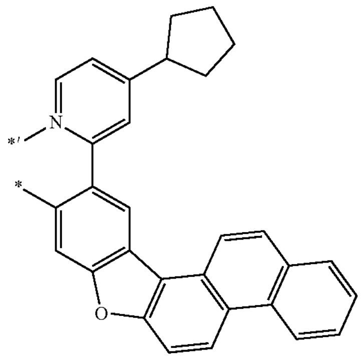
B312
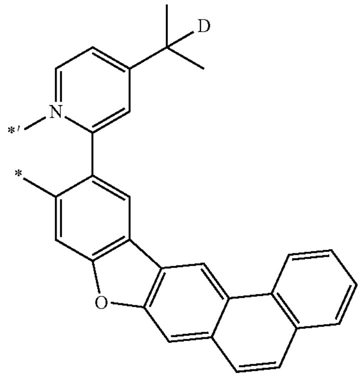
B313
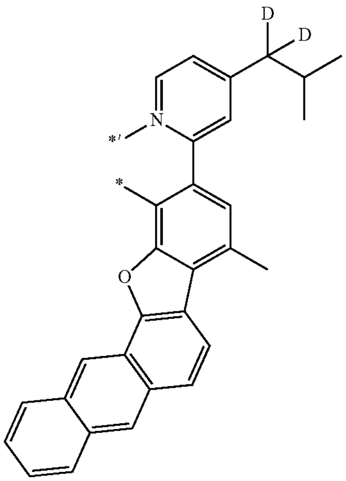

-continued
B314
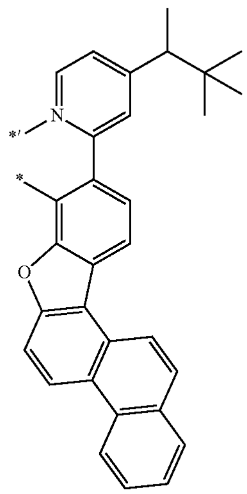
B315
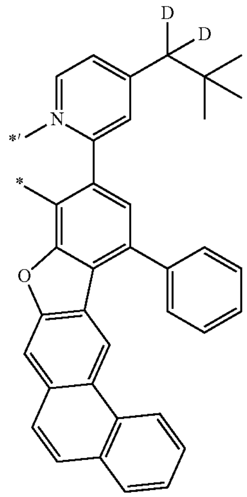
B316
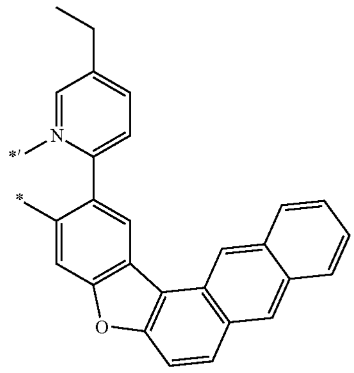
-continued
B317
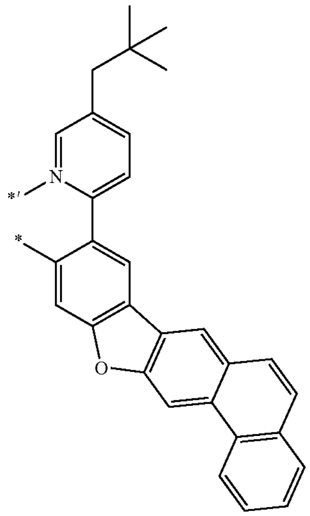
B318
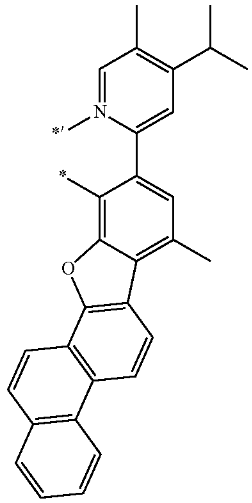
B319
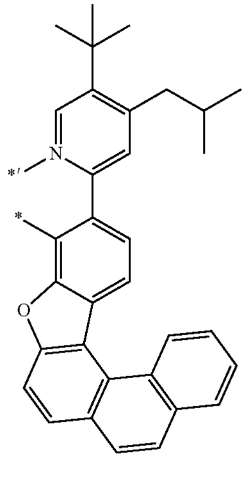

-continued
B320
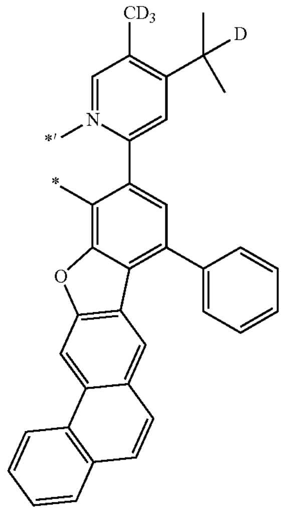
B321
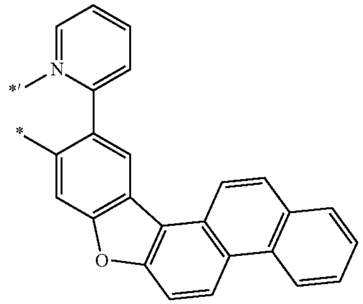
B322
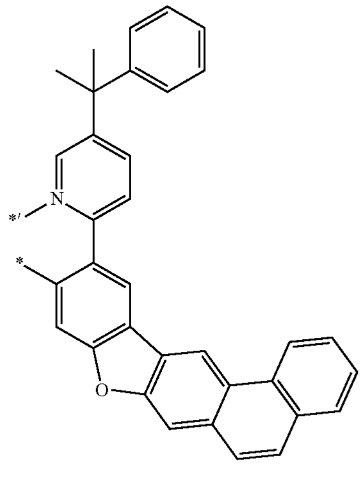
-continued
B323
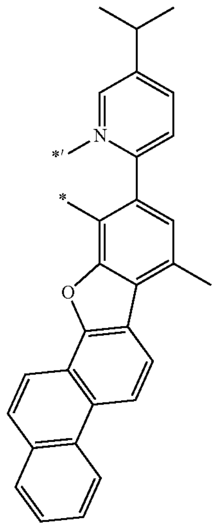
B324
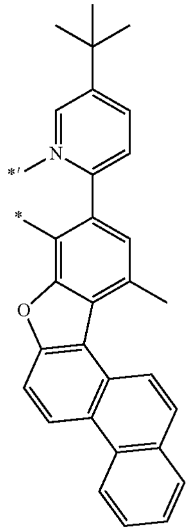
B325
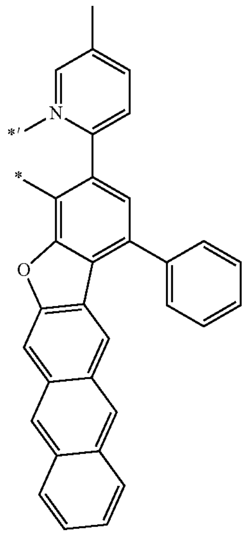

-continued
B326
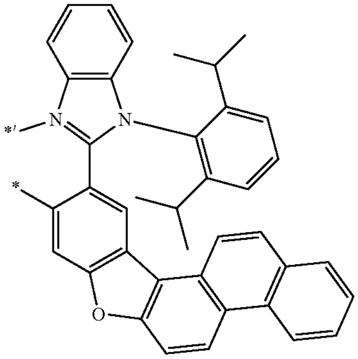
B327
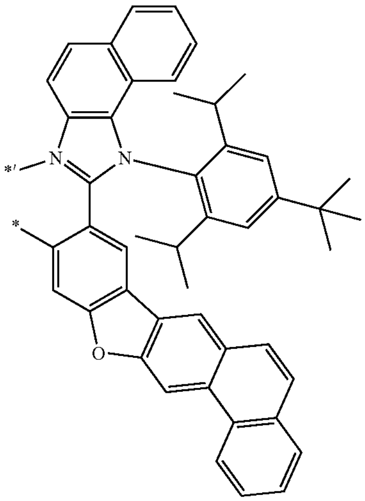
B328
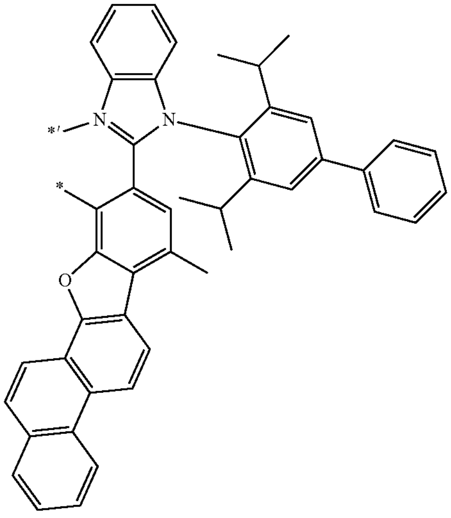
-continued
B329
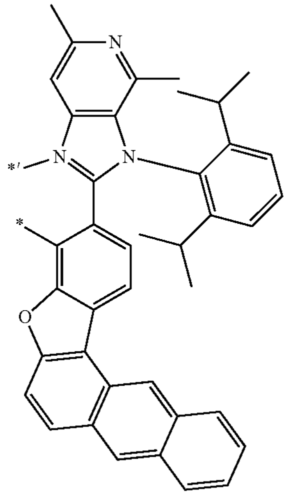
B330
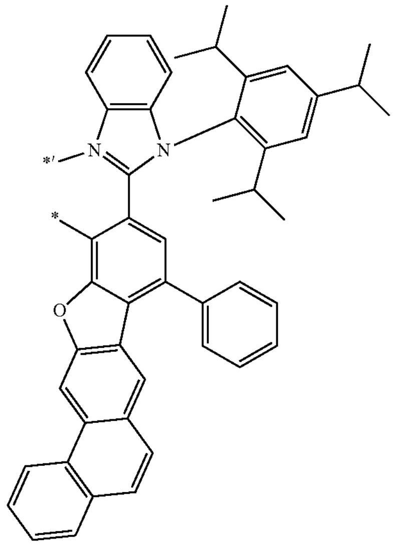
B331
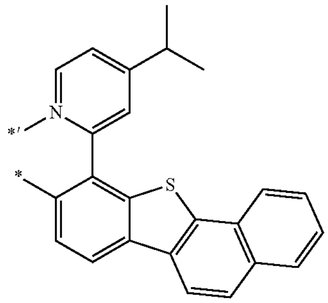
B332
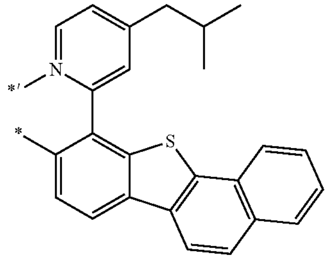

-continued
B333
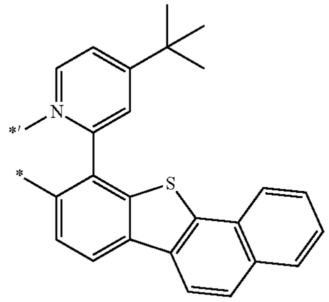
B334
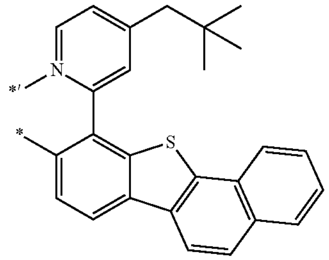
B335
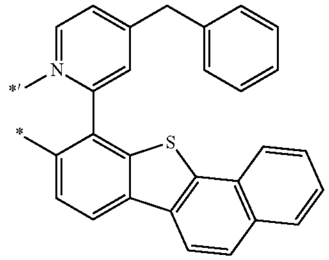
B336
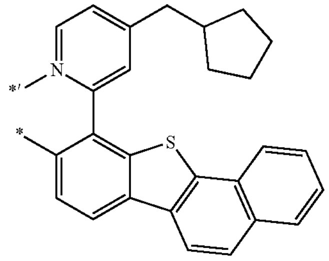
B337
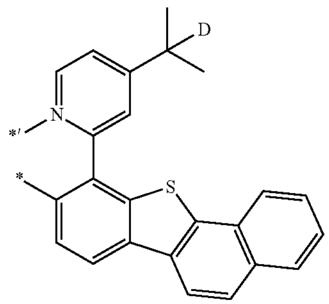
-continued
B338
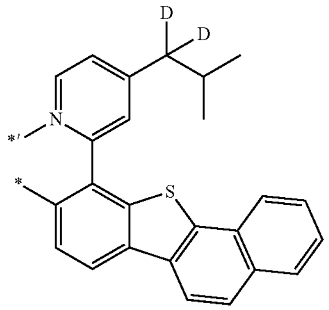
B339
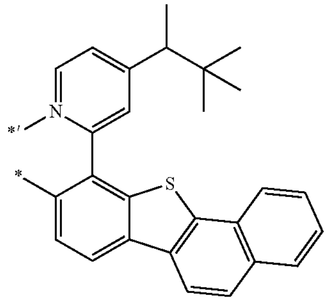
B340
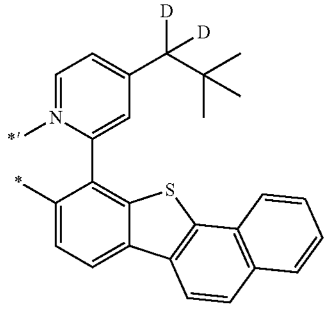
B341
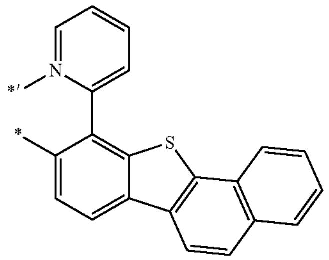
B342
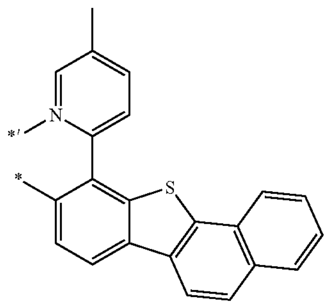

-continued
B343
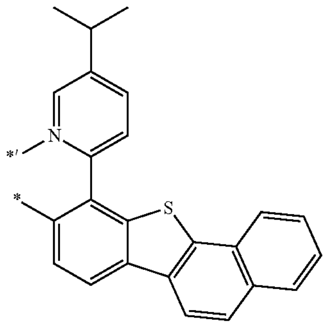
B344
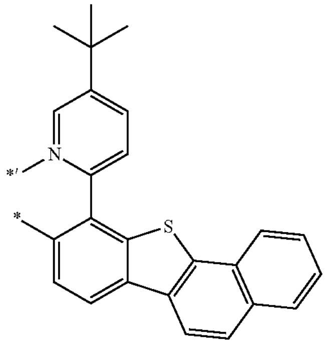
B345
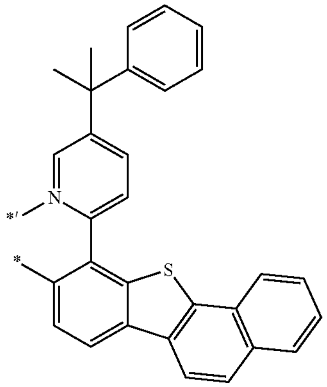
B346
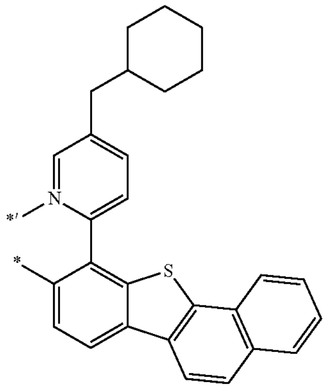
-continued
B347
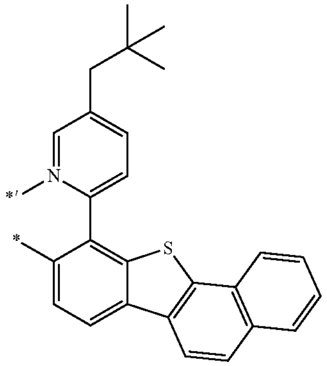
B348
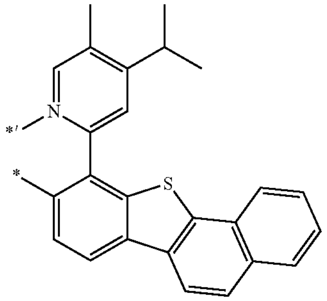
B349
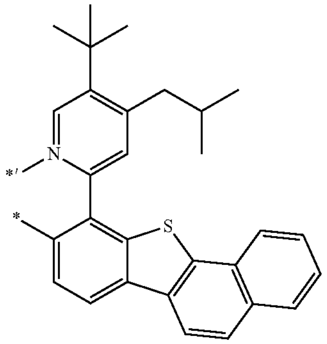
B350
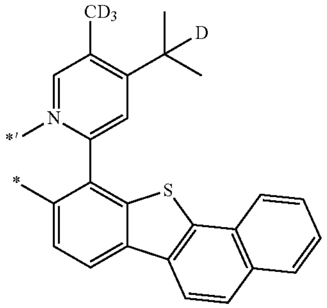

-continued
B351
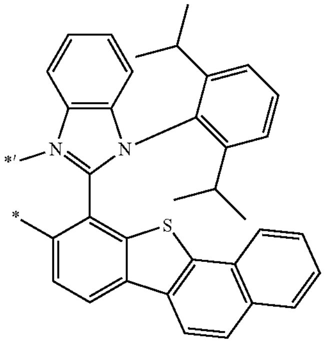
B352
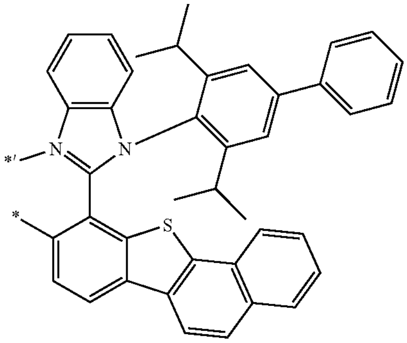
B353
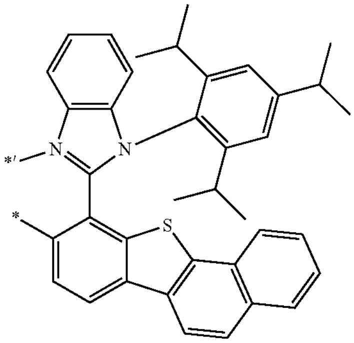
B354
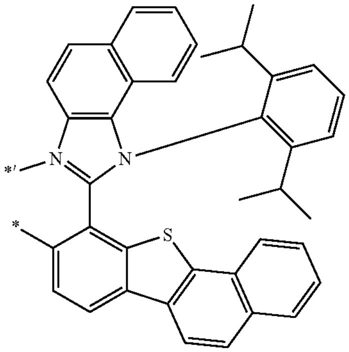
-continued
B355
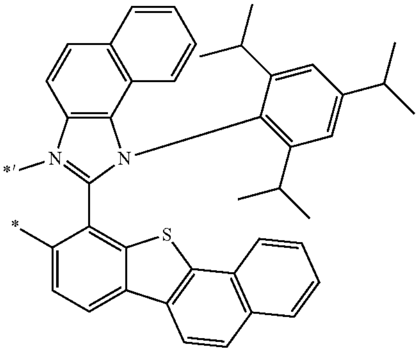
B356
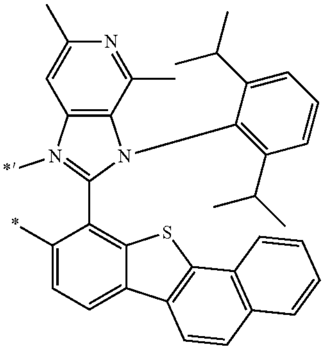
B357
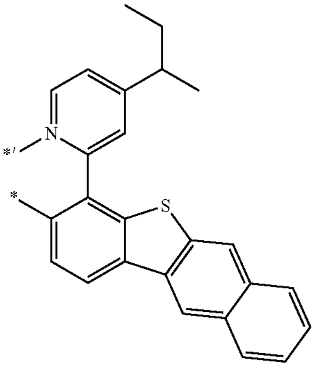
B358
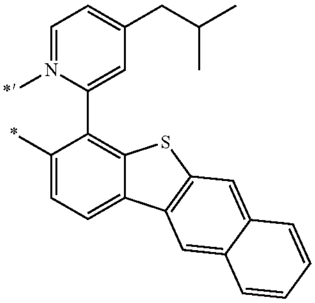

B359
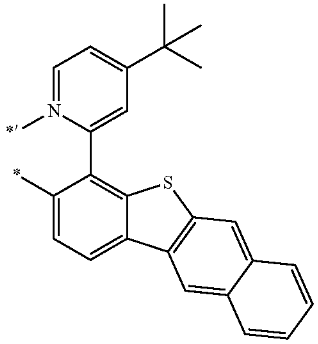
B360
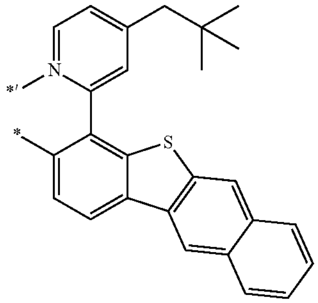
B361
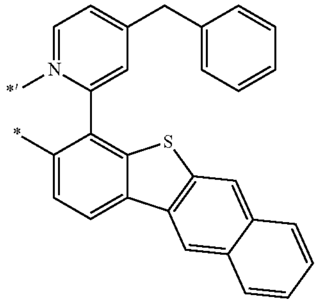
B362
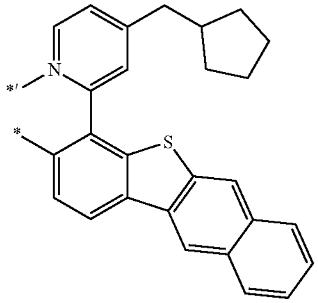
B363
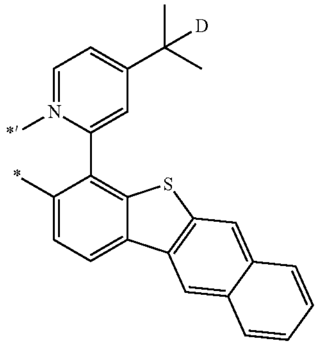
B364
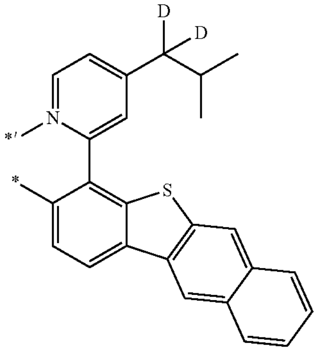
B365
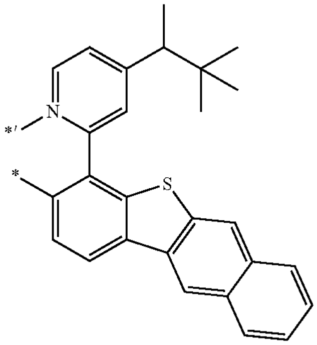
B366
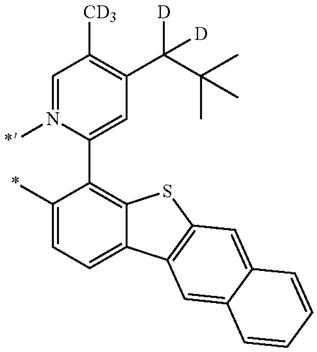
B367
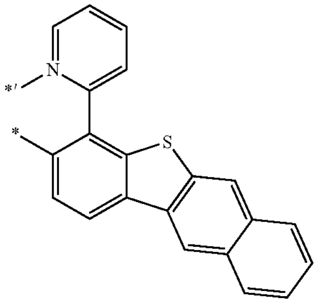

-continued
B368
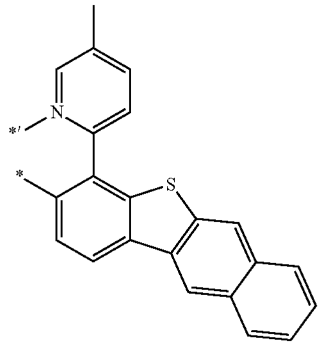
B369
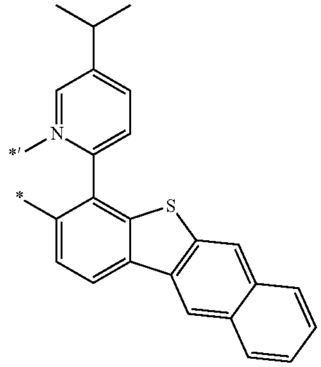
B370
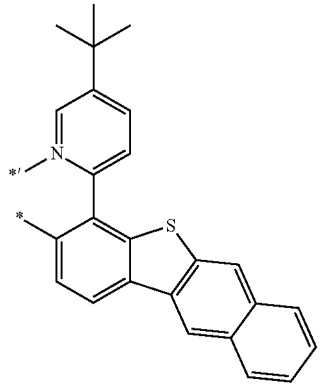
B371
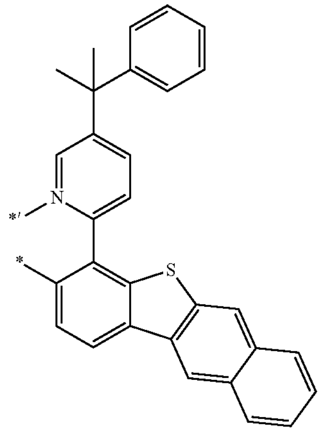
-continued
B372
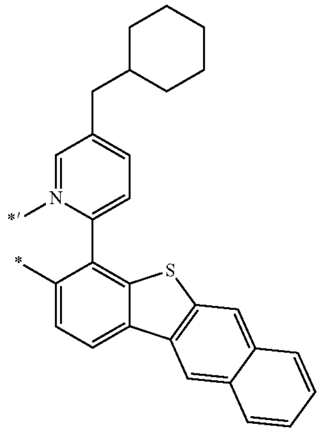
B373
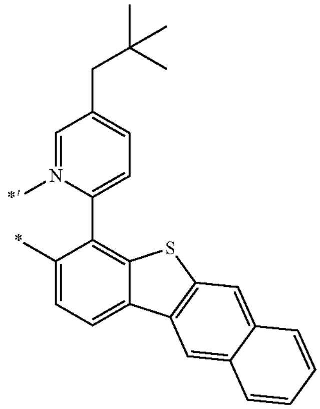
B374
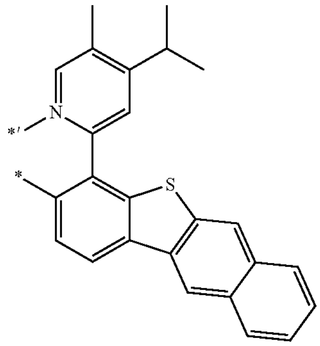
B375
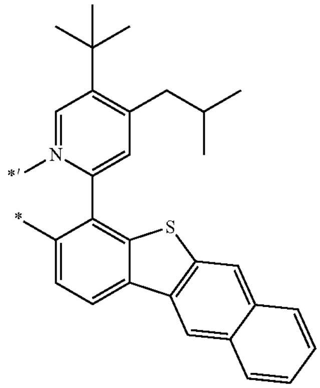

-continued
B376
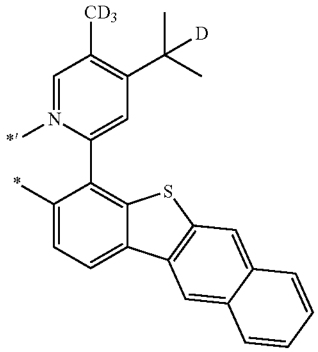
B377
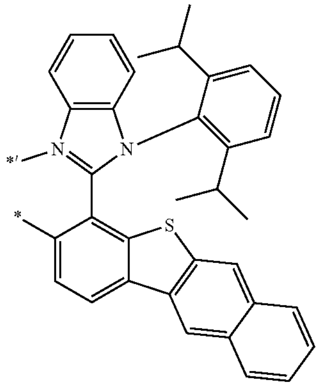
B378
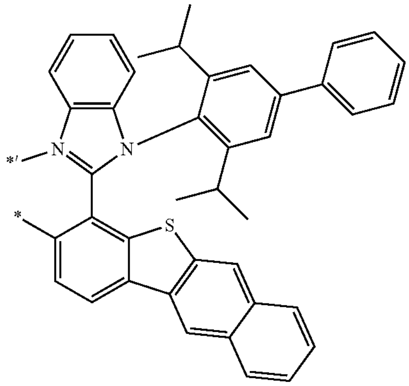
B379
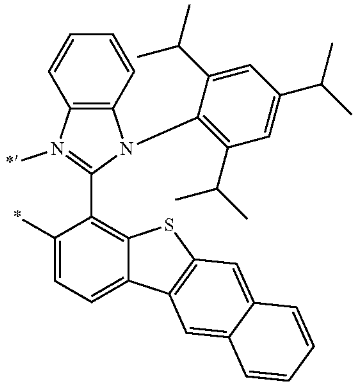
-continued
B380
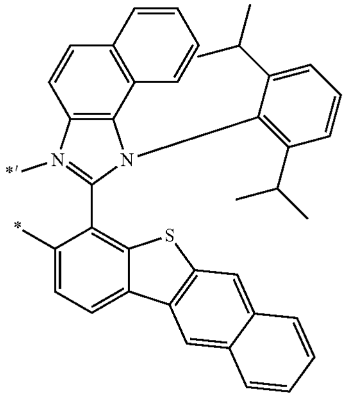
B381
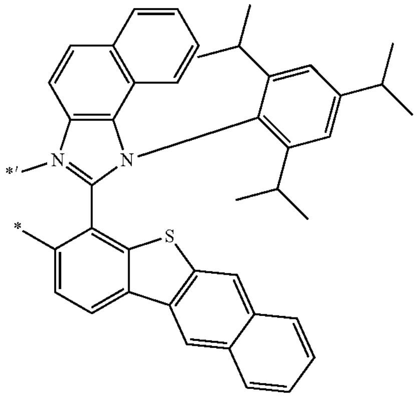
B382
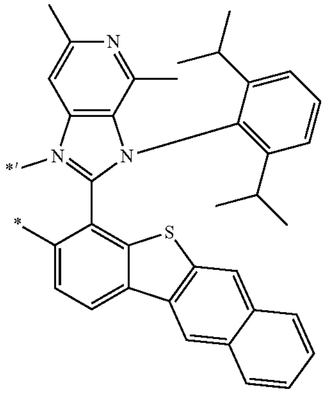
B383
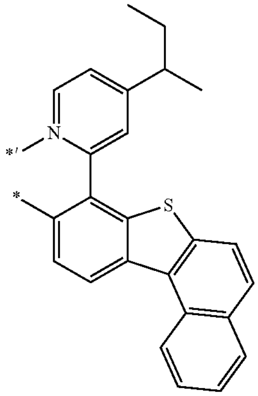

-continued
B384
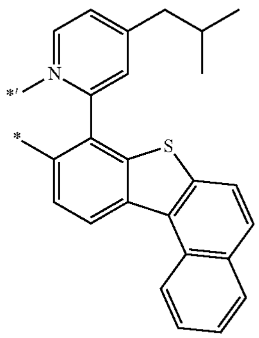
B385
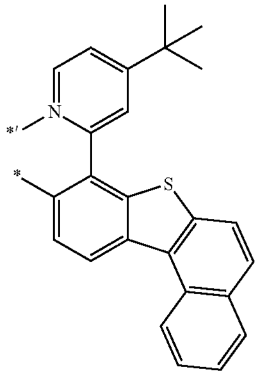
B386
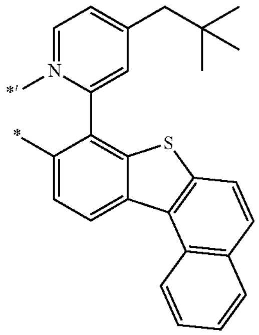
B387
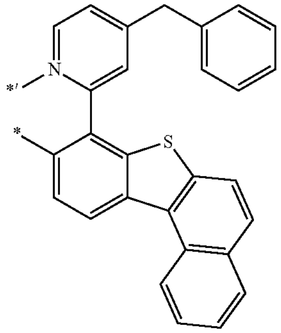
-continued
B388
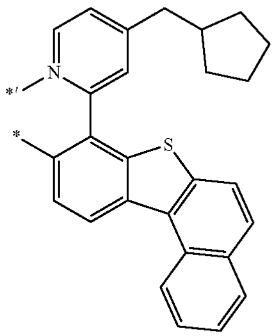
B389
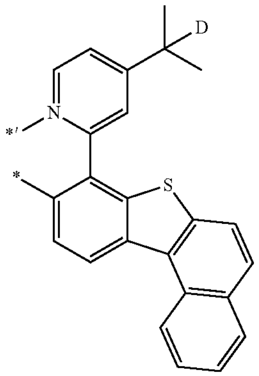
B390
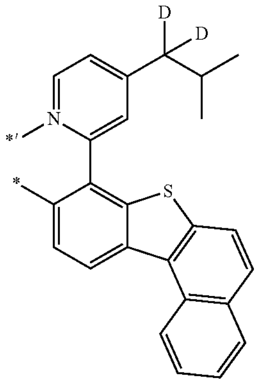
B391
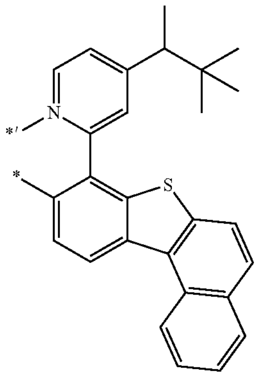

-continued
B392
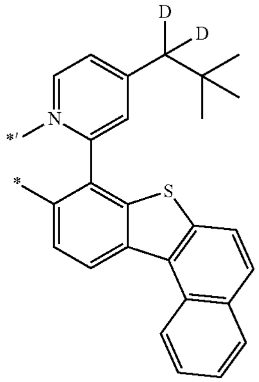
B393
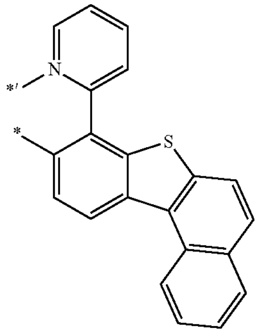
B394
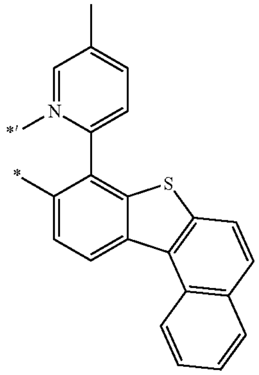
B395
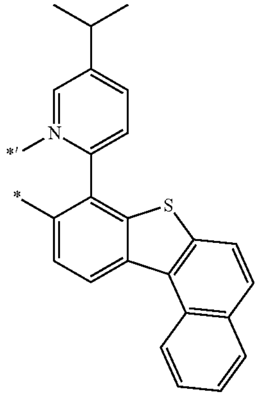
-continued
B396
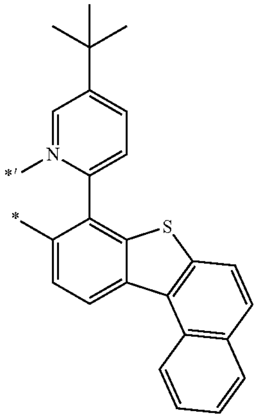
B397
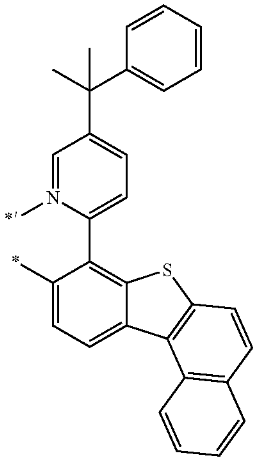
B398
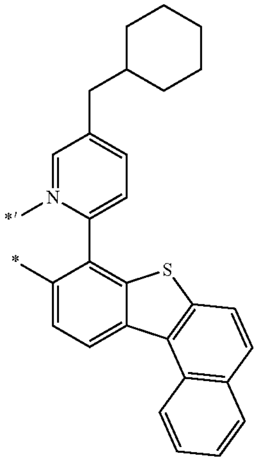

-continued
B399
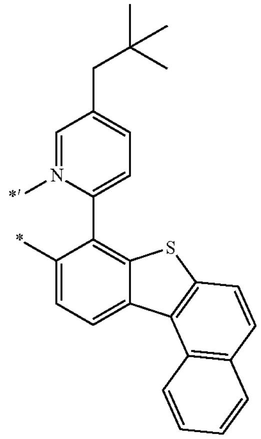
B400
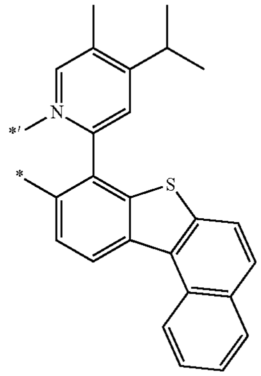
B401
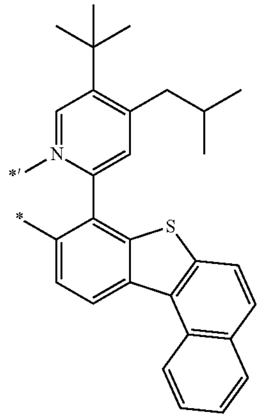
B402
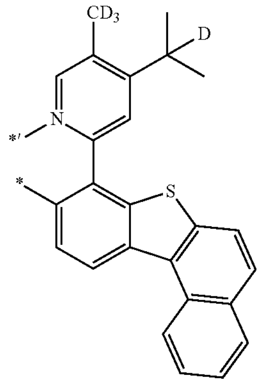
-continued
B403
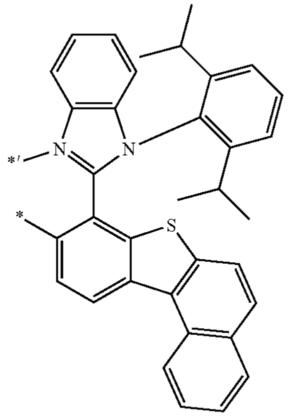
B404
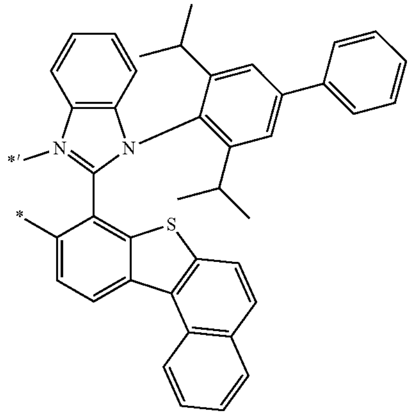
B405
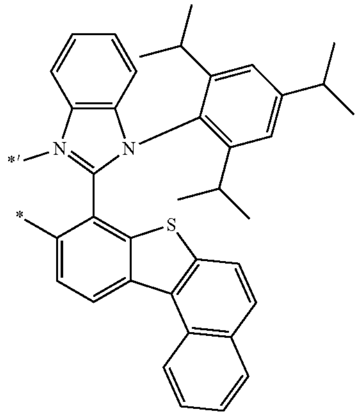

-continued
B406
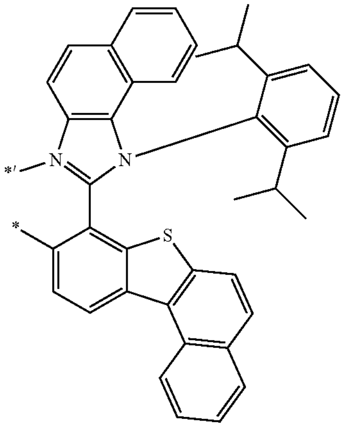
B407
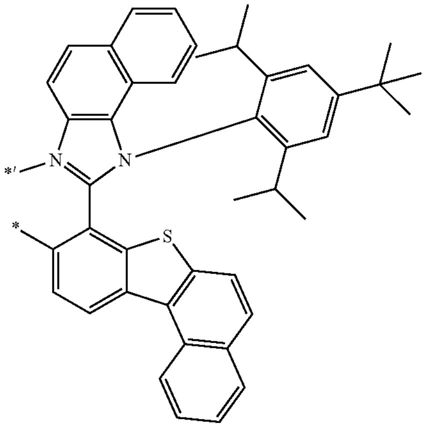
B408
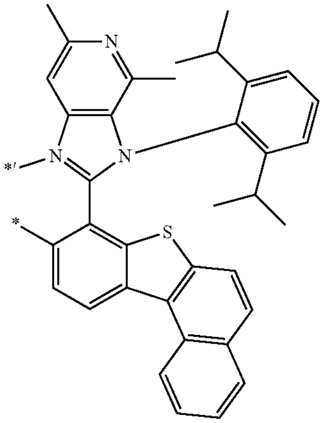
B409
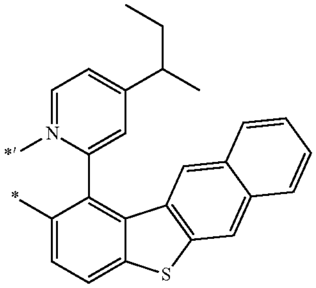
-continued
B410
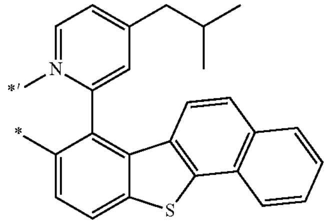
B411
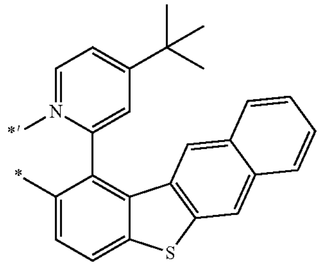
B412
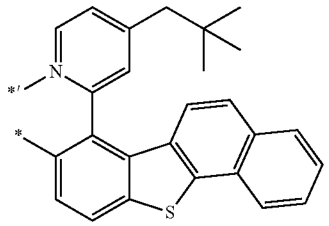
B413
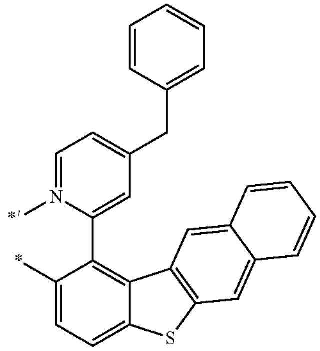
B414
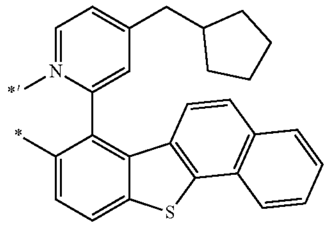
B415
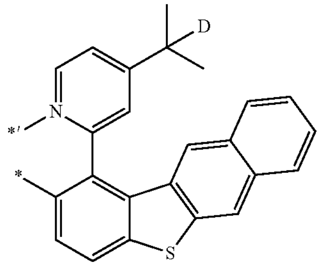

-continued
B416
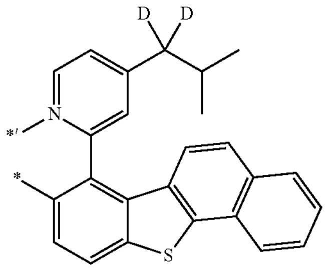
B417
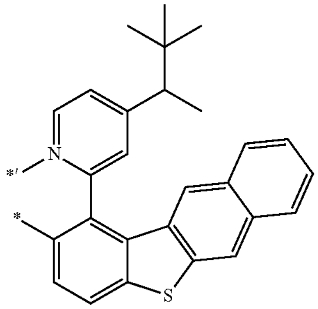
B418
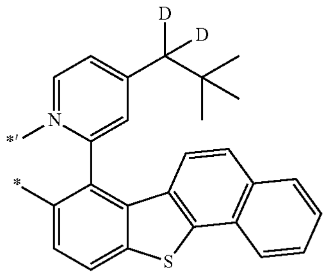
B419
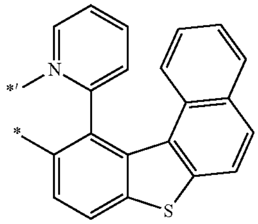
B420
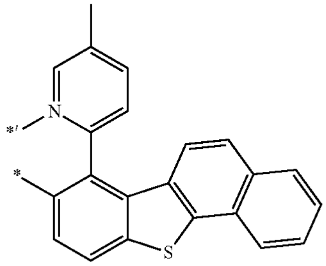
-continued
B421
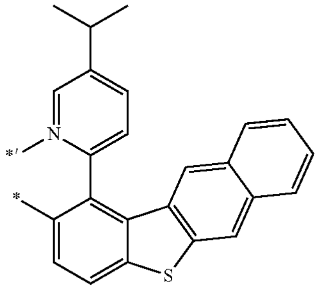
B422
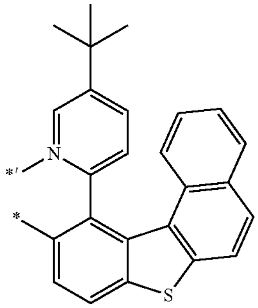
B423
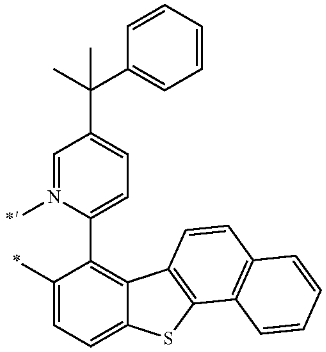
B424
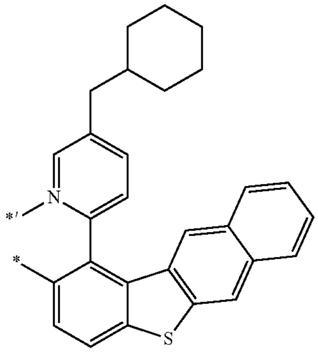

B425
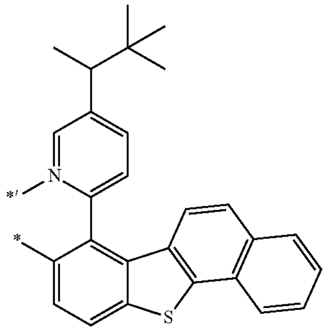
B426
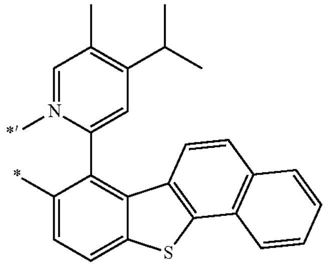
B427
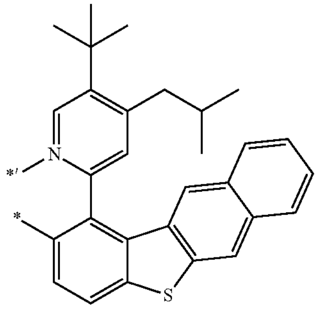
B428
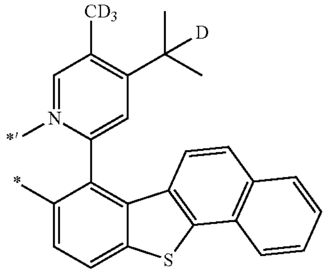
B429
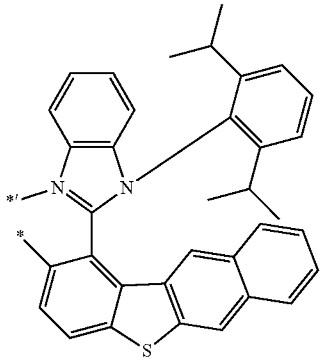
B430
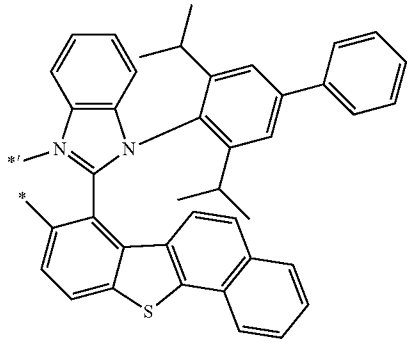
B431
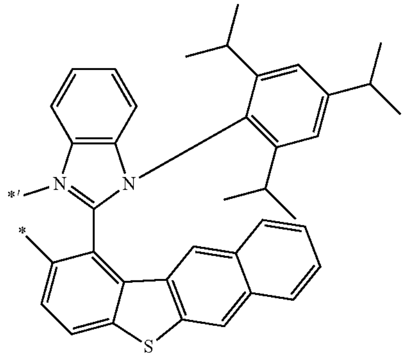
B432
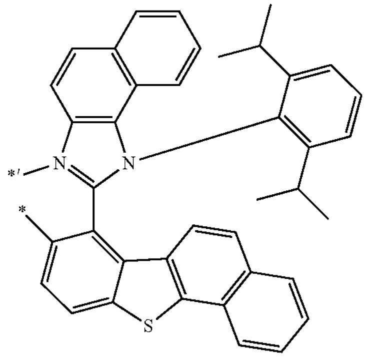
B433
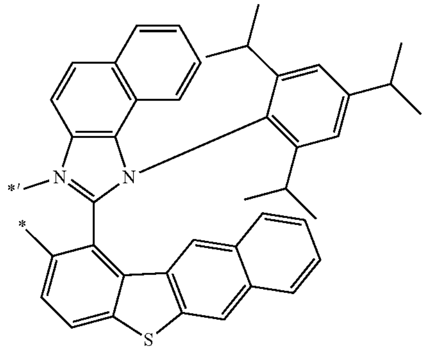

-continued
B434
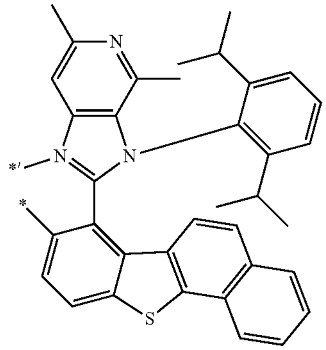
B435
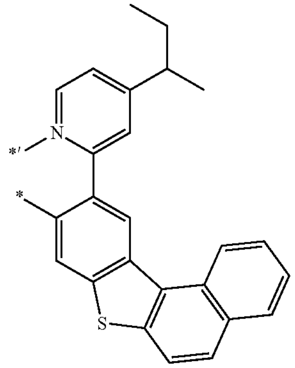
B436
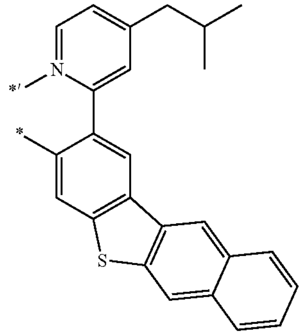
B437
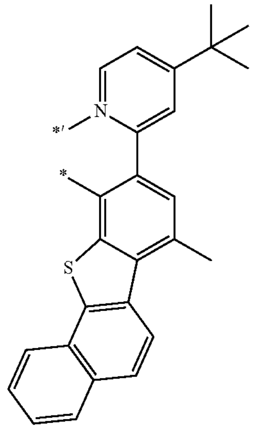
-continued
B438
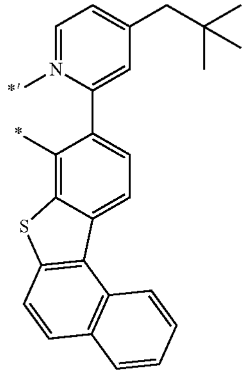
B439
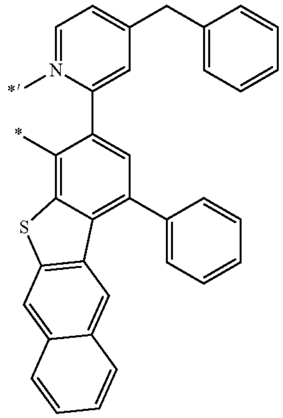
B440
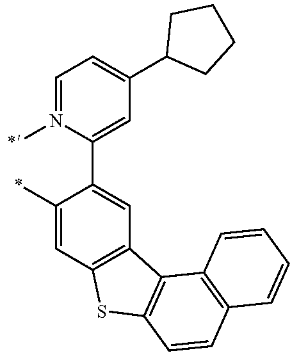
B441
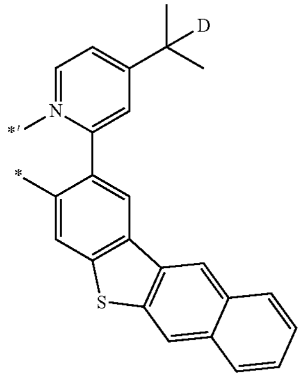

-continued
B442
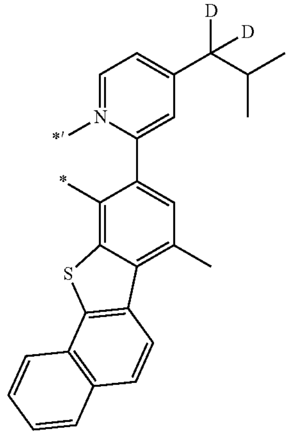
B443
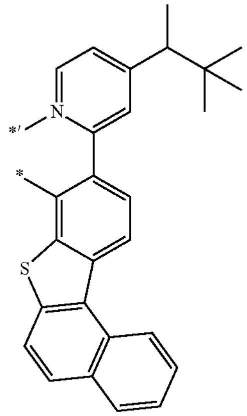
B444
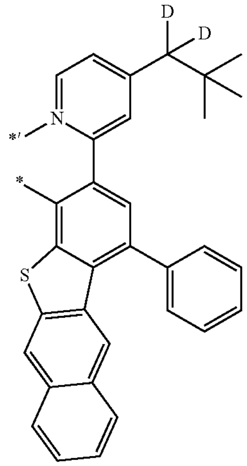
-continued
B445
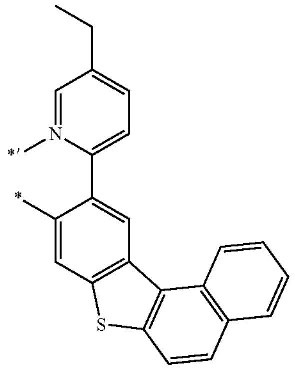
B446
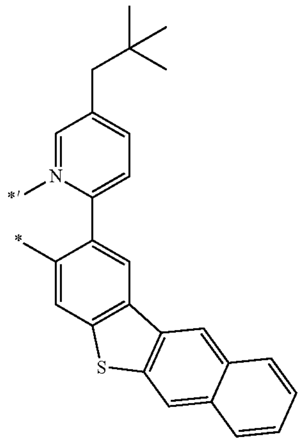
B447
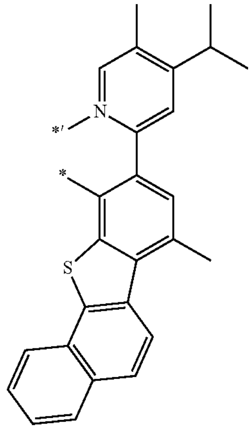

-continued
B448
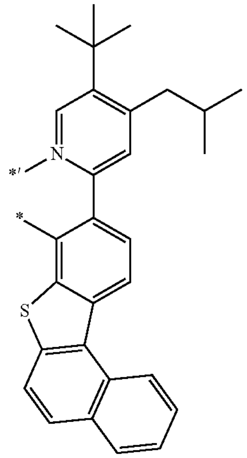
B449
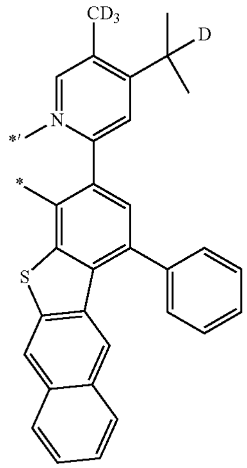
B450
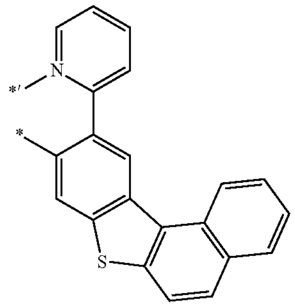
-continued
B451
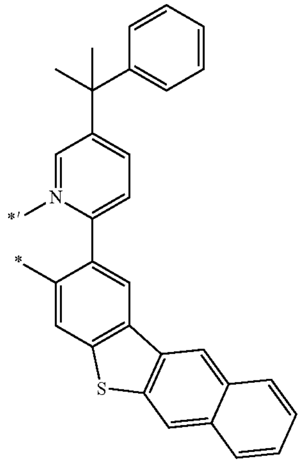
B452
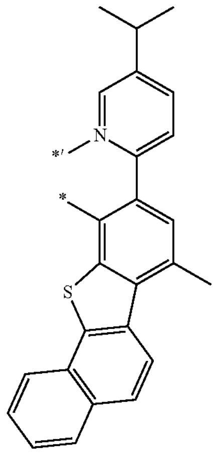
B453
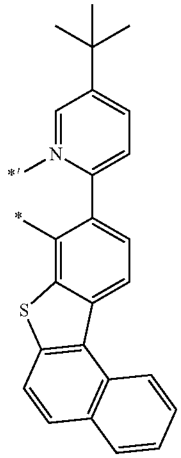

-continued
B454
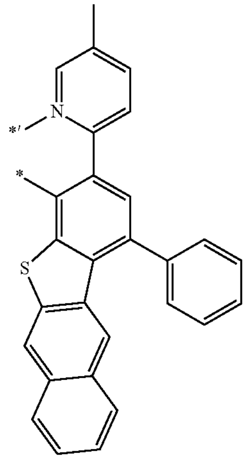
B455
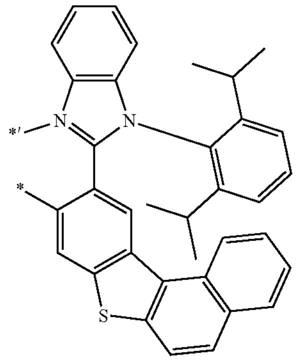
B456
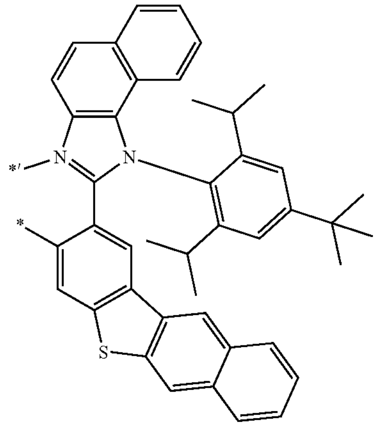
-continued
B457
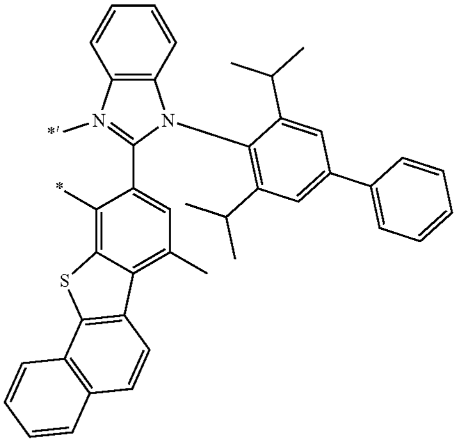
B458
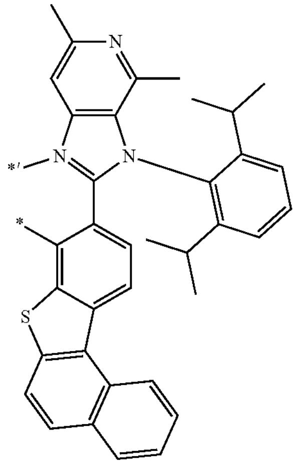
B459
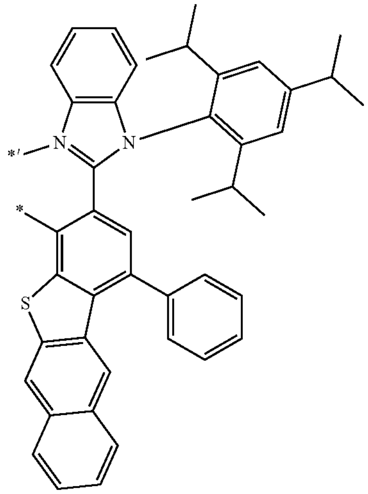

-continued
B460
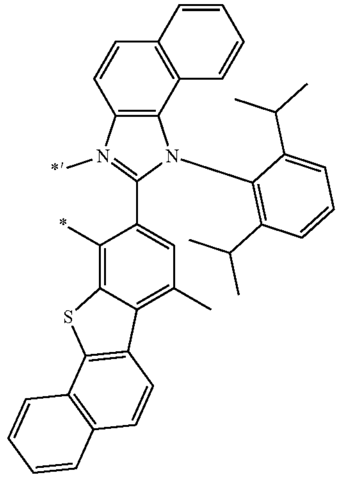
B461
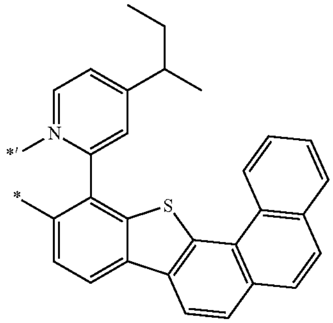
B462
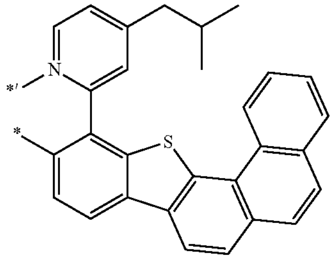
B463
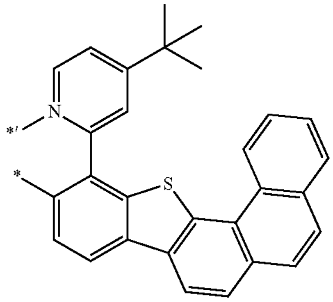
B464
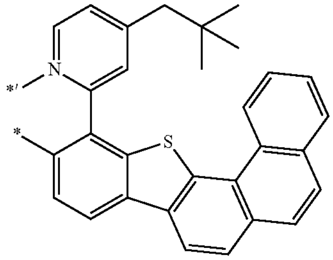
-continued
B465
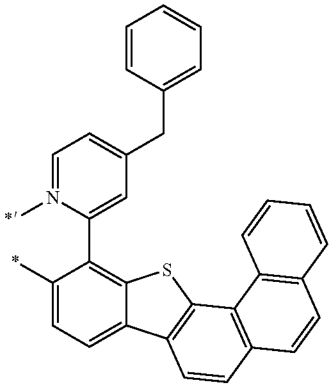
B466
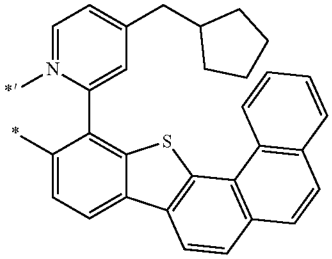
B467
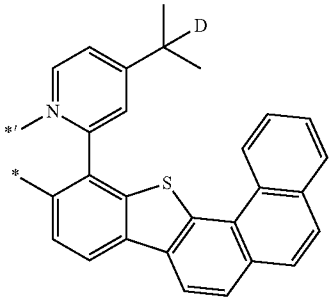
B468
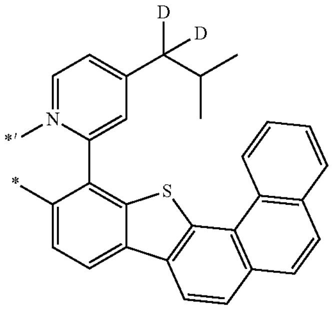
B469
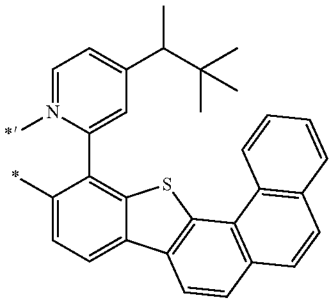

-continued
B470
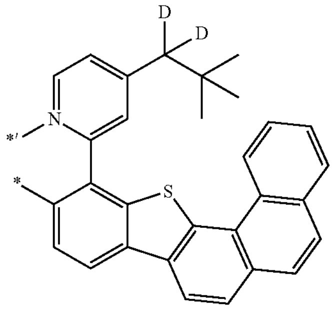
B471
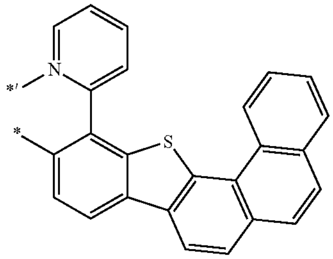
B472
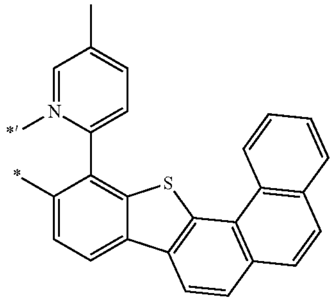
B473
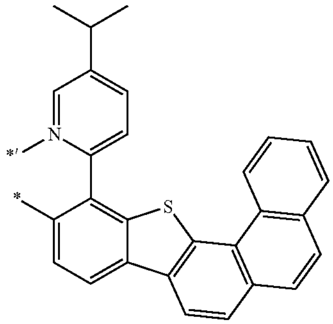
B474
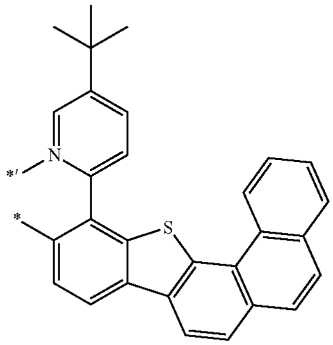
-continued
B475
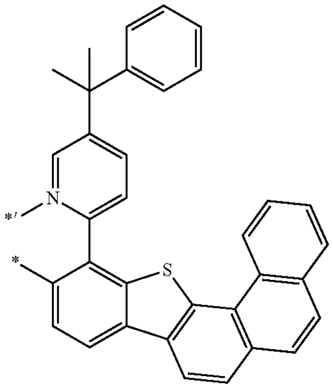
B476
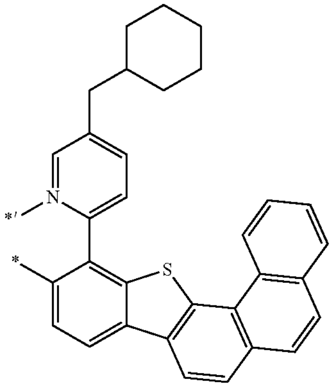
B477
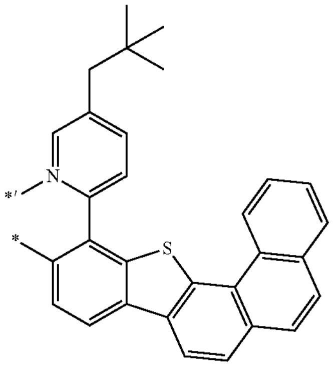
B478
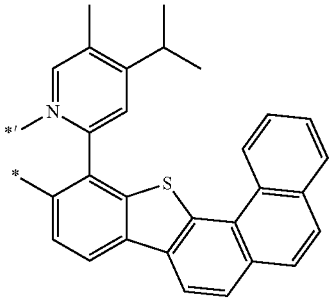

-continued
B479
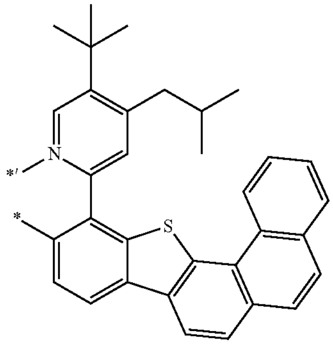
B480
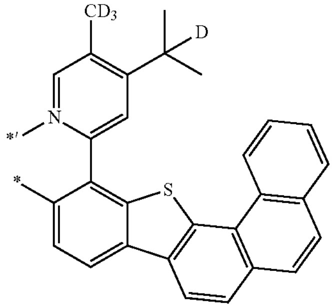
B481
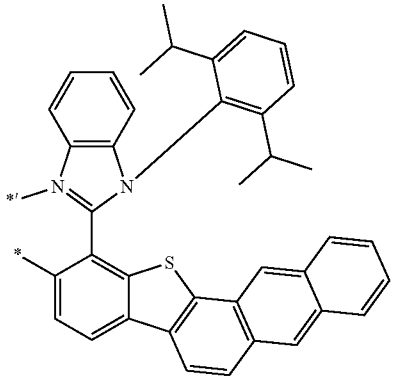
B482
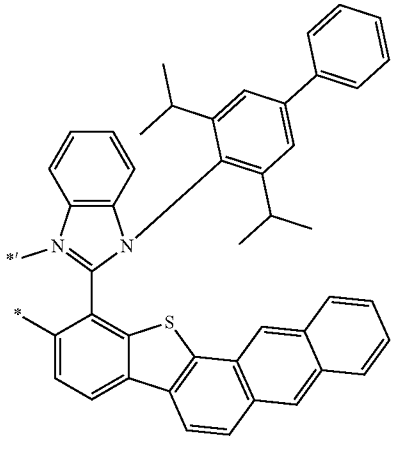
-continued
B483
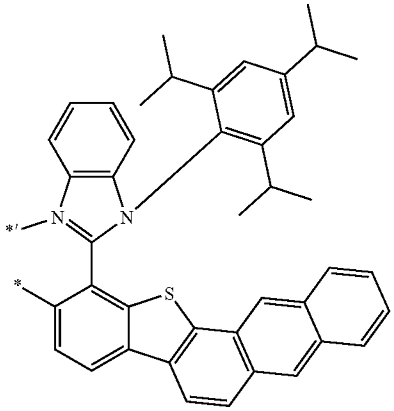
B484
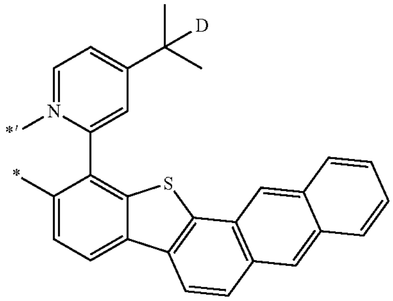
B485
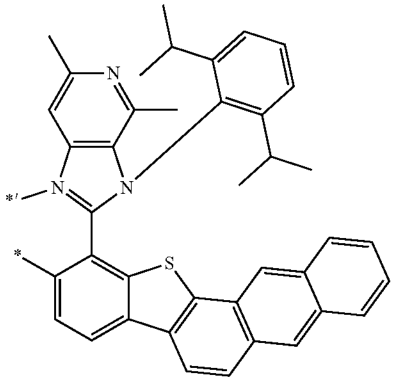
B486
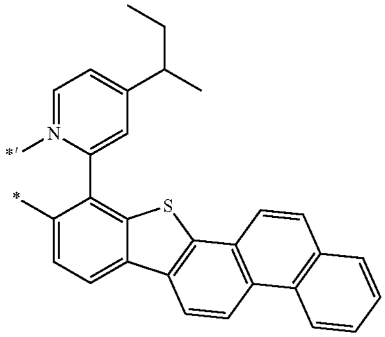

-continued
B487
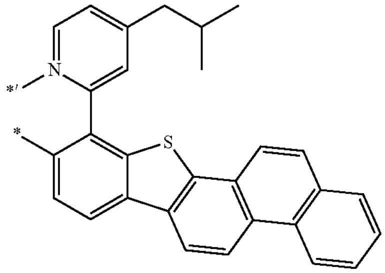
B488
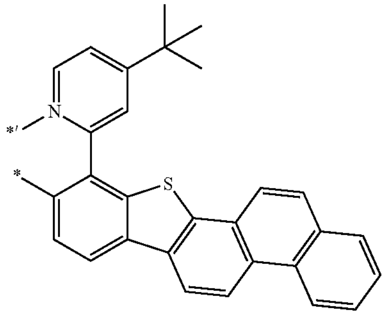
B489
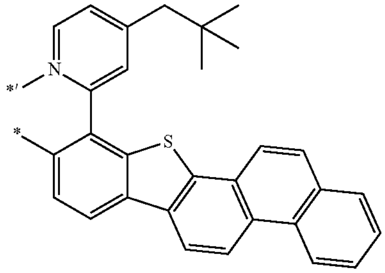
B490
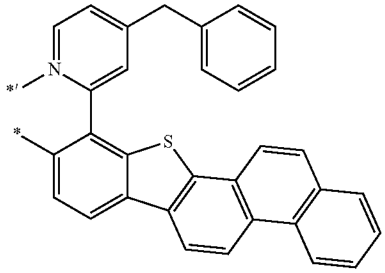
B491
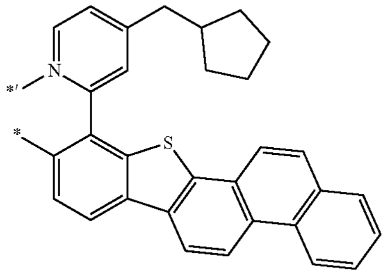
-continued
B492
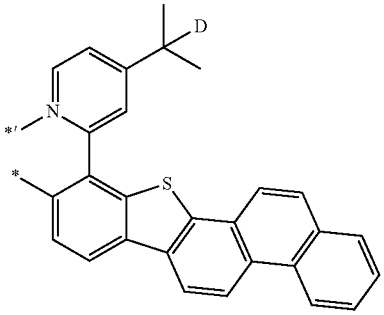
B493
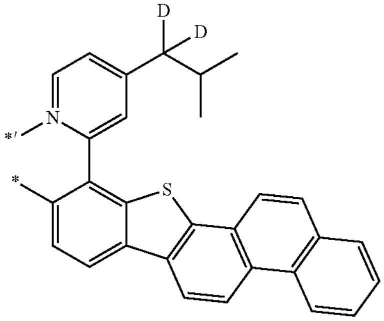
B494
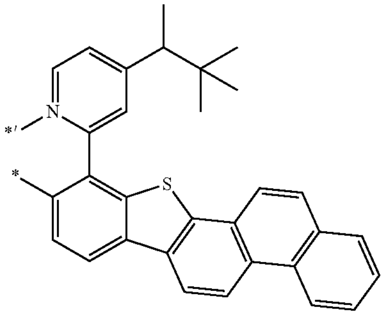
B495
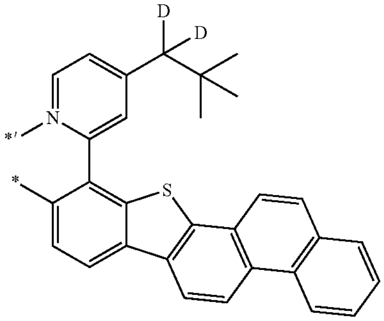
B496
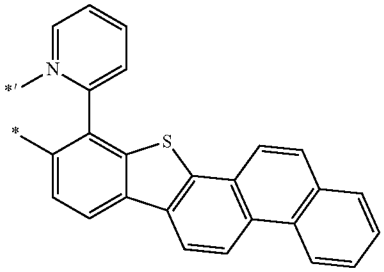

-continued
B497
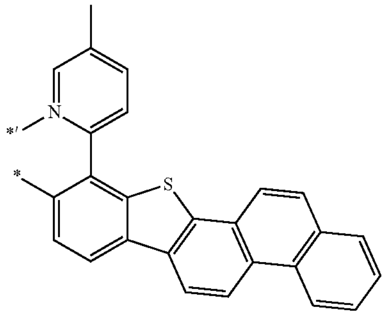
B498
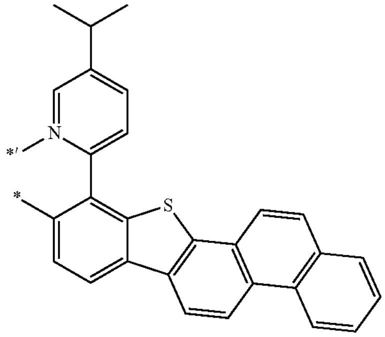
B499
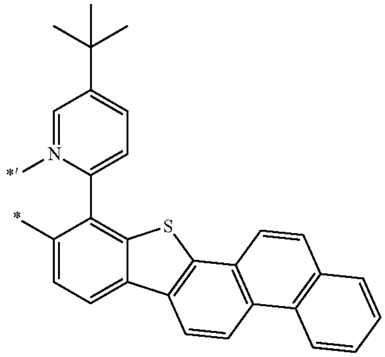
B500
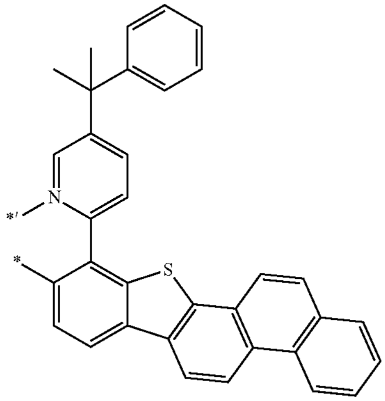
-continued
B501
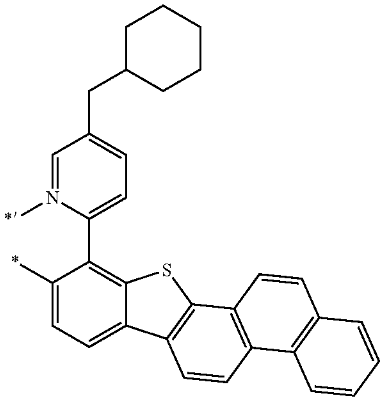
B502
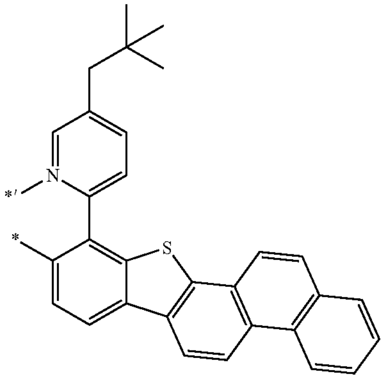
B503
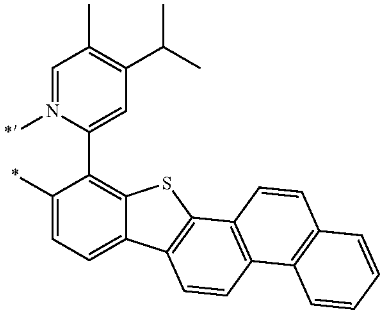
B504
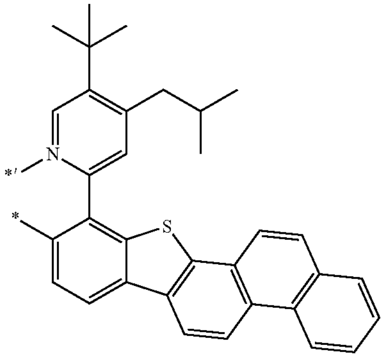

-continued
B505
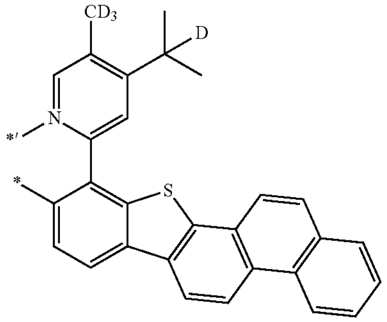
B506
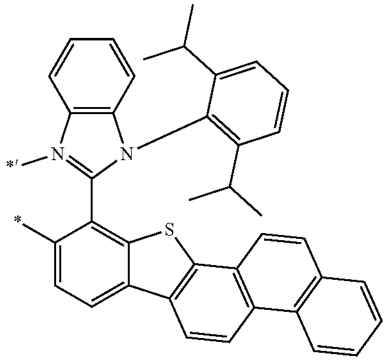
B507
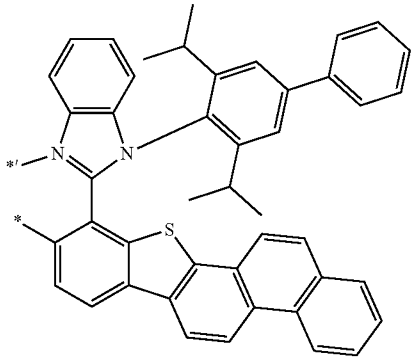
B508
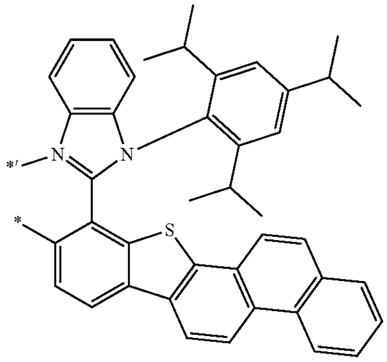
-continued
B509
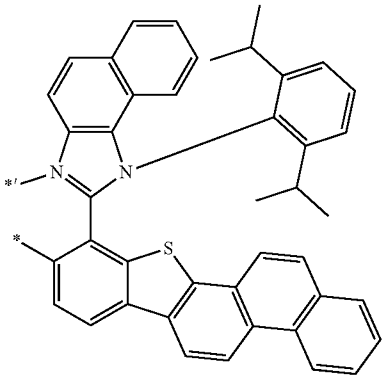
B510
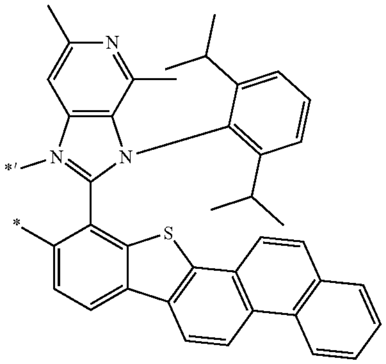
B511
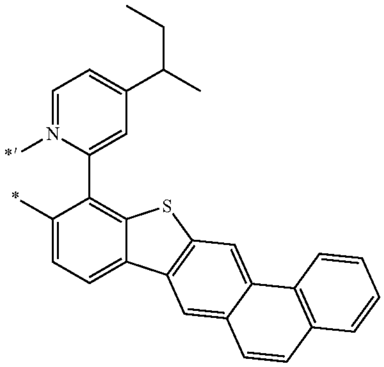
B512
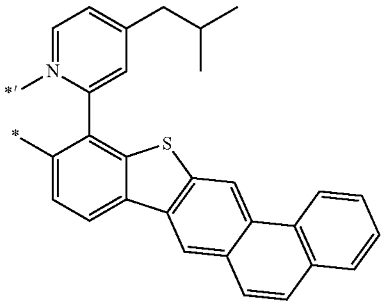

-continued
B513
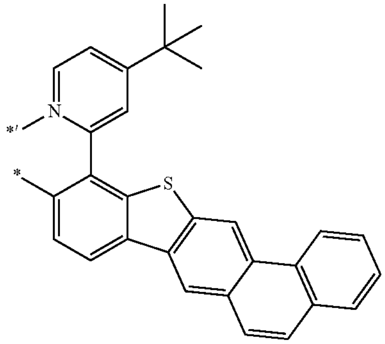
B514
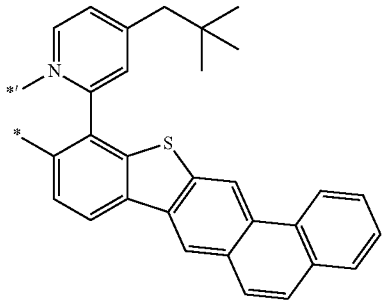
B515
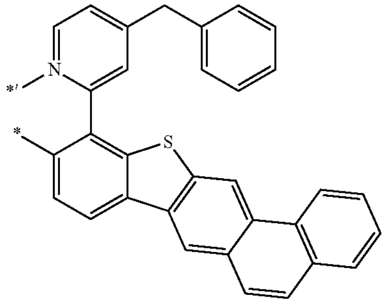
B516
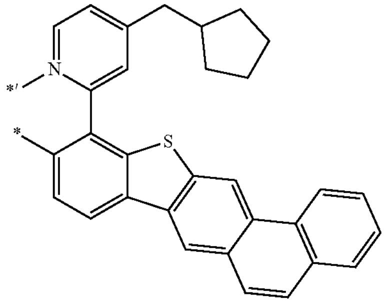
B517
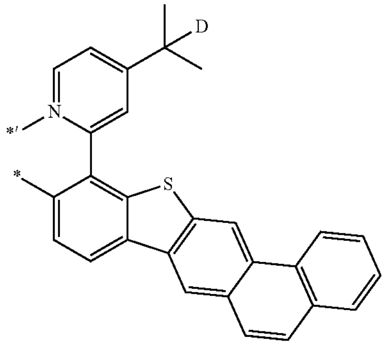
-continued
B518
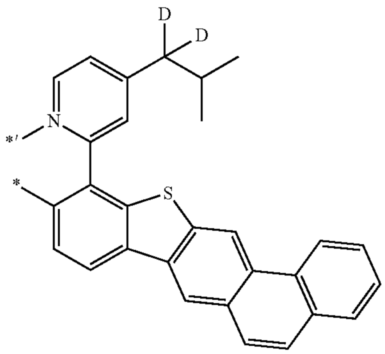
B519
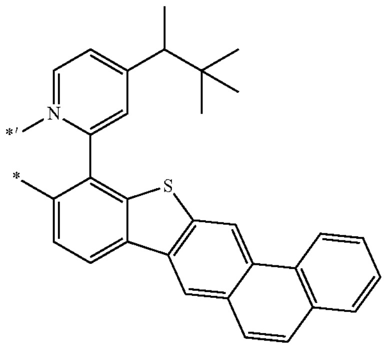
B520
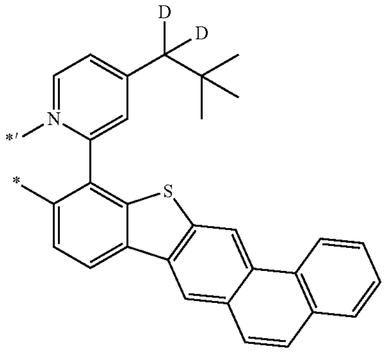
B521
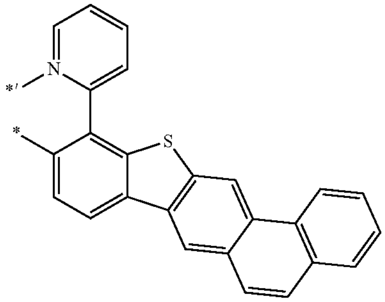

-continued
B522
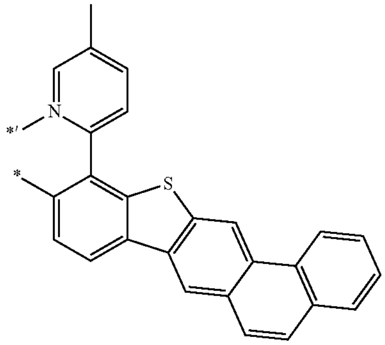
B523
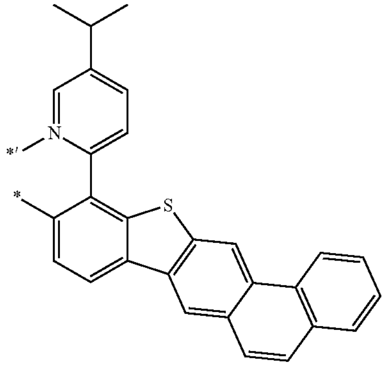
B524
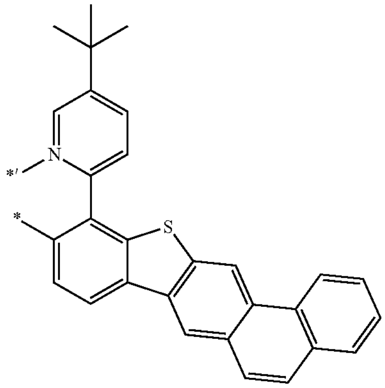
B525
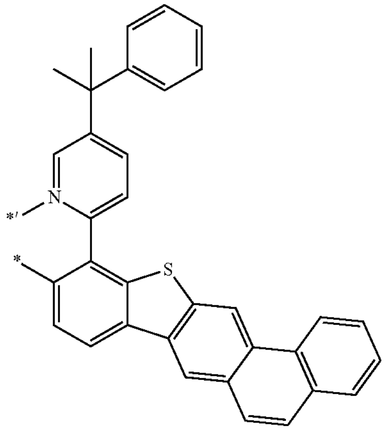
-continued
B526
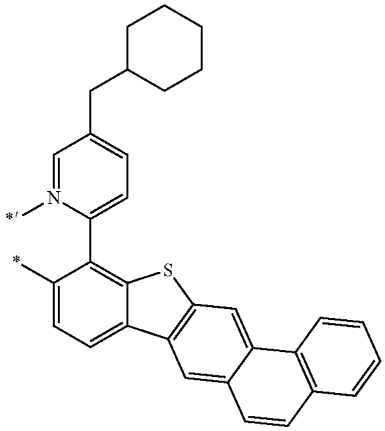
B527
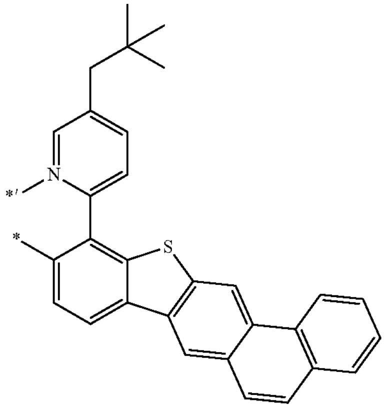
B528
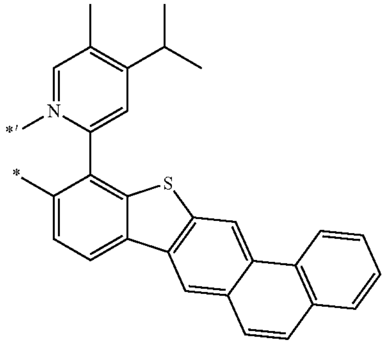
B529
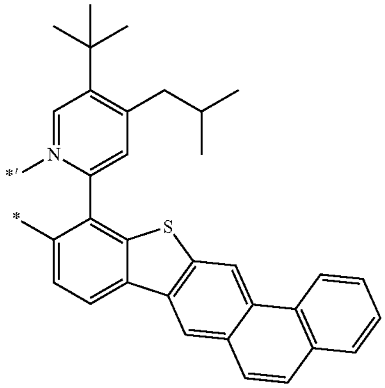

-continued
B530
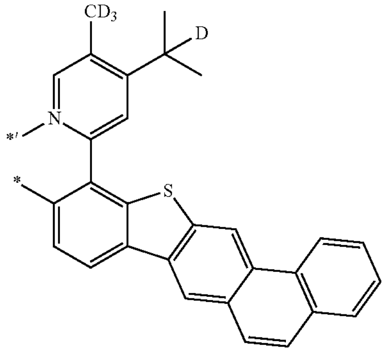
B531
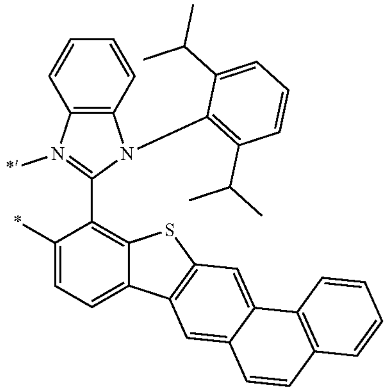
B532
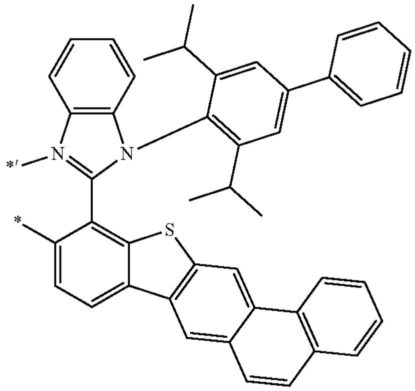
B533
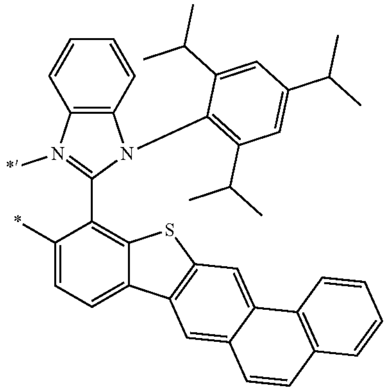
-continued
B534
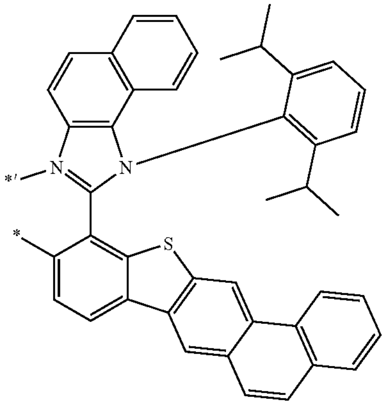
B535
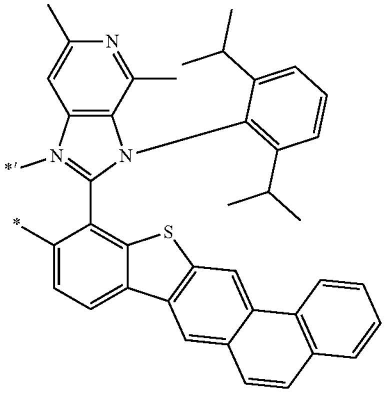
B536
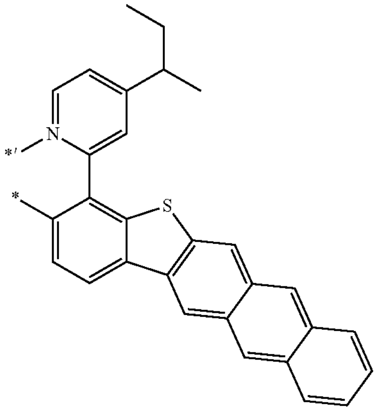
B537
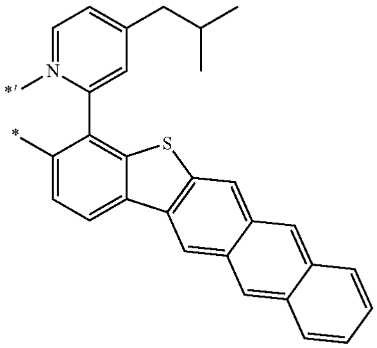

-continued
B538
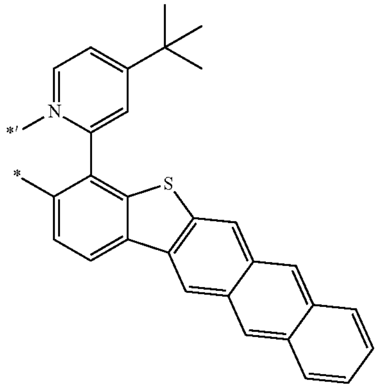
B539
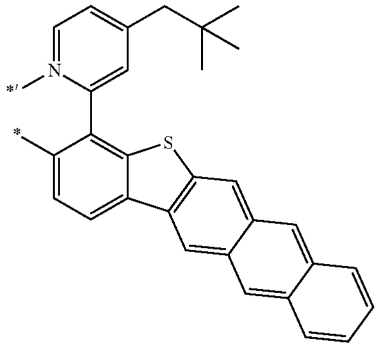
B540
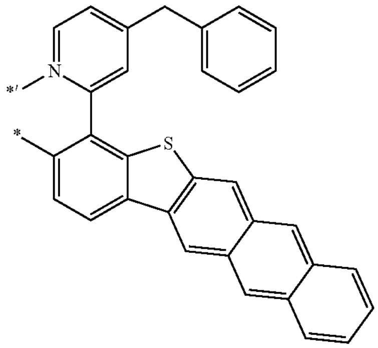
B541
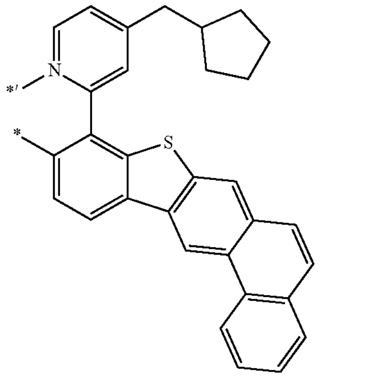
-continued
B542
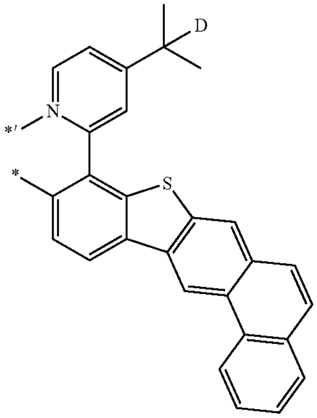
B543
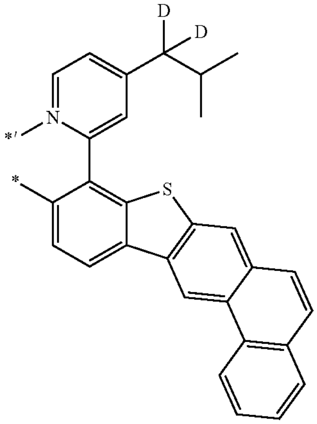
B544
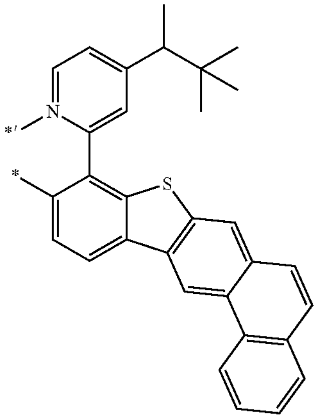

-continued
B545
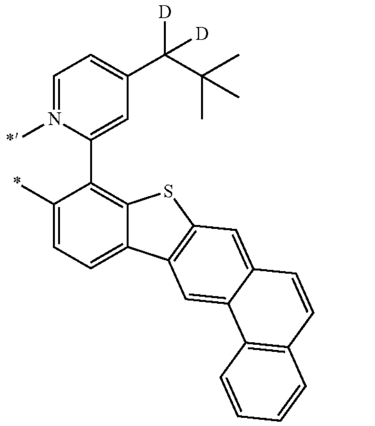
B546
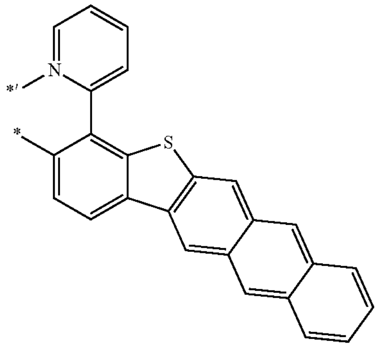
B547
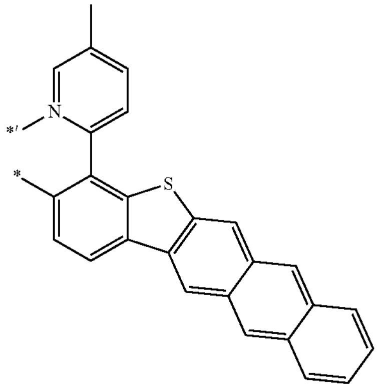
B548
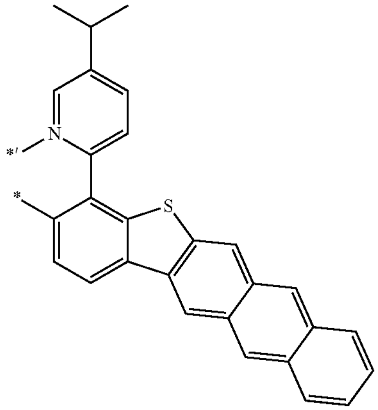
-continued
B549
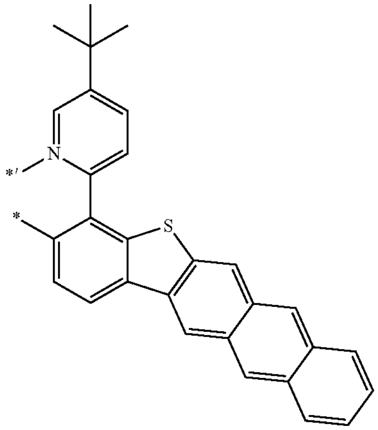
B550
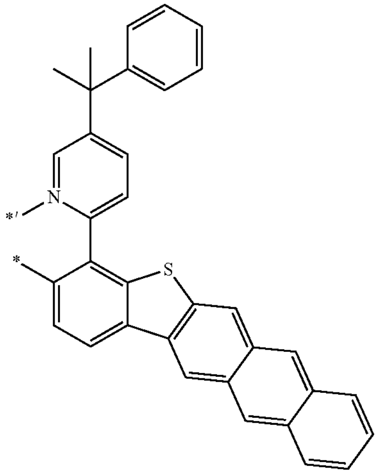
B551
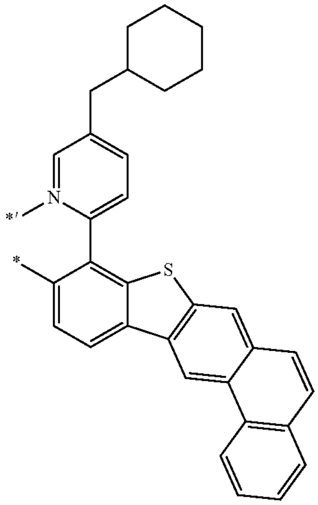

-continued
B552
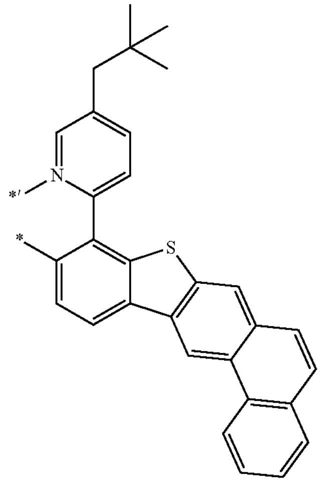
B553
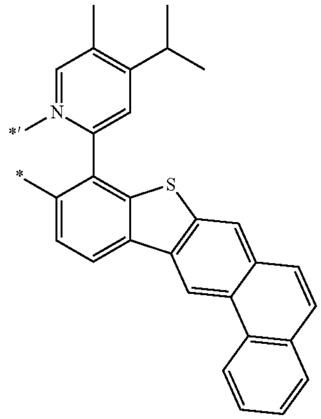
B554
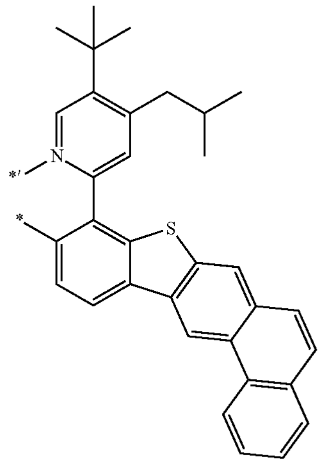
-continued
B555
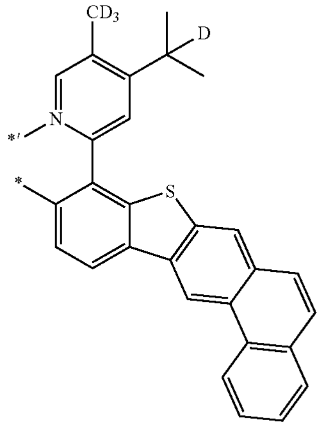
B556
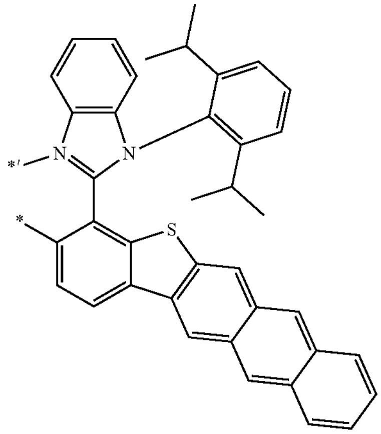
B557
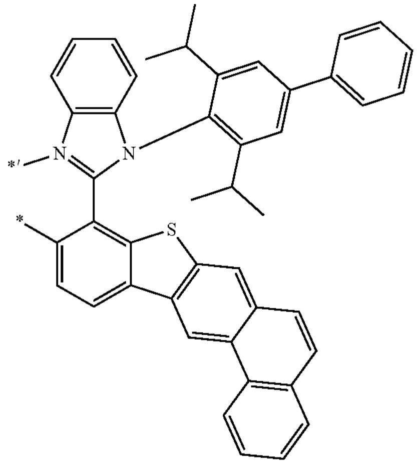

-continued
B558
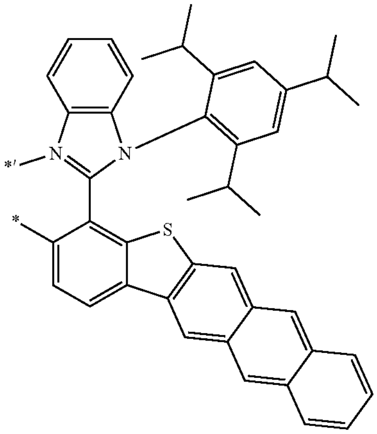
B559
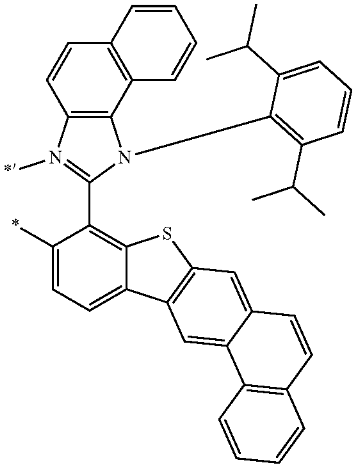
B560
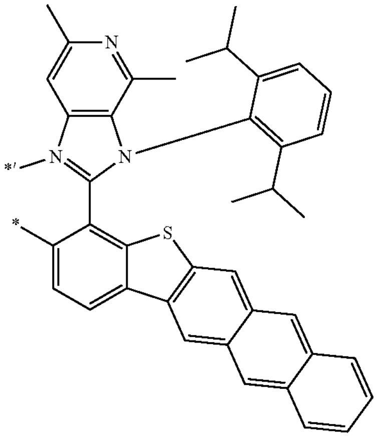
-continued
B561
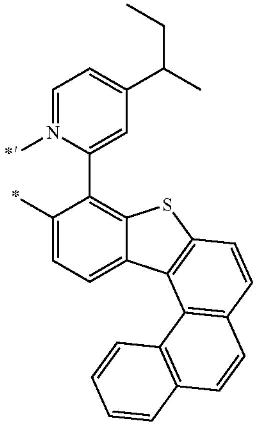
B562
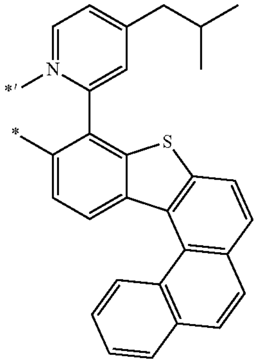
B563
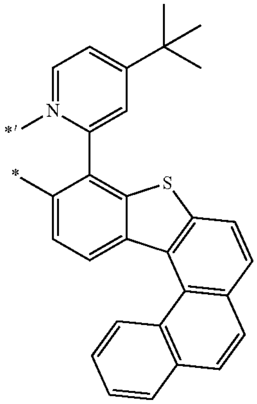
B564
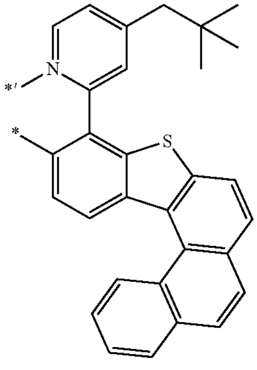

-continued
B565
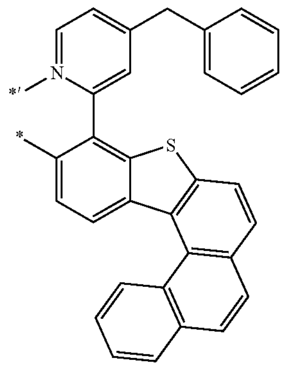
B566
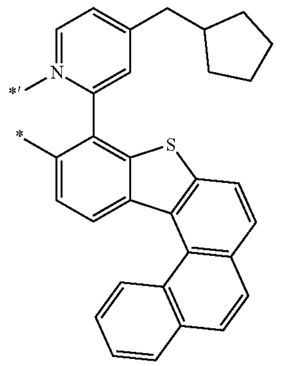
B567
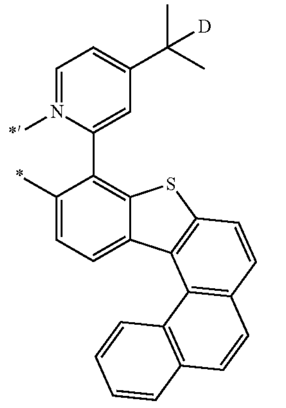
B568
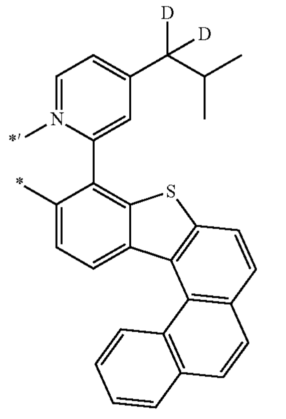
-continued
B569
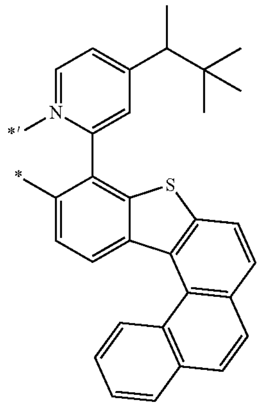
B570
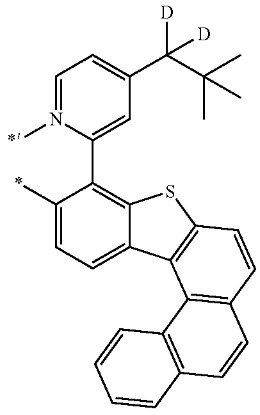
B571
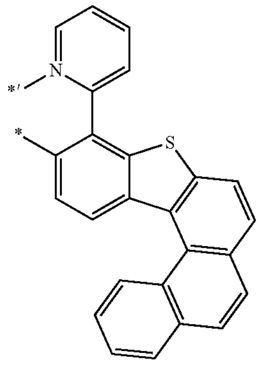
B572
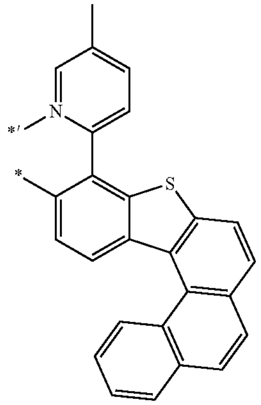

-continued
B573
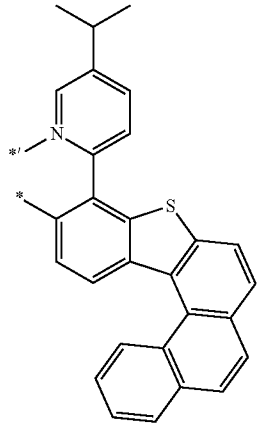
B574
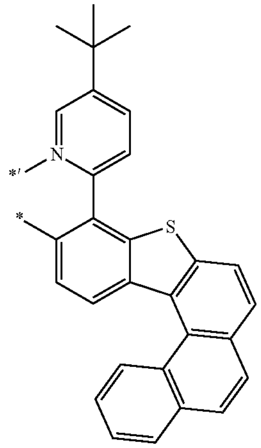
B575
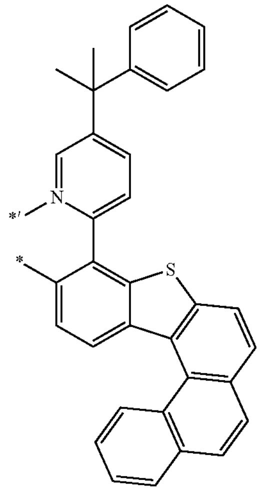
-continued
B576
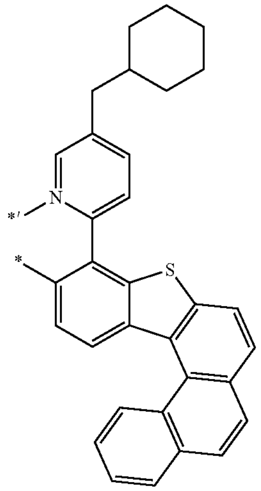
B577
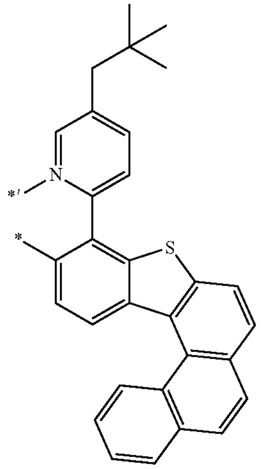
B578
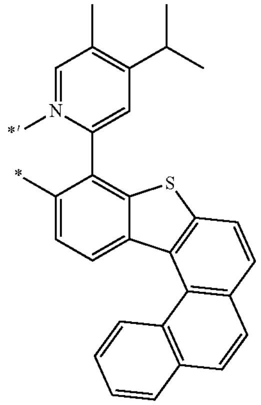

-continued
B579
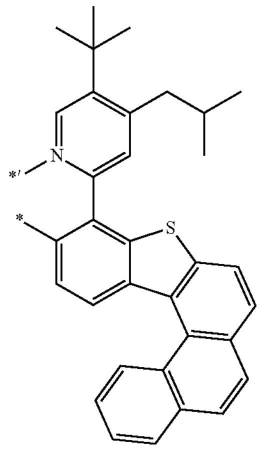
B580
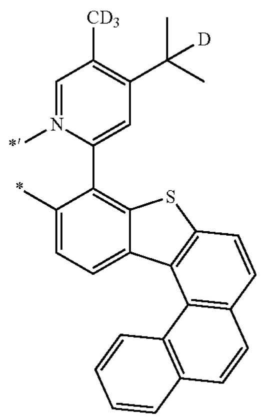
B581
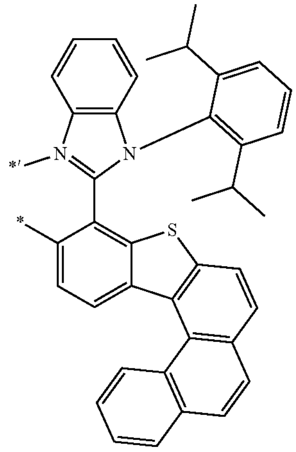
-continued
B582
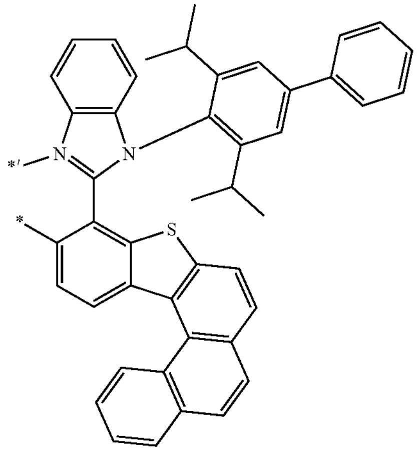
B583
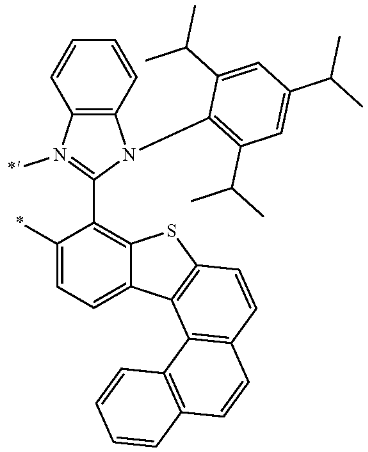
B584
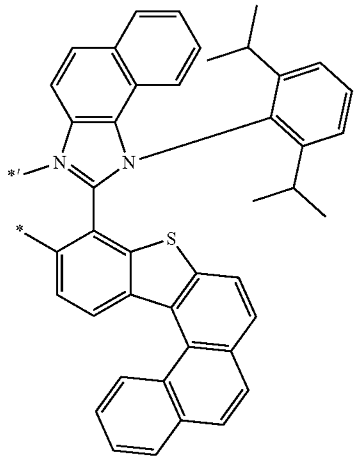

-continued
B585
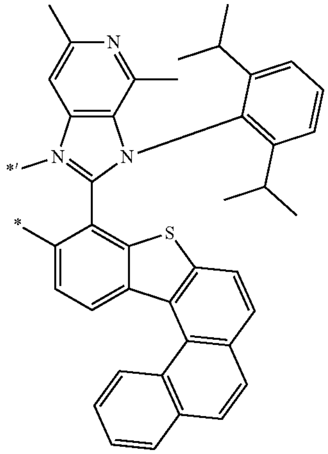
B586
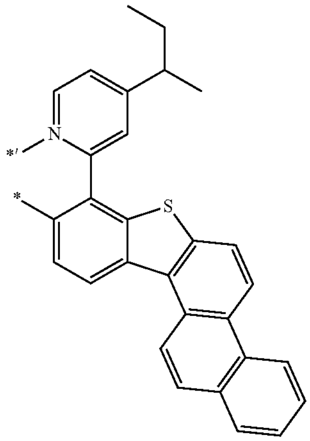
B587
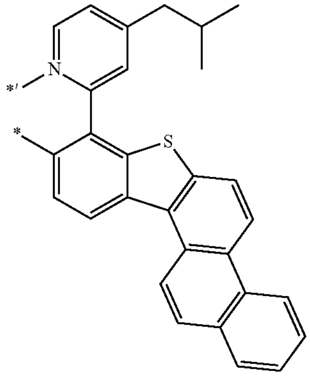
-continued
B588
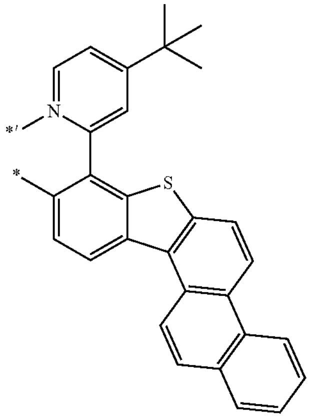
B589
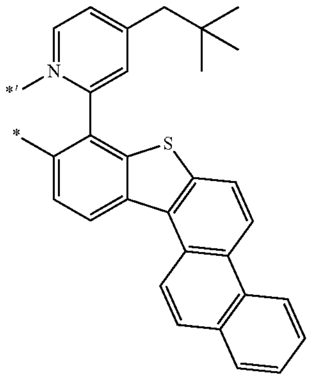
B590
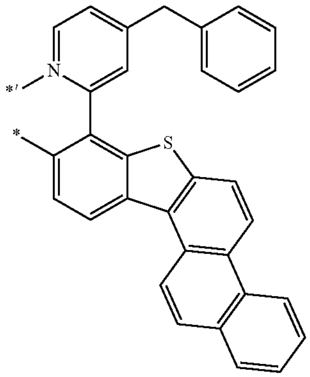
B591
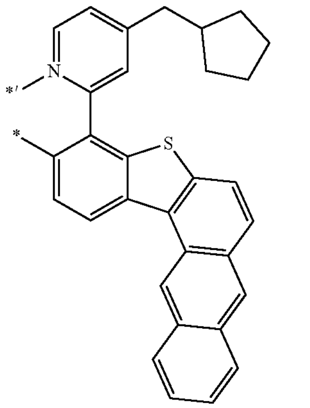

-continued
B592
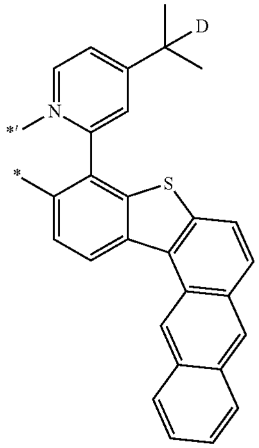
B593
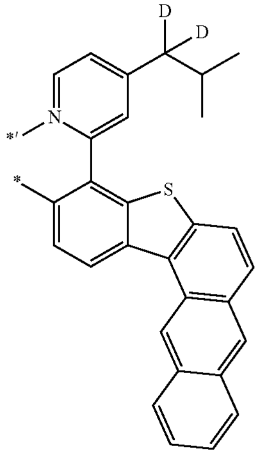
B594
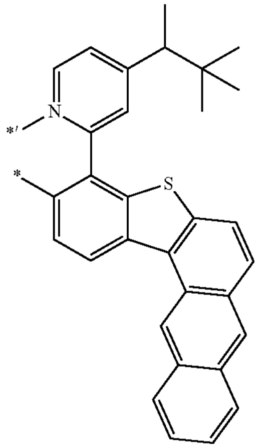
-continued
B595
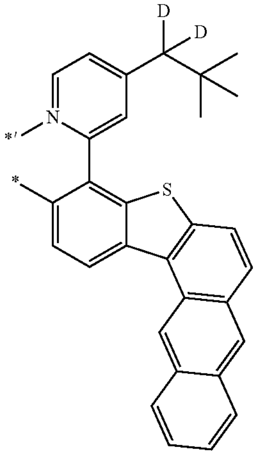
B596
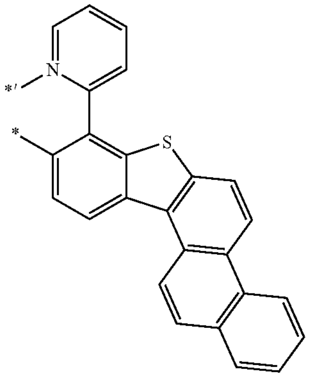
B597
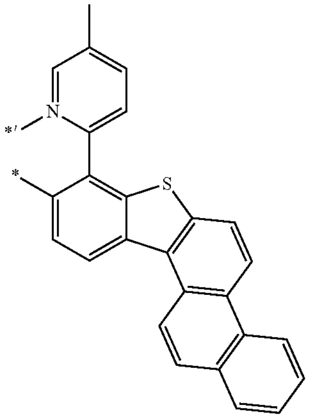

-continued
B598
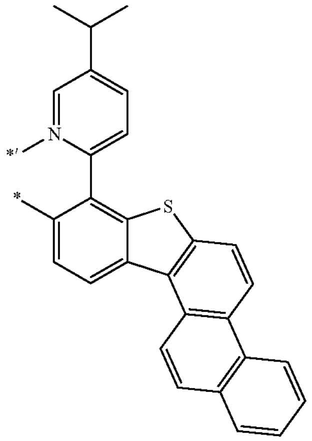
B599
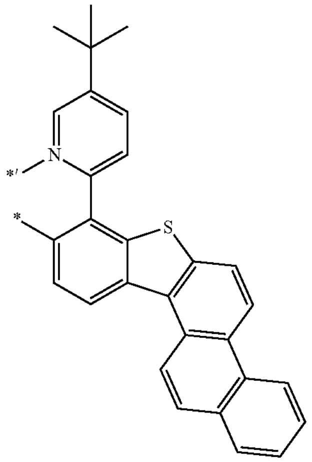
B600
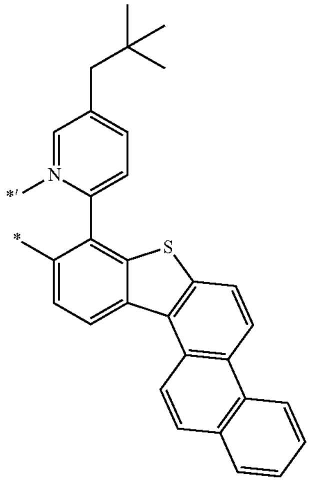
-continued
B601
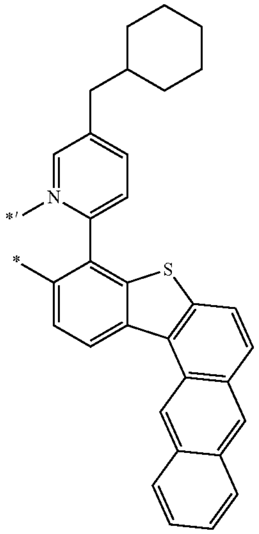
B602
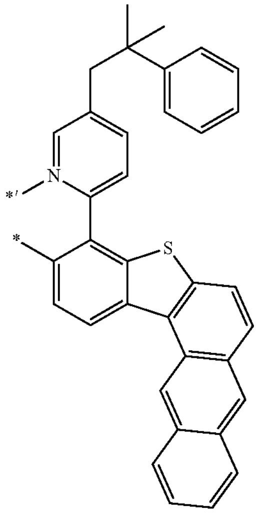
B603
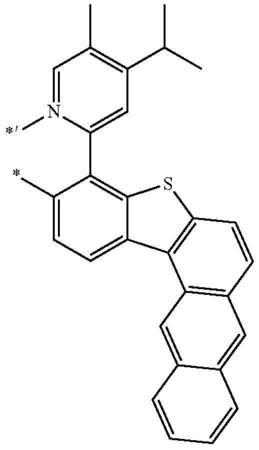

-continued
B604
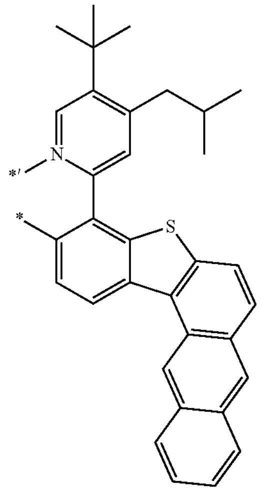
B605
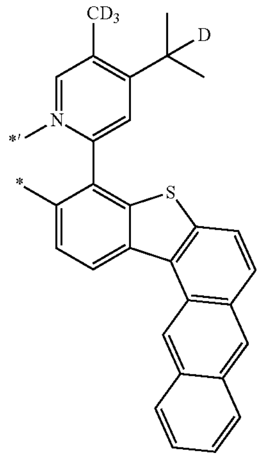
B606
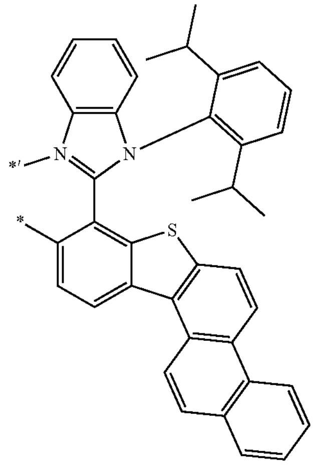
-continued
B607
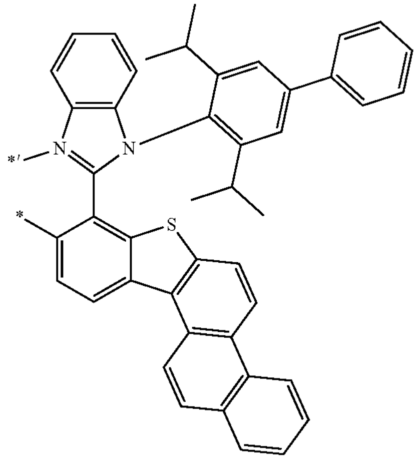
B608
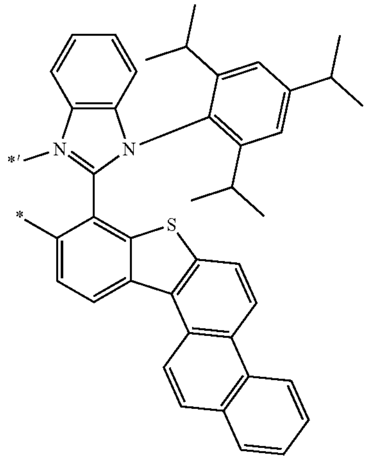
B609
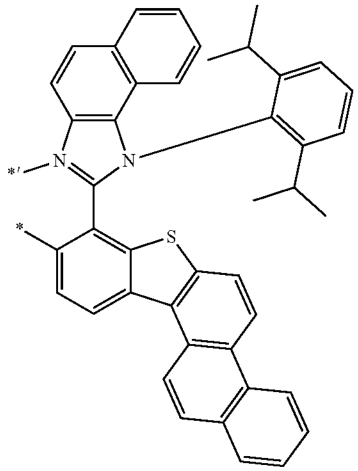

-continued
B610
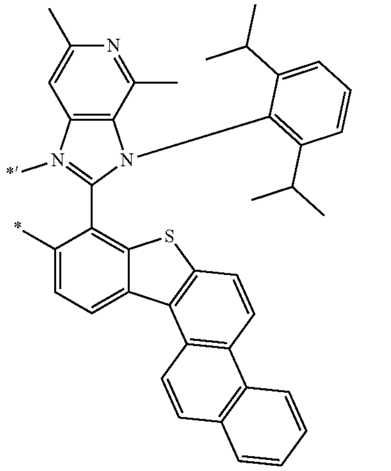
B611
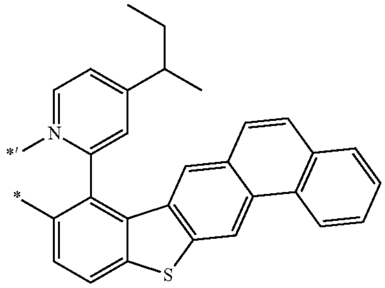
B612
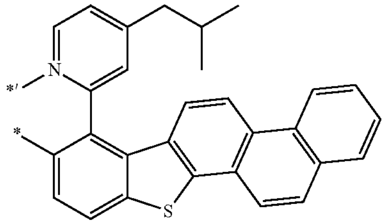
B613
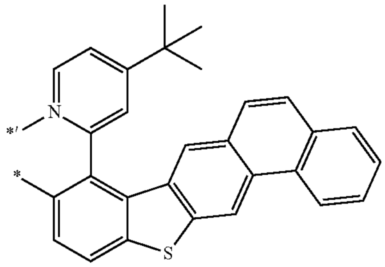
B614
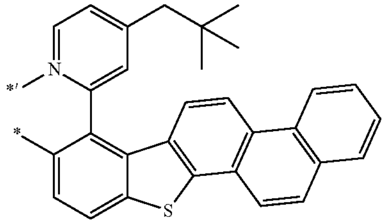
-continued
B615
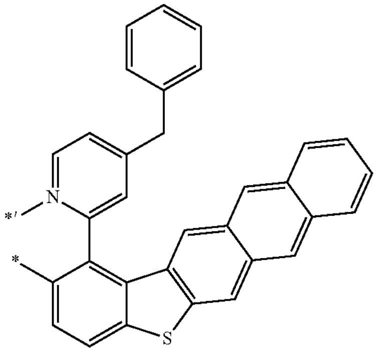
B616
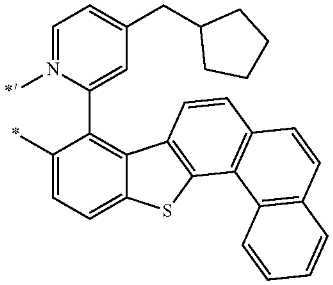
B617
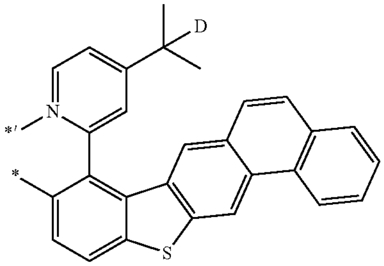
B618
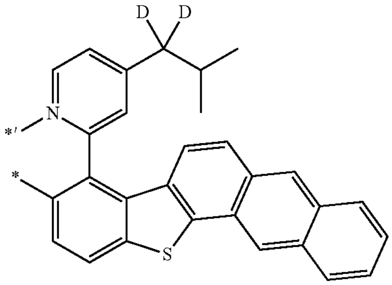
B619
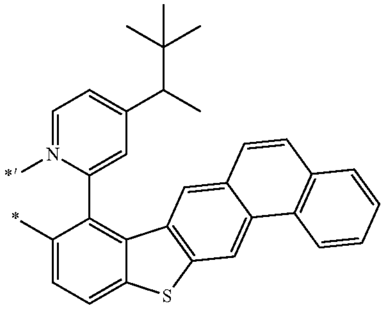

-continued
B620
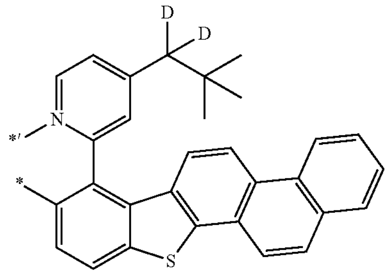
B621
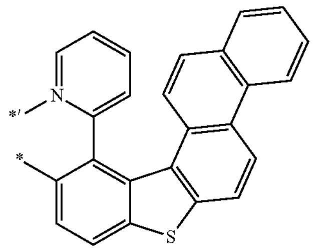
B622
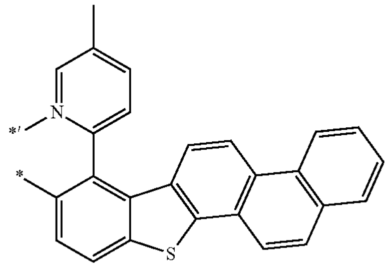
B623
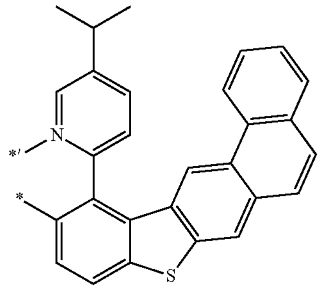
B624
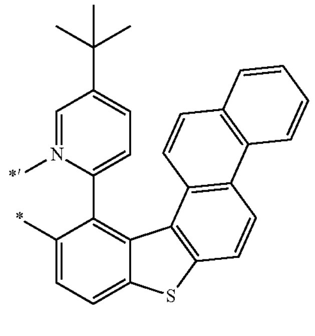
-continued
B625
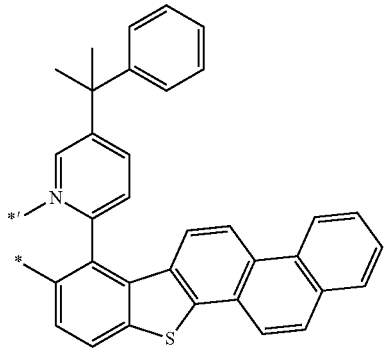
B626
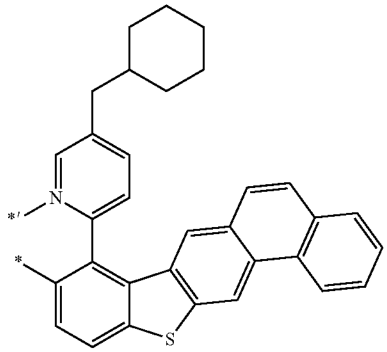
B627
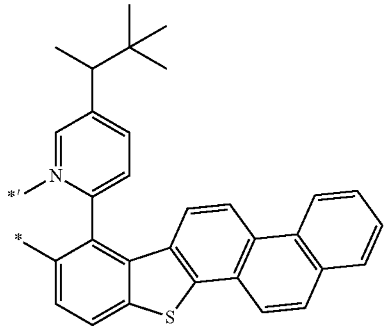
B628
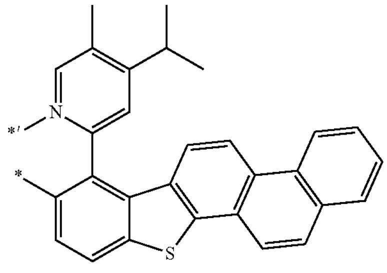
B629
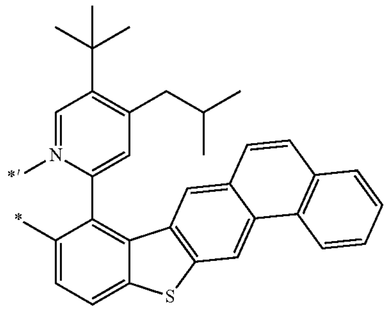

-continued
B630
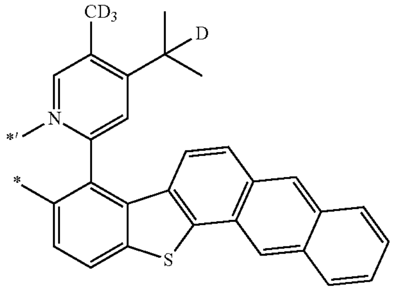
B631
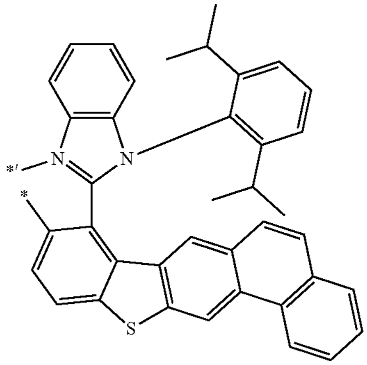
B632
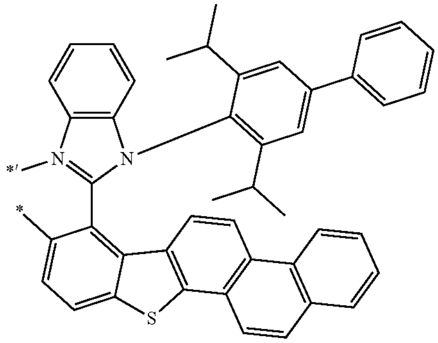
B633
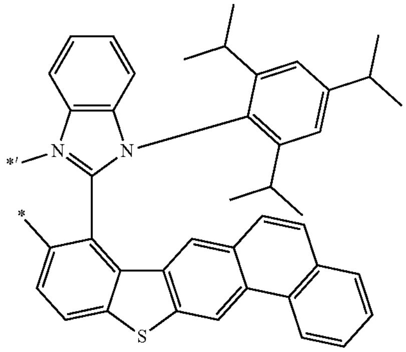
-continued
B634
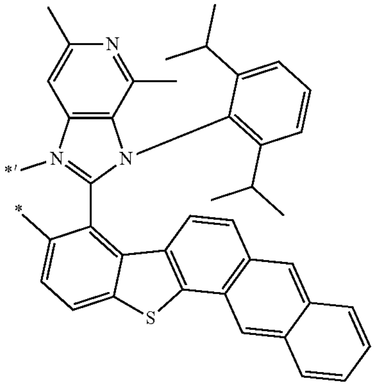
B635
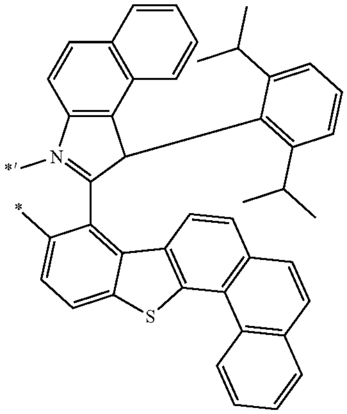
B636
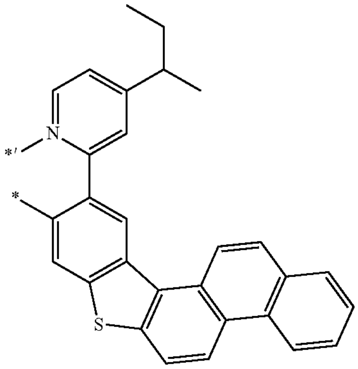
B637
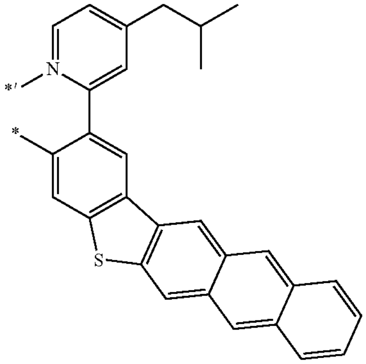

-continued
B638
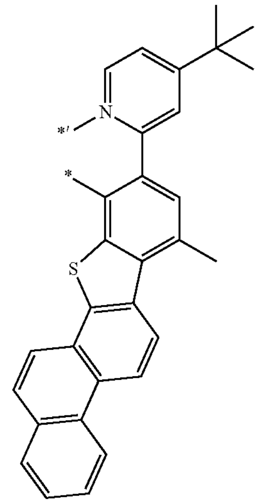
B639
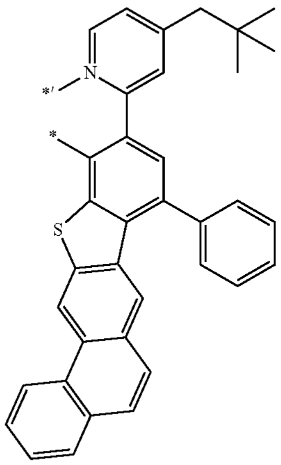
B640
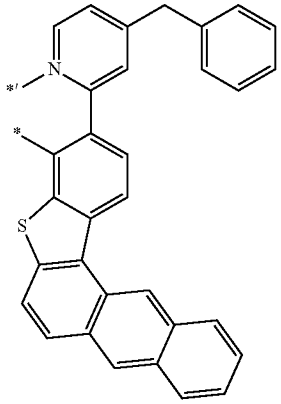
-continued
B641
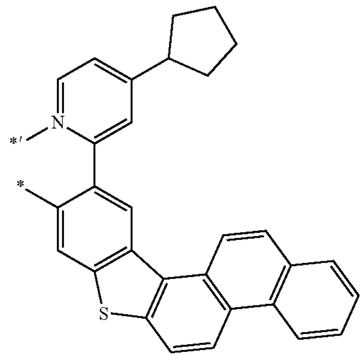
B642
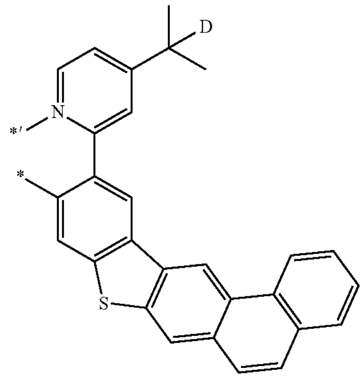
B643
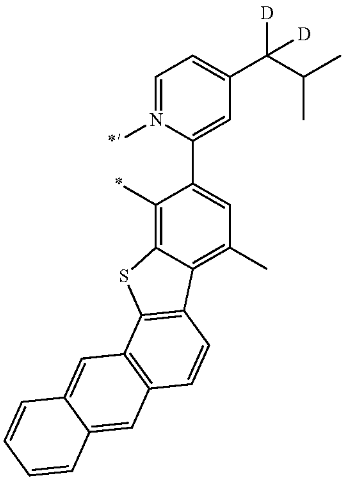

-continued
B644
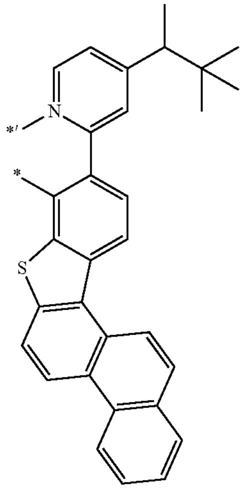
B645
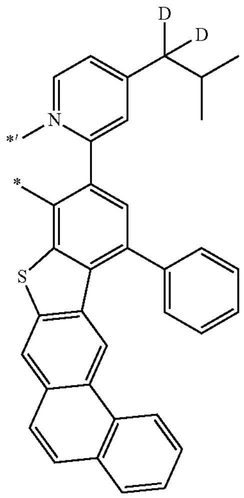
B646
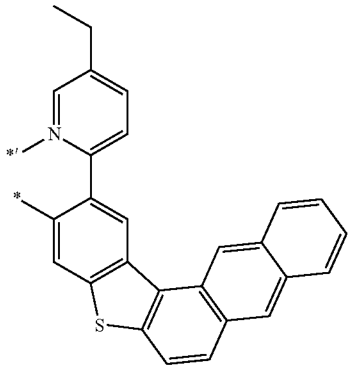
-continued
B647
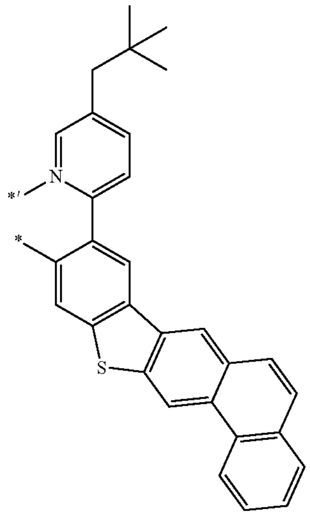
B648
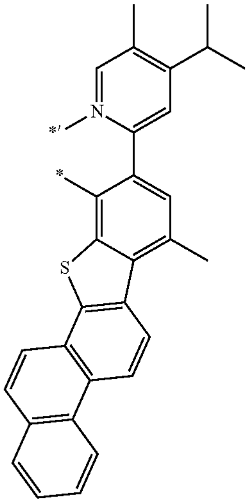
B649
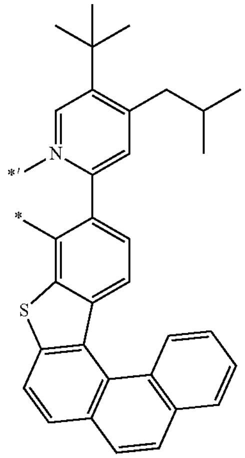

-continued
B650
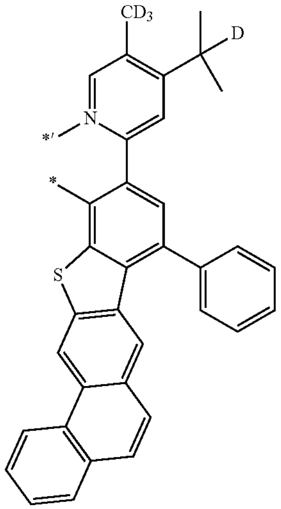
B651
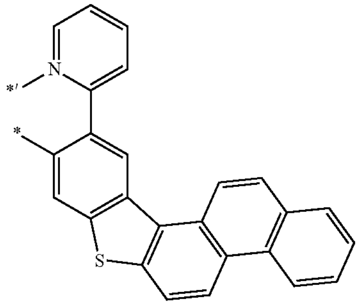
B652
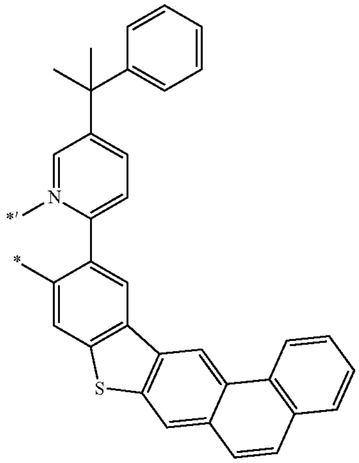
-continued
B653
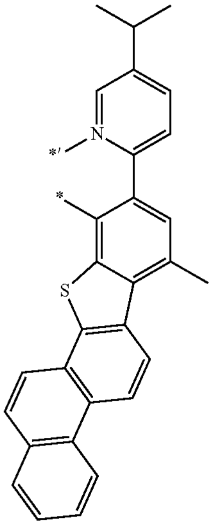
B654
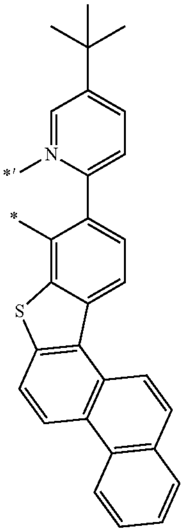
B655
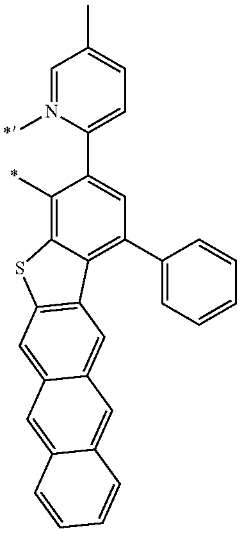

-continued
B656
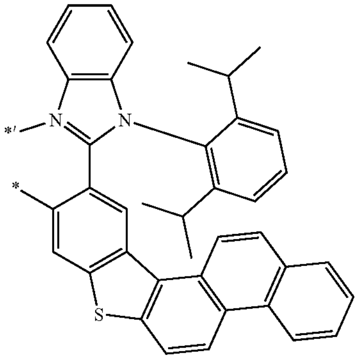
B657
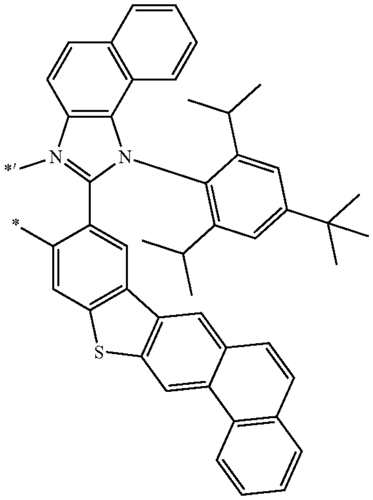
B658
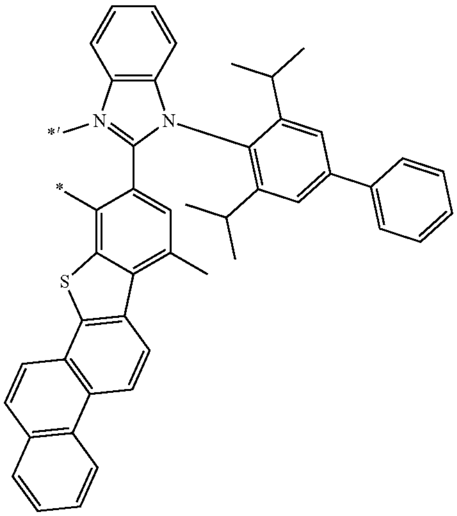
-continued
B659
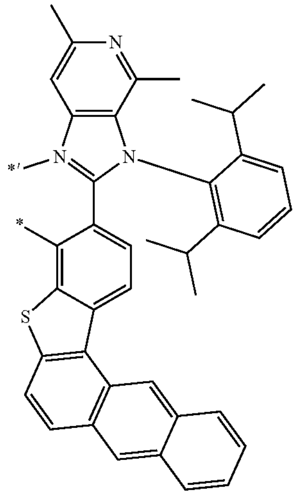
B660
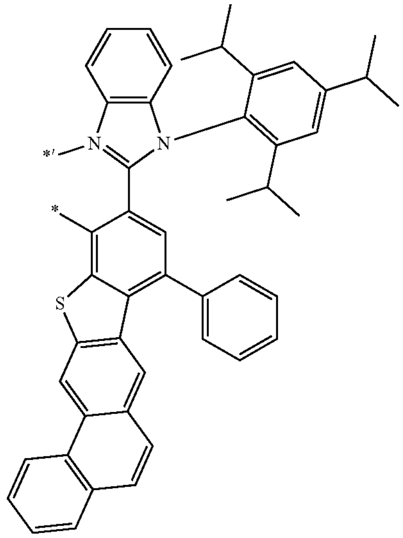
wherein, in Formulae B1 to B660, * and *' each indicate a binding site to M in Formula 1.
In one or more embodiments, the organometallic compound may be represented by Formula 1, wherein M in Formula 1 may be iridium, and $L_1$, $L_2$, n1, and n2 may each be as defined in Tables 1 to 96:
TABLE 1
| Compound No. | $L_1$ | $L_2$ | n1 | n2 |
|---|---|---|---|---|
| 1-1 or 1 | A1 | B1 | 2 | 1 |
| 1-2 | A1 | B2 | 2 | 1 |
| 1-3 | A1 | B3 | 2 | 1 |
| 1-4 | A1 | B4 | 2 | 1 |
| 1-5 | A1 | B5 | 2 | 1 |
| 1-6 | A1 | B6 | 2 | 1 |
| 1-7 | A1 | B7 | 2 | 1 |
| 1-8 | A1 | B8 | 2 | 1 |
| 1-9 | A1 | B9 | 2 | 1 |
| 1-10 | A1 | B10 | 2 | 1 |
| 1-11 | A1 | B11 | 2 | 1 |
| 1-12 | A1 | B12 | 2 | 1 |
| 1-13 | A1 | B13 | 2 | 1 |
| 1-14 | A1 | B14 | 2 | 1 |
| 1-15 | A1 | B15 | 2 | 1 |

TABLE 1-continued

| Compound No. | $L_1$ | $L_2$ | n1 | n2 |
|---|---|---|---|---|
| 1-16 | A1 | B16 | 2 | 1 |
| 1-17 | A1 | B17 | 2 | 1 |
| 1-18 | A1 | B18 | 2 | 1 |
| 1-19 | A1 | B19 | 2 | 1 |
| 1-20 | A1 | B20 | 2 | 1 |
| 1-21 | A1 | B21 | 2 | 1 |
| 1-22 | A1 | B22 | 2 | 1 |
| 1-23 | A1 | B23 | 2 | 1 |
| 1-24 | A1 | B24 | 2 | 1 |
| 1-25 | A1 | B25 | 2 | 1 |
| 1-26 | A1 | B26 | 2 | 1 |
| 1-27 | A1 | B27 | 2 | 1 |
| 1-28 | A1 | B28 | 2 | 1 |
| 1-29 | A1 | B29 | 2 | 1 |
| 1-30 | A1 | B30 | 2 | 1 |

TABLE 2

| Compound No. | $L_1$ | $L_2$ | n1 | n2 |
|---|---|---|---|---|
| 1-31 | A1 | B31 | 2 | 1 |
| 1-32 | A1 | B32 | 2 | 1 |
| 1-33 | A1 | B33 | 2 | 1 |
| 1-34 | A1 | B34 | 2 | 1 |
| 1-35 | A1 | B35 | 2 | 1 |
| 1-36 | A1 | B36 | 2 | 1 |
| 1-37 | A1 | B37 | 2 | 1 |
| 1-38 | A1 | B38 | 2 | 1 |
| 1-39 | A1 | B39 | 2 | 1 |
| 1-40 | A1 | B40 | 2 | 1 |
| 1-41 | A1 | B41 | 2 | 1 |
| 1-42 | A1 | B42 | 2 | 1 |
| 1-43 | A1 | B43 | 2 | 1 |
| 1-44 | A1 | B44 | 2 | 1 |
| 1-45 | A1 | B45 | 2 | 1 |
| 1-46 | A1 | B46 | 2 | 1 |
| 1-47 | A1 | B47 | 2 | 1 |
| 1-48 | A1 | B48 | 2 | 1 |
| 1-49 | A1 | B49 | 2 | 1 |
| 1-50 | A1 | B50 | 2 | 1 |
| 1-51 | A1 | B51 | 2 | 1 |
| 1-52 | A1 | B52 | 2 | 1 |
| 1-53 | A1 | B53 | 2 | 1 |
| 1-54 | A1 | B54 | 2 | 1 |
| 1-55 | A1 | B55 | 2 | 1 |
| 1-56 | A1 | B56 | 2 | 1 |
| 1-57 | A1 | B57 | 2 | 1 |
| 1-58 | A1 | B58 | 2 | 1 |
| 1-59 | A1 | B59 | 2 | 1 |
| 1-60 | A1 | B60 | 2 | 1 |

TABLE 3

| Compound No. | $L_1$ | $L_2$ | n1 | n2 |
|---|---|---|---|---|
| 1-61 | A1 | B61 | 2 | 1 |
| 1-62 | A1 | B62 | 2 | 1 |
| 1-63 | A1 | B63 | 2 | 1 |
| 1-64 | A1 | B64 | 2 | 1 |
| 1-65 | A1 | B65 | 2 | 1 |
| 1-66 | A1 | B66 | 2 | 1 |
| 1-67 | A1 | B67 | 2 | 1 |
| 1-68 | A1 | B68 | 2 | 1 |
| 1-69 | A1 | B69 | 2 | 1 |
| 1-70 | A1 | B70 | 2 | 1 |
| 1-71 | A1 | B71 | 2 | 1 |
| 1-72 | A1 | B72 | 2 | 1 |
| 1-73 | A1 | B73 | 2 | 1 |
| 1-74 | A1 | B74 | 2 | 1 |
| 1-75 | A1 | B75 | 2 | 1 |

TABLE 3-continued

| Compound No. | $L_1$ | $L_2$ | n1 | n2 |
|---|---|---|---|---|
| 1-76 | A1 | B76 | 2 | 1 |
| 1-77 | A1 | B77 | 2 | 1 |
| 1-78 | A1 | B78 | 2 | 1 |
| 1-79 | A1 | B79 | 2 | 1 |
| 1-80 | A1 | B80 | 2 | 1 |
| 1-81 | A1 | B81 | 2 | 1 |
| 1-82 | A1 | B82 | 2 | 1 |
| 1-83 | A1 | B83 | 2 | 1 |
| 1-84 | A1 | B84 | 2 | 1 |
| 1-85 | A1 | B85 | 2 | 1 |
| 1-86 | A1 | B86 | 2 | 1 |
| 1-87 | A1 | B87 | 2 | 1 |
| 1-88 | A1 | B88 | 2 | 1 |
| 1-89 | A1 | B89 | 2 | 1 |
| 1-90 | A1 | B90 | 2 | 1 |

TABLE 4

| Compound No. | $L_1$ | $L_2$ | n1 | n2 |
|---|---|---|---|---|
| 1-91 | A1 | B91 | 2 | 1 |
| 1-92 | A1 | B92 | 2 | 1 |
| 1-93 | A1 | B93 | 2 | 1 |
| 1-94 | A1 | B94 | 2 | 1 |
| 1-95 | A1 | B95 | 2 | 1 |
| 1-96 | A1 | B96 | 2 | 1 |
| 1-97 | A1 | B97 | 2 | 1 |
| 1-98 | A1 | B98 | 2 | 1 |
| 1-99 | A1 | B99 | 2 | 1 |
| 1-100 | A1 | B100 | 2 | 1 |
| 1-101 | A1 | B101 | 2 | 1 |
| 1-102 | A1 | B102 | 2 | 1 |
| 1-103 | A1 | B103 | 2 | 1 |
| 1-104 | A1 | B104 | 2 | 1 |
| 1-105 | A1 | B105 | 2 | 1 |
| 1-106 | A1 | B106 | 2 | 1 |
| 1-107 | A1 | B107 | 2 | 1 |
| 1-108 | A1 | B108 | 2 | 1 |
| 1-109 | A1 | B109 | 2 | 1 |
| 1-110 | A1 | B110 | 2 | 1 |
| 1-111 | A1 | B111 | 2 | 1 |
| 1-112 | A1 | B112 | 2 | 1 |
| 1-113 | A1 | B113 | 2 | 1 |
| 1-114 | A1 | B114 | 2 | 1 |
| 1-115 | A1 | B115 | 2 | 1 |
| 1-116 | A1 | B116 | 2 | 1 |
| 1-117 | A1 | B117 | 2 | 1 |
| 1-118 | A1 | B118 | 2 | 1 |
| 1-119 | A1 | B119 | 2 | 1 |
| 1-120 | A1 | B120 | 2 | 1 |

TABLE 5

| Compound No. | $L_1$ | $L_2$ | n1 | n2 |
|---|---|---|---|---|
| 1-121 | A1 | B121 | 2 | 1 |
| 1-122 | A1 | B122 | 2 | 1 |
| 1-123 | A1 | B123 | 2 | 1 |
| 1-124 | A1 | B124 | 2 | 1 |
| 1-125 | A1 | B125 | 2 | 1 |
| 1-126 | A1 | B126 | 2 | 1 |
| 1-127 | A1 | B127 | 2 | 1 |
| 1-128 | A1 | B128 | 2 | 1 |
| 1-129 | A1 | B129 | 2 | 1 |
| 1-130 | A1 | B130 | 2 | 1 |
| 1-131 | A1 | B131 | 2 | 1 |
| 1-132 | A1 | B132 | 2 | 1 |
| 1-133 | A1 | B133 | 2 | 1 |
| 1-134 | A1 | B134 | 2 | 1 |
| 1-135 | A1 | B135 | 2 | 1 |

TABLE 5-continued

| Compound No. | $L_1$ | $L_2$ | n1 | n2 |
|---|---|---|---|---|
| 1-136 | A1 | B136 | 2 | 1 |
| 1-137 | A1 | B137 | 2 | 1 |
| 1-138 | A1 | B138 | 2 | 1 |
| 1-139 | A1 | B139 | 2 | 1 |
| 1-140 | A1 | B140 | 2 | 1 |
| 1-141 | A1 | B141 | 2 | 1 |
| 1-142 | A1 | B142 | 2 | 1 |
| 1-143 | A1 | B143 | 2 | 1 |
| 1-144 | A1 | B144 | 2 | 1 |
| 1-145 | A1 | B145 | 2 | 1 |
| 1-146 | A1 | B146 | 2 | 1 |
| 1-147 | A1 | B147 | 2 | 1 |
| 1-148 | A1 | B148 | 2 | 1 |
| 1-149 | A1 | B149 | 2 | 1 |
| 1-150 | A1 | B150 | 2 | 1 |

TABLE 6

| Compound No. | $L_1$ | $L_2$ | n1 | n2 |
|---|---|---|---|---|
| 1-151 | A1 | B151 | 2 | 1 |
| 1-152 | A1 | B152 | 2 | 1 |
| 1-153 | A1 | B153 | 2 | 1 |
| 1-154 | A1 | B154 | 2 | 1 |
| 1-155 | A1 | B155 | 2 | 1 |
| 1-156 | A1 | B156 | 2 | 1 |
| 1-157 | A1 | B157 | 2 | 1 |
| 1-158 | A1 | B158 | 2 | 1 |
| 1-159 | A1 | B159 | 2 | 1 |
| 1-160 | A1 | B160 | 2 | 1 |
| 1-161 | A1 | B161 | 2 | 1 |
| 1-162 | A1 | B162 | 2 | 1 |
| 1-163 | A1 | B163 | 2 | 1 |
| 1-164 | A1 | B164 | 2 | 1 |
| 1-165 | A1 | B165 | 2 | 1 |
| 1-166 | A1 | B166 | 2 | 1 |
| 1-167 | A1 | B167 | 2 | 1 |
| 1-168 | A1 | B168 | 2 | 1 |
| 1-169 | A1 | B169 | 2 | 1 |
| 1-170 | A1 | B170 | 2 | 1 |
| 1-171 | A1 | B171 | 2 | 1 |
| 1-172 | A1 | B172 | 2 | 1 |
| 1-173 | A1 | B173 | 2 | 1 |
| 1-174 | A1 | B174 | 2 | 1 |
| 1-175 | A1 | B175 | 2 | 1 |
| 1-176 | A1 | B176 | 2 | 1 |
| 1-177 | A1 | B177 | 2 | 1 |
| 1-178 | A1 | B178 | 2 | 1 |
| 1-179 | A1 | B179 | 2 | 1 |
| 1-180 | A1 | B180 | 2 | 1 |

TABLE 7

| Compound No. | $L_1$ | $L_2$ | n1 | n2 |
|---|---|---|---|---|
| 1-181 | A1 | B181 | 2 | 1 |
| 1-182 | A1 | B182 | 2 | 1 |
| 1-183 | A1 | B183 | 2 | 1 |
| 1-184 | A1 | B184 | 2 | 1 |
| 1-185 | A1 | B185 | 2 | 1 |
| 1-186 | A1 | B186 | 2 | 1 |
| 1-187 | A1 | B187 | 2 | 1 |
| 1-188 | A1 | B188 | 2 | 1 |
| 1-189 | A1 | B189 | 2 | 1 |
| 1-190 | A1 | B190 | 2 | 1 |
| 1-191 | A1 | B191 | 2 | 1 |
| 1-192 | A1 | B192 | 2 | 1 |
| 1-193 | A1 | B193 | 2 | 1 |
| 1-194 | A1 | B194 | 2 | 1 |
| 1-195 | A1 | B195 | 2 | 1 |
| 1-196 | A1 | B196 | 2 | 1 |

TABLE 7-continued

| Compound No. | $L_1$ | $L_2$ | n1 | n2 |
|---|---|---|---|---|
| 1-197 | A1 | B197 | 2 | 1 |
| 1-198 | A1 | B198 | 2 | 1 |
| 1-199 | A1 | B199 | 2 | 1 |
| 1-200 | A1 | B200 | 2 | 1 |
| 1-201 | A1 | B201 | 2 | 1 |
| 1-202 | A1 | B202 | 2 | 1 |
| 1-203 | A1 | B203 | 2 | 1 |
| 1-204 | A1 | B204 | 2 | 1 |
| 1-205 | A1 | B205 | 2 | 1 |
| 1-206 | A1 | B206 | 2 | 1 |
| 1-207 | A1 | B207 | 2 | 1 |
| 1-208 | A1 | B208 | 2 | 1 |
| 1-209 | A1 | B209 | 2 | 1 |
| 1-210 | A1 | B210 | 2 | 1 |

TABLE 8

| Compound No. | $L_1$ | $L_2$ | n1 | n2 |
|---|---|---|---|---|
| 1-211 | A1 | B211 | 2 | 1 |
| 1-212 | A1 | B212 | 2 | 1 |
| 1-213 | A1 | B213 | 2 | 1 |
| 1-214 | A1 | B214 | 2 | 1 |
| 1-215 | A1 | B215 | 2 | 1 |
| 1-216 | A1 | B216 | 2 | 1 |
| 1-217 | A1 | B217 | 2 | 1 |
| 1-218 | A1 | B218 | 2 | 1 |
| 1-219 | A1 | B219 | 2 | 1 |
| 1-220 | A1 | B220 | 2 | 1 |
| 1-221 | A1 | B221 | 2 | 1 |
| 1-222 | A1 | B222 | 2 | 1 |
| 1-223 | A1 | B223 | 2 | 1 |
| 1-224 | A1 | B224 | 2 | 1 |
| 1-225 | A1 | B225 | 2 | 1 |
| 1-226 | A1 | B226 | 2 | 1 |
| 1-227 | A1 | B227 | 2 | 1 |
| 1-228 | A1 | B228 | 2 | 1 |
| 1-229 | A1 | B229 | 2 | 1 |
| 1-230 | A1 | B230 | 2 | 1 |
| 1-231 | A1 | B231 | 2 | 1 |
| 1-232 | A1 | B232 | 2 | 1 |
| 1-233 | A1 | B233 | 2 | 1 |
| 1-234 | A1 | B234 | 2 | 1 |
| 1-235 | A1 | B235 | 2 | 1 |
| 1-236 | A1 | B236 | 2 | 1 |
| 1-237 | A1 | B237 | 2 | 1 |
| 1-238 | A1 | B238 | 2 | 1 |
| 1-239 | A1 | B239 | 2 | 1 |
| 1-240 | A1 | B240 | 2 | 1 |

TABLE 9

| Compound No. | $L_1$ | $L_2$ | n1 | n2 |
|---|---|---|---|---|
| 1-241 | A1 | B241 | 2 | 1 |
| 1-242 | A1 | B242 | 2 | 1 |
| 1-243 | A1 | B243 | 2 | 1 |
| 1-244 | A1 | B244 | 2 | 1 |
| 1-245 | A1 | B245 | 2 | 1 |
| 1-246 | A1 | B246 | 2 | 1 |
| 1-247 | A1 | B247 | 2 | 1 |
| 1-248 | A1 | B248 | 2 | 1 |
| 1-249 | A1 | B249 | 2 | 1 |
| 1-250 | A1 | B250 | 2 | 1 |
| 1-251 | A1 | B251 | 2 | 1 |
| 1-252 | A1 | B252 | 2 | 1 |
| 1-253 | A1 | B253 | 2 | 1 |
| 1-254 | A1 | B254 | 2 | 1 |
| 1-255 | A1 | B255 | 2 | 1 |
| 1-256 | A1 | B256 | 2 | 1 |
| 1-257 | A1 | B257 | 2 | 1 |
| 1-258 | A1 | B258 | 2 | 1 |
| 1-259 | A1 | B259 | 2 | 1 |

TABLE 9-continued

| Compound No. | $L_1$ | $L_2$ | n1 | n2 |
|---|---|---|---|---|
| 1-260 | A1 | B260 | 2 | 1 |
| 1-261 | A1 | B261 | 2 | 1 |
| 1-262 | A1 | B262 | 2 | 1 |
| 1-263 | A1 | B263 | 2 | 1 |
| 1-264 | A1 | B264 | 2 | 1 |
| 1-265 | A1 | B265 | 2 | 1 |
| 1-266 | A1 | B266 | 2 | 1 |
| 1-267 | A1 | B267 | 2 | 1 |
| 1-268 | A1 | B268 | 2 | 1 |
| 1-269 | A1 | B269 | 2 | 1 |
| 1-270 | A1 | B270 | 2 | 1 |

TABLE 10

| Compound No. | $L_1$ | $L_2$ | n1 | n2 |
|---|---|---|---|---|
| 1-271 | A1 | B271 | 2 | 1 |
| 1-272 | A1 | B272 | 2 | 1 |
| 1-273 | A1 | B273 | 2 | 1 |
| 1-274 | A1 | B274 | 2 | 1 |
| 1-275 | A1 | B275 | 2 | 1 |
| 1-276 | A1 | B276 | 2 | 1 |
| 1-277 | A1 | B277 | 2 | 1 |
| 1-278 | A1 | B278 | 2 | 1 |
| 1-279 | A1 | B279 | 2 | 1 |
| 1-280 | A1 | B280 | 2 | 1 |
| 1-281 | A1 | B281 | 2 | 1 |
| 1-282 | A1 | B282 | 2 | 1 |
| 1-283 | A1 | B283 | 2 | 1 |
| 1-284 | A1 | B284 | 2 | 1 |
| 1-285 | A1 | B285 | 2 | 1 |
| 1-286 | A1 | B286 | 2 | 1 |
| 1-287 | A1 | B287 | 2 | 1 |
| 1-288 | A1 | B288 | 2 | 1 |
| 1-289 | A1 | B289 | 2 | 1 |
| 1-290 | A1 | B290 | 2 | 1 |
| 1-291 | A1 | B291 | 2 | 1 |
| 1-292 | A1 | B292 | 2 | 1 |
| 1-293 | A1 | B293 | 2 | 1 |
| 1-294 | A1 | B294 | 2 | 1 |
| 1-295 | A1 | B295 | 2 | 1 |
| 1-296 | A1 | B296 | 2 | 1 |
| 1-297 | A1 | B297 | 2 | 1 |
| 1-298 | A1 | B298 | 2 | 1 |
| 1-299 | A1 | B299 | 2 | 1 |
| 1-300 | A1 | B300 | 2 | 1 |

TABLE 11

| Compound No. | $L_1$ | $L_2$ | n1 | n2 |
|---|---|---|---|---|
| 1-301 | A1 | B301 | 2 | 1 |
| 1-302 | A1 | B302 | 2 | 1 |
| 1-303 | A1 | B303 | 2 | 1 |
| 1-304 | A1 | B304 | 2 | 1 |
| 1-305 | A1 | B305 | 2 | 1 |
| 1-306 | A1 | B306 | 2 | 1 |
| 1-307 | A1 | B307 | 2 | 1 |
| 1-308 | A1 | B308 | 2 | 1 |
| 1-309 | A1 | B309 | 2 | 1 |
| 1-310 | A1 | B310 | 2 | 1 |
| 1-311 | A1 | B311 | 2 | 1 |
| 1-312 | A1 | B312 | 2 | 1 |
| 1-313 | A1 | B313 | 2 | 1 |
| 1-314 | A1 | B314 | 2 | 1 |
| 1-315 | A1 | B315 | 2 | 1 |
| 1-316 | A1 | B316 | 2 | 1 |
| 1-317 | A1 | B317 | 2 | 1 |
| 1-318 | A1 | B318 | 2 | 1 |
| 1-319 | A1 | B319 | 2 | 1 |
| 1-320 | A1 | B320 | 2 | 1 |
| 1-321 | A1 | B321 | 2 | 1 |
| 1-322 | A1 | B322 | 2 | 1 |

TABLE 11-continued

| Compound No. | $L_1$ | $L_2$ | n1 | n2 |
|---|---|---|---|---|
| 1-323 | A1 | B323 | 2 | 1 |
| 1-324 | A1 | B324 | 2 | 1 |
| 1-325 | A1 | B325 | 2 | 1 |
| 1-326 | A1 | B326 | 2 | 1 |
| 1-327 | A1 | B327 | 2 | 1 |
| 1-328 | A1 | B328 | 2 | 1 |
| 1-329 | A1 | B329 | 2 | 1 |
| 1-330 | A1 | B330 | 2 | 1 |

TABLE 12

| Compound No. | $L_1$ | $L_2$ | n1 | n2 |
|---|---|---|---|---|
| 1-331 | A1 | B331 | 2 | 1 |
| 1-332 | A1 | B332 | 2 | 1 |
| 1-333 | A1 | B333 | 2 | 1 |
| 1-334 | A1 | B334 | 2 | 1 |
| 1-335 | A1 | B335 | 2 | 1 |
| 1-336 | A1 | B336 | 2 | 1 |
| 1-337 | A1 | B337 | 2 | 1 |
| 1-338 | A1 | B338 | 2 | 1 |
| 1-339 | A1 | B339 | 2 | 1 |
| 1-340 | A1 | B340 | 2 | 1 |
| 1-341 | A1 | B341 | 2 | 1 |
| 1-342 | A1 | B342 | 2 | 1 |
| 1-343 | A1 | B343 | 2 | 1 |
| 1-344 | A1 | B344 | 2 | 1 |
| 1-345 | A1 | B345 | 2 | 1 |
| 1-346 | A1 | B346 | 2 | 1 |
| 1-347 | A1 | B347 | 2 | 1 |
| 1-348 | A1 | B348 | 2 | 1 |
| 1-349 | A1 | B349 | 2 | 1 |
| 1-350 | A1 | B350 | 2 | 1 |
| 1-351 | A1 | B351 | 2 | 1 |
| 1-352 | A1 | B352 | 2 | 1 |
| 1-353 | A1 | B353 | 2 | 1 |
| 1-354 | A1 | B354 | 2 | 1 |
| 1-355 | A1 | B355 | 2 | 1 |
| 1-356 | A1 | B356 | 2 | 1 |
| 1-357 | A1 | B357 | 2 | 1 |
| 1-358 | A1 | B358 | 2 | 1 |
| 1-359 | A1 | B359 | 2 | 1 |
| 1-360 | A1 | B360 | 2 | 1 |

TABLE 13

| Compound No. | $L_1$ | $L_2$ | n1 | n2 |
|---|---|---|---|---|
| 1-361 | A1 | B361 | 2 | 1 |
| 1-362 | A1 | B362 | 2 | 1 |
| 1-363 | A1 | B363 | 2 | 1 |
| 1-364 | A1 | B364 | 2 | 1 |
| 1-365 | A1 | B365 | 2 | 1 |
| 1-366 | A1 | B366 | 2 | 1 |
| 1-367 | A1 | B367 | 2 | 1 |
| 1-368 | A1 | B368 | 2 | 1 |
| 1-369 | A1 | B369 | 2 | 1 |
| 1-370 | A1 | B370 | 2 | 1 |
| 1-371 | A1 | B371 | 2 | 1 |
| 1-372 | A1 | B372 | 2 | 1 |
| 1-373 | A1 | B373 | 2 | 1 |
| 1-374 | A1 | B374 | 2 | 1 |
| 1-375 | A1 | B375 | 2 | 1 |
| 1-376 | A1 | B376 | 2 | 1 |
| 1-377 | A1 | B377 | 2 | 1 |
| 1-378 | A1 | B378 | 2 | 1 |
| 1-379 | A1 | B379 | 2 | 1 |
| 1-380 | A1 | B380 | 2 | 1 |
| 1-381 | A1 | B381 | 2 | 1 |
| 1-382 | A1 | B382 | 2 | 1 |
| 1-383 | A1 | B383 | 2 | 1 |
| 1-384 | A1 | B384 | 2 | 1 |
| 1-385 | A1 | B385 | 2 | 1 |

TABLE 13-continued

| Compound No. | $L_1$ | $L_2$ | n1 | n2 |
|---|---|---|---|---|
| 1-386 | A1 | B386 | 2 | 1 |
| 1-387 | A1 | B387 | 2 | 1 |
| 1-388 | A1 | B388 | 2 | 1 |
| 1-389 | A1 | B389 | 2 | 1 |
| 1-390 | A1 | B390 | 2 | 1 |

TABLE 14

| Compound No. | $L_1$ | $L_2$ | n1 | n2 |
|---|---|---|---|---|
| 1-391 | A1 | B391 | 2 | 1 |
| 1-392 | A1 | B392 | 2 | 1 |
| 1-393 | A1 | B393 | 2 | 1 |
| 1-394 | A1 | B394 | 2 | 1 |
| 1-395 | A1 | B395 | 2 | 1 |
| 1-396 | A1 | B396 | 2 | 1 |
| 1-397 | A1 | B397 | 2 | 1 |
| 1-398 | A1 | B398 | 2 | 1 |
| 1-399 | A1 | B399 | 2 | 1 |
| 1-400 | A1 | B400 | 2 | 1 |
| 1-401 | A1 | B401 | 2 | 1 |
| 1-402 | A1 | B402 | 2 | 1 |
| 1-403 | A1 | B403 | 2 | 1 |
| 1-404 | A1 | B404 | 2 | 1 |
| 1-405 | A1 | B405 | 2 | 1 |
| 1-406 | A1 | B406 | 2 | 1 |
| 1-407 | A1 | B407 | 2 | 1 |
| 1-408 | A1 | B408 | 2 | 1 |
| 1-409 | A1 | B409 | 2 | 1 |
| 1-410 | A1 | B410 | 2 | 1 |
| 1-411 | A1 | B411 | 2 | 1 |
| 1-412 | A1 | B412 | 2 | 1 |
| 1-413 | A1 | B413 | 2 | 1 |
| 1-414 | A1 | B414 | 2 | 1 |
| 1-415 | A1 | B415 | 2 | 1 |
| 1-416 | A1 | B416 | 2 | 1 |
| 1-417 | A1 | B417 | 2 | 1 |
| 1-418 | A1 | B418 | 2 | 1 |
| 1-419 | A1 | B419 | 2 | 1 |
| 1-420 | A1 | B420 | 2 | 1 |

TABLE 15

| Compound No. | $L_1$ | $L_2$ | n1 | n2 |
|---|---|---|---|---|
| 1-421 | A1 | B421 | 2 | 1 |
| 1-422 | A1 | B422 | 2 | 1 |
| 1-423 | A1 | B423 | 2 | 1 |
| 1-424 | A1 | B424 | 2 | 1 |
| 1-425 | A1 | B425 | 2 | 1 |
| 1-426 | A1 | B426 | 2 | 1 |
| 1-427 | A1 | B427 | 2 | 1 |
| 1-428 | A1 | B428 | 2 | 1 |
| 1-429 | A1 | B429 | 2 | 1 |
| 1-430 | A1 | B430 | 2 | 1 |
| 1-431 | A1 | B431 | 2 | 1 |
| 1-432 | A1 | B432 | 2 | 1 |
| 1-433 | A1 | B433 | 2 | 1 |
| 1-434 | A1 | B434 | 2 | 1 |
| 1-435 | A1 | B435 | 2 | 1 |
| 1-436 | A1 | B436 | 2 | 1 |
| 1-437 | A1 | B437 | 2 | 1 |
| 1-438 | A1 | B438 | 2 | 1 |
| 1-439 | A1 | B439 | 2 | 1 |
| 1-440 | A1 | B440 | 2 | 1 |
| 1-441 | A1 | B441 | 2 | 1 |
| 1-442 | A1 | B442 | 2 | 1 |
| 1-443 | A1 | B443 | 2 | 1 |
| 1-444 | A1 | B444 | 2 | 1 |
| 1-445 | A1 | B445 | 2 | 1 |
| 1-446 | A1 | B446 | 2 | 1 |
| 1-447 | A1 | B447 | 2 | 1 |
| 1-448 | A1 | B448 | 2 | 1 |

TABLE 15-continued

| Compound No. | $L_1$ | $L_2$ | n1 | n2 |
|---|---|---|---|---|
| 1-449 | A1 | B449 | 2 | 1 |
| 1-450 | A1 | B450 | 2 | 1 |

TABLE 16

| Compound No. | $L_1$ | $L_2$ | n1 | n2 |
|---|---|---|---|---|
| 1-451 | A1 | B451 | 2 | 1 |
| 1-452 | A1 | B452 | 2 | 1 |
| 1-453 | A1 | B453 | 2 | 1 |
| 1-454 | A1 | B454 | 2 | 1 |
| 1-455 | A1 | B455 | 2 | 1 |
| 1-456 | A1 | B456 | 2 | 1 |
| 1-457 | A1 | B457 | 2 | 1 |
| 1-458 | A1 | B458 | 2 | 1 |
| 1-459 | A1 | B459 | 2 | 1 |
| 1-460 | A1 | B460 | 2 | 1 |
| 1-461 | A1 | B461 | 2 | 1 |
| 1-462 | A1 | B462 | 2 | 1 |
| 1-463 | A1 | B463 | 2 | 1 |
| 1-464 | A1 | B464 | 2 | 1 |
| 1-465 | A1 | B465 | 2 | 1 |
| 1-466 | A1 | B466 | 2 | 1 |
| 1-467 | A1 | B467 | 2 | 1 |
| 1-468 | A1 | B468 | 2 | 1 |
| 1-469 | A1 | B469 | 2 | 1 |
| 1-470 | A1 | B470 | 2 | 1 |
| 1-471 | A1 | B471 | 2 | 1 |
| 1-472 | A1 | B472 | 2 | 1 |
| 1-473 | A1 | B473 | 2 | 1 |
| 1-474 | A1 | B474 | 2 | 1 |
| 1-475 | A1 | B475 | 2 | 1 |
| 1-476 | A1 | B476 | 2 | 1 |
| 1-477 | A1 | B477 | 2 | 1 |
| 1-478 | A1 | B478 | 2 | 1 |
| 1-479 | A1 | B479 | 2 | 1 |
| 1-480 | A1 | B480 | 2 | 1 |

TABLE 17

| Compound No. | $L_1$ | $L_2$ | n1 | n2 |
|---|---|---|---|---|
| 1-481 | A1 | B481 | 2 | 1 |
| 1-482 | A1 | B482 | 2 | 1 |
| 1-483 | A1 | B483 | 2 | 1 |
| 1-484 | A1 | B484 | 2 | 1 |
| 1-485 | A1 | B485 | 2 | 1 |
| 1-486 | A1 | B486 | 2 | 1 |
| 1-487 | A1 | B487 | 2 | 1 |
| 1-488 | A1 | B488 | 2 | 1 |
| 1-489 | A1 | B489 | 2 | 1 |
| 1-490 | A1 | B490 | 2 | 1 |
| 1-491 | A1 | B491 | 2 | 1 |
| 1-492 | A1 | B492 | 2 | 1 |
| 1-493 | A1 | B493 | 2 | 1 |
| 1-494 | A1 | B494 | 2 | 1 |
| 1-495 | A1 | B495 | 2 | 1 |
| 1-496 | A1 | B496 | 2 | 1 |
| 1-497 | A1 | B497 | 2 | 1 |
| 1-498 | A1 | B498 | 2 | 1 |
| 1-499 | A1 | B499 | 2 | 1 |
| 1-500 | A1 | B500 | 2 | 1 |
| 1-501 | A1 | B501 | 2 | 1 |
| 1-502 | A1 | B502 | 2 | 1 |
| 1-503 | A1 | B503 | 2 | 1 |
| 1-504 | A1 | B504 | 2 | 1 |
| 1-505 | A1 | B505 | 2 | 1 |
| 1-506 | A1 | B506 | 2 | 1 |
| 1-507 | A1 | B507 | 2 | 1 |
| 1-508 | A1 | B508 | 2 | 1 |
| 1-509 | A1 | B509 | 2 | 1 |
| 1-510 | A1 | B510 | 2 | 1 |

TABLE 18

| Compound No. | $L_1$ | $L_2$ | n1 | n2 |
|---|---|---|---|---|
| 1-511 | A1 | B511 | 2 | 1 |
| 1-512 | A1 | B512 | 2 | 1 |
| 1-513 | A1 | B513 | 2 | 1 |
| 1-514 | A1 | B514 | 2 | 1 |
| 1-515 | A1 | B515 | 2 | 1 |
| 1-516 | A1 | B516 | 2 | 1 |
| 1-517 | A1 | B517 | 2 | 1 |
| 1-518 | A1 | B518 | 2 | 1 |
| 1-519 | A1 | B519 | 2 | 1 |
| 1-520 | A1 | B520 | 2 | 1 |
| 1-521 | A1 | B521 | 2 | 1 |
| 1-522 | A1 | B522 | 2 | 1 |
| 1-523 | A1 | B523 | 2 | 1 |
| 1-524 | A1 | B524 | 2 | 1 |
| 1-525 | A1 | B525 | 2 | 1 |
| 1-526 | A1 | B526 | 2 | 1 |
| 1-527 | A1 | B527 | 2 | 1 |
| 1-528 | A1 | B528 | 2 | 1 |
| 1-529 | A1 | B529 | 2 | 1 |
| 1-530 | A1 | B530 | 2 | 1 |
| 1-531 | A1 | B531 | 2 | 1 |
| 1-532 | A1 | B532 | 2 | 1 |
| 1-533 | A1 | B533 | 2 | 1 |
| 1-534 | A1 | B534 | 2 | 1 |
| 1-535 | A1 | B535 | 2 | 1 |
| 1-536 | A1 | B536 | 2 | 1 |
| 1-537 | A1 | B537 | 2 | 1 |
| 1-538 | A1 | B538 | 2 | 1 |
| 1-539 | A1 | B539 | 2 | 1 |
| 1-540 | A1 | B540 | 2 | 1 |

TABLE 19

| Compound No. | $L_1$ | $L_2$ | n1 | n2 |
|---|---|---|---|---|
| 1-541 | A1 | B541 | 2 | 1 |
| 1-542 | A1 | B542 | 2 | 1 |
| 1-543 | A1 | B543 | 2 | 1 |
| 1-544 | A1 | B544 | 2 | 1 |
| 1-545 | A1 | B545 | 2 | 1 |
| 1-546 | A1 | B546 | 2 | 1 |
| 1-547 | A1 | B547 | 2 | 1 |
| 1-548 | A1 | B548 | 2 | 1 |
| 1-549 | A1 | B549 | 2 | 1 |
| 1-550 | A1 | B550 | 2 | 1 |
| 1-551 | A1 | B551 | 2 | 1 |
| 1-552 | A1 | B552 | 2 | 1 |
| 1-553 | A1 | B553 | 2 | 1 |
| 1-554 | A1 | B554 | 2 | 1 |
| 1-555 | A1 | B555 | 2 | 1 |
| 1-556 | A1 | B556 | 2 | 1 |
| 1-557 | A1 | B557 | 2 | 1 |
| 1-558 | A1 | B558 | 2 | 1 |
| 1-559 | A1 | B559 | 2 | 1 |
| 1-560 | A1 | B560 | 2 | 1 |
| 1-561 | A1 | B561 | 2 | 1 |
| 1-562 | A1 | B562 | 2 | 1 |
| 1-563 | A1 | B563 | 2 | 1 |
| 1-564 | A1 | B564 | 2 | 1 |
| 1-565 | A1 | B565 | 2 | 1 |
| 1-566 | A1 | B566 | 2 | 1 |
| 1-567 | A1 | B567 | 2 | 1 |
| 1-568 | A1 | B568 | 2 | 1 |
| 1-569 | A1 | B569 | 2 | 1 |
| 1-570 | A1 | B570 | 2 | 1 |

TABLE 20

| Compound No. | $L_1$ | $L_2$ | n1 | n2 |
|---|---|---|---|---|
| 1-571 | A1 | B571 | 2 | 1 |
| 1-572 | A1 | B572 | 2 | 1 |
| 1-573 | A1 | B573 | 2 | 1 |

TABLE 20-continued

| Compound No. | $L_1$ | $L_2$ | n1 | n2 |
|---|---|---|---|---|
| 1-574 | A1 | B574 | 2 | 1 |
| 1-575 | A1 | B575 | 2 | 1 |
| 1-576 | A1 | B576 | 2 | 1 |
| 1-577 | A1 | B577 | 2 | 1 |
| 1-578 | A1 | B578 | 2 | 1 |
| 1-579 | A1 | B579 | 2 | 1 |
| 1-580 | A1 | B580 | 2 | 1 |
| 1-581 | A1 | B581 | 2 | 1 |
| 1-582 | A1 | B582 | 2 | 1 |
| 1-583 | A1 | B583 | 2 | 1 |
| 1-584 | A1 | B584 | 2 | 1 |
| 1-585 | A1 | B585 | 2 | 1 |
| 1-586 | A1 | B586 | 2 | 1 |
| 1-587 | A1 | B587 | 2 | 1 |
| 1-588 | A1 | B588 | 2 | 1 |
| 1-589 | A1 | B589 | 2 | 1 |
| 1-590 | A1 | B590 | 2 | 1 |
| 1-591 | A1 | B591 | 2 | 1 |
| 1-592 | A1 | B592 | 2 | 1 |
| 1-593 | A1 | B593 | 2 | 1 |
| 1-594 | A1 | B594 | 2 | 1 |
| 1-595 | A1 | B595 | 2 | 1 |
| 1-596 | A1 | B596 | 2 | 1 |
| 1-597 | A1 | B597 | 2 | 1 |
| 1-598 | A1 | B598 | 2 | 1 |
| 1-599 | A1 | B599 | 2 | 1 |
| 1-600 | A1 | B600 | 2 | 1 |

TABLE 21

| Compound No. | $L_1$ | $L_2$ | n1 | n2 |
|---|---|---|---|---|
| 1-601 | A1 | B601 | 2 | 1 |
| 1-602 | A1 | B602 | 2 | 1 |
| 1-603 | A1 | B603 | 2 | 1 |
| 1-604 | A1 | B604 | 2 | 1 |
| 1-605 | A1 | B605 | 2 | 1 |
| 1-606 | A1 | B606 | 2 | 1 |
| 1-607 | A1 | B607 | 2 | 1 |
| 1-608 | A1 | B608 | 2 | 1 |
| 1-609 | A1 | B609 | 2 | 1 |
| 1-610 | A1 | B610 | 2 | 1 |
| 1-611 | A1 | B611 | 2 | 1 |
| 1-612 | A1 | B612 | 2 | 1 |
| 1-613 | A1 | B613 | 2 | 1 |
| 1-614 | A1 | B614 | 2 | 1 |
| 1-615 | A1 | B615 | 2 | 1 |
| 1-616 | A1 | B616 | 2 | 1 |
| 1-617 | A1 | B617 | 2 | 1 |
| 1-618 | A1 | B618 | 2 | 1 |
| 1-619 | A1 | B619 | 2 | 1 |
| 1-620 | A1 | B620 | 2 | 1 |
| 1-621 | A1 | B621 | 2 | 1 |
| 1-622 | A1 | B622 | 2 | 1 |
| 1-623 | A1 | B623 | 2 | 1 |
| 1-624 | A1 | B624 | 2 | 1 |
| 1-625 | A1 | B625 | 2 | 1 |
| 1-626 | A1 | B626 | 2 | 1 |
| 1-627 | A1 | B627 | 2 | 1 |
| 1-628 | A1 | B628 | 2 | 1 |
| 1-629 | A1 | B629 | 2 | 1 |
| 1-630 | A1 | B630 | 2 | 1 |

TABLE 22

| Compound No. | $L_1$ | $L_2$ | n1 | n2 |
|---|---|---|---|---|
| 1-631 | A1 | B631 | 2 | 1 |
| 1-632 | A1 | B632 | 2 | 1 |
| 1-633 | A1 | B633 | 2 | 1 |
| 1-634 | A1 | B634 | 2 | 1 |
| 1-635 | A1 | B635 | 2 | 1 |
| 1-636 | A1 | B636 | 2 | 1 |

TABLE 22-continued

| Compound No. | $L_1$ | $L_2$ | n1 | n2 |
|---|---|---|---|---|
| 1-637 | A1 | B637 | 2 | 1 |
| 1-638 | A1 | B638 | 2 | 1 |
| 1-639 | A1 | B639 | 2 | 1 |
| 1-640 | A1 | B640 | 2 | 1 |
| 1-641 | A1 | B641 | 2 | 1 |
| 1-642 | A1 | B642 | 2 | 1 |
| 1-643 | A1 | B643 | 2 | 1 |
| 1-644 | A1 | B644 | 2 | 1 |
| 1-645 | A1 | B645 | 2 | 1 |
| 1-646 | A1 | B646 | 2 | 1 |
| 1-647 | A1 | B647 | 2 | 1 |
| 1-648 | A1 | B648 | 2 | 1 |
| 1-649 | A1 | B649 | 2 | 1 |
| 1-650 | A1 | B650 | 2 | 1 |
| 1-651 | A1 | B651 | 2 | 1 |
| 1-652 | A1 | B652 | 2 | 1 |
| 1-653 | A1 | B653 | 2 | 1 |
| 1-654 | A1 | B654 | 2 | 1 |
| 1-655 | A1 | B655 | 2 | 1 |
| 1-656 | A1 | B656 | 2 | 1 |
| 1-657 | A1 | B657 | 2 | 1 |
| 1-658 | A1 | B658 | 2 | 1 |
| 1-659 | A1 | B659 | 2 | 1 |
| 1-660 | A1 | B660 | 2 | 1 |

TABLE 23

| Compound No. | $L_1$ | $L_2$ | n1 | n2 |
|---|---|---|---|---|
| 2-1 | A2 | B1 | 2 | 1 |
| 4-1 | A4 | B1 | 2 | 1 |
| 6-1 | A6 | B1 | 2 | 1 |
| 8-1 | A8 | B1 | 2 | 1 |
| 10-1 | A10 | B1 | 2 | 1 |
| 12-1 | A12 | B1 | 2 | 1 |
| 14-1 | A14 | B1 | 2 | 1 |
| 16-1 | A16 | B1 | 2 | 1 |
| 18-1 | A18 | B1 | 2 | 1 |
| 20-1 | A20 | B1 | 2 | 1 |
| 22-1 | A22 | B1 | 2 | 1 |
| 24-1 | A24 | B1 | 2 | 1 |
| 26-1 | A26 | B1 | 2 | 1 |
| 28-1 | A28 | B1 | 2 | 1 |
| 30-1 | A30 | B1 | 2 | 1 |
| 32-1 | A32 | B1 | 2 | 1 |
| 34-1 | A34 | B1 | 2 | 1 |
| 36-1 | A36 | B1 | 2 | 1 |
| 38-1 | A38 | B1 | 2 | 1 |
| 40-1 | A40 | B1 | 2 | 1 |
| 42-1 | A42 | B1 | 2 | 1 |
| 44-1 | A44 | B1 | 2 | 1 |
| 46-1 | A46 | B1 | 2 | 1 |
| 48-1 | A48 | B1 | 2 | 1 |
| 50-1 | A50 | B1 | 2 | 1 |
| 52-1 | A52 | B1 | 2 | 1 |
| 54-1 | A54 | B1 | 2 | 1 |
| 56-1 | A56 | B1 | 2 | 1 |
| 58-1 | A58 | B1 | 2 | 1 |
| 60-1 | A60 | B1 | 2 | 1 |

TABLE 24

| Compound No. | $L_1$ | $L_2$ | n1 | n2 |
|---|---|---|---|---|
| 62-1 | A62 | B1 | 2 | 1 |
| 64-1 | A64 | B1 | 2 | 1 |
| 66-1 | A66 | B1 | 2 | 1 |
| 68-1 | A68 | B1 | 2 | 1 |
| 70-1 | A70 | B1 | 2 | 1 |
| 73-1 | A73 | B1 | 2 | 1 |
| 76-1 | A76 | B1 | 2 | 1 |
| 80-1 | A80 | B1 | 2 | 1 |
| 84-1 | A84 | B1 | 2 | 1 |

TABLE 24-continued

| Compound No. | $L_1$ | $L_2$ | n1 | n2 |
|---|---|---|---|---|
| 87-1 | A87 | B1 | 2 | 1 |
| 90-1 | A90 | B1 | 2 | 1 |
| 93-1 | A93 | B1 | 2 | 1 |
| 96-1 | A96 | B1 | 2 | 1 |
| 99-1 | A99 | B1 | 2 | 1 |
| 102-1 | A102 | B1 | 2 | 1 |
| 105-1 | A105 | B1 | 2 | 1 |
| 108-1 | A108 | B1 | 2 | 1 |
| 120-1 | A120 | B1 | 2 | 1 |
| 125-1 | A125 | B1 | 2 | 1 |
| 129-1 | A129 | B1 | 2 | 1 |
| 130-1 | A130 | B1 | 2 | 1 |
| 133-1 | A133 | B1 | 2 | 1 |
| 137-1 | A137 | B1 | 2 | 1 |
| 140-1 | A140 | B1 | 2 | 1 |
| 143-1 | A143 | B1 | 2 | 1 |
| 146-1 | A146 | B1 | 2 | 1 |
| 149-1 | A149 | B1 | 2 | 1 |
| 151-1 | A151 | B1 | 2 | 1 |
| 152-1 | A152 | B1 | 2 | 1 |
| 153-1 | A153 | B1 | 2 | 1 |

TABLE 25

| Compound No. | $L_1$ | $L_2$ | n1 | n2 |
|---|---|---|---|---|
| 154-1 | A154 | B1 | 2 | 1 |
| 155-1 | A155 | B1 | 2 | 1 |
| 156-1 | A156 | B1 | 2 | 1 |
| 157-1 | A157 | B1 | 2 | 1 |
| 158-1 | A158 | B1 | 2 | 1 |
| 159-1 | A159 | B1 | 2 | 1 |
| 160-1 | A160 | B1 | 2 | 1 |
| 161-1 | A161 | B1 | 2 | 1 |
| 162-1 | A162 | B1 | 2 | 1 |
| 163-1 | A163 | B1 | 2 | 1 |
| 164-1 | A164 | B1 | 2 | 1 |
| 165-1 | A165 | B1 | 2 | 1 |
| 166-1 | A166 | B1 | 2 | 1 |
| 167-1 | A167 | B1 | 2 | 1 |
| 168-1 | A168 | B1 | 2 | 1 |
| 169-1 | A169 | B1 | 2 | 1 |
| 170-1 | A170 | B1 | 2 | 1 |
| 171-1 | A171 | B1 | 2 | 1 |
| 172-1 | A172 | B1 | 2 | 1 |
| 173-1 | A173 | B1 | 2 | 1 |
| 174-1 | A174 | B1 | 2 | 1 |
| 175-1 | A175 | B1 | 2 | 1 |
| 176-1 | A176 | B1 | 2 | 1 |
| 177-1 | A177 | B1 | 2 | 1 |
| 178-1 | A178 | B1 | 2 | 1 |
| 179-1 | A179 | B1 | 2 | 1 |
| 180-1 | A180 | B1 | 2 | 1 |
| 181-1 | A181 | B1 | 2 | 1 |
| 182-1 | A182 | B1 | 2 | 1 |
| 183-1 | A183 | B1 | 2 | 1 |

TABLE 26

| Compound No. | $L_1$ | $L_2$ | n1 | n2 |
|---|---|---|---|---|
| 184-1 | A184 | B1 | 2 | 1 |
| 185-1 | A185 | B1 | 2 | 1 |
| 186-1 | A186 | B1 | 2 | 1 |
| 187-1 | A187 | B1 | 2 | 1 |
| 188-1 | A188 | B1 | 2 | 1 |
| 189-1 | A189 | B1 | 2 | 1 |
| 190-1 | A190 | B1 | 2 | 1 |
| 191-1 | A191 | B1 | 2 | 1 |
| 192-1 | A192 | B1 | 2 | 1 |
| 193-1 | A193 | B1 | 2 | 1 |
| 194-1 | A194 | B1 | 2 | 1 |
| 195-1 | A195 | B1 | 2 | 1 |

TABLE 26-continued

| Compound No. | $L_1$ | $L_2$ | n1 | n2 |
|---|---|---|---|---|
| 196-1 | A196 | B1 | 2 | 1 |
| 197-1 | A197 | B1 | 2 | 1 |
| 198-1 | A198 | B1 | 2 | 1 |
| 199-1 | A199 | B1 | 2 | 1 |
| 200-1 | A200 | B1 | 2 | 1 |
| 201-1 | A201 | B1 | 2 | 1 |
| 202-1 | A202 | B1 | 2 | 1 |
| 203-1 | A203 | B1 | 2 | 1 |
| 204-1 | A204 | B1 | 2 | 1 |
| 205-1 | A205 | B1 | 2 | 1 |
| 206-1 | A206 | B1 | 2 | 1 |
| 207-1 | A207 | B1 | 2 | 1 |
| 208-1 | A208 | B1 | 2 | 1 |
| 209-1 | A209 | B1 | 2 | 1 |
| 210-1 | A210 | B1 | 2 | 1 |
| 211-1 | A211 | B1 | 2 | 1 |
| 212-1 | A212 | B1 | 2 | 1 |
| 213-1 | A213 | B1 | 2 | 1 |

TABLE 27

| Compound No. | $L_1$ | $L_2$ | n1 | n2 |
|---|---|---|---|---|
| 214-1 | A214 | B1 | 2 | 1 |
| 215-1 | A215 | B1 | 2 | 1 |
| 216-1 | A216 | B1 | 2 | 1 |
| 217-1 | A217 | B1 | 2 | 1 |
| 218-1 | A218 | B1 | 2 | 1 |
| 219-1 | A219 | B1 | 2 | 1 |
| 220-1 | A220 | B1 | 2 | 1 |
| 221-1 | A221 | B1 | 2 | 1 |
| 222-1 | A222 | B1 | 2 | 1 |
| 223-1 | A223 | B1 | 2 | 1 |
| 224-1 | A224 | B1 | 2 | 1 |
| 225-1 | A225 | B1 | 2 | 1 |
| 226-1 | A226 | B1 | 2 | 1 |
| 227-1 | A227 | B1 | 2 | 1 |
| 228-1 | A228 | B1 | 2 | 1 |
| 229-1 | A229 | B1 | 2 | 1 |
| 230-1 | A230 | B1 | 2 | 1 |
| 231-1 | A231 | B1 | 2 | 1 |
| 232-1 | A232 | B1 | 2 | 1 |
| 233-1 | A233 | B1 | 2 | 1 |
| 234-1 | A234 | B1 | 2 | 1 |
| 235-1 | A235 | B1 | 2 | 1 |
| 236-1 | A236 | B1 | 2 | 1 |
| 237-1 | A237 | B1 | 2 | 1 |
| 238-1 | A238 | B1 | 2 | 1 |
| 239-1 | A239 | B1 | 2 | 1 |
| 240-1 | A240 | B1 | 2 | 1 |
| 241-1 | A241 | B1 | 2 | 1 |
| 242-1 | A242 | B1 | 2 | 1 |
| 243-1 | A243 | B1 | 2 | 1 |

TABLE 28

| Compound No. | $L_1$ | $L_2$ | n1 | n2 |
|---|---|---|---|---|
| 244-1 | A244 | B1 | 2 | 1 |
| 245-1 | A245 | B1 | 2 | 1 |
| 246-1 | A246 | B1 | 2 | 1 |
| 247-1 | A247 | B1 | 2 | 1 |
| 248-1 | A248 | B1 | 2 | 1 |
| 249-1 | A249 | B1 | 2 | 1 |
| 250-1 | A250 | B1 | 2 | 1 |
| 251-1 | A251 | B1 | 2 | 1 |
| 252-1 | A252 | B1 | 2 | 1 |
| 253-1 | A253 | B1 | 2 | 1 |
| 254-1 | A254 | B1 | 2 | 1 |
| 255-1 | A255 | B1 | 2 | 1 |
| 256-1 | A256 | B1 | 2 | 1 |
| 257-1 | A257 | B1 | 2 | 1 |
| 258-1 | A258 | B1 | 2 | 1 |

TABLE 28-continued

| Compound No. | $L_1$ | $L_2$ | n1 | n2 |
|---|---|---|---|---|
| 259-1 | A259 | B1 | 2 | 1 |
| 260-1 | A260 | B1 | 2 | 1 |
| 261-1 | A261 | B1 | 2 | 1 |
| 262-1 | A262 | B1 | 2 | 1 |
| 263-1 | A263 | B1 | 2 | 1 |
| 264-1 | A264 | B1 | 2 | 1 |
| 265-1 | A265 | B1 | 2 | 1 |
| 266-1 | A266 | B1 | 2 | 1 |
| 267-1 | A267 | B1 | 2 | 1 |
| 268-1 | A268 | B1 | 2 | 1 |
| 269-1 | A269 | B1 | 2 | 1 |
| 270-1 | A270 | B1 | 2 | 1 |
| 271-1 | A271 | B1 | 2 | 1 |
| 272-1 | A272 | B1 | 2 | 1 |
| 273-1 | A273 | B1 | 2 | 1 |

TABLE 29

| Compound No. | $L_1$ | $L_2$ | n1 | n2 |
|---|---|---|---|---|
| 274-1 | A274 | B1 | 2 | 1 |
| 275-1 | A275 | B1 | 2 | 1 |
| 276-1 | A276 | B1 | 2 | 1 |
| 277-1 | A277 | B1 | 2 | 1 |
| 278-1 | A278 | B1 | 2 | 1 |
| 279-1 | A279 | B1 | 2 | 1 |
| 280-1 | A280 | B1 | 2 | 1 |
| 281-1 | A281 | B1 | 2 | 1 |
| 282-1 | A282 | B1 | 2 | 1 |
| 283-1 | A283 | B1 | 2 | 1 |
| 284-1 | A284 | B1 | 2 | 1 |
| 285-1 | A285 | B1 | 2 | 1 |
| 286-1 | A286 | B1 | 2 | 1 |
| 287-1 | A287 | B1 | 2 | 1 |
| 288-1 | A288 | B1 | 2 | 1 |
| 289-1 | A289 | B1 | 2 | 1 |
| 290-1 | A290 | B1 | 2 | 1 |
| 291-1 | A291 | B1 | 2 | 1 |
| 292-1 | A292 | B1 | 2 | 1 |
| 293-1 | A293 | B1 | 2 | 1 |
| 294-1 | A294 | B1 | 2 | 1 |
| 295-1 | A295 | B1 | 2 | 1 |
| 296-1 | A296 | B1 | 2 | 1 |
| 297-1 | A297 | B1 | 2 | 1 |
| 298-1 | A298 | B1 | 2 | 1 |
| 299-1 | A299 | B1 | 2 | 1 |
| 300-1 | A300 | B1 | 2 | 1 |

TABLE 30

| Compound No. | $L_1$ | $L_2$ | n1 | n2 |
|---|---|---|---|---|
| 2-4 | A2 | B4 | 2 | 1 |
| 2-8 | A2 | B8 | 2 | 1 |
| 2-10 | A2 | B10 | 2 | 1 |
| 2-13 | A2 | B13 | 2 | 1 |
| 2-20 | A2 | B20 | 2 | 1 |
| 2-24 | A2 | B24 | 2 | 1 |
| 2-27 | A2 | B27 | 2 | 1 |
| 2-48 | A2 | B48 | 2 | 1 |
| 2-62 | A2 | B62 | 2 | 1 |
| 2-63 | A2 | B63 | 2 | 1 |
| 2-85 | A2 | B85 | 2 | 1 |
| 2-91 | A2 | B91 | 2 | 1 |
| 2-108 | A2 | B108 | 2 | 1 |
| 2-116 | A2 | B116 | 2 | 1 |
| 2-137 | A2 | B137 | 2 | 1 |
| 2-144 | A2 | B144 | 2 | 1 |
| 2-152 | A2 | B152 | 2 | 1 |
| 2-162 | A2 | B162 | 2 | 1 |
| 2-169 | A2 | B169 | 2 | 1 |
| 2-176 | A2 | B176 | 2 | 1 |
| 2-187 | A2 | B187 | 2 | 1 |

TABLE 30-continued

| Compound No. | $L_1$ | $L_2$ | n1 | n2 |
|---|---|---|---|---|
| 2-201 or 838 | A2 | B201 | 2 | 1 |
| 2-213 | A2 | B213 | 2 | 1 |
| 2-249 | A2 | B249 | 2 | 1 |
| 2-272 | A2 | B272 | 2 | 1 |
| 2-281 | A2 | B281 | 2 | 1 |
| 2-306 | A2 | B306 | 2 | 1 |
| 2-340 | A2 | B340 | 2 | 1 |
| 2-399 | A2 | B399 | 2 | 1 |
| 2-445 | A2 | B445 | 2 | 1 |

TABLE 31

| Compound No. | $L_1$ | $L_2$ | n1 | n2 |
|---|---|---|---|---|
| 3-4 | A3 | B4 | 2 | 1 |
| 4-8 | A4 | B8 | 2 | 1 |
| 5-10 | A5 | B10 | 2 | 1 |
| 6-13 | A6 | B13 | 2 | 1 |
| 7-20 | A7 | B20 | 2 | 1 |
| 8-24 | A8 | B24 | 2 | 1 |
| 9-27 | A9 | B27 | 2 | 1 |
| 10-48 | A10 | B48 | 2 | 1 |
| 11-366 or 855 | A11 | B366 | 2 | 1 |
| 12-63 | A12 | B63 | 2 | 1 |
| 13-85 | A13 | B85 | 2 | 1 |
| 14-91 | A14 | B91 | 2 | 1 |
| 15-108 | A15 | B108 | 2 | 1 |
| 16-116 | A16 | B116 | 2 | 1 |
| 17-137 | A17 | B137 | 2 | 1 |
| 18-144 | A18 | B144 | 2 | 1 |
| 19-152 | A19 | B152 | 2 | 1 |
| 20-162 | A20 | B162 | 2 | 1 |
| 21-169 | A21 | B169 | 2 | 1 |
| 22-176 | A22 | B176 | 2 | 1 |
| 23-187 | A23 | B187 | 2 | 1 |
| 24-201 | A24 | B201 | 2 | 1 |
| 25-202 | A25 | B202 | 2 | 1 |
| 26-213 | A26 | B213 | 2 | 1 |
| 27-249 | A27 | B249 | 2 | 1 |
| 28-272 | A28 | B272 | 2 | 1 |
| 29-281 | A29 | B281 | 2 | 1 |
| 30-306 | A30 | B306 | 2 | 1 |
| 31-62 | A31 | B62 | 2 | 1 |
| 32-399 | A32 | B399 | 2 | 1 |
| 33-445 | A33 | B445 | 2 | 1 |

TABLE 32

| Compound No. | $L_1$ | $L_2$ | n1 | n2 |
|---|---|---|---|---|
| 34-4 | A34 | B4 | 2 | 1 |
| 35-8 | A35 | B8 | 2 | 1 |
| 36-10 | A36 | B10 | 2 | 1 |
| 37-13 | A37 | B13 | 2 | 1 |
| 38-20 | A38 | B20 | 2 | 1 |
| 39-24 | A39 | B24 | 2 | 1 |
| 40-27 | A40 | B27 | 2 | 1 |
| 41-48 | A41 | B48 | 2 | 1 |
| 42-62 | A42 | B62 | 2 | 1 |
| 43-63 | A43 | B63 | 2 | 1 |
| 44-85 | A44 | B85 | 2 | 1 |
| 45-91 | A45 | B91 | 2 | 1 |
| 46-108 | A46 | B108 | 2 | 1 |
| 47-116 | A47 | B116 | 2 | 1 |
| 48-137 | A48 | B137 | 2 | 1 |
| 49-144 | A49 | B144 | 2 | 1 |
| 50-152 | A50 | B152 | 2 | 1 |
| 51-162 | A51 | B162 | 2 | 1 |
| 52-169 | A52 | B169 | 2 | 1 |
| 53-176 | A53 | B176 | 2 | 1 |
| 54-187 | A54 | B187 | 2 | 1 |
| 55-201 | A55 | B201 | 2 | 1 |
| 56-202 | A56 | B202 | 2 | 1 |

TABLE 32-continued

| Compound No. | $L_1$ | $L_2$ | n1 | n2 |
|---|---|---|---|---|
| 57-213 | A57 | B213 | 2 | 1 |
| 58-249 | A58 | B249 | 2 | 1 |
| 59-272 | A59 | B272 | 2 | 1 |
| 60-281 | A60 | B281 | 2 | 1 |
| 61-306 | A61 | B306 | 2 | 1 |
| 62-340 | A62 | B340 | 2 | 1 |
| 63-399 | A63 | B399 | 2 | 1 |
| 64-445 | A64 | B445 | 2 | 1 |

TABLE 33

| Compound No. | $L_1$ | $L_2$ | n1 | n2 |
|---|---|---|---|---|
| 65-4 | A65 | B4 | 2 | 1 |
| 66-8 | A66 | B8 | 2 | 1 |
| 67-10 | A67 | B10 | 2 | 1 |
| 68-13 | A68 | B13 | 2 | 1 |
| 69-20 | A69 | B20 | 2 | 1 |
| 70-24 | A70 | B24 | 2 | 1 |
| 71-27 | A71 | B27 | 2 | 1 |
| 72-48 | A72 | B48 | 2 | 1 |
| 73-62 | A73 | B62 | 2 | 1 |
| 74-63 | A74 | B63 | 2 | 1 |
| 75-85 | A75 | B85 | 2 | 1 |
| 76-91 | A76 | B91 | 2 | 1 |
| 77-108 | A77 | B108 | 2 | 1 |
| 78-116 | A78 | B116 | 2 | 1 |
| 79-137 | A79 | B137 | 2 | 1 |
| 80-144 | A80 | B144 | 2 | 1 |
| 81-152 | A81 | B152 | 2 | 1 |
| 82-162 | A82 | B162 | 2 | 1 |
| 83-169 | A83 | B169 | 2 | 1 |
| 84-176 | A84 | B176 | 2 | 1 |
| 85-187 | A85 | B187 | 2 | 1 |
| 86-201 | A86 | B201 | 2 | 1 |
| 87-202 | A87 | B202 | 2 | 1 |
| 88-213 | A88 | B213 | 2 | 1 |
| 89-249 | A89 | B249 | 2 | 1 |
| 90-272 | A90 | B272 | 2 | 1 |
| 91-281 | A91 | B281 | 2 | 1 |
| 92-306 | A92 | B306 | 2 | 1 |
| 93-340 | A93 | B340 | 2 | 1 |
| 94-399 | A94 | B399 | 2 | 1 |
| 95-445 | A95 | B445 | 2 | 1 |

TABLE 34

| Compound No. | $L_1$ | $L_2$ | n1 | n2 |
|---|---|---|---|---|
| 96-4 | A96 | B4 | 2 | 1 |
| 97-8 | A97 | B8 | 2 | 1 |
| 98-10 | A98 | B10 | 2 | 1 |
| 99-13 | A99 | B13 | 2 | 1 |
| 100-20 | A100 | B20 | 2 | 1 |
| 101-24 | A101 | B24 | 2 | 1 |
| 102-27 | A102 | B27 | 2 | 1 |
| 103-48 | A103 | B48 | 2 | 1 |
| 104-62 | A104 | B62 | 2 | 1 |
| 105-63 | A105 | B63 | 2 | 1 |
| 106-85 | A106 | B85 | 2 | 1 |
| 107-91 | A107 | B91 | 2 | 1 |
| 108-108 | A108 | B108 | 2 | 1 |
| 109-116 | A109 | B116 | 2 | 1 |
| 110-137 | A110 | B137 | 2 | 1 |
| 111-144 | A111 | B144 | 2 | 1 |
| 112-152 | A112 | B152 | 2 | 1 |
| 113-162 | A113 | B162 | 2 | 1 |
| 114-169 | A114 | B169 | 2 | 1 |
| 115-176 | A115 | B176 | 2 | 1 |
| 116-48 or 960 | A116 | B48 | 2 | 1 |
| 117-201 | A117 | B201 | 2 | 1 |
| 118-24 or 962 | A118 | B24 | 2 | 1 |
| 119-213 | A119 | B213 | 2 | 1 |

TABLE 34-continued

| Compound No. | $L_1$ | $L_2$ | n1 | n2 |
|---|---|---|---|---|
| 120-249 | A120 | B249 | 2 | 1 |
| 121-272 | A121 | B272 | 2 | 1 |
| 122-281 | A122 | B281 | 2 | 1 |
| 123-306 | A123 | B306 | 2 | 1 |
| 124-340 | A124 | B340 | 2 | 1 |
| 125-399 | A125 | B399 | 2 | 1 |
| 126-445 | A126 | B445 | 2 | 1 |

TABLE 35

| Compound No. | $L_1$ | $L_2$ | n1 | n2 |
|---|---|---|---|---|
| 127-4 | A127 | B4 | 2 | 1 |
| 128-8 | A128 | B8 | 2 | 1 |
| 129-10 | A129 | B10 | 2 | 1 |
| 130-13 | A130 | B13 | 2 | 1 |
| 131-20 | A131 | B20 | 2 | 1 |
| 132-24 | A132 | B24 | 2 | 1 |
| 133-27 | A133 | B27 | 2 | 1 |
| 134-48 | A134 | B48 | 2 | 1 |
| 135-62 | A135 | B62 | 2 | 1 |
| 136-309 or 980 | A136 | B309 | 2 | 1 |
| 137-85 | A137 | B85 | 2 | 1 |
| 138-91 | A138 | B91 | 2 | 1 |
| 139-108 | A139 | B108 | 2 | 1 |
| 140-116 | A140 | B116 | 2 | 1 |
| 141-137 | A141 | B137 | 2 | 1 |
| 142-144 | A142 | B144 | 2 | 1 |
| 143-152 | A143 | B152 | 2 | 1 |
| 144-162 | A144 | B162 | 2 | 1 |
| 145-169 | A145 | B169 | 2 | 1 |
| 146-176 | A146 | B176 | 2 | 1 |
| 147-187 | A147 | B187 | 2 | 1 |
| 148-201 | A148 | B201 | 2 | 1 |
| 149-202 | A149 | B202 | 2 | 1 |
| 150-213 | A150 | B213 | 2 | 1 |
| 209-249 | A209 | B249 | 2 | 1 |
| 152-272 | A152 | B272 | 2 | 1 |
| 153-281 | A153 | B281 | 2 | 1 |
| 154-306 | A154 | B306 | 2 | 1 |
| 155-340 | A155 | B340 | 2 | 1 |
| 156-399 | A156 | B399 | 2 | 1 |
| 157-445 | A157 | B445 | 2 | 1 |

TABLE 36

| Compound No. | $L_1$ | $L_2$ | n1 | n2 |
|---|---|---|---|---|
| 158-4 | A158 | B4 | 2 | 1 |
| 159-8 | A159 | B8 | 2 | 1 |
| 160-10 | A160 | B10 | 2 | 1 |
| 161-13 | A161 | B13 | 2 | 1 |
| 162-20 | A162 | B20 | 2 | 1 |
| 163-24 | A163 | B24 | 2 | 1 |
| 164-27 | A164 | B27 | 2 | 1 |
| 165-48 | A165 | B48 | 2 | 1 |
| 166-62 | A166 | B62 | 2 | 1 |
| 167-63 | A167 | B63 | 2 | 1 |
| 168-85 | A168 | B85 | 2 | 1 |
| 169-91 | A169 | B91 | 2 | 1 |
| 170-108 | A170 | B108 | 2 | 1 |
| 171-116 | A171 | B116 | 2 | 1 |
| 172-137 | A172 | B137 | 2 | 1 |
| 173-144 | A173 | B144 | 2 | 1 |
| 174-152 | A174 | B152 | 2 | 1 |
| 175-162 | A175 | B162 | 2 | 1 |
| 176-169 | A176 | B169 | 2 | 1 |
| 177-176 | A177 | B176 | 2 | 1 |
| 178-187 | A178 | B187 | 2 | 1 |
| 179-201 | A179 | B201 | 2 | 1 |
| 180-202 | A180 | B202 | 2 | 1 |
| 181-213 | A181 | B213 | 2 | 1 |
| 182-249 | A182 | B249 | 2 | 1 |

TABLE 36-continued

| Compound No. | $L_1$ | $L_2$ | n1 | n2 |
|---|---|---|---|---|
| 183-272 | A183 | B272 | 2 | 1 |
| 184-281 | A184 | B281 | 2 | 1 |
| 185-306 | A185 | B306 | 2 | 1 |
| 186-340 | A186 | B340 | 2 | 1 |
| 187-399 | A187 | B399 | 2 | 1 |
| 188-445 | A188 | B445 | 2 | 1 |

TABLE 37

| Compound No. | $L_1$ | $L_2$ | n1 | n2 |
|---|---|---|---|---|
| 189-4 | A189 | B4 | 2 | 1 |
| 190-8 | A190 | B8 | 2 | 1 |
| 191-10 | A191 | B10 | 2 | 1 |
| 192-13 | A192 | B13 | 2 | 1 |
| 193-20 | A193 | B20 | 2 | 1 |
| 194-24 | A194 | B24 | 2 | 1 |
| 195-27 | A195 | B27 | 2 | 1 |
| 196-48 | A196 | B48 | 2 | 1 |
| 197-62 | A197 | B62 | 2 | 1 |
| 198-63 | A198 | B63 | 2 | 1 |
| 199-85 | A199 | B85 | 2 | 1 |
| 200-91 | A200 | B91 | 2 | 1 |
| 201-108 | A201 | B108 | 2 | 1 |
| 202-116 | A202 | B116 | 2 | 1 |
| 203-137 | A203 | B137 | 2 | 1 |
| 204-144 | A204 | B144 | 2 | 1 |
| 205-152 | A205 | B152 | 2 | 1 |
| 206-162 | A206 | B162 | 2 | 1 |
| 207-169 | A207 | B169 | 2 | 1 |
| 208-176 | A208 | B176 | 2 | 1 |
| 210-187 | A210 | B187 | 2 | 1 |
| 211-201 | A211 | B201 | 2 | 1 |
| 212-202 | A212 | B202 | 2 | 1 |
| 213-213 | A213 | B213 | 2 | 1 |
| 214-249 | A214 | B249 | 2 | 1 |
| 215-272 | A215 | B272 | 2 | 1 |
| 216-281 | A216 | B281 | 2 | 1 |
| 217-306 | A217 | B306 | 2 | 1 |
| 218-340 | A218 | B340 | 2 | 1 |
| 219-399 | A219 | B399 | 2 | 1 |
| 220-445 | A220 | B445 | 2 | 1 |

TABLE 38

| Compound No. | $L_1$ | $L_2$ | n1 | n2 |
|---|---|---|---|---|
| 221-4 | A221 | B4 | 2 | 1 |
| 222-8 | A222 | B8 | 2 | 1 |
| 223-10 | A223 | B10 | 2 | 1 |
| 224-13 | A224 | B13 | 2 | 1 |
| 225-20 | A225 | B20 | 2 | 1 |
| 226-24 | A226 | B24 | 2 | 1 |
| 227-27 | A227 | B27 | 2 | 1 |
| 228-48 | A228 | B48 | 2 | 1 |
| 229-62 | A229 | B62 | 2 | 1 |
| 230-63 | A230 | B63 | 2 | 1 |
| 231-85 | A231 | B85 | 2 | 1 |
| 232-91 | A232 | B91 | 2 | 1 |
| 233-108 | A233 | B108 | 2 | 1 |
| 234-116 | A234 | B116 | 2 | 1 |
| 235-137 | A235 | B137 | 2 | 1 |
| 236-144 | A236 | B144 | 2 | 1 |
| 237-152 | A237 | B152 | 2 | 1 |
| 238-162 | A238 | B162 | 2 | 1 |
| 239-169 | A239 | B169 | 2 | 1 |
| 240-176 | A240 | B176 | 2 | 1 |
| 241-187 | A241 | B187 | 2 | 1 |
| 242-201 | A242 | B201 | 2 | 1 |
| 243-202 | A243 | B202 | 2 | 1 |
| 244-213 | A244 | B213 | 2 | 1 |
| 245-249 | A245 | B249 | 2 | 1 |
| 246-272 | A246 | B272 | 2 | 1 |

TABLE 38-continued

| Compound No. | $L_1$ | $L_2$ | n1 | n2 |
|---|---|---|---|---|
| 247-281 | A247 | B281 | 2 | 1 |
| 248-306 | A248 | B306 | 2 | 1 |
| 249-340 | A249 | B340 | 2 | 1 |
| 250-399 | A250 | B399 | 2 | 1 |
| 251-445 | A251 | B445 | 2 | 1 |

TABLE 39

| Compound No. | $L_1$ | $L_2$ | n1 | n2 |
|---|---|---|---|---|
| 252-4 | A252 | B4 | 2 | 1 |
| 253-8 | A253 | B8 | 2 | 1 |
| 254-10 | A254 | B10 | 2 | 1 |
| 255-13 | A255 | B13 | 2 | 1 |
| 256-20 | A256 | B20 | 2 | 1 |
| 257-24 | A257 | B24 | 2 | 1 |
| 258-27 | A258 | B27 | 2 | 1 |
| 259-48 | A259 | B48 | 2 | 1 |
| 260-62 | A260 | B62 | 2 | 1 |
| 261-63 | A261 | B63 | 2 | 1 |
| 262-85 | A262 | B85 | 2 | 1 |
| 263-91 | A263 | B91 | 2 | 1 |
| 264-108 | A264 | B108 | 2 | 1 |
| 265-116 | A265 | B116 | 2 | 1 |
| 266-137 | A266 | B137 | 2 | 1 |
| 267-144 | A267 | B144 | 2 | 1 |
| 268-152 | A268 | B152 | 2 | 1 |
| 269-162 | A269 | B162 | 2 | 1 |
| 270-169 | A270 | B169 | 2 | 1 |
| 271-176 | A271 | B176 | 2 | 1 |
| 272-187 | A272 | B187 | 2 | 1 |
| 274-201 | A274 | B201 | 2 | 1 |
| 275-202 | A275 | B202 | 2 | 1 |
| 276-213 | A276 | B213 | 2 | 1 |
| 277-249 | A277 | B249 | 2 | 1 |
| 278-272 | A278 | B272 | 2 | 1 |
| 279-281 | A279 | B281 | 2 | 1 |
| 280-306 | A280 | B306 | 2 | 1 |
| 281-340 | A281 | B340 | 2 | 1 |
| 282-399 | A282 | B399 | 2 | 1 |
| 283-445 | A283 | B445 | 2 | 1 |

TABLE 40

| Compound No. | $L_1$ | $L_2$ | n1 | n2 |
|---|---|---|---|---|
| 284-4 | A284 | B4 | 2 | 1 |
| 285-8 | A285 | B8 | 2 | 1 |
| 286-10 | A286 | B10 | 2 | 1 |
| 287-13 | A287 | B13 | 2 | 1 |
| 288-20 | A288 | B20 | 2 | 1 |
| 289-24 | A289 | B24 | 2 | 1 |
| 290-27 | A290 | B27 | 2 | 1 |
| 291-48 | A291 | B48 | 2 | 1 |
| 292-62 | A292 | B62 | 2 | 1 |
| 293-63 | A293 | B63 | 2 | 1 |
| 294-85 | A294 | B85 | 2 | 1 |
| 295-91 | A295 | B91 | 2 | 1 |
| 296-108 | A296 | B108 | 2 | 1 |
| 297-116 | A297 | B116 | 2 | 1 |
| 298-137 | A298 | B137 | 2 | 1 |
| 299-144 | A299 | B144 | 2 | 1 |
| 300-152 | A300 | B152 | 2 | 1 |

TABLE 41

| Compound No. | $L_1$ | $L_2$ | n1 | n2 |
|---|---|---|---|---|
| 151-1 | A151 | B1 | 2 | 1 |
| 151-2 | A151 | B2 | 2 | 1 |
| 151-3 | A151 | B3 | 2 | 1 |

TABLE 41-continued

| Compound No. | $L_1$ | $L_2$ | n1 | n2 |
|---|---|---|---|---|
| 151-4 | A151 | B4 | 2 | 1 |
| 151-5 | A151 | B5 | 2 | 1 |
| 151-6 | A151 | B6 | 2 | 1 |
| 151-7 | A151 | B7 | 2 | 1 |
| 151-8 | A151 | B8 | 2 | 1 |
| 151-9 | A151 | B9 | 2 | 1 |
| 151-10 | A151 | B10 | 2 | 1 |
| 151-11 | A151 | B11 | 2 | 1 |
| 151-12 | A151 | B12 | 2 | 1 |
| 151-13 | A151 | B13 | 2 | 1 |
| 151-14 | A151 | B14 | 2 | 1 |
| 151-15 | A151 | B15 | 2 | 1 |
| 151-16 | A151 | B16 | 2 | 1 |
| 151-17 | A151 | B17 | 2 | 1 |
| 151-18 | A151 | B18 | 2 | 1 |
| 151-19 | A151 | B19 | 2 | 1 |
| 151-20 | A151 | B20 | 2 | 1 |
| 151-21 | A151 | B21 | 2 | 1 |
| 151-22 | A151 | B22 | 2 | 1 |
| 151-23 | A151 | B23 | 2 | 1 |
| 151-24 | A151 | B24 | 2 | 1 |
| 151-25 | A151 | B25 | 2 | 1 |
| 151-26 | A151 | B26 | 2 | 1 |
| 151-27 | A151 | B27 | 2 | 1 |
| 151-28 | A151 | B28 | 2 | 1 |
| 151-29 | A151 | B29 | 2 | 1 |
| 151-30 | A151 | B30 | 2 | 1 |

TABLE 42

| Compound No. | $L_1$ | $L_2$ | n1 | n2 |
|---|---|---|---|---|
| 151-31 | A151 | B31 | 2 | 1 |
| 151-32 | A151 | B32 | 2 | 1 |
| 151-33 | A151 | B33 | 2 | 1 |
| 151-34 | A151 | B34 | 2 | 1 |
| 151-35 | A151 | B35 | 2 | 1 |
| 151-36 | A151 | B36 | 2 | 1 |
| 151-37 | A151 | B37 | 2 | 1 |
| 151-38 | A151 | B38 | 2 | 1 |
| 151-39 | A151 | B39 | 2 | 1 |
| 151-40 | A151 | B40 | 2 | 1 |
| 151-41 | A151 | B41 | 2 | 1 |
| 151-42 | A151 | B42 | 2 | 1 |
| 151-43 | A151 | B43 | 2 | 1 |
| 151-44 | A151 | B44 | 2 | 1 |
| 151-45 | A151 | B45 | 2 | 1 |
| 151-46 | A151 | B46 | 2 | 1 |
| 151-47 | A151 | B47 | 2 | 1 |
| 151-48 | A151 | B48 | 2 | 1 |
| 151-49 | A151 | B49 | 2 | 1 |
| 151-50 | A151 | B50 | 2 | 1 |
| 151-51 | A151 | B51 | 2 | 1 |
| 151-52 | A151 | B52 | 2 | 1 |
| 151-53 | A151 | B53 | 2 | 1 |
| 151-54 | A151 | B54 | 2 | 1 |
| 151-55 | A151 | B55 | 2 | 1 |
| 151-56 | A151 | B56 | 2 | 1 |
| 151-57 | A151 | B57 | 2 | 1 |
| 151-58 | A151 | B58 | 2 | 1 |
| 151-59 | A151 | B59 | 2 | 1 |
| 151-60 | A151 | B60 | 2 | 1 |

TABLE 43

| Compound No. | $L_1$ | $L_2$ | n1 | n2 |
|---|---|---|---|---|
| 151-61 | A151 | B61 | 2 | 1 |
| 151-62 | A151 | B62 | 2 | 1 |
| 151-63 | A151 | B63 | 2 | 1 |
| 151-64 | A151 | B64 | 2 | 1 |
| 151-65 | A151 | B65 | 2 | 1 |
| 151-66 | A151 | B66 | 2 | 1 |

TABLE 43-continued

| Compound No. | $L_1$ | $L_2$ | n1 | n2 |
|---|---|---|---|---|
| 151-67 | A151 | B67 | 2 | 1 |
| 151-68 | A151 | B68 | 2 | 1 |
| 151-69 | A151 | B69 | 2 | 1 |
| 151-70 | A151 | B70 | 2 | 1 |
| 151-71 | A151 | B71 | 2 | 1 |
| 151-72 | A151 | B72 | 2 | 1 |
| 151-73 | A151 | B73 | 2 | 1 |
| 151-74 | A151 | B74 | 2 | 1 |
| 151-75 | A151 | B75 | 2 | 1 |
| 151-76 | A151 | B76 | 2 | 1 |
| 151-77 | A151 | B77 | 2 | 1 |
| 151-78 | A151 | B78 | 2 | 1 |
| 151-79 | A151 | B79 | 2 | 1 |
| 151-80 | A151 | B80 | 2 | 1 |
| 151-81 | A151 | B81 | 2 | 1 |
| 151-82 | A151 | B82 | 2 | 1 |
| 151-83 | A151 | B83 | 2 | 1 |
| 151-84 | A151 | B84 | 2 | 1 |
| 151-85 | A151 | B85 | 2 | 1 |
| 151-86 | A151 | B86 | 2 | 1 |
| 151-87 | A151 | B87 | 2 | 1 |
| 151-88 | A151 | B88 | 2 | 1 |
| 151-89 | A151 | B89 | 2 | 1 |
| 151-90 | A151 | B90 | 2 | 1 |

TABLE 44

| Compound No. | $L_1$ | $L_2$ | n1 | n2 |
|---|---|---|---|---|
| 151-91 | A151 | B91 | 2 | 1 |
| 151-92 | A151 | B92 | 2 | 1 |
| 151-93 | A151 | B93 | 2 | 1 |
| 151-94 | A151 | B94 | 2 | 1 |
| 151-95 | A151 | B95 | 2 | 1 |
| 151-96 | A151 | B96 | 2 | 1 |
| 151-97 | A151 | B97 | 2 | 1 |
| 151-98 | A151 | B98 | 2 | 1 |
| 151-99 | A151 | B99 | 2 | 1 |
| 151-100 | A151 | B100 | 2 | 1 |
| 151-101 | A151 | B101 | 2 | 1 |
| 151-102 | A151 | B102 | 2 | 1 |
| 151-103 | A151 | B103 | 2 | 1 |
| 151-104 | A151 | B104 | 2 | 1 |
| 151-105 | A151 | B105 | 2 | 1 |
| 151-106 | A151 | B106 | 2 | 1 |
| 151-107 | A151 | B107 | 2 | 1 |
| 151-108 | A151 | B108 | 2 | 1 |
| 151-109 | A151 | B109 | 2 | 1 |
| 151-110 | A151 | B110 | 2 | 1 |
| 151-111 | A151 | B111 | 2 | 1 |
| 151-112 | A151 | B112 | 2 | 1 |
| 151-113 | A151 | B113 | 2 | 1 |
| 151-114 | A151 | B114 | 2 | 1 |
| 151-115 | A151 | B115 | 2 | 1 |
| 151-116 | A151 | B116 | 2 | 1 |
| 151-117 | A151 | B117 | 2 | 1 |
| 151-118 | A151 | B118 | 2 | 1 |
| 151-119 | A151 | B119 | 2 | 1 |
| 151-120 | A151 | B120 | 2 | 1 |

TABLE 45

| Compound No. | $L_1$ | $L_2$ | n1 | n2 |
|---|---|---|---|---|
| 151-121 | A151 | B121 | 2 | 1 |
| 151-122 | A151 | B122 | 2 | 1 |
| 151-123 | A151 | B123 | 2 | 1 |
| 151-124 | A151 | B124 | 2 | 1 |
| 151-125 | A151 | B125 | 2 | 1 |
| 151-126 | A151 | B126 | 2 | 1 |
| 151-127 | A151 | B127 | 2 | 1 |
| 151-128 | A151 | B128 | 2 | 1 |
| 151-129 | A151 | B129 | 2 | 1 |

TABLE 45-continued

| Compound No. | $L_1$ | $L_2$ | n1 | n2 |
|---|---|---|---|---|
| 151-130 | A151 | B130 | 2 | 1 |
| 151-131 | A151 | B131 | 2 | 1 |
| 151-132 | A151 | B132 | 2 | 1 |
| 151-133 | A151 | B133 | 2 | 1 |
| 151-134 | A151 | B134 | 2 | 1 |
| 151-135 | A151 | B135 | 2 | 1 |
| 151-136 | A151 | B136 | 2 | 1 |
| 151-137 or 1279 | A151 | B137 | 2 | 1 |
| 151-138 | A151 | B138 | 2 | 1 |
| 151-139 | A151 | B139 | 2 | 1 |
| 151-140 | A151 | B140 | 2 | 1 |
| 151-141 | A151 | B141 | 2 | 1 |
| 151-142 | A151 | B142 | 2 | 1 |
| 151-143 | A151 | B143 | 2 | 1 |
| 151-144 | A151 | B144 | 2 | 1 |
| 151-145 | A151 | B145 | 2 | 1 |
| 151-146 | A151 | B146 | 2 | 1 |
| 151-147 | A151 | B147 | 2 | 1 |
| 151-148 | A151 | B148 | 2 | 1 |
| 151-149 | A151 | B149 | 2 | 1 |
| 151-150 | A151 | B150 | 2 | 1 |

TABLE 46

| Compound No. | $L_1$ | $L_2$ | n1 | n2 |
|---|---|---|---|---|
| 151-151 | A151 | B151 | 2 | 1 |
| 151-152 | A151 | B152 | 2 | 1 |
| 151-153 | A151 | B153 | 2 | 1 |
| 151-154 | A151 | B154 | 2 | 1 |
| 151-155 | A151 | B155 | 2 | 1 |
| 151-156 | A151 | B156 | 2 | 1 |
| 151-157 | A151 | B157 | 2 | 1 |
| 151-158 | A151 | B158 | 2 | 1 |
| 151-159 | A151 | B159 | 2 | 1 |
| 151-160 | A151 | B160 | 2 | 1 |
| 151-161 | A151 | B161 | 2 | 1 |
| 151-162 | A151 | B162 | 2 | 1 |
| 151-163 | A151 | B163 | 2 | 1 |
| 151-164 | A151 | B164 | 2 | 1 |
| 151-165 | A151 | B165 | 2 | 1 |
| 151-166 | A151 | B166 | 2 | 1 |
| 151-167 | A151 | B167 | 2 | 1 |
| 151-168 | A151 | B168 | 2 | 1 |
| 151-169 | A151 | B169 | 2 | 1 |
| 151-170 | A151 | B170 | 2 | 1 |
| 151-171 | A151 | B171 | 2 | 1 |
| 151-172 | A151 | B172 | 2 | 1 |
| 151-173 | A151 | B173 | 2 | 1 |
| 151-174 | A151 | B174 | 2 | 1 |
| 151-175 | A151 | B175 | 2 | 1 |
| 151-176 | A151 | B176 | 2 | 1 |
| 151-177 | A151 | B177 | 2 | 1 |
| 151-178 | A151 | B178 | 2 | 1 |
| 151-179 | A151 | B179 | 2 | 1 |
| 151-180 | A151 | B180 | 2 | 1 |

TABLE 47

| Compound No. | $L_1$ | $L_2$ | n1 | n2 |
|---|---|---|---|---|
| 151-181 | A151 | B181 | 2 | 1 |
| 151-182 | A151 | B182 | 2 | 1 |
| 151-183 | A151 | B183 | 2 | 1 |
| 151-184 | A151 | B184 | 2 | 1 |
| 151-185 | A151 | B185 | 2 | 1 |
| 151-186 | A151 | B186 | 2 | 1 |
| 151-187 | A151 | B187 | 2 | 1 |
| 151-188 | A151 | B188 | 2 | 1 |
| 151-189 | A151 | B189 | 2 | 1 |
| 151-190 | A151 | B190 | 2 | 1 |
| 151-191 | A151 | B191 | 2 | 1 |
| 151-192 | A151 | B192 | 2 | 1 |

TABLE 47-continued

| Compound No. | $L_1$ | $L_2$ | n1 | n2 |
|---|---|---|---|---|
| 151-193 | A151 | B193 | 2 | 1 |
| 151-194 | A151 | B194 | 2 | 1 |
| 151-195 | A151 | B195 | 2 | 1 |
| 151-196 | A151 | B196 | 2 | 1 |
| 151-197 | A151 | B197 | 2 | 1 |
| 151-198 | A151 | B198 | 2 | 1 |
| 151-199 | A151 | B199 | 2 | 1 |
| 151-200 | A151 | B200 | 2 | 1 |
| 151-201 | A151 | B201 | 2 | 1 |
| 151-202 | A151 | B202 | 2 | 1 |
| 151-203 | A151 | B203 | 2 | 1 |
| 151-204 | A151 | B204 | 2 | 1 |
| 151-205 | A151 | B205 | 2 | 1 |
| 151-206 | A151 | B206 | 2 | 1 |
| 151-207 | A151 | B207 | 2 | 1 |
| 151-208 | A151 | B208 | 2 | 1 |
| 151-209 | A151 | B209 | 2 | 1 |
| 151-210 | A151 | B210 | 2 | 1 |

TABLE 48

| Compound No. | $L_1$ | $L_2$ | n1 | n2 |
|---|---|---|---|---|
| 151-211 | A151 | B211 | 2 | 1 |
| 151-212 | A151 | B212 | 2 | 1 |
| 151-213 | A151 | B213 | 2 | 1 |
| 151-214 | A151 | B214 | 2 | 1 |
| 151-215 | A151 | B215 | 2 | 1 |
| 151-216 | A151 | B216 | 2 | 1 |
| 151-217 | A151 | B217 | 2 | 1 |
| 151-218 | A151 | B218 | 2 | 1 |
| 151-219 | A151 | B219 | 2 | 1 |
| 151-220 | A151 | B220 | 2 | 1 |
| 151-221 | A151 | B221 | 2 | 1 |
| 151-222 | A151 | B222 | 2 | 1 |
| 151-223 | A151 | B223 | 2 | 1 |
| 151-224 | A151 | B224 | 2 | 1 |
| 151-225 | A151 | B225 | 2 | 1 |
| 151-226 | A151 | B226 | 2 | 1 |
| 151-227 | A151 | B227 | 2 | 1 |
| 151-228 | A151 | B228 | 2 | 1 |
| 151-229 | A151 | B229 | 2 | 1 |
| 151-230 | A151 | B230 | 2 | 1 |
| 151-231 | A151 | B231 | 2 | 1 |
| 151-232 | A151 | B232 | 2 | 1 |
| 151-233 | A151 | B233 | 2 | 1 |
| 151-234 | A151 | B234 | 2 | 1 |
| 151-235 | A151 | B235 | 2 | 1 |
| 151-236 | A151 | B236 | 2 | 1 |
| 151-237 | A151 | B237 | 2 | 1 |
| 151-238 | A151 | B238 | 2 | 1 |
| 151-239 | A151 | B239 | 2 | 1 |
| 151-240 | A151 | B240 | 2 | 1 |

TABLE 49

| Compound No. | $L_1$ | $L_2$ | n1 | n2 |
|---|---|---|---|---|
| 151-241 | A151 | B241 | 2 | 1 |
| 151-242 | A151 | B242 | 2 | 1 |
| 151-243 | A151 | B243 | 2 | 1 |
| 151-244 | A151 | B244 | 2 | 1 |
| 151-245 | A151 | B245 | 2 | 1 |
| 151-246 | A151 | B246 | 2 | 1 |
| 151-247 | A151 | B247 | 2 | 1 |
| 151-248 | A151 | B248 | 2 | 1 |
| 151-249 | A151 | B249 | 2 | 1 |
| 151-250 | A151 | B250 | 2 | 1 |
| 151-251 | A151 | B251 | 2 | 1 |
| 151-252 | A151 | B252 | 2 | 1 |
| 151-253 | A151 | B253 | 2 | 1 |
| 151-254 | A151 | B254 | 2 | 1 |
| 151-255 | A151 | B255 | 2 | 1 |

TABLE 49-continued

| Compound No. | $L_1$ | $L_2$ | n1 | n2 |
|---|---|---|---|---|
| 151-256 | A151 | B256 | 2 | 1 |
| 151-257 | A151 | B257 | 2 | 1 |
| 151-258 | A151 | B258 | 2 | 1 |
| 151-259 | A151 | B259 | 2 | 1 |
| 151-260 | A151 | B260 | 2 | 1 |
| 151-261 | A151 | B261 | 2 | 1 |
| 151-262 | A151 | B262 | 2 | 1 |
| 151-263 | A151 | B263 | 2 | 1 |
| 151-264 | A151 | B264 | 2 | 1 |
| 151-265 | A151 | B265 | 2 | 1 |
| 151-266 | A151 | B266 | 2 | 1 |
| 151-267 | A151 | B267 | 2 | 1 |
| 151-268 | A151 | B268 | 2 | 1 |
| 151-269 | A151 | B269 | 2 | 1 |
| 151-270 | A151 | B270 | 2 | 1 |

TABLE 50

| Compound No. | $L_1$ | $L_2$ | n1 | n2 |
|---|---|---|---|---|
| 151-271 | A151 | B271 | 2 | 1 |
| 151-272 | A151 | B272 | 2 | 1 |
| 151-273 | A151 | B273 | 2 | 1 |
| 151-274 | A151 | B274 | 2 | 1 |
| 151-275 | A151 | B275 | 2 | 1 |
| 151-276 | A151 | B276 | 2 | 1 |
| 151-277 | A151 | B277 | 2 | 1 |
| 151-278 | A151 | B278 | 2 | 1 |
| 151-279 | A151 | B279 | 2 | 1 |
| 151-280 | A151 | B280 | 2 | 1 |
| 151-281 | A151 | B281 | 2 | 1 |
| 151-282 | A151 | B282 | 2 | 1 |
| 151-283 | A151 | B283 | 2 | 1 |
| 151-284 | A151 | B284 | 2 | 1 |
| 151-285 | A151 | B285 | 2 | 1 |
| 151-286 | A151 | B286 | 2 | 1 |
| 151-287 | A151 | B287 | 2 | 1 |
| 151-288 | A151 | B288 | 2 | 1 |
| 151-289 | A151 | B289 | 2 | 1 |
| 151-290 | A151 | B290 | 2 | 1 |
| 151-291 | A151 | B291 | 2 | 1 |
| 151-292 | A151 | B292 | 2 | 1 |
| 151-293 | A151 | B293 | 2 | 1 |
| 151-294 | A151 | B294 | 2 | 1 |
| 151-295 | A151 | B295 | 2 | 1 |
| 151-296 | A151 | B296 | 2 | 1 |
| 151-297 | A151 | B297 | 2 | 1 |
| 151-298 | A151 | B298 | 2 | 1 |
| 151-299 | A151 | B299 | 2 | 1 |
| 151-300 | A151 | B300 | 2 | 1 |

TABLE 51

| Compound No. | $L_1$ | $L_2$ | n1 | n2 |
|---|---|---|---|---|
| 151-301 | A151 | B301 | 2 | 1 |
| 151-302 | A151 | B302 | 2 | 1 |
| 151-303 | A151 | B303 | 2 | 1 |
| 151-304 | A151 | B304 | 2 | 1 |
| 151-305 | A151 | B305 | 2 | 1 |
| 151-306 | A151 | B306 | 2 | 1 |
| 151-307 | A151 | B307 | 2 | 1 |
| 151-308 | A151 | B308 | 2 | 1 |
| 151-309 | A151 | B309 | 2 | 1 |
| 151-310 | A151 | B310 | 2 | 1 |
| 151-311 | A151 | B311 | 2 | 1 |
| 151-312 | A151 | B312 | 2 | 1 |
| 151-313 | A151 | B313 | 2 | 1 |
| 151-314 | A151 | B314 | 2 | 1 |
| 151-315 | A151 | B315 | 2 | 1 |
| 151-316 | A151 | B316 | 2 | 1 |
| 151-317 | A151 | B317 | 2 | 1 |
| 151-318 | A151 | B318 | 2 | 1 |

TABLE 51-continued

| Compound No. | $L_1$ | $L_2$ | n1 | n2 |
|---|---|---|---|---|
| 151-319 | A151 | B319 | 2 | 1 |
| 151-320 | A151 | B320 | 2 | 1 |
| 151-321 | A151 | B321 | 2 | 1 |
| 151-322 | A151 | B322 | 2 | 1 |
| 151-323 | A151 | B323 | 2 | 1 |
| 151-324 | A151 | B324 | 2 | 1 |
| 151-325 | A151 | B325 | 2 | 1 |
| 151-326 | A151 | B326 | 2 | 1 |
| 151-327 | A151 | B327 | 2 | 1 |
| 151-328 | A151 | B328 | 2 | 1 |
| 151-329 | A151 | B329 | 2 | 1 |
| 151-330 | A151 | B330 | 2 | 1 |

TABLE 52

| Compound No. | $L_1$ | $L_2$ | n1 | n2 |
|---|---|---|---|---|
| 151-331 | A151 | B331 | 2 | 1 |
| 151-332 | A151 | B332 | 2 | 1 |
| 151-333 | A151 | B333 | 2 | 1 |
| 151-334 | A151 | B334 | 2 | 1 |
| 151-335 | A151 | B335 | 2 | 1 |
| 151-336 | A151 | B336 | 2 | 1 |
| 151-337 | A151 | B337 | 2 | 1 |
| 151-338 | A151 | B338 | 2 | 1 |
| 151-339 | A151 | B339 | 2 | 1 |
| 151-340 | A151 | B340 | 2 | 1 |
| 151-341 | A151 | B341 | 2 | 1 |
| 151-342 | A151 | B342 | 2 | 1 |
| 151-343 | A151 | B343 | 2 | 1 |
| 151-344 | A151 | B344 | 2 | 1 |
| 151-345 | A151 | B345 | 2 | 1 |
| 151-346 | A151 | B346 | 2 | 1 |
| 151-347 | A151 | B347 | 2 | 1 |
| 151-348 | A151 | B348 | 2 | 1 |
| 151-349 | A151 | B349 | 2 | 1 |
| 151-350 | A151 | B350 | 2 | 1 |
| 151-351 | A151 | B351 | 2 | 1 |
| 151-352 | A151 | B352 | 2 | 1 |
| 151-353 | A151 | B353 | 2 | 1 |
| 151-354 | A151 | B354 | 2 | 1 |
| 151-355 | A151 | B355 | 2 | 1 |
| 151-356 | A151 | B356 | 2 | 1 |
| 151-357 | A151 | B357 | 2 | 1 |
| 151-358 | A151 | B358 | 2 | 1 |
| 151-359 | A151 | B359 | 2 | 1 |
| 151-360 | A151 | B360 | 2 | 1 |

TABLE 53

| Compound No. | $L_1$ | $L_2$ | n1 | n2 |
|---|---|---|---|---|
| 151-361 | A151 | B361 | 2 | 1 |
| 151-362 | A151 | B362 | 2 | 1 |
| 151-363 | A151 | B363 | 2 | 1 |
| 151-364 | A151 | B364 | 2 | 1 |
| 151-365 | A151 | B365 | 2 | 1 |
| 151-366 | A151 | B366 | 2 | 1 |
| 151-367 | A151 | B367 | 2 | 1 |
| 151-368 | A151 | B368 | 2 | 1 |
| 151-369 | A151 | B369 | 2 | 1 |
| 151-370 | A151 | B370 | 2 | 1 |
| 151-371 | A151 | B371 | 2 | 1 |
| 151-372 | A151 | B372 | 2 | 1 |
| 151-373 | A151 | B373 | 2 | 1 |
| 151-374 | A151 | B374 | 2 | 1 |
| 151-375 | A151 | B375 | 2 | 1 |
| 151-376 | A151 | B376 | 2 | 1 |
| 151-377 | A151 | B377 | 2 | 1 |
| 151-378 | A151 | B378 | 2 | 1 |
| 151-379 | A151 | B379 | 2 | 1 |
| 151-380 | A151 | B380 | 2 | 1 |
| 151-381 | A151 | B381 | 2 | 1 |

TABLE 53-continued

| Compound No. | $L_1$ | $L_2$ | n1 | n2 |
|---|---|---|---|---|
| 151-382 | A151 | B382 | 2 | 1 |
| 151-383 | A151 | B383 | 2 | 1 |
| 151-384 | A151 | B384 | 2 | 1 |
| 151-385 | A151 | B385 | 2 | 1 |
| 151-386 | A151 | B386 | 2 | 1 |
| 151-387 | A151 | B387 | 2 | 1 |
| 151-388 | A151 | B388 | 2 | 1 |
| 151-389 | A151 | B389 | 2 | 1 |
| 151-390 | A151 | B390 | 2 | 1 |

TABLE 54

| Compound No. | $L_1$ | $L_2$ | n1 | n2 |
|---|---|---|---|---|
| 151-391 | A151 | B391 | 2 | 1 |
| 151-392 | A151 | B392 | 2 | 1 |
| 151-393 | A151 | B393 | 2 | 1 |
| 151-394 | A151 | B394 | 2 | 1 |
| 151-395 | A151 | B395 | 2 | 1 |
| 151-396 | A151 | B396 | 2 | 1 |
| 151-397 | A151 | B397 | 2 | 1 |
| 151-398 | A151 | B398 | 2 | 1 |
| 151-399 | A151 | B399 | 2 | 1 |
| 151-400 | A151 | B400 | 2 | 1 |
| 151-401 | A151 | B401 | 2 | 1 |
| 151-402 | A151 | B402 | 2 | 1 |
| 151-403 | A151 | B403 | 2 | 1 |
| 151-404 | A151 | B404 | 2 | 1 |
| 151-405 | A151 | B405 | 2 | 1 |
| 151-406 | A151 | B406 | 2 | 1 |
| 151-407 | A151 | B407 | 2 | 1 |
| 151-408 | A151 | B408 | 2 | 1 |
| 151-409 | A151 | B409 | 2 | 1 |
| 151-410 | A151 | B410 | 2 | 1 |
| 151-411 | A151 | B411 | 2 | 1 |
| 151-412 | A151 | B412 | 2 | 1 |
| 151-413 | A151 | B413 | 2 | 1 |
| 151-414 | A151 | B414 | 2 | 1 |
| 151-415 | A151 | B415 | 2 | 1 |
| 151-416 | A151 | B416 | 2 | 1 |
| 151-417 | A151 | B417 | 2 | 1 |
| 151-418 | A151 | B418 | 2 | 1 |
| 151-419 | A151 | B419 | 2 | 1 |
| 151-420 | A151 | B420 | 2 | 1 |

TABLE 55

| Compound No. | $L_1$ | $L_2$ | n1 | n2 |
|---|---|---|---|---|
| 151-421 | A151 | B421 | 2 | 1 |
| 151-422 | A151 | B422 | 2 | 1 |
| 151-423 | A151 | B423 | 2 | 1 |
| 151-424 | A151 | B424 | 2 | 1 |
| 151-425 | A151 | B425 | 2 | 1 |
| 151-426 | A151 | B426 | 2 | 1 |
| 151-427 | A151 | B427 | 2 | 1 |
| 151-428 | A151 | B428 | 2 | 1 |
| 151-429 | A151 | B429 | 2 | 1 |
| 151-430 | A151 | B430 | 2 | 1 |
| 115-431 | A151 | B431 | 2 | 1 |
| 151-432 | A151 | B432 | 2 | 1 |
| 151-433 | A151 | B433 | 2 | 1 |
| 151-434 | A151 | B434 | 2 | 1 |
| 151-435 | A151 | B435 | 2 | 1 |
| 151-436 | A151 | B436 | 2 | 1 |
| 151-437 | A151 | B437 | 2 | 1 |
| 151-438 | A151 | B438 | 2 | 1 |
| 151-439 | A151 | B439 | 2 | 1 |
| 151-440 | A151 | B440 | 2 | 1 |
| 151-441 | A151 | B441 | 2 | 1 |
| 151-442 | A151 | B442 | 2 | 1 |
| 151-443 | A151 | B443 | 2 | 1 |
| 151-444 | A151 | B444 | 2 | 1 |

TABLE 55-continued

| Compound No. | $L_1$ | $L_2$ | n1 | n2 |
|---|---|---|---|---|
| 151-445 | A151 | B445 | 2 | 1 |
| 151-446 | A151 | B446 | 2 | 1 |
| 151-447 | A151 | B447 | 2 | 1 |
| 151-448 | A151 | B448 | 2 | 1 |
| 151-449 | A151 | B449 | 2 | 1 |
| 151-450 | A151 | B450 | 2 | 1 |

TABLE 56

| Compound No. | $L_1$ | $L_2$ | n1 | n2 |
|---|---|---|---|---|
| 151-451 | A151 | B451 | 2 | 1 |
| 151-452 | A151 | B452 | 2 | 1 |
| 151-453 | A151 | B453 | 2 | 1 |
| 151-454 | A151 | B454 | 2 | 1 |
| 151-455 | A151 | B455 | 2 | 1 |
| 151-456 | A151 | B456 | 2 | 1 |
| 151-457 | A151 | B457 | 2 | 1 |
| 151-458 | A151 | B458 | 2 | 1 |
| 151-459 | A151 | B459 | 2 | 1 |
| 151-460 | A151 | B460 | 2 | 1 |
| 151-461 | A151 | B461 | 2 | 1 |
| 151-462 | A151 | B462 | 2 | 1 |
| 151-463 | A151 | B463 | 2 | 1 |
| 151-464 | A151 | B464 | 2 | 1 |
| 151-465 | A151 | B465 | 2 | 1 |
| 151-466 | A151 | B466 | 2 | 1 |
| 151-467 | A151 | B467 | 2 | 1 |
| 151-468 | A151 | B468 | 2 | 1 |
| 151-469 | A151 | B469 | 2 | 1 |
| 151-470 | A151 | B470 | 2 | 1 |
| 151-471 | A151 | B471 | 2 | 1 |
| 151-472 | A151 | B472 | 2 | 1 |
| 151-473 | A151 | B473 | 2 | 1 |
| 151-474 | A151 | B474 | 2 | 1 |
| 151-475 | A151 | B475 | 2 | 1 |
| 151-476 | A151 | B476 | 2 | 1 |
| 151-477 | A151 | B477 | 2 | 1 |
| 151-478 | A151 | B478 | 2 | 1 |
| 151-479 | A151 | B479 | 2 | 1 |
| 151-480 | A151 | B480 | 2 | 1 |

TABLE 57

| Compound No. | $L_1$ | $L_2$ | n1 | n2 |
|---|---|---|---|---|
| 151-481 | A151 | B481 | 2 | 1 |
| 151-482 | A151 | B482 | 2 | 1 |
| 151-483 | A151 | B483 | 2 | 1 |
| 151-484 | A151 | B484 | 2 | 1 |
| 151-485 | A151 | B485 | 2 | 1 |
| 151-486 | A151 | B486 | 2 | 1 |
| 151-487 | A151 | B487 | 2 | 1 |
| 151-488 | A151 | B488 | 2 | 1 |
| 151-489 | A151 | B489 | 2 | 1 |
| 151-490 | A151 | B490 | 2 | 1 |
| 151-491 | A151 | B491 | 2 | 1 |
| 151-492 | A151 | B492 | 2 | 1 |
| 151-493 | A151 | B493 | 2 | 1 |
| 151-494 | A151 | B494 | 2 | 1 |
| 151-495 | A151 | B495 | 2 | 1 |
| 151-496 | A151 | B496 | 2 | 1 |
| 151-497 | A151 | B497 | 2 | 1 |
| 151-498 | A151 | B498 | 2 | 1 |
| 151-499 | A151 | B499 | 2 | 1 |
| 151-500 | A151 | B500 | 2 | 1 |
| 151-501 | A151 | B501 | 2 | 1 |
| 151-502 | A151 | B502 | 2 | 1 |
| 151-503 | A151 | B503 | 2 | 1 |
| 151-504 | A151 | B504 | 2 | 1 |
| 151-505 | A151 | B505 | 2 | 1 |
| 151-506 | A151 | B506 | 2 | 1 |
| 151-507 | A151 | B507 | 2 | 1 |

TABLE 57-continued

| Compound No. | $L_1$ | $L_2$ | n1 | n2 |
|---|---|---|---|---|
| 151-508 | A151 | B508 | 2 | 1 |
| 151-509 | A151 | B509 | 2 | 1 |
| 151-510 | A151 | B510 | 2 | 1 |

TABLE 58

| Compound No. | $L_1$ | $L_2$ | n1 | n2 |
|---|---|---|---|---|
| 151-511 | A151 | B511 | 2 | 1 |
| 151-512 | A151 | B512 | 2 | 1 |
| 151-513 | A151 | B513 | 2 | 1 |
| 151-514 | A151 | B514 | 2 | 1 |
| 151-515 | A151 | B515 | 2 | 1 |
| 151-516 | A151 | B516 | 2 | 1 |
| 151-517 | A151 | B517 | 2 | 1 |
| 151-518 | A151 | B518 | 2 | 1 |
| 151-519 | A151 | B519 | 2 | 1 |
| 151-520 | A151 | B520 | 2 | 1 |
| 151-521 | A151 | B521 | 2 | 1 |
| 151-522 | A151 | B522 | 2 | 1 |
| 151-523 | A151 | B523 | 2 | 1 |
| 151-524 | A151 | B524 | 2 | 1 |
| 151-525 | A151 | B525 | 2 | 1 |
| 151-526 | A151 | B526 | 2 | 1 |
| 151-527 | A151 | B527 | 2 | 1 |
| 151-528 | A151 | B528 | 2 | 1 |
| 151-529 | A151 | B529 | 2 | 1 |
| 151-530 | A151 | B530 | 2 | 1 |
| 151-531 | A151 | B531 | 2 | 1 |
| 151-532 | A151 | B532 | 2 | 1 |
| 151-533 | A151 | B533 | 2 | 1 |
| 151-534 | A151 | B534 | 2 | 1 |
| 151-535 | A151 | B535 | 2 | 1 |
| 151-536 | A151 | B536 | 2 | 1 |
| 151-537 | A151 | B537 | 2 | 1 |
| 151-538 | A151 | B538 | 2 | 1 |
| 151-539 | A151 | B539 | 2 | 1 |
| 151-540 | A151 | B540 | 2 | 1 |

TABLE 59

| Compound No. | $L_1$ | $L_2$ | n1 | n2 |
|---|---|---|---|---|
| 151-541 | A151 | B541 | 2 | 1 |
| 151-542 | A151 | B542 | 2 | 1 |
| 151-543 | A151 | B543 | 2 | 1 |
| 151-544 | A151 | B544 | 2 | 1 |
| 151-545 | A151 | B545 | 2 | 1 |
| 151-546 | A151 | B546 | 2 | 1 |
| 151-547 | A151 | B547 | 2 | 1 |
| 151-548 | A151 | B548 | 2 | 1 |
| 151-549 | A151 | B549 | 2 | 1 |
| 151-550 | A151 | B550 | 2 | 1 |
| 151-551 | A151 | B551 | 2 | 1 |
| 151-552 | A151 | B552 | 2 | 1 |
| 151-553 | A151 | B553 | 2 | 1 |
| 151-554 | A151 | B554 | 2 | 1 |
| 151-555 | A151 | B555 | 2 | 1 |
| 151-556 | A151 | B556 | 2 | 1 |
| 151-557 | A151 | B557 | 2 | 1 |
| 151-558 | A151 | B558 | 2 | 1 |
| 151-559 | A151 | B559 | 2 | 1 |
| 151-560 | A151 | B560 | 2 | 1 |
| 151-561 | A151 | B561 | 2 | 1 |
| 151-562 | A151 | B562 | 2 | 1 |
| 151-563 | A151 | B563 | 2 | 1 |
| 151-564 | A151 | B564 | 2 | 1 |
| 151-565 | A151 | B565 | 2 | 1 |
| 151-566 | A151 | B566 | 2 | 1 |
| 151-567 | A151 | B567 | 2 | 1 |
| 151-568 | A151 | B568 | 2 | 1 |
| 151-569 | A151 | B569 | 2 | 1 |
| 151-570 | A151 | B570 | 2 | 1 |

TABLE 59-continued

| Compound No. | $L_1$ | $L_2$ | n1 | n2 |
|---|---|---|---|---|

TABLE 60

| Compound No. | $L_1$ | $L_2$ | n1 | n2 |
|---|---|---|---|---|
| 151-571 | A151 | B571 | 2 | 1 |
| 151-572 | A151 | B572 | 2 | 1 |
| 151-573 | A151 | B573 | 2 | 1 |
| 115-574 | A151 | B574 | 2 | 1 |
| 151-575 | A151 | B575 | 2 | 1 |
| 151-576 | A151 | B576 | 2 | 1 |
| 151-577 | A151 | B577 | 2 | 1 |
| 151-578 | A151 | B578 | 2 | 1 |
| 151-579 | A151 | B579 | 2 | 1 |
| 151-580 | A151 | B580 | 2 | 1 |
| 151-581 | A151 | B581 | 2 | 1 |
| 151-582 | A151 | B582 | 2 | 1 |
| 151-583 | A151 | B583 | 2 | 1 |
| 151-584 | A151 | B584 | 2 | 1 |
| 151-585 | A151 | B585 | 2 | 1 |
| 151-586 | A151 | B586 | 2 | 1 |
| 151-587 | A151 | B587 | 2 | 1 |
| 151-588 | A151 | B588 | 2 | 1 |
| 151-589 | A151 | B589 | 2 | 1 |
| 151-590 | A151 | B590 | 2 | 1 |
| 151-591 | A151 | B591 | 2 | 1 |
| 151-592 | A151 | B592 | 2 | 1 |
| 151-593 | A151 | B593 | 2 | 1 |
| 151-594 | A151 | B594 | 2 | 1 |
| 151-595 | A151 | B595 | 2 | 1 |
| 151-596 | A151 | B596 | 2 | 1 |
| 151-597 | A151 | B597 | 2 | 1 |
| 151-598 | A151 | B598 | 2 | 1 |
| 151-599 | A151 | B599 | 2 | 1 |
| 151-600 | A151 | B600 | 2 | 1 |

TABLE 61

| Compound No. | $L_1$ | $L_2$ | n1 | n2 |
|---|---|---|---|---|
| 151-601 | A151 | B601 | 2 | 1 |
| 151-602 | A151 | B602 | 2 | 1 |
| 151-603 | A151 | B603 | 2 | 1 |
| 151-604 | A151 | B604 | 2 | 1 |
| 151-605 | A151 | B605 | 2 | 1 |
| 151-606 | A151 | B606 | 2 | 1 |
| 151-607 | A151 | B607 | 2 | 1 |
| 151-608 | A151 | B608 | 2 | 1 |
| 151-609 | A151 | B609 | 2 | 1 |
| 151-610 | A151 | B610 | 2 | 1 |
| 151-611 | A151 | B611 | 2 | 1 |
| 151-612 | A151 | B612 | 2 | 1 |
| 151-613 | A151 | B613 | 2 | 1 |
| 151-614 | A151 | B614 | 2 | 1 |
| 151-615 | A151 | B615 | 2 | 1 |
| 151-616 | A151 | B616 | 2 | 1 |
| 151-617 | A151 | B617 | 2 | 1 |
| 151-618 | A151 | B618 | 2 | 1 |
| 151-619 | A151 | B619 | 2 | 1 |
| 151-620 | A151 | B620 | 2 | 1 |
| 151-621 | A151 | B621 | 2 | 1 |
| 151-622 | A151 | B622 | 2 | 1 |
| 151-623 | A151 | B623 | 2 | 1 |
| 151-624 | A151 | B624 | 2 | 1 |
| 151-625 | A151 | B625 | 2 | 1 |
| 151-626 | A151 | B626 | 2 | 1 |
| 151-627 | A151 | B627 | 2 | 1 |
| 151-628 | A151 | B628 | 2 | 1 |
| 151-629 | A151 | B629 | 2 | 1 |
| 151-630 | A151 | B630 | 2 | 1 |

TABLE 62

| Compound No. | $L_1$ | $L_2$ | n1 | n2 |
|---|---|---|---|---|
| 151-631 | A151 | B631 | 2 | 1 |
| 151-632 | A151 | B632 | 2 | 1 |
| 151-633 | A151 | B633 | 2 | 1 |
| 151-634 | A151 | B634 | 2 | 1 |
| 151-635 | A151 | B635 | 2 | 1 |
| 151-636 | A151 | B636 | 2 | 1 |
| 151-637 | A151 | B637 | 2 | 1 |
| 151-638 | A151 | B638 | 2 | 1 |
| 151-639 | A151 | B639 | 2 | 1 |
| 151-640 | A151 | B640 | 2 | 1 |
| 151-641 | A151 | B641 | 2 | 1 |
| 151-642 | A151 | B642 | 2 | 1 |
| 151-643 | A151 | B643 | 2 | 1 |
| 151-644 | A151 | B644 | 2 | 1 |
| 151-645 | A151 | B645 | 2 | 1 |
| 151-646 | A151 | B646 | 2 | 1 |
| 151-647 | A151 | B647 | 2 | 1 |
| 151-648 | A151 | B648 | 2 | 1 |
| 151-649 | A151 | B649 | 2 | 1 |
| 151-650 | A151 | B650 | 2 | 1 |
| 151-651 | A151 | B651 | 2 | 1 |
| 151-1652 | A151 | B652 | 2 | 1 |
| 151-653 | A151 | B653 | 2 | 1 |
| 151-654 | A151 | B654 | 2 | 1 |
| 151-655 | A151 | B655 | 2 | 1 |
| 151-656 | A151 | B656 | 2 | 1 |
| 151-657 | A151 | B657 | 2 | 1 |
| 151-658 | A151 | B658 | 2 | 1 |
| 151-659 | A151 | B659 | 2 | 1 |
| 151-660 | A151 | B660 | 2 | 1 |

TABLE 63

| Compound No. | $L_1$ | $L_2$ | n1 | n2 |
|---|---|---|---|---|
| 152-4 | A152 | B4 | 2 | 1 |
| 152-8 | A152 | B8 | 2 | 1 |
| 152-10 | A152 | B10 | 2 | 1 |
| 152-13 | A152 | B13 | 2 | 1 |
| 152-20 | A152 | B20 | 2 | 1 |
| 152-24 | A152 | B24 | 2 | 1 |
| 152-27 | A152 | B27 | 2 | 1 |
| 152-48 | A152 | B48 | 2 | 1 |
| 152-62 | A152 | B62 | 2 | 1 |
| 152-63 | A152 | B63 | 2 | 1 |
| 152-85 | A152 | B85 | 2 | 1 |
| 152-91 | A152 | B91 | 2 | 1 |
| 152-108 | A152 | B108 | 2 | 1 |
| 152-116 | A152 | B116 | 2 | 1 |
| 152-137 | A152 | B137 | 2 | 1 |
| 152-144 | A152 | B144 | 2 | 1 |
| 152-152 | A152 | B152 | 2 | 1 |
| 152-162 | A152 | B162 | 2 | 1 |
| 152-169 | A152 | B169 | 2 | 1 |
| 152-176 | A152 | B176 | 2 | 1 |
| 152-187 | A152 | B187 | 2 | 1 |
| 152-201 | A152 | B201 | 2 | 1 |
| 152-202 | A152 | B202 | 2 | 1 |
| 152-213 | A152 | B213 | 2 | 1 |
| 152-249 | A152 | B249 | 2 | 1 |
| 152-272 | A152 | B272 | 2 | 1 |
| 152-281 | A152 | B281 | 2 | 1 |
| 152-306 | A152 | B306 | 2 | 1 |
| 152-340 | A152 | B340 | 2 | 1 |
| 152-399 | A152 | B399 | 2 | 1 |
| 152-445 | A152 | B445 | 2 | 1 |

TABLE 64

| Compound No. | $L_1$ | $L_2$ | n1 | n2 |
|---|---|---|---|---|
| 153-7 | A153 | B7 | 2 | 1 |
| 153-9 | A153 | B9 | 2 | 1 |

TABLE 64-continued

| Compound No. | $L_1$ | $L_2$ | n1 | n2 |
|---|---|---|---|---|
| 153-10 | A153 | B10 | 2 | 1 |
| 153-13 | A153 | B13 | 2 | 1 |
| 153-22 | A153 | B22 | 2 | 1 |
| 153-26 | A153 | B26 | 2 | 1 |
| 153-29 | A153 | B29 | 2 | 1 |
| 153-50 | A153 | B50 | 2 | 1 |
| 153-64 | A153 | B64 | 2 | 1 |
| 153-65 | A153 | B65 | 2 | 1 |
| 153-87 | A153 | B87 | 2 | 1 |
| 153-93 | A153 | B93 | 2 | 1 |
| 153-110 | A153 | B110 | 2 | 1 |
| 153-118 | A153 | B118 | 2 | 1 |
| 153-139 | A153 | B139 | 2 | 1 |
| 153-146 | A153 | B146 | 2 | 1 |
| 153-154 | A153 | B154 | 2 | 1 |
| 153-163 | A153 | B163 | 2 | 1 |
| 153-167 | A153 | B167 | 2 | 1 |
| 154-178 | A154 | B178 | 2 | 1 |
| 154-189 | A154 | B189 | 2 | 1 |
| 154-203 | A154 | B203 | 2 | 1 |
| 154-205 | A154 | B205 | 2 | 1 |
| 154-215 | A154 | B215 | 2 | 1 |
| 154-251 | A154 | B251 | 2 | 1 |
| 154-274 | A154 | B274 | 2 | 1 |
| 154-283 | A154 | B283 | 2 | 1 |
| 154-308 | A154 | B308 | 2 | 1 |
| 154-341 | A154 | B341 | 2 | 1 |
| 154-397 | A154 | B397 | 2 | 1 |
| 154-447 | A154 | B447 | 2 | 1 |

TABLE 65

| Compound No. | $L_1$ | $L_2$ | n1 | n2 |
|---|---|---|---|---|
| 155-7 | A155 | B7 | 2 | 1 |
| 155-9 | A155 | B9 | 2 | 1 |
| 155-10 | A155 | B10 | 2 | 1 |
| 155-13 | A155 | B13 | 2 | 1 |
| 155-22 | A155 | B22 | 2 | 1 |
| 155-26 | A155 | B26 | 2 | 1 |
| 155-29 | A155 | B29 | 2 | 1 |
| 155-50 | A155 | B50 | 2 | 1 |
| 155-64 | A155 | B64 | 2 | 1 |
| 155-65 | A155 | B65 | 2 | 1 |
| 155-87 | A155 | B87 | 2 | 1 |
| 155-93 | A155 | B93 | 2 | 1 |
| 155-110 | A155 | B110 | 2 | 1 |
| 155-118 | A155 | B118 | 2 | 1 |
| 155-139 | A155 | B139 | 2 | 1 |
| 155-146 | A155 | B146 | 2 | 1 |
| 155-154 | A155 | B154 | 2 | 1 |
| 155-163 | A155 | B163 | 2 | 1 |
| 155-167 | A155 | B167 | 2 | 1 |
| 155-178 | A155 | B178 | 2 | 1 |
| 155-189 | A155 | B189 | 2 | 1 |
| 155-203 | A155 | B203 | 2 | 1 |
| 155-205 | A155 | B205 | 2 | 1 |
| 155-215 | A155 | B215 | 2 | 1 |
| 155-251 | A155 | B251 | 2 | 1 |
| 155-274 | A155 | B274 | 2 | 1 |
| 155-283 | A155 | B283 | 2 | 1 |
| 155-308 | A155 | B308 | 2 | 1 |
| 155-341 | A155 | B341 | 2 | 1 |
| 155-397 | A155 | B397 | 2 | 1 |
| 155-447 | A155 | B447 | 2 | 1 |

TABLE 66

| Compound No. | $L_1$ | $L_2$ | n1 | n2 |
|---|---|---|---|---|
| 156-7 | A156 | B7 | 2 | 1 |
| 157-9 | A157 | B9 | 2 | 1 |
| 158-10 | A158 | B10 | 2 | 1 |

TABLE 66-continued

| Compound No. | $L_1$ | $L_2$ | n1 | n2 |
|---|---|---|---|---|
| 159-13 | A159 | B13 | 2 | 1 |
| 160-22 | A160 | B22 | 2 | 1 |

TABLE 67

| Compound No. | $L_1$ | $L_2$ | n1 | n2 |
|---|---|---|---|---|
| 161-4 | A161 | B4 | 2 | 1 |
| 161-8 | A161 | B8 | 2 | 1 |
| 161-10 | A161 | B10 | 2 | 1 |
| 161-13 | A161 | B13 | 2 | 1 |
| 161-20 | A161 | B20 | 2 | 1 |
| 161-24 | A161 | B24 | 2 | 1 |
| 161-27 | A161 | B27 | 2 | 1 |
| 161-48 | A161 | B48 | 2 | 1 |
| 161-62 | A161 | B62 | 2 | 1 |
| 161-63 | A161 | B63 | 2 | 1 |
| 161-85 | A161 | B85 | 2 | 1 |
| 161-91 | A161 | B91 | 2 | 1 |
| 161-108 | A161 | B108 | 2 | 1 |
| 161-116 | A161 | B116 | 2 | 1 |
| 161-137 | A161 | B137 | 2 | 1 |
| 161-144 | A161 | B144 | 2 | 1 |
| 161-152 | A161 | B152 | 2 | 1 |
| 161-162 | A161 | B162 | 2 | 1 |
| 161-169 | A161 | B169 | 2 | 1 |
| 161-176 | A161 | B176 | 2 | 1 |
| 161-187 | A161 | B187 | 2 | 1 |
| 161-201 | A161 | B201 | 2 | 1 |
| 161-202 | A161 | B202 | 2 | 1 |
| 161-213 | A161 | B213 | 2 | 1 |
| 161-249 | A161 | B249 | 2 | 1 |
| 161-272 | A161 | B272 | 2 | 1 |
| 161-281 | A161 | B281 | 2 | 1 |
| 161-306 | A161 | B306 | 2 | 1 |
| 161-340 | A161 | B340 | 2 | 1 |
| 161-399 | A161 | B399 | 2 | 1 |
| 161-445 | A161 | B445 | 2 | 1 |

TABLE 68

| Compound No. | $L_1$ | $L_2$ | n1 | n2 |
|---|---|---|---|---|
| 162-4 | A162 | B4 | 2 | 1 |
| 163-8 | A163 | B8 | 2 | 1 |
| 164-10 | A164 | B10 | 2 | 1 |
| 165-13 | A165 | B13 | 2 | 1 |
| 166-20 | A166 | B20 | 2 | 1 |
| 167-24 | A167 | B24 | 2 | 1 |
| 168-27 | A168 | B27 | 2 | 1 |
| 169-48 | A169 | B48 | 2 | 1 |
| 170-62 | A170 | B62 | 2 | 1 |
| 171-63 | A171 | B63 | 2 | 1 |
| 171-85 | A171 | B85 | 2 | 1 |
| 171-91 | A171 | B91 | 2 | 1 |
| 171-108 | A171 | B108 | 2 | 1 |
| 171-116 | A171 | B116 | 2 | 1 |
| 171-137 | A171 | B137 | 2 | 1 |
| 171-144 | A171 | B144 | 2 | 1 |
| 171-152 | A171 | B152 | 2 | 1 |
| 171-162 | A171 | B162 | 2 | 1 |
| 171-169 | A171 | B169 | 2 | 1 |
| 171-176 | A171 | B176 | 2 | 1 |
| 171-187 | A171 | B187 | 2 | 1 |
| 171-201 | A171 | B201 | 2 | 1 |
| 171-202 | A171 | B202 | 2 | 1 |
| 171-213 | A171 | B213 | 2 | 1 |
| 171-249 | A171 | B249 | 2 | 1 |
| 171-272 | A171 | B272 | 2 | 1 |

TABLE 68-continued

| Compound No. | $L_1$ | $L_2$ | n1 | n2 |
|---|---|---|---|---|
| 171-281 | A171 | B281 | 2 | 1 |
| 171-306 | A171 | B306 | 2 | 1 |
| 171-340 | A171 | B340 | 2 | 1 |
| 171-399 | A171 | B399 | 2 | 1 |
| 171-445 | A171 | B445 | 2 | 1 |

TABLE 69

| Compound No. | $L_1$ | $L_2$ | n1 | n2 |
|---|---|---|---|---|
| 171-7 | A171 | B7 | 2 | 1 |
| 171-9 | A171 | B9 | 2 | 1 |
| 171-10 | A171 | B10 | 2 | 1 |
| 171-13 | A171 | B13 | 2 | 1 |
| 171-22 | A171 | B22 | 2 | 1 |
| 171-26 | A171 | B26 | 2 | 1 |
| 171-29 | A171 | B29 | 2 | 1 |
| 171-50 | A171 | B50 | 2 | 1 |
| 171-64 | A171 | B64 | 2 | 1 |
| 171-65 | A171 | B65 | 2 | 1 |
| 172-87 | A172 | B87 | 2 | 1 |
| 173-93 | A173 | B93 | 2 | 1 |
| 174-110 | A174 | B110 | 2 | 1 |
| 175-118 | A175 | B118 | 2 | 1 |
| 176-139 | A176 | B139 | 2 | 1 |
| 177-146 | A177 | B146 | 2 | 1 |
| 178-154 | A178 | B154 | 2 | 1 |
| 178-163 | A178 | B163 | 2 | 1 |
| 178-167 | A178 | B167 | 2 | 1 |
| 178-178 | A178 | B178 | 2 | 1 |
| 178-189 | A178 | B189 | 2 | 1 |
| 178-203 | A178 | B203 | 2 | 1 |
| 178-205 | A178 | B205 | 2 | 1 |
| 178-215 | A178 | B215 | 2 | 1 |
| 178-251 | A178 | B251 | 2 | 1 |
| 178-274 | A178 | B274 | 2 | 1 |
| 178-283 | A178 | B283 | 2 | 1 |
| 178-308 | A178 | B308 | 2 | 1 |
| 178-341 | A178 | B341 | 2 | 1 |
| 178-397 | A178 | B397 | 2 | 1 |
| 178-447 | A178 | B447 | 2 | 1 |

TABLE 70

| Compound No. | $L_1$ | $L_2$ | n1 | n2 |
|---|---|---|---|---|
| 178-4 | A178 | B4 | 2 | 1 |
| 178-8 | A178 | B8 | 2 | 1 |
| 178-10 | A178 | B10 | 2 | 1 |
| 178-13 | A178 | B13 | 2 | 1 |
| 178-20 | A178 | B20 | 2 | 1 |
| 178-24 | A178 | B24 | 2 | 1 |
| 178-27 | A178 | B27 | 2 | 1 |
| 178-48 | A178 | B48 | 2 | 1 |
| 178-62 | A178 | B62 | 2 | 1 |
| 178-63 | A178 | B63 | 2 | 1 |
| 178-85 | A178 | B85 | 2 | 1 |
| 178-91 | A178 | B91 | 2 | 1 |
| 178-108 | A178 | B108 | 2 | 1 |
| 178-116 | A178 | B116 | 2 | 1 |
| 178-137 | A178 | B137 | 2 | 1 |
| 178-144 | A178 | B144 | 2 | 1 |
| 178-152 | A178 | B152 | 2 | 1 |
| 179-162 | A179 | B162 | 2 | 1 |
| 180-169 | A180 | B169 | 2 | 1 |
| 181-176 | A181 | B176 | 2 | 1 |
| 182-187 | A182 | B187 | 2 | 1 |
| 183-201 | A183 | B201 | 2 | 1 |
| 184-202 | A184 | B202 | 2 | 1 |
| 185-213 | A185 | B213 | 2 | 1 |
| 186-249 | A186 | B249 | 2 | 1 |
| 187-272 | A187 | B272 | 2 | 1 |
| 188-281 | A188 | B281 | 2 | 1 |

TABLE 70-continued

| Compound No. | $L_1$ | $L_2$ | n1 | n2 |
|---|---|---|---|---|
| 189-306 | A189 | B306 | 2 | 1 |
| 190-340 | A190 | B340 | 2 | 1 |
| 191-399 | A191 | B399 | 2 | 1 |
| 192-445 | A192 | B445 | 2 | 1 |

TABLE 71

| Compound No. | $L_1$ | $L_2$ | n1 | n2 |
|---|---|---|---|---|
| 193-4 | A193 | B4 | 2 | 1 |
| 194-8 | A194 | B8 | 2 | 1 |
| 195-10 | A195 | B10 | 2 | 1 |
| 196-13 | A196 | B13 | 2 | 1 |
| 197-20 | A197 | B20 | 2 | 1 |
| 198-24 | A198 | B24 | 2 | 1 |
| 199-27 | A199 | B27 | 2 | 1 |
| 200-48 | A200 | B48 | 2 | 1 |
| 201-62 | A201 | B62 | 2 | 1 |
| 202-63 | A202 | B63 | 2 | 1 |
| 203-85 | A203 | B85 | 2 | 1 |
| 204-91 | A204 | B91 | 2 | 1 |
| 205-108 | A205 | B108 | 2 | 1 |
| 206-116 | A206 | B116 | 2 | 1 |
| 207-137 | A207 | B137 | 2 | 1 |
| 208-144 | A208 | B144 | 2 | 1 |
| 209-152 | A209 | B152 | 2 | 1 |
| 210-162 | A210 | B162 | 2 | 1 |
| 211-169 | A211 | B169 | 2 | 1 |
| 212-176 | A212 | B176 | 2 | 1 |
| 213-187 | A213 | B187 | 2 | 1 |
| 214-201 | A214 | B201 | 2 | 1 |
| 215-202 | A215 | B202 | 2 | 1 |
| 216-213 | A216 | B213 | 2 | 1 |
| 217-249 | A217 | B249 | 2 | 1 |
| 218-272 | A218 | B272 | 2 | 1 |
| 219-281 | A219 | B281 | 2 | 1 |
| 220-306 | A220 | B306 | 2 | 1 |
| 221-340 | A221 | B340 | 2 | 1 |
| 222-399 | A222 | B399 | 2 | 1 |

TABLE 72

| Compound No. | $L_1$ | $L_2$ | n1 | n2 |
|---|---|---|---|---|
| 223-4 | A223 | B4 | 2 | 1 |
| 224-8 | A224 | B8 | 2 | 1 |
| 225-10 | A225 | B10 | 2 | 1 |
| 226-13 | A226 | B13 | 2 | 1 |
| 227-20 | A227 | B20 | 2 | 1 |
| 228-24 | A228 | B24 | 2 | 1 |
| 229-27 | A229 | B27 | 2 | 1 |
| 230-48 | A230 | B48 | 2 | 1 |
| 231-62 | A231 | B62 | 2 | 1 |
| 232-63 | A232 | B63 | 2 | 1 |
| 233-85 | A233 | B85 | 2 | 1 |
| 234-91 | A234 | B91 | 2 | 1 |
| 235-108 | A235 | B108 | 2 | 1 |
| 236-116 | A236 | B116 | 2 | 1 |
| 237-137 | A237 | B137 | 2 | 1 |
| 238-144 | A238 | B144 | 2 | 1 |
| 239-152 | A239 | B152 | 2 | 1 |
| 240-162 | A240 | B162 | 2 | 1 |
| 241-169 | A241 | B169 | 2 | 1 |
| 242-176 | A242 | B176 | 2 | 1 |
| 243-187 | A243 | B187 | 2 | 1 |
| 244-201 | A244 | B201 | 2 | 1 |
| 245-202 | A245 | B202 | 2 | 1 |
| 246-213 | A246 | B213 | 2 | 1 |
| 247-249 | A247 | B249 | 2 | 1 |

TABLE 72-continued

| Compound No. | $L_1$ | $L_2$ | n1 | n2 |
|---|---|---|---|---|
| 248-272 | A248 | B272 | 2 | 1 |
| 249-281 | A249 | B281 | 2 | 1 |
| 250-306 | A250 | B306 | 2 | 1 |
| 251-340 | A251 | B340 | 2 | 1 |
| 252-399 | A252 | B399 | 2 | 1 |

TABLE 73

| Compound No. | $L_1$ | $L_2$ | n1 | n2 |
|---|---|---|---|---|
| 253-1 | A253 | B1 | 2 | 1 |
| 253-2 | A253 | B2 | 2 | 1 |
| 253-3 | A253 | B3 | 2 | 1 |
| 253-4 | A253 | B4 | 2 | 1 |
| 253-5 | A253 | B5 | 2 | 1 |
| 253-6 | A253 | B6 | 2 | 1 |
| 253-7 | A253 | B7 | 2 | 1 |
| 253-8 | A253 | B8 | 2 | 1 |
| 253-9 | A253 | B9 | 2 | 1 |
| 253-10 | A253 | B10 | 2 | 1 |
| 253-11 | A253 | B11 | 2 | 1 |
| 253-12 | A253 | B12 | 2 | 1 |
| 253-13 | A253 | B13 | 2 | 1 |
| 253-14 | A253 | B14 | 2 | 1 |
| 253-15 | A253 | B15 | 2 | 1 |
| 253-16 | A253 | B16 | 2 | 1 |
| 253-17 | A253 | B17 | 2 | 1 |
| 253-18 | A253 | B18 | 2 | 1 |
| 253-19 | A253 | B19 | 2 | 1 |
| 253-20 | A253 | B20 | 2 | 1 |
| 253-21 | A253 | B21 | 2 | 1 |
| 253-22 | A253 | B22 | 2 | 1 |
| 253-23 | A253 | B23 | 2 | 1 |
| 253-24 | A253 | B24 | 2 | 1 |
| 253-25 | A253 | B25 | 2 | 1 |
| 253-26 | A253 | B26 | 2 | 1 |
| 253-27 | A253 | B27 | 2 | 1 |
| 253-28 | A253 | B28 | 2 | 1 |
| 253-29 | A253 | B29 | 2 | 1 |
| 253-30 | A253 | B30 | 2 | 1 |

TABLE 74

| Compound No. | $L_1$ | $L_2$ | n1 | n2 |
|---|---|---|---|---|
| 253-31 | A253 | B31 | 2 | 1 |
| 253-32 | A253 | B32 | 2 | 1 |
| 253-33 | A253 | B33 | 2 | 1 |
| 253-34 | A253 | B34 | 2 | 1 |
| 253-35 | A253 | B35 | 2 | 1 |
| 253-36 | A253 | B36 | 2 | 1 |
| 253-37 | A253 | B37 | 2 | 1 |
| 253-38 | A253 | B38 | 2 | 1 |
| 253-39 | A253 | B39 | 2 | 1 |
| 253-40 | A253 | B40 | 2 | 1 |
| 253-41 | A253 | B41 | 2 | 1 |
| 253-42 | A253 | B42 | 2 | 1 |
| 253-43 | A253 | B43 | 2 | 1 |
| 253-44 | A253 | B44 | 2 | 1 |
| 253-45 | A253 | B45 | 2 | 1 |
| 253-46 | A253 | B46 | 2 | 1 |
| 253-47 | A253 | B47 | 2 | 1 |
| 253-48 | A253 | B48 | 2 | 1 |
| 253-49 | A253 | B49 | 2 | 1 |
| 253-50 | A253 | B50 | 2 | 1 |
| 253-51 | A253 | B51 | 2 | 1 |
| 253-52 | A253 | B52 | 2 | 1 |
| 253-53 | A253 | B53 | 2 | 1 |
| 253-74 | A253 | B74 | 2 | 1 |
| 253-136 | A253 | B136 | 2 | 1 |
| 253-137 | A253 | B137 | 2 | 1 |
| 253-138 | A253 | B138 | 2 | 1 |
| 253-139 | A253 | B139 | 2 | 1 |

TABLE 74-continued

| Compound No. | $L_1$ | $L_2$ | n1 | n2 |
|---|---|---|---|---|
| 253-140 | A253 | B140 | 2 | 1 |
| 253-141 | A253 | B141 | 2 | 1 |

TABLE 75

| Compound No. | $L_1$ | $L_2$ | n1 | n2 |
|---|---|---|---|---|
| 253-156 | A253 | B156 | 2 | 1 |
| 253-157 | A253 | B157 | 2 | 1 |
| 253-158 | A253 | B158 | 2 | 1 |
| 253-159 | A253 | B159 | 2 | 1 |
| 253-160 | A253 | B160 | 2 | 1 |
| 253-161 | A253 | B161 | 2 | 1 |
| 253-162 | A253 | B162 | 2 | 1 |
| 253-163 | A253 | B163 | 2 | 1 |
| 253-164 | A253 | B164 | 2 | 1 |
| 253-165 | A253 | B165 | 2 | 1 |
| 253-166 | A253 | B166 | 2 | 1 |
| 253-167 | A253 | B167 | 2 | 1 |
| 253-168 | A253 | B168 | 2 | 1 |
| 253-169 | A253 | B169 | 2 | 1 |
| 253-170 | A253 | B170 | 2 | 1 |
| 253-171 | A253 | B171 | 2 | 1 |
| 253-172 | A253 | B172 | 2 | 1 |
| 253-173 | A253 | B173 | 2 | 1 |
| 253-174 | A253 | B174 | 2 | 1 |
| 253-175 | A253 | B175 | 2 | 1 |
| 253-176 | A253 | B176 | 2 | 1 |
| 253-177 | A253 | B177 | 2 | 1 |
| 257-178 | A257 | B178 | 2 | 1 |
| 258-179 | A258 | B179 | 2 | 1 |
| 259-180 | A259 | B180 | 2 | 1 |
| 260-181 | A260 | B181 | 2 | 1 |
| 261-182 | A261 | B182 | 2 | 1 |
| 262-183 | A262 | B183 | 2 | 1 |
| 263-184 | A263 | B184 | 2 | 1 |
| 264-185 | A264 | B185 | 2 | 1 |

TABLE 76

| Compound No. | $L_1$ | $L_2$ | n1 | n2 |
|---|---|---|---|---|
| 265-186 | A265 | B186 | 2 | 1 |
| 266-187 | A266 | B187 | 2 | 1 |
| 266-188 | A266 | B188 | 2 | 1 |
| 267-189 | A267 | B189 | 2 | 1 |
| 267-190 | A267 | B190 | 2 | 1 |
| 268-191 | A268 | B191 | 2 | 1 |
| 269-192 | A269 | B192 | 2 | 1 |
| 270-193 | A270 | B193 | 2 | 1 |
| 271-194 | A271 | B194 | 2 | 1 |
| 272-195 | A272 | B195 | 2 | 1 |
| 274-196 | A274 | B196 | 2 | 1 |
| 275-197 | A275 | B197 | 2 | 1 |
| 276-198 | A276 | B198 | 2 | 1 |
| 277-199 | A277 | B199 | 2 | 1 |
| 278-200 | A278 | B200 | 2 | 1 |
| 279-201 | A279 | B201 | 2 | 1 |
| 280-202 | A280 | B202 | 2 | 1 |
| 281-203 | A281 | B203 | 2 | 1 |
| 282-204 | A282 | B204 | 2 | 1 |
| 283-205 | A283 | B205 | 2 | 1 |
| 284-209 | A284 | B209 | 2 | 1 |
| 285-231 | A285 | B231 | 2 | 1 |
| 286-340 | A286 | B340 | 2 | 1 |
| 287-399 | A287 | B399 | 2 | 1 |
| 288-445 | A288 | B445 | 2 | 1 |

TABLE 77

| Compound No. | $L_1$ | $L_2$ | n1 | n2 |
|---|---|---|---|---|
| 273-1 | A273 | B1 | 2 | 1 |
| 273-2 | A273 | B2 | 2 | 1 |
| 273-3 | A273 | B3 | 2 | 1 |
| 273-4 | A273 | B4 | 2 | 1 |
| 273-5 | A273 | B5 | 2 | 1 |
| 273-6 | A273 | B6 | 2 | 1 |
| 273-7 | A273 | B7 | 2 | 1 |
| 273-8 | A273 | B8 | 2 | 1 |
| 273-9 | A273 | B9 | 2 | 1 |
| 273-10 | A273 | B10 | 2 | 1 |
| 273-11 | A273 | B11 | 2 | 1 |
| 273-12 | A273 | B12 | 2 | 1 |
| 273-13 | A273 | B13 | 2 | 1 |
| 273-14 | A273 | B14 | 2 | 1 |
| 273-15 | A273 | B15 | 2 | 1 |
| 273-16 | A273 | B16 | 2 | 1 |
| 273-17 | A273 | B17 | 2 | 1 |
| 273-18 | A273 | B18 | 2 | 1 |
| 273-19 | A273 | B19 | 2 | 1 |
| 273-20 | A273 | B20 | 2 | 1 |
| 273-21 | A273 | B21 | 2 | 1 |
| 273-22 | A273 | B22 | 2 | 1 |
| 273-23 | A273 | B23 | 2 | 1 |
| 273-24 | A273 | B24 | 2 | 1 |
| 273-25 | A273 | B25 | 2 | 1 |
| 273-26 | A273 | B26 | 2 | 1 |
| 273-27 | A273 | B27 | 2 | 1 |
| 273-28 | A273 | B28 | 2 | 1 |
| 273-29 | A273 | B29 | 2 | 1 |
| 273-30 | A273 | B30 | 2 | 1 |

TABLE 78

| Compound No. | $L_1$ | $L_2$ | n1 | n2 |
|---|---|---|---|---|
| 273-31 | A273 | B31 | 2 | 1 |
| 273-32 | A273 | B32 | 2 | 1 |
| 273-33 | A273 | B33 | 2 | 1 |
| 273-34 | A273 | B34 | 2 | 1 |
| 273-35 | A273 | B35 | 2 | 1 |
| 273-36 | A273 | B36 | 2 | 1 |
| 273-37 | A273 | B37 | 2 | 1 |
| 273-38 | A273 | B38 | 2 | 1 |
| 273-39 | A273 | B39 | 2 | 1 |
| 273-40 | A273 | B40 | 2 | 1 |
| 273-41 | A273 | B41 | 2 | 1 |
| 273-42 | A273 | B42 | 2 | 1 |
| 273-43 | A273 | B43 | 2 | 1 |
| 273-44 | A273 | B44 | 2 | 1 |
| 273-45 | A273 | B45 | 2 | 1 |
| 273-46 | A273 | B46 | 2 | 1 |
| 273-47 | A273 | B47 | 2 | 1 |
| 273-48 | A273 | B48 | 2 | 1 |
| 273-49 | A273 | B49 | 2 | 1 |
| 273-50 | A273 | B50 | 2 | 1 |
| 273-51 | A273 | B51 | 2 | 1 |
| 273-52 | A273 | B52 | 2 | 1 |
| 273-53 | A273 | B53 | 2 | 1 |
| 273-74 | A273 | B74 | 2 | 1 |
| 257-136 | A273 | B136 | 2 | 1 |
| 257-137 | A273 | B137 | 2 | 1 |
| 257-138 | A273 | B138 | 2 | 1 |
| 257-139 | A273 | B139 | 2 | 1 |
| 257-140 | A273 | B140 | 2 | 1 |
| 257-141 | A273 | B141 | 2 | 1 |

TABLE 79

| Compound No. | $L_1$ | $L_2$ | n1 | n2 |
|---|---|---|---|---|
| 273-156 | A273 | B156 | 2 | 1 |
| 273-157 | A273 | B157 | 2 | 1 |
| 273-158 | A273 | B158 | 2 | 1 |

TABLE 79-continued

| Compound No. | $L_1$ | $L_2$ | n1 | n2 |
|---|---|---|---|---|
| 273-159 | A273 | B159 | 2 | 1 |
| 273-160 | A273 | B160 | 2 | 1 |
| 273-161 | A273 | B161 | 2 | 1 |
| 273-162 or 2206 | A273 | B162 | 2 | 1 |
| 273-163 | A273 | B163 | 2 | 1 |
| 273-164 | A273 | B164 | 2 | 1 |
| 273-165 | A273 | B165 | 2 | 1 |
| 273-166 | A273 | B166 | 2 | 1 |
| 273-167 | A273 | B167 | 2 | 1 |
| 273-168 | A273 | B168 | 2 | 1 |
| 273-169 | A273 | B169 | 2 | 1 |
| 273-170 | A273 | B170 | 2 | 1 |
| 273-171 | A273 | B171 | 2 | 1 |
| 273-172 | A273 | B172 | 2 | 1 |
| 273-173 | A273 | B173 | 2 | 1 |
| 273-174 | A273 | B174 | 2 | 1 |
| 273-175 | A273 | B175 | 2 | 1 |
| 273-176 | A273 | B176 | 2 | 1 |
| 273-177 | A273 | B177 | 2 | 1 |
| 273-178 | A273 | B178 | 2 | 1 |
| 273-179 | A273 | B179 | 2 | 1 |
| 273-180 | A273 | B180 | 2 | 1 |
| 273-181 | A273 | B181 | 2 | 1 |
| 273-182 | A273 | B182 | 2 | 1 |
| 273-183 | A273 | B183 | 2 | 1 |
| 273-184 | A273 | B184 | 2 | 1 |
| 273-185 | A273 | B185 | 2 | 1 |

TABLE 80

| Compound No. | $L_1$ | $L_2$ | n1 | n2 |
|---|---|---|---|---|
| 273-186 | A273 | B186 | 2 | 1 |
| 273-187 | A273 | B187 | 2 | 1 |
| 273-188 | A273 | B188 | 2 | 1 |
| 273-189 | A273 | B189 | 2 | 1 |
| 273-190 | A273 | B190 | 2 | 1 |
| 273-191 | A273 | B191 | 2 | 1 |
| 273-192 | A273 | B192 | 2 | 1 |
| 273-193 | A273 | B193 | 2 | 1 |
| 273-194 | A273 | B194 | 2 | 1 |
| 273-195 | A273 | B195 | 2 | 1 |
| 273-196 | A273 | B196 | 2 | 1 |
| 273-197 | A273 | B197 | 2 | 1 |
| 273-198 | A273 | B198 | 2 | 1 |
| 273-199 | A273 | B199 | 2 | 1 |
| 273-200 | A273 | B200 | 2 | 1 |
| 273-201 | A273 | B201 | 2 | 1 |
| 273-202 | A273 | B202 | 2 | 1 |
| 273-203 | A273 | B203 | 2 | 1 |
| 273-204 | A273 | B204 | 2 | 1 |
| 273-205 | A273 | B205 | 2 | 1 |
| 273-209 | A273 | B209 | 2 | 1 |
| 273-231 | A273 | B231 | 2 | 1 |
| 273-340 | A273 | B340 | 2 | 1 |

TABLE 81

| Compound No. | $L_1$ | $L_2$ | n1 | n2 |
|---|---|---|---|---|
| 277-1 | A277 | B1 | 2 | 1 |
| 278-4 | A278 | B4 | 2 | 1 |
| 279-8 | A279 | B8 | 2 | 1 |
| 280-10 | A280 | B10 | 2 | 1 |
| 281-13 | A281 | B13 | 2 | 1 |
| 282-20 | A282 | B20 | 2 | 1 |
| 283-24 | A283 | B24 | 2 | 1 |
| 284-27 | A284 | B27 | 2 | 1 |
| 285-48 | A285 | B48 | 2 | 1 |
| 286-62 | A286 | B62 | 2 | 1 |
| 287-63 | A287 | B63 | 2 | 1 |
| 288-85 | A288 | B85 | 2 | 1 |
| 289-1 | A289 | B1 | 2 | 1 |

TABLE 81-continued

| Compound No. | $L_1$ | $L_2$ | n1 | n2 |
|---|---|---|---|---|
| 290-4 | A290 | B4 | 2 | 1 |
| 291-8 | A291 | B8 | 2 | 1 |
| 292-10 | A292 | B10 | 2 | 1 |
| 293-13 | A293 | B13 | 2 | 1 |
| 294-20 | A294 | B20 | 2 | 1 |
| 295-24 | A295 | B24 | 2 | 1 |
| 296-27 | A296 | B27 | 2 | 1 |
| 297-48 | A297 | B48 | 2 | 1 |
| 298-62 | A298 | B62 | 2 | 1 |
| 299-63 | A299 | B63 | 2 | 1 |
| 300-85 | A300 | B85 | 2 | 1 |

TABLE 82

| Compound No. | $L_1$ | $L_2$ | n1 | n2 |
|---|---|---|---|---|
| 2-156 | A2 | B156 | 2 | 1 |
| 69-156 | A69 | B156 | 2 | 1 |
| 109-156 | A109 | B156 | 2 | 1 |
| 114-156 | A114 | B156 | 2 | 1 |
| 118-156 | A118 | B156 | 2 | 1 |
| 123-156 | A123 | B156 | 2 | 1 |
| 152-156 | A152 | B156 | 2 | 1 |
| 219-156 | A219 | B156 | 2 | 1 |
| 259-156 | A259 | B156 | 2 | 1 |
| 264-156 | A264 | B156 | 2 | 1 |
| 268-156 | A268 | B156 | 2 | 1 |
| 2-157 | A2 | B157 | 2 | 1 |
| 69-157 | A69 | B157 | 2 | 1 |
| 109-157 | A109 | B157 | 2 | 1 |
| 114-157 | A114 | B157 | 2 | 1 |
| 118-157 | A118 | B157 | 2 | 1 |
| 123-157 | A123 | B157 | 2 | 1 |
| 152-157 | A152 | B157 | 2 | 1 |
| 219-157 | A219 | B157 | 2 | 1 |
| 259-157 | A259 | B157 | 2 | 1 |
| 264-157 | A264 | B157 | 2 | 1 |
| 268-157 | A268 | B157 | 2 | 1 |
| 2-158 | A2 | B158 | 2 | 1 |
| 69-158 | A69 | B158 | 2 | 1 |
| 109-158 | A109 | B158 | 2 | 1 |
| 114-158 | A114 | B158 | 2 | 1 |
| 118-158 | A118 | B158 | 2 | 1 |
| 123-158 | A123 | B158 | 2 | 1 |
| 152-158 | A152 | B158 | 2 | 1 |
| 219-158 | A219 | B158 | 2 | 1 |
| 259-158 | A259 | B158 | 2 | 1 |

TABLE 83

| Compound No. | $L_1$ | $L_2$ | n1 | n2 |
|---|---|---|---|---|
| 264-158 | A264 | B158 | 2 | 1 |
| 268-158 | A268 | B158 | 2 | 1 |
| 2-159 | A2 | B159 | 2 | 1 |
| 69-159 | A69 | B159 | 2 | 1 |
| 109-159 | A109 | B159 | 2 | 1 |
| 114-159 | A114 | B159 | 2 | 1 |
| 118-159 | A118 | B159 | 2 | 1 |
| 123-159 | A123 | B159 | 2 | 1 |
| 152-159 | A152 | B159 | 2 | 1 |
| 219-159 | A219 | B159 | 2 | 1 |
| 259-159 | A259 | B159 | 2 | 1 |
| 264-159 | A264 | B159 | 2 | 1 |
| 268-159 | A268 | B159 | 2 | 1 |
| 2-160 | A2 | B160 | 2 | 1 |
| 69-160 | A69 | B160 | 2 | 1 |
| 109-160 | A109 | B160 | 2 | 1 |
| 114-160 | A114 | B160 | 2 | 1 |
| 118-160 | A118 | B160 | 2 | 1 |
| 123-160 | A123 | B160 | 2 | 1 |
| 152-160 | A152 | B160 | 2 | 1 |
| 219-160 | A219 | B160 | 2 | 1 |

TABLE 83-continued

| Compound No. | $L_1$ | $L_2$ | n1 | n2 |
|---|---|---|---|---|
| 259-160 | A259 | B160 | 2 | 1 |
| 264-160 | A264 | B160 | 2 | 1 |
| 268-160 | A268 | B160 | 2 | 1 |
| 2-161 | A2 | B161 | 2 | 1 |
| 69-161 | A69 | B161 | 2 | 1 |
| 109-161 | A109 | B161 | 2 | 1 |
| 114-161 | A114 | B161 | 2 | 1 |
| 118-161 | A118 | B161 | 2 | 1 |
| 123-161 | A123 | B161 | 2 | 1 |
| 152-161 | A152 | B161 | 2 | 1 |

TABLE 84

| Compound No. | $L_1$ | $L_2$ | n1 | n2 |
|---|---|---|---|---|
| 219-161 | A219 | B161 | 2 | 1 |
| 259-161 | A259 | B161 | 2 | 1 |
| 264-161 | A264 | B161 | 2 | 1 |
| 268-161 | A268 | B161 | 2 | 1 |
| 69-162 | A69 | B162 | 2 | 1 |
| 109-162 | A109 | B162 | 2 | 1 |
| 114-162 | A114 | B162 | 2 | 1 |
| 118-162 | A118 | B162 | 2 | 1 |
| 123-162 | A123 | B162 | 2 | 1 |
| 219-162 | A219 | B162 | 2 | 1 |
| 259-162 | A259 | B162 | 2 | 1 |
| 264-162 | A264 | B162 | 2 | 1 |
| 268-162 | A268 | B162 | 2 | 1 |
| 2-163 | A2 | B163 | 2 | 1 |
| 69-163 | A69 | B163 | 2 | 1 |
| 109-163 | A109 | B163 | 2 | 1 |
| 114-163 | A114 | B163 | 2 | 1 |
| 118-160 | A118 | B163 | 2 | 1 |
| 123-160 | A123 | B163 | 2 | 1 |
| 152-160 | A152 | B163 | 2 | 1 |
| 219-160 | A219 | B163 | 2 | 1 |
| 259-160 | A259 | B163 | 2 | 1 |
| 264-160 | A264 | B163 | 2 | 1 |
| 268-160 | A268 | B163 | 2 | 1 |
| 2-164 | A2 | B164 | 2 | 1 |
| 69-164 | A69 | B164 | 2 | 1 |
| 109-164 | A109 | B164 | 2 | 1 |
| 114-164 | A114 | B164 | 2 | 1 |
| 118-164 | A118 | B164 | 2 | 1 |
| 123-164 | A123 | B164 | 2 | 1 |
| 152-164 | A152 | B164 | 2 | 1 |

TABLE 85

| Compound No. | $L_1$ | $L_2$ | n1 | n2 |
|---|---|---|---|---|
| 219-164 | A219 | B164 | 2 | 1 |
| 259-164 | A259 | B164 | 2 | 1 |
| 264-164 | A264 | B164 | 2 | 1 |
| 268-164 | A268 | B164 | 2 | 1 |
| 2-165 | A2 | B165 | 2 | 1 |
| 69-165 | A69 | B165 | 2 | 1 |
| 109-165 | A109 | B165 | 2 | 1 |
| 114-165 | A114 | B165 | 2 | 1 |
| 118-165 | A118 | B165 | 2 | 1 |
| 123-165 | A123 | B165 | 2 | 1 |
| 152-165 | A152 | B165 | 2 | 1 |
| 219-165 | A219 | B165 | 2 | 1 |
| 259-165 | A259 | B165 | 2 | 1 |
| 264-165 | A264 | B165 | 2 | 1 |
| 268-165 | A268 | B165 | 2 | 1 |
| 2-166 | A2 | B165 | 2 | 1 |
| 69-166 | A69 | B165 | 2 | 1 |
| 109-166 | A109 | B165 | 2 | 1 |
| 114-166 | A114 | B165 | 2 | 1 |
| 118-166 | A118 | B165 | 2 | 1 |
| 123-166 | A123 | B165 | 2 | 1 |
| 152-166 | A152 | B165 | 2 | 1 |

TABLE 85-continued

| Compound No. | $L_1$ | $L_2$ | n1 | n2 |
|---|---|---|---|---|
| 219-166 | A219 | B165 | 2 | 1 |
| 259-166 | A259 | B165 | 2 | 1 |
| 264-166 | A264 | B165 | 2 | 1 |
| 268-166 | A268 | B165 | 2 | 1 |
| 2-173 | A2 | B173 | 2 | 1 |
| 69-173 | A69 | B173 | 2 | 1 |
| 109-173 | A109 | B173 | 2 | 1 |
| 114-173 | A114 | B173 | 2 | 1 |
| 118-173 | A118 | B173 | 2 | 1 |

TABLE 86

| Compound No. | $L_1$ | $L_2$ | n1 | n2 |
|---|---|---|---|---|
| 123-173 | A123 | B173 | 2 | 1 |
| 152-173 | A152 | B173 | 2 | 1 |
| 219-173 | A219 | B173 | 2 | 1 |
| 259-173 | A259 | B173 | 2 | 1 |
| 264-173 | A264 | B173 | 2 | 1 |
| 268-173 | A268 | B173 | 2 | 1 |
| 69-176 | A69 | B176 | 2 | 1 |
| 109-176 | A109 | B176 | 2 | 1 |
| 114-176 | A114 | B176 | 2 | 1 |
| 118-176 | A118 | B176 | 2 | 1 |
| 123-176 | A123 | B176 | 2 | 1 |
| 219-176 | A219 | B176 | 2 | 1 |
| 259-176 | A259 | B176 | 2 | 1 |
| 264-176 | A264 | B176 | 2 | 1 |
| 268-176 | A268 | B176 | 2 | 1 |
| 2-177 | A2 | B177 | 2 | 1 |
| 69-177 | A69 | B177 | 2 | 1 |
| 109-177 | A109 | B177 | 2 | 1 |
| 114-177 | A114 | B177 | 2 | 1 |
| 118-177 | A118 | B177 | 2 | 1 |
| 123-177 | A123 | B177 | 2 | 1 |
| 152-177 | A152 | B177 | 2 | 1 |
| 219-177 | A219 | B177 | 2 | 1 |
| 259-177 | A259 | B177 | 2 | 1 |
| 264-177 | A264 | B177 | 2 | 1 |
| 268-177 | A268 | B177 | 2 | 1 |
| 2-180 | A2 | B180 | 2 | 1 |
| 152-180 | A69 | B180 | 2 | 1 |
| 219-180 | A109 | B180 | 2 | 1 |
| 259-180 | A114 | B180 | 2 | 1 |
| 264-180 | A118 | B180 | 2 | 1 |

TABLE 87

| Compound No. | $L_1$ | $L_2$ | n1 | n2 |
|---|---|---|---|---|
| 2-181 | A2 | B181 | 2 | 1 |
| 69-181 | A69 | B181 | 2 | 1 |
| 109-181 | A109 | B181 | 2 | 1 |
| 114-181 | A114 | B181 | 2 | 1 |
| 118-181 | A118 | B181 | 2 | 1 |
| 123-181 | A123 | B181 | 2 | 1 |
| 152-181 | A152 | B181 | 2 | 1 |
| 219-181 | A219 | B181 | 2 | 1 |
| 259-181 | A259 | B181 | 2 | 1 |
| 264-181 | A264 | B181 | 2 | 1 |
| 268-181 | A268 | B181 | 2 | 1 |
| 2-182 | A2 | B182 | 2 | 1 |
| 69-182 | A69 | B182 | 2 | 1 |
| 109-182 | A109 | B182 | 2 | 1 |
| 114-182 | A114 | B182 | 2 | 1 |
| 118-182 | A118 | B182 | 2 | 1 |
| 123-182 | A123 | B182 | 2 | 1 |
| 152-182 | A152 | B182 | 2 | 1 |
| 219-182 | A219 | B182 | 2 | 1 |
| 259-182 | A259 | B182 | 2 | 1 |
| 264-182 | A264 | B182 | 2 | 1 |
| 268-182 | A268 | B182 | 2 | 1 |
| 2-183 | A2 | B183 | 2 | 1 |

TABLE 87-continued

| Compound No. | $L_1$ | $L_2$ | n1 | n2 |
|---|---|---|---|---|
| 69-183 | A69 | B183 | 2 | 1 |
| 109-183 | A109 | B183 | 2 | 1 |
| 114-183 | A114 | B183 | 2 | 1 |
| 118-183 | A118 | B183 | 2 | 1 |
| 123-183 | A123 | B183 | 2 | 1 |
| 152-183 | A152 | B183 | 2 | 1 |
| 219-183 | A219 | B183 | 2 | 1 |
| 259-183 | A259 | B183 | 2 | 1 |

TABLE 88

| Compound No. | $L_1$ | $L_2$ | n1 | n2 |
|---|---|---|---|---|
| 264-183 | A264 | B183 | 2 | 1 |
| 268-183 | A268 | B183 | 2 | 1 |
| 2-184 | A2 | B184 | 2 | 1 |
| 69-184 | A69 | B184 | 2 | 1 |
| 109-184 | A109 | B184 | 2 | 1 |
| 114-184 | A114 | B184 | 2 | 1 |
| 118-184 | A118 | B184 | 2 | 1 |
| 123-184 | A123 | B184 | 2 | 1 |
| 152-184 | A152 | B184 | 2 | 1 |
| 219-184 | A219 | B184 | 2 | 1 |
| 259-184 | A259 | B184 | 2 | 1 |
| 264-184 | A264 | B184 | 2 | 1 |
| 268-184 | A268 | B184 | 2 | 1 |
| 2-185 | A2 | B185 | 2 | 1 |
| 69-185 | A69 | B185 | 2 | 1 |
| 109-185 | A109 | B185 | 2 | 1 |
| 114-185 | A114 | B185 | 2 | 1 |
| 118-185 | A118 | B185 | 2 | 1 |
| 123-185 | A123 | B185 | 2 | 1 |
| 152-185 | A152 | B185 | 2 | 1 |
| 219-185 | A219 | B185 | 2 | 1 |
| 259-185 | A259 | B185 | 2 | 1 |
| 268-185 | A268 | B185 | 2 | 1 |
| 2-186 | A2 | B186 | 2 | 1 |
| 69-186 | A69 | B186 | 2 | 1 |
| 109-186 | A109 | B186 | 2 | 1 |
| 114-186 | A114 | B186 | 2 | 1 |
| 118-186 | A118 | B186 | 2 | 1 |
| 123-186 | A123 | B186 | 2 | 1 |
| 152-186 | A152 | B186 | 2 | 1 |

TABLE 89

| Compound No. | $L_1$ | $L_2$ | n1 | n2 |
|---|---|---|---|---|
| 219-186 | A219 | B186 | 2 | 1 |
| 259-186 | A259 | B186 | 2 | 1 |
| 264-186 | A264 | B186 | 2 | 1 |
| 268-186 | A268 | B186 | 2 | 1 |
| 69-187 | A69 | B187 | 2 | 1 |
| 109-187 | A109 | B187 | 2 | 1 |
| 114-187 | A114 | B187 | 2 | 1 |
| 118-187 | A118 | B187 | 2 | 1 |
| 123-187 | A123 | B187 | 2 | 1 |
| 219-187 | A219 | B187 | 2 | 1 |
| 259-187 | A259 | B187 | 2 | 1 |
| 264-187 | A264 | B187 | 2 | 1 |
| 268-187 | A268 | B187 | 2 | 1 |
| 2-188 | A2 | B188 | 2 | 1 |
| 69-188 | A69 | B188 | 2 | 1 |
| 109-188 | A109 | B188 | 2 | 1 |
| 114-188 | A114 | B188 | 2 | 1 |
| 118-188 | A118 | B188 | 2 | 1 |
| 123-188 | A123 | B188 | 2 | 1 |
| 152-188 | A152 | B188 | 2 | 1 |
| 219-188 | A219 | B188 | 2 | 1 |
| 259-188 | A259 | B188 | 2 | 1 |
| 264-188 | A264 | B188 | 2 | 1 |
| 268-188 | A268 | B188 | 2 | 1 |
| 2-189 | A2 | B189 | 2 | 1 |

TABLE 89-continued

| Compound No. | $L_1$ | $L_2$ | n1 | n2 |
|---|---|---|---|---|
| 69-189 | A69 | B189 | 2 | 1 |
| 109-189 | A109 | B189 | 2 | 1 |
| 114-189 | A114 | B189 | 2 | 1 |
| 118-189 | A118 | B189 | 2 | 1 |
| 123-189 | A123 | B189 | 2 | 1 |
| 152-189 | A152 | B189 | 2 | 1 |

TABLE 90

| Compound No. | $L_1$ | $L_2$ | n1 | n2 |
|---|---|---|---|---|
| 219-189 | A219 | B189 | 2 | 1 |
| 259-189 | A259 | B189 | 2 | 1 |
| 264-189 | A264 | B189 | 2 | 1 |
| 268-189 | A268 | B189 | 2 | 1 |
| 2-190 | A2 | B190 | 2 | 1 |
| 69-190 | A69 | B190 | 2 | 1 |
| 109-190 | A109 | B190 | 2 | 1 |
| 114-190 | A114 | B190 | 2 | 1 |
| 118-190 | A118 | B190 | 2 | 1 |
| 123-190 | A123 | B190 | 2 | 1 |
| 152-190 | A152 | B190 | 2 | 1 |
| 219-190 | A219 | B190 | 2 | 1 |
| 259-190 | A259 | B190 | 2 | 1 |
| 264-190 | A264 | B190 | 2 | 1 |
| 268-190 | A268 | B190 | 2 | 1 |
| 2-191 | A2 | B191 | 2 | 1 |
| 69-191 | A69 | B191 | 2 | 1 |
| 109-191 | A109 | B191 | 2 | 1 |
| 114-191 | A114 | B191 | 2 | 1 |
| 118-191 | A118 | B191 | 2 | 1 |
| 123-191 | A123 | B191 | 2 | 1 |
| 152-191 | A152 | B191 | 2 | 1 |
| 219-191 | A219 | B191 | 2 | 1 |
| 259-191 | A259 | B191 | 2 | 1 |
| 264-191 | A264 | B191 | 2 | 1 |
| 2-198 | A2 | B198 | 2 | 1 |
| 69-198 | A69 | B198 | 2 | 1 |
| 109-198 | A109 | B198 | 2 | 1 |
| 114-198 | A114 | B198 | 2 | 1 |
| 118-198 | A118 | B198 | 2 | 1 |

TABLE 91

| Compound No. | $L_1$ | $L_2$ | n1 | n2 |
|---|---|---|---|---|
| 123-198 | A123 | B173 | 2 | 1 |
| 152-198 | A152 | B173 | 2 | 1 |
| 219-198 | A219 | B173 | 2 | 1 |
| 259-198 | A259 | B173 | 2 | 1 |
| 264-198 | A264 | B173 | 2 | 1 |
| 268-198 | A268 | B173 | 2 | 1 |
| 69-201 | A69 | B201 | 2 | 1 |
| 109-201 | A109 | B201 | 2 | 1 |
| 114-201 | A114 | B201 | 2 | 1 |
| 118-201 | A118 | B201 | 2 | 1 |
| 123-201 | A123 | B201 | 2 | 1 |
| 219-201 | A219 | B201 | 2 | 1 |
| 259-201 | A259 | B201 | 2 | 1 |
| 264-201 | A264 | B201 | 12 | 1 |
| 268-201 | A268 | B201 | 2 | 1 |
| 2-202 | A2 | B202 | 2 | 1 |
| 69-202 | A69 | B202 | 2 | 1 |
| 109-202 | A109 | B202 | 2 | 1 |
| 114-202 | A114 | B202 | 2 | 1 |
| 118-202 | A118 | B202 | 2 | 1 |
| 123-202 | A123 | B202 | 2 | 1 |
| 219-202 | A219 | B202 | 2 | 1 |
| 259-202 | A259 | B202 | 2 | 1 |
| 264-202 | A264 | B202 | 2 | 1 |
| 268-202 | A268 | B202 | 2 | 1 |
| 2-205 | A2 | B205 | 2 | 1 |
| 152-205 | A69 | B205 | 2 | 1 |

TABLE 91-continued

| Compound No. | $L_1$ | $L_2$ | n1 | n2 |
|---|---|---|---|---|
| 219-205 | A109 | B205 | 2 | 1 |
| 259-205 | A114 | B205 | 2 | 1 |
| 264-205 | A118 | B205 | 2 | 1 |
| 268-205 | A268 | B205 | 2 | 1 |

TABLE 92

| Compound No. | $L_1$ | $L_2$ | n1 | n2 |
|---|---|---|---|---|
| 301-1 | A301 | B1 | 2 | 1 |
| 302-1 | A302 | B1 | 2 | 1 |
| 303-1 | A303 | B1 | 2 | 1 |
| 304-1 | A304 | B1 | 2 | 1 |
| 305-1 | A305 | B1 | 2 | 1 |
| 306-1 | A306 | B1 | 2 | 1 |
| 307-1 | A307 | B1 | 2 | 1 |
| 308-1 | A308 | B1 | 2 | 1 |
| 309-1 | A309 | B1 | 2 | 1 |
| 310-1 | A310 | B1 | 2 | 1 |
| 306-181 | A306 | B181 | 2 | 1 |
| 306-182 | A306 | B182 | 2 | 1 |
| 306-183 or 2543 | A306 | B183 | 2 | 1 |
| 306-184 | A306 | B184 | 12 | 1 |
| 306-185 | A306 | B185 | 2 | 1 |
| 306-186 | A306 | B186 | 2 | 1 |
| 306-187 | A306 | B187 | 2 | 1 |
| 306-188 | A306 | B188 | 2 | 1 |
| 306-189 | A306 | B189 | 2 | 1 |
| 306-190 | A306 | B190 | 2 | 1 |
| 306-191 | A306 | B191 | 2 | 1 |
| 306-192 | A306 | B192 | 2 | 1 |
| 306-193 | A306 | B193 | 2 | 1 |
| 306-194 | A306 | B194 | 2 | 1 |
| 306-195 | A306 | B195 | 2 | 1 |
| 306-197 | A306 | B197 | 2 | 1 |
| 306-198 | A306 | B198 | 2 | 1 |
| 306-199 | A306 | B199 | 2 | 1 |
| 306-200 | A306 | B200 | 2 | 1 |
| 306-201 | A306 | B201 | 2 | 1 |
| 306-202 | A306 | B202 | 2 | 1 |

TABLE 93

| Compound No. | $L_1$ | $L_2$ | n1 | n2 |
|---|---|---|---|---|
| 301-4 | A301 | B4 | 2 | 1 |
| 302-8 | A302 | B8 | 2 | 1 |
| 303-10 | A303 | B10 | 2 | 1 |
| 304-13 | A304 | B13 | 2 | 1 |
| 305-20 | A305 | B20 | 2 | 1 |
| 306-24 | A306 | B24 | 2 | 1 |
| 307-27 | A307 | B27 | 2 | 1 |
| 308-48 | A308 | B48 | 2 | 1 |
| 309-62 | A309 | B62 | 2 | 1 |
| 310-63 | A310 | B63 | 2 | 1 |
| 301-85 | A301 | B85 | 2 | 1 |
| 302-91 | A302 | B91 | 2 | 1 |
| 303-108 | A303 | B108 | 2 | 1 |
| 304-116 | A304 | B116 | 2 | 1 |
| 305-137 | A305 | B137 | 2 | 1 |
| 306-144 | A306 | B144 | 2 | 1 |
| 307-152 | A307 | B152 | 2 | 1 |
| 308-162 | A308 | B162 | 2 | 1 |
| 309-169 | A309 | B169 | 2 | 1 |
| 310-176 | A310 | B176 | 2 | 1 |
| 301-187 | A301 | B187 | 2 | 1 |
| 302-201 | A302 | B201 | 2 | 1 |
| 303-202 | A303 | B202 | 2 | 1 |
| 304-213 | A304 | B213 | 2 | 1 |
| 305-249 | A305 | B249 | 2 | 1 |
| 306-272 | A306 | B272 | 2 | 1 |
| 307-281 | A307 | B281 | 2 | 1 |
| 308-306 | A308 | B306 | 2 | 1 |

TABLE 93-continued

| Compound No. | $L_1$ | $L_2$ | n1 | n2 |
|---|---|---|---|---|
| 309-340 | A309 | B340 | 2 | 1 |
| 310-399 | A310 | B399 | 2 | 1 |
| 301-445 | A301 | B445 | 2 | 1 |

TABLE 94

| Compound No. | $L_1$ | $L_2$ | n1 | n2 |
|---|---|---|---|---|
| 1-1N | A1 | B1 | 1 | 2 |
| 2-2N | A2 | B2 | 1 | 2 |
| 5-7N | A5 | B7 | 1 | 2 |
| 11-9N | A11 | B9 | 1 | 2 |
| 13-11N | A15 | B11 | 1 | 2 |
| 27-20N | A27 | B20 | 1 | 2 |
| 28-22N | A28 | B22 | 1 | 2 |
| 66-24N | A66 | B24 | 1 | 2 |
| 109-29N | A109 | B29 | 1 | 2 |
| 113-35N | A113 | B35 | 1 | 2 |
| 116-47N | A116 | B47 | 1 | 2 |
| 118-49N | A118 | B49 | 1 | 2 |
| 136-137N | A136 | B137 | 1 | 2 |
| 137-162N | A137 | B162 | 1 | 2 |
| 1-184N or 2588 | A1 | B184 | 1 | 2 |
| 1-187N | A1 | B187 | 1 | 2 |
| 2-200N | A2 | B200 | 1 | 2 |
| 5-201N | A5 | B201 | 1 | 2 |
| 11-202N | A11 | B202 | 1 | 2 |
| 15-1N | A15 | B1 | 1 | 2 |
| 27-22N | A27 | B2 | 1 | 2 |
| 28-7N | A28 | B7 | 1 | 2 |
| 66-9N | A66 | B9 | 1 | 2 |
| 109-11N | A109 | B11 | 1 | 2 |
| 113-20N | A113 | B20 | 1 | 2 |
| 116-22N | A116 | B22 | 1 | 2 |
| 118-24N | A118 | B24 | 1 | 2 |
| 136-29N | A136 | B29 | 1 | 2 |
| 137-35N | A137 | B35 | 1 | 2 |

TABLE 95

| Compound No. | $L_1$ | $L_2$ | n1 | n2 |
|---|---|---|---|---|
| 1-47N | A1 | B47 | 1 | 2 |
| 2-49N | A2 | B49 | 1 | 2 |
| 5-137N | A5 | B137 | 1 | 2 |
| 11-162N | A11 | B162 | 1 | 2 |
| 15-187N | A15 | B187 | 1 | 2 |
| 27-200N | A27 | B200 | 1 | 2 |
| 151-201N | A151 | B201 | 1 | 2 |
| 152-202N | A152 | B202 | 1 | 2 |
| 155-1N | A155 | B1 | 1 | 2 |
| 180-2N | A180 | B2 | 1 | 2 |
| 201-7N | A201 | B7 | 1 | 2 |
| 202-9N | A202 | B9 | 1 | 2 |
| 228-11N | A228 | B11 | 1 | 2 |
| 258-20N | A258 | B20 | 1 | 2 |
| 263-22N | A263 | B22 | 1 | 2 |
| 264-24N | A264 | B24 | 1 | 2 |
| 265-29N | A265 | B29 | 1 | 2 |
| 266-35N | A266 | B35 | 1 | 2 |
| 267-47N | A267 | B47 | 1 | 2 |
| 268-49N | A268 | B49 | 1 | 2 |
| 269-137N | A269 | B137 | 1 | 2 |
| 270-162N | A270 | B162 | 1 | 2 |
| 271-187N | A271 | B187 | 1 | 2 |
| 273-200N | A273 | B200 | 1 | 2 |
| 174-201N | A274 | B201 | 1 | 2 |
| 282-202N | A282 | B202 | 1 | 2 |

TABLE 96

| Compound No. | $L_1$ | $L_2$ | n1 | n2 |
|---|---|---|---|---|
| 283-1N | A283 | B1 | 1 | 2 |
| 151-2N | A151 | B2 | 1 | 2 |
| 152-7N | A152 | B7 | 1 | 2 |
| 155-9N | A155 | B9 | 1 | 2 |
| 180-11N | A180 | B11 | 1 | 2 |
| 201-20N | A201 | B20 | 1 | 2 |
| 202-22N | A202 | B22 | 1 | 2 |
| 228-24N | A228 | B24 | 1 | 2 |
| 258-29N | A258 | B29 | 1 | 2 |
| 263-35N | A263 | B35 | 1 | 2 |
| 264-47N | A264 | B47 | 1 | 2 |
| 265-49N | A265 | B49 | 1 | 2 |
| 266-137N | A266 | B137 | 1 | 2 |
| 267-162N | A267 | B162 | 1 | 2 |

$L_1$ and $L_2$ in the organometallic compound represented by Formula 1 may respectively be ligands represented by Formulae 2-1 and 2-2. n1 and n2, which may respectively be the number of L, ligands and $L_2$ ligands, may each independently be 1 or 2. That is, the organometallic compound may include $L_1$ (Formula 2-1) including a group represented by $*—X_{11}(R_{14})(R_{15})(R_{16})$ as a substituent and $L_2$ (Formula 2-2) having a structure in which ring $CY_{43}$ is condensed to ring $CY_{42}$. Accordingly, the organometallic compound represented by Formula 1 may have significantly improved molecular orientation and molecular rigidity. Thus, an electronic device, e.g., an organic light-emitting device, including the organometallic compound may have an improved external quantum yield and improved lifespan.

The highest occupied molecular orbital (HOMO) energy level, lowest unoccupied molecular orbital (LUMO) energy level, and $T_1$ energy level of some of the organometallic compounds represented by Formula 1 were evaluated by using Gaussian 09 program that performs molecular structure optimizations according to density functional theory (DFT) at a level of B3LYP. The results thereof are shown in Table 97.

TABLE 97

| Compound No. | HOMO (electronvolts (eV)) | LUMO (eV) | $T_1$ (eV) |
|---|---|---|---|
| Compound 1 | −4.769 | −1.244 | 2.492 |
| Compound 838 | −4.742 | −1.221 | 2.452 |
| Compound 855 | −4.733 | −1.222 | 2.316 |
| Compound 960 | −4.724 | −1.223 | 2.400 |
| Compound 962 | −4.669 | −1.240 | 2.442 |
| Compound 980 | −4.871 | −1.448 | 2.415 |
| Compound 1279 | −4.742 | −1.243 | 2.407 |
| Compound 2206 | −4.671 | −1.141 | 2.466 |
| Compound 2543 | −4.741 | −1.187 | 2.444 |
| Compound 2588 | −4.870 | −1.351 | 2.459 |

Referring to the results of Table 97, the organometallic compound represented by Formula 1 was found to have suitable electrical characteristics for use as a dopant in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, for example, as a dopant in an emission layer of the organic layer. Thus, according to another aspect, there is provided an organic light-emitting device that may include a first electrode; a second electrode; and an organic layer between the first electrode and the second electrode, the organic layer including an emission layer and at least one organometallic compound represented by Formula 1.

Since the organic light-emitting device has an organic layer including the organometallic compound represented by Formula 1, the organic light-emitting device may have an improved external quantum yield and improved lifespan characteristics.

The organometallic compound represented by Formula 1 may be used in a pair of electrodes of an organic light-emitting device. For example, the organometallic compound represented by Formula 1 may be included in the emission layer. In this embodiment, the organometallic compound may serve as a dopant and the emission layer may further include a host (that is, an amount of the organometallic compound represented by Formula 1 may be smaller than that of the host). The emission layer may emit red light or green light, e.g., red light or green light having a maximum emission wavelength of about 500 nanometers (nm) or longer, e.g., about 500 nm to about 850 nm. In some embodiments, the organometallic compound may emit green light. In some embodiments, the emission layer (or, the organic light-emitting device) may emit a light (for example, a green light) having a maximum emission wavelength of about 515 nm to about 550 nm, or about 520 nm to about 540 nm.

As used herein, the expression the "(organic layer) includes at least one organometallic compound" may be construed as meaning the "(organic layer) may include one organometallic compound of Formula 1 or two or more different organometallic compounds of Formula 1".

For example, only Compound 1 may be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" as used herein refers to a single and/or a plurality of layers between the first electrode and the second electrode in an organic light-emitting device. The "organic layer" may include not only organic compounds but also organometallic complexes including metals.

The FIGURE illustrates a schematic cross-sectional view of an organic light-emitting device 10 according to an embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may include a material with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO.

The organic layer 15 may be on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum degree in a range of about $10^{-8}$ torr to about $10^{-3}$ torr, and at a rate in a range of about 0.01 Angstroms per second (A/sec) to about 100 Å/sec, though the conditions may vary depending on a compound used as a hole injection material and a structure and thermal properties of a desired hole injection layer.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer.

The conditions for forming a hole transport layer and an electron blocking layer may be inferred from the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or any combination thereof:

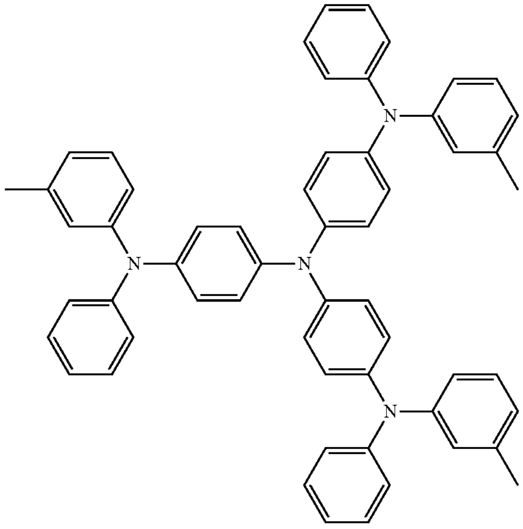

m-MTDATA

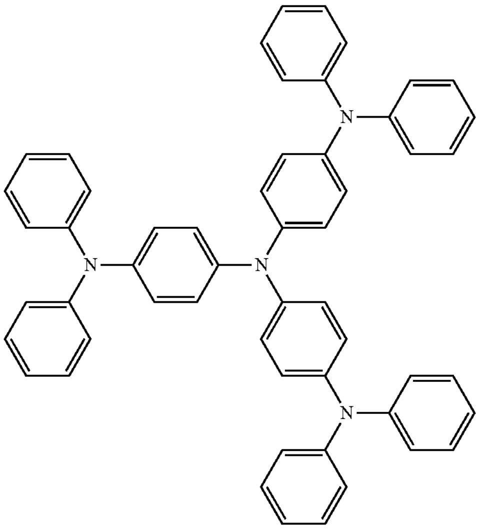

TDATA

-continued

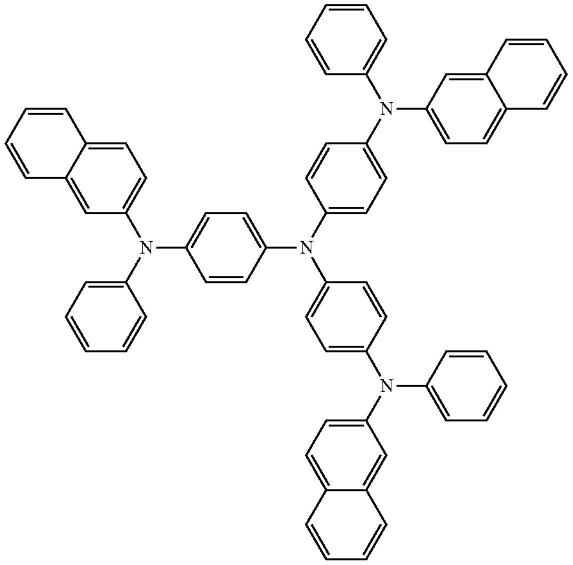

2-TNATA

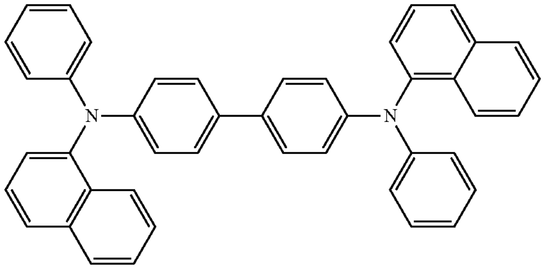

NPB

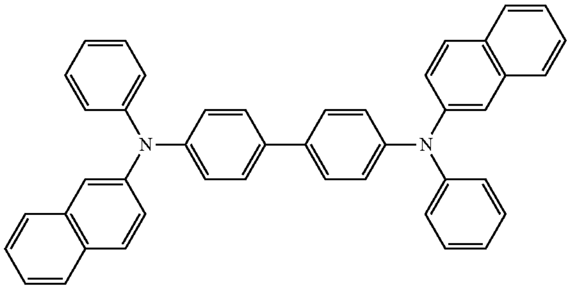

β-NPB

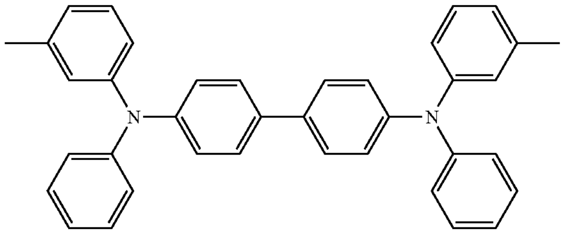

TPD

-continued

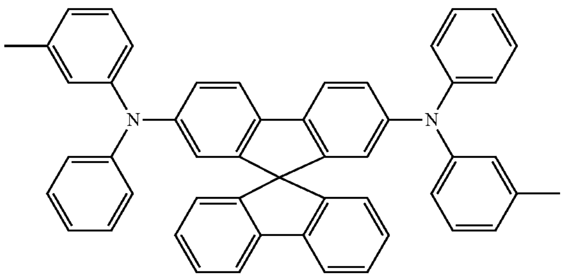

Spiro-TPD

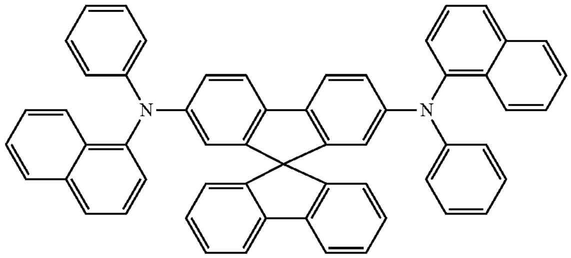

Spiro-NPB

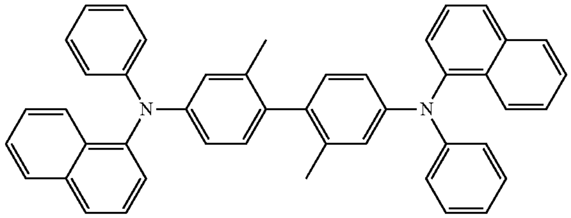

methylated NPB

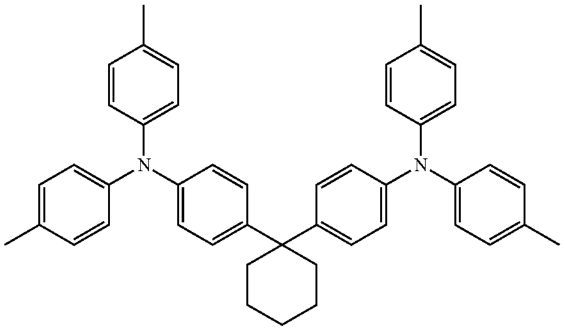

TAPC

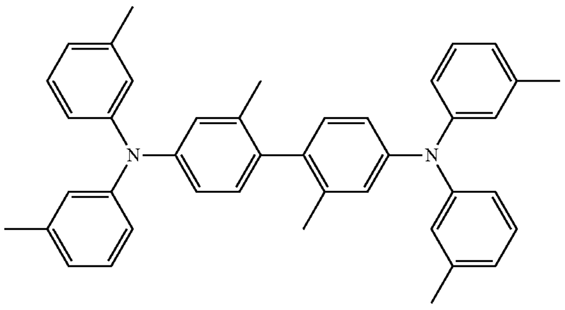

HMTPD

-continued

Formula 201

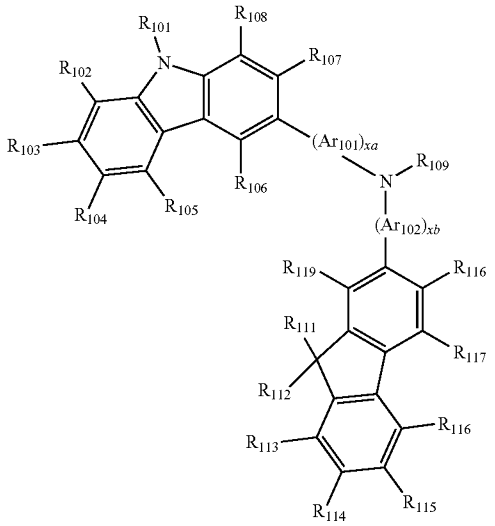

Formula 202

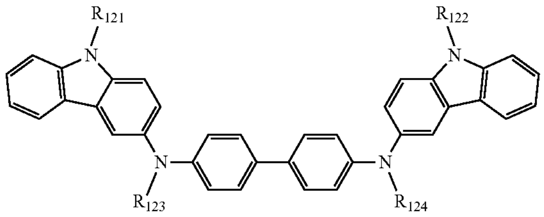

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5. In some embodiments, xa and xb may each independently be 0, 1, or 2. In some embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, a $C_1$-$C_{10}$ alkyl group (e.g., a methyl group, an ethyl group, a propyl group, a butyl group, a pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, an anthracenyl group, a pyridinyl group, or any combination thereof.

In some embodiments, the compound represented by Formula 201 may be represented by Formula 201A:

Formula 201A

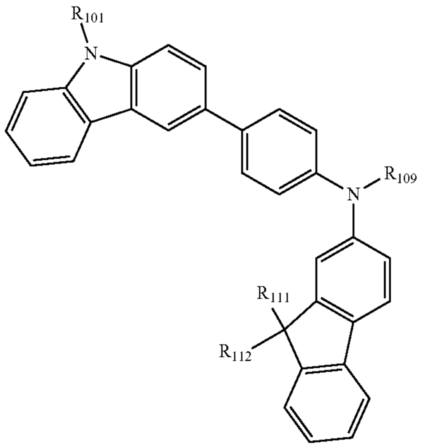

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the compounds represented by Formulae 201 and 202 may include Compounds HT1 to HT20:

HT1

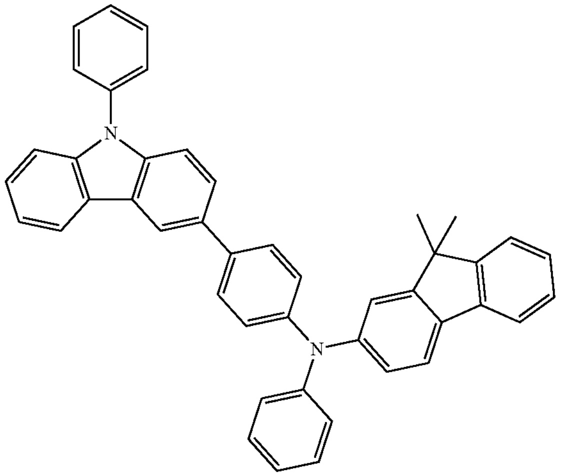

-continued

HT2

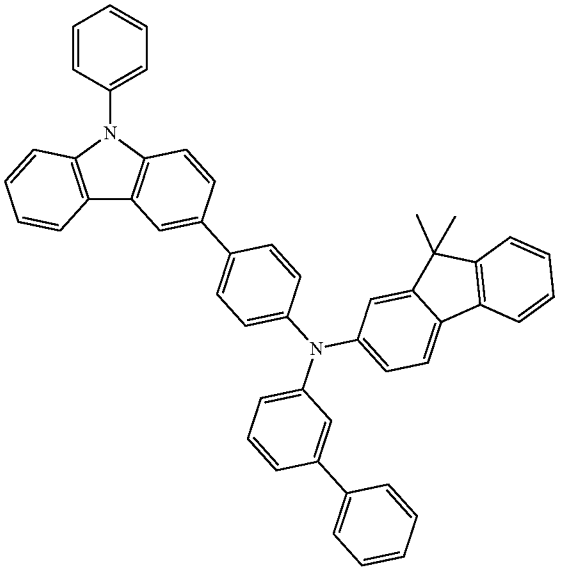

HT3

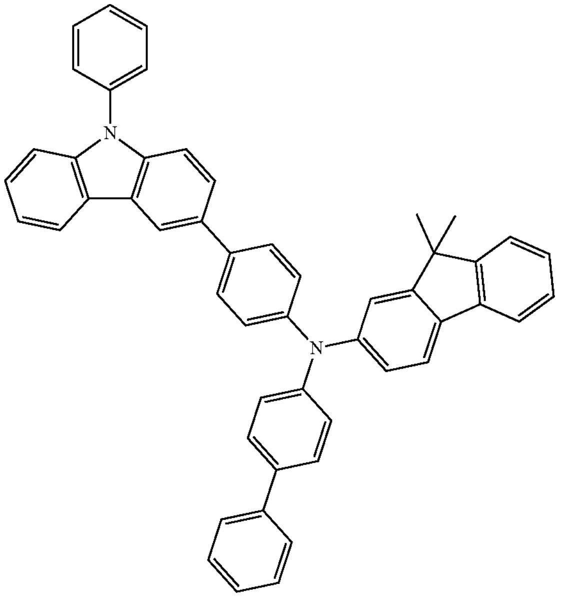

-continued
HT4
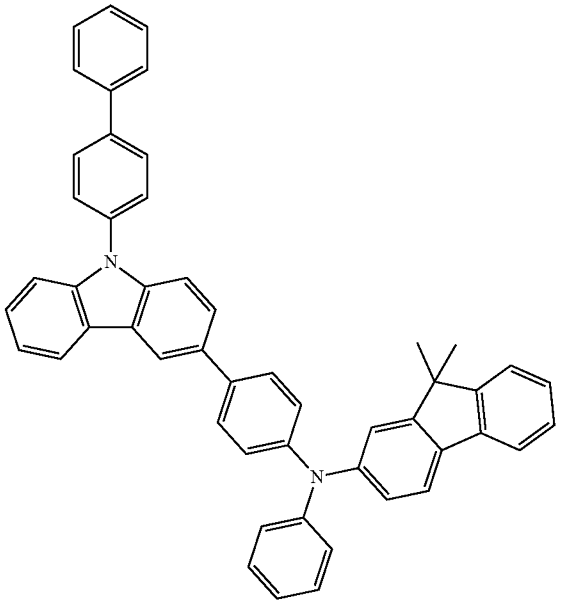
HT5
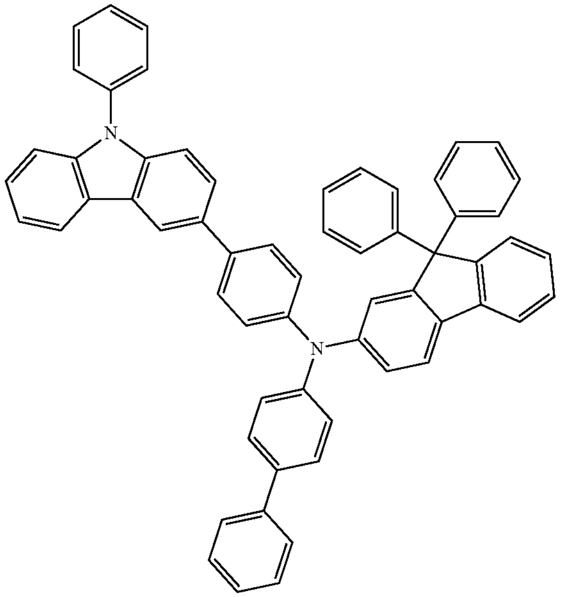
-continued
HT6
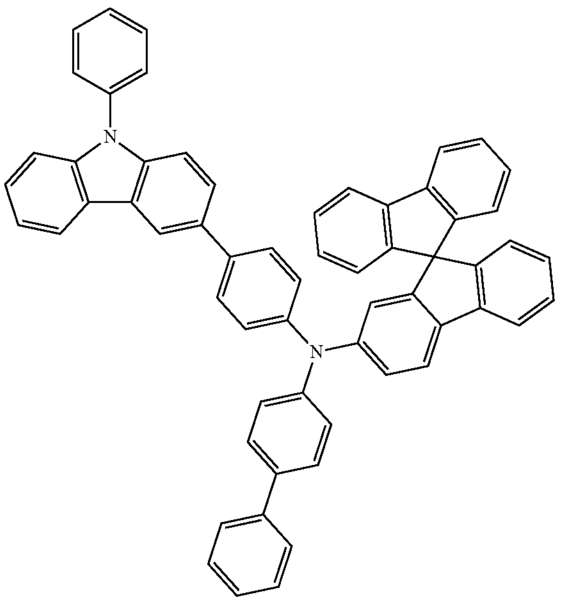
HT7
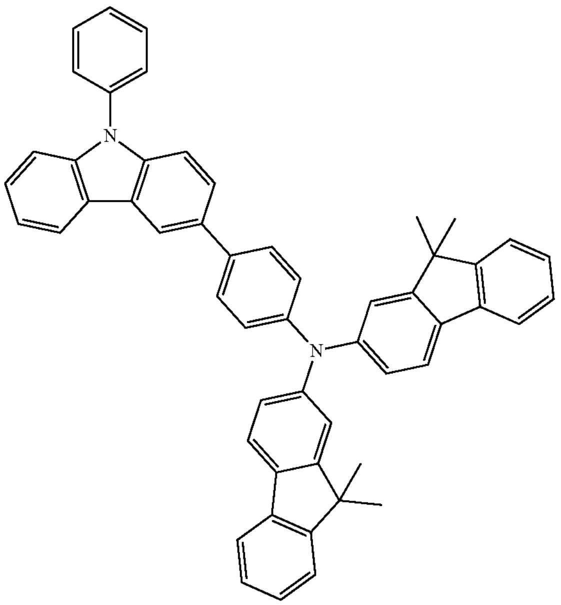

HT8
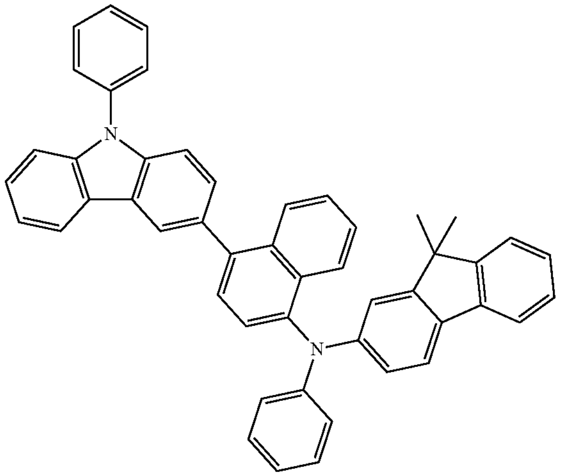
HT9
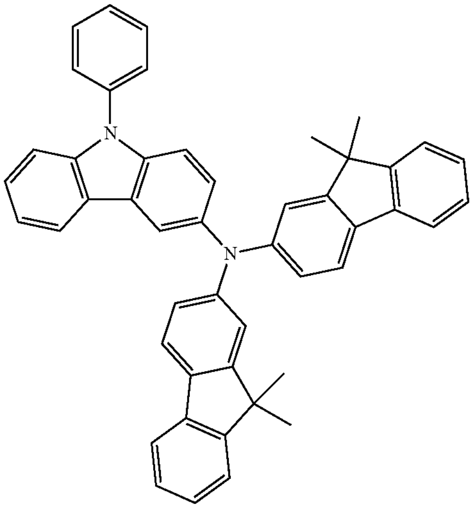
HT10
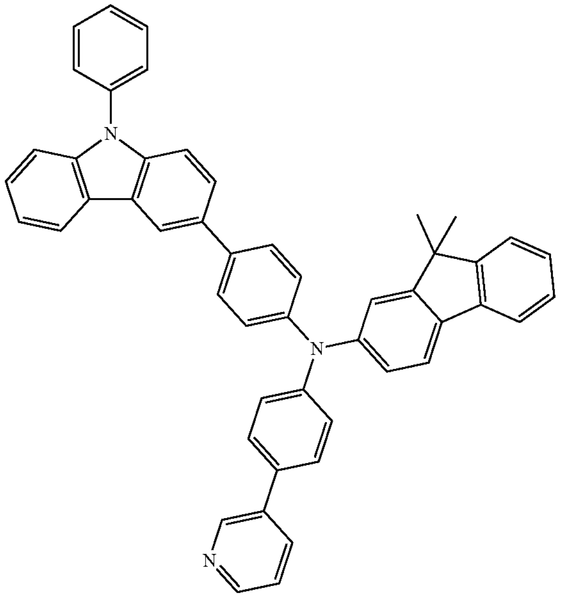
HT11
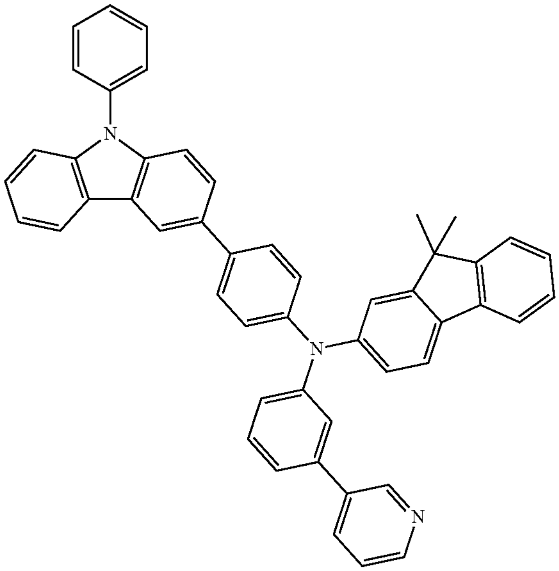
HT12
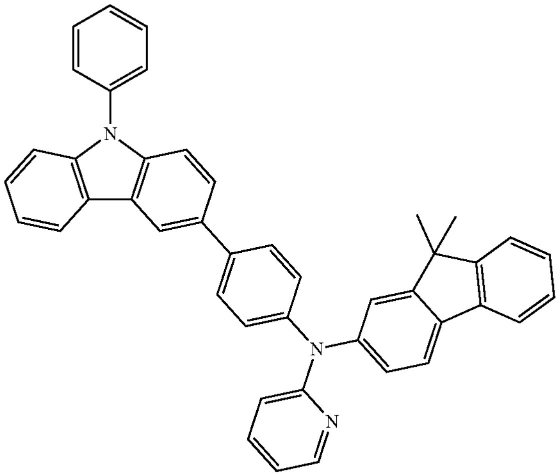
HT13
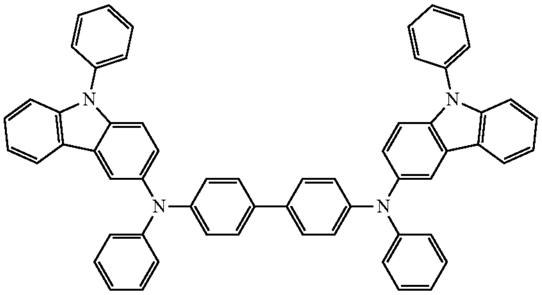

-continued

HT14

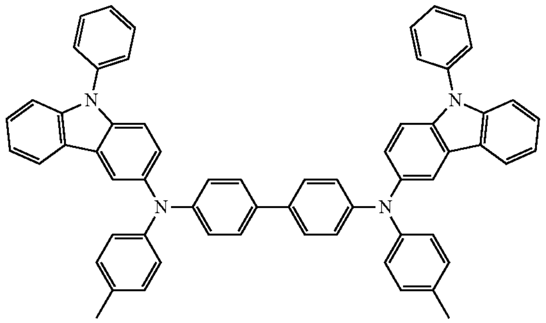

HT15

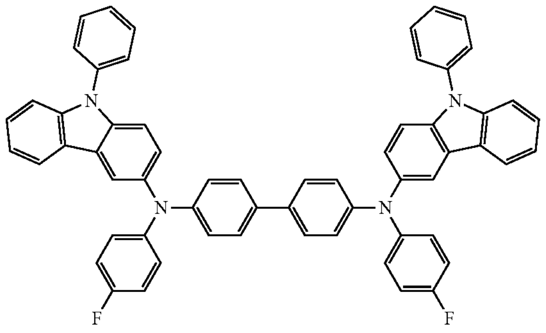

HT16

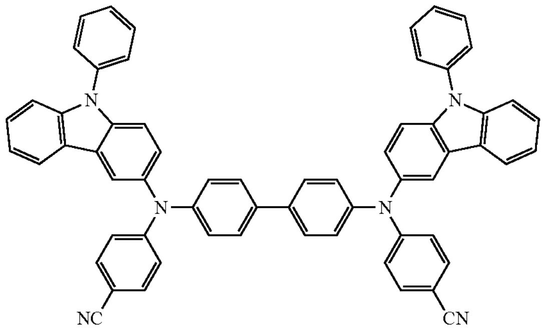

HT17

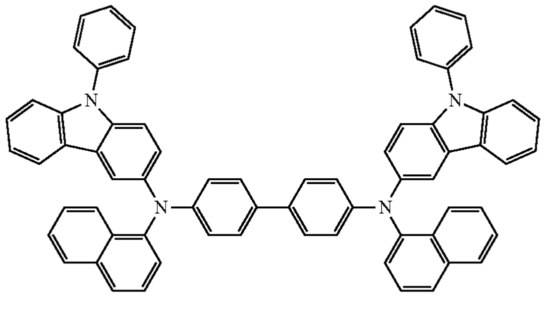

-continued

HT18

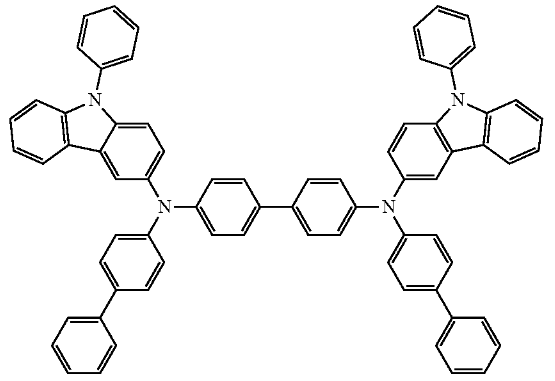

HT19

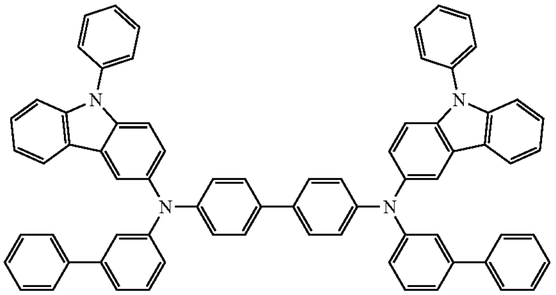

HT20

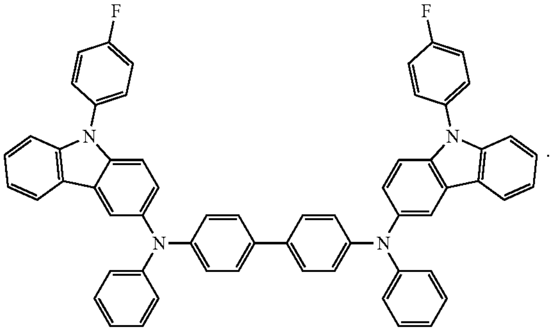

The thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group. For example, non-limiting examples of the p-dopant include a quinone derivative, such as tetracyano-quinodimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; and a compound containing a cyano group, such as Compound HT-D1:

HT-D1

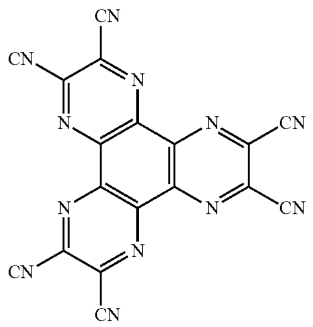

F4-TCNQ

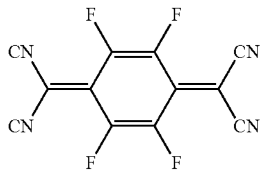

F6-TCNNQ

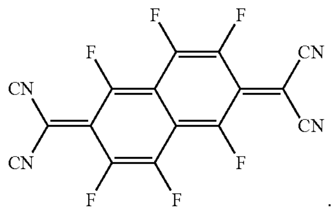

.

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may include the material for forming a hole transport region, the host material described herein or any combination thereof. In some embodiments, when the hole transport region includes an electron blocking layer, mCP described herein, H-H1, or the like may be used for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The emission layer may include a host and a dopant, and the dopant may include the organometallic compound represented by Formula 1.

The host may include TPBi, TBADN, ADN (also known as "DNA"), CBP, CDBP, TCP, mCP, Compound H50, Compound H51, Compound H52, Compound H-H1, Compound H-E43, or any combination thereof:

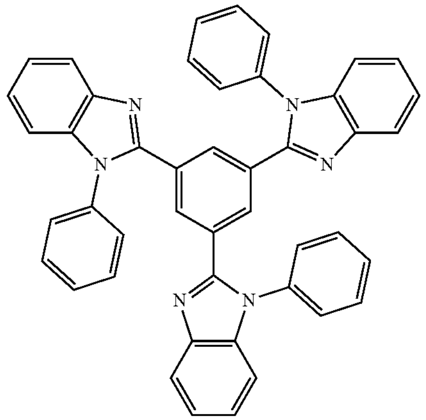

TPBi

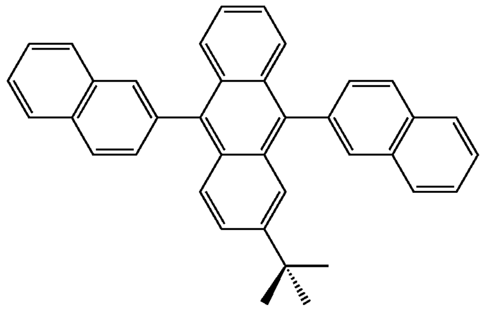

TBADN

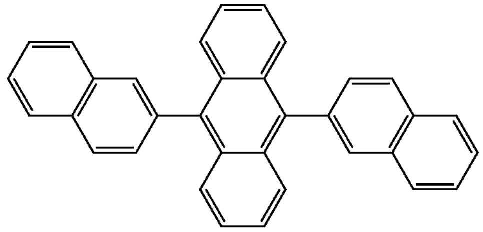

ADN

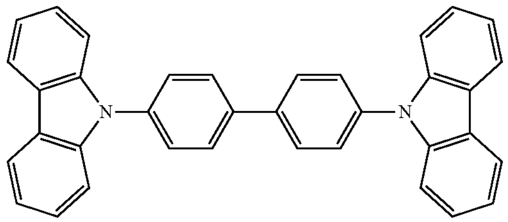

CBP

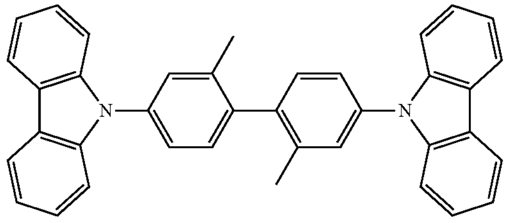

CDBP

-continued

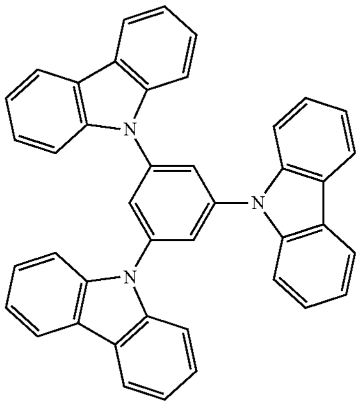

TCP

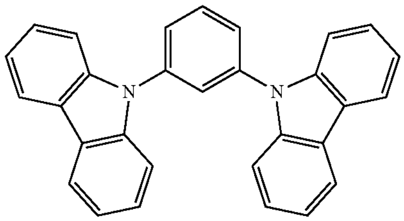

mCP

H50

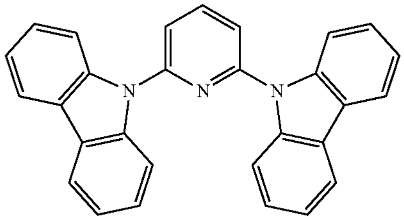

H51

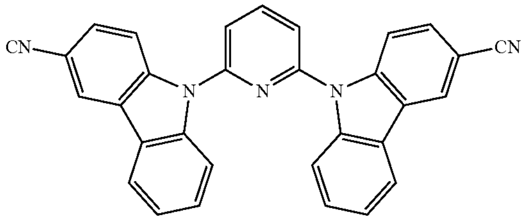

H52

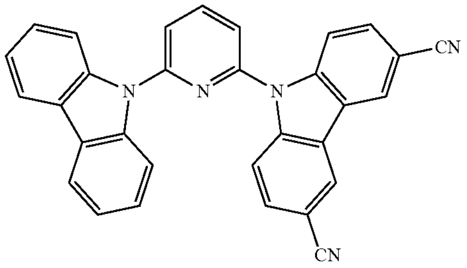

-continued

H-H1

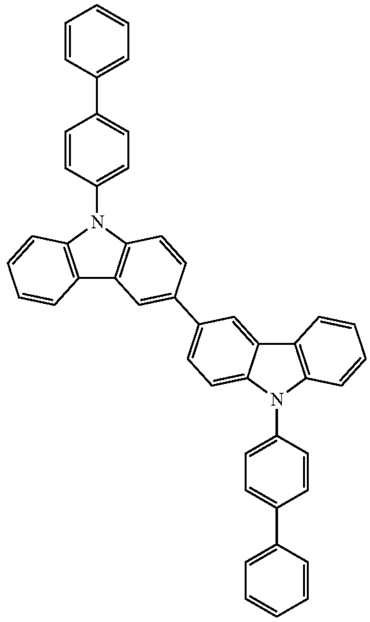

H-E43

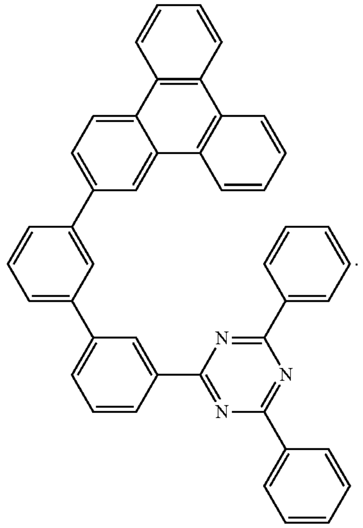

H-E43

When the organic light-emitting device 10 is a full-color organic light-emitting device, the emission layer may be patterned into a red emission layer, a green emission layer, and/or a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount (e.g., a content) of the dopant may be present in a range of about 0.01 parts to about 15 parts by weight based on about 100 parts by weight of the host.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

An electron transport region may be over the emission layer.

The electron transport region may include a hole blocking layer, an electron transport layer, an electron injection layer, or any combination thereof.

In some embodiments, the electron transport region may have a hole blocking layer/an electron transport layer/an electron injection layer structure or an electron transport layer/an electron injection layer structure. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, BCP, Bphen, BAlq, or any combination thereof:

BCP

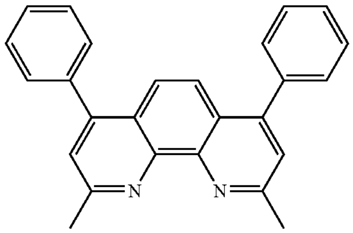

Bphen

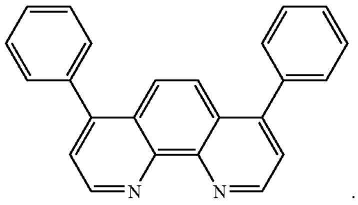

.

-continued

BAlq

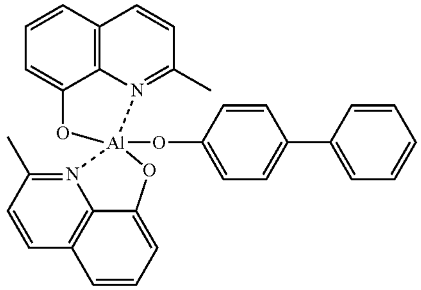

TAZ

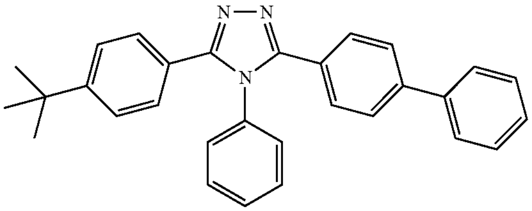

NTAZ

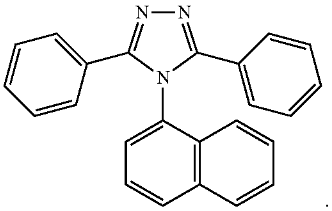

.

The thickness of the hole blocking layer may be in a range of about 20 Å to about 1,000 Å, for example, about 30 Å to about 300 Å. When the thickness of the hole blocking layer is within any of these ranges, excellent hole blocking characteristics may be obtained without a substantial increase in driving voltage.

The electron transport layer may include BCP, Bphen, $Alq_3$, BAlq, TAZ, NTAZ, or any combination thereof:

$Alq_3$

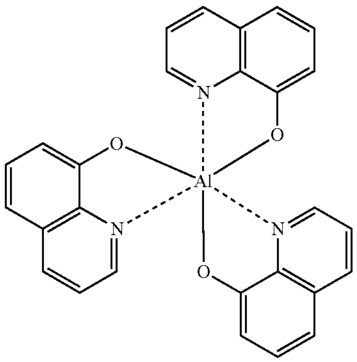

In some embodiments, the electron transport layer may include one of Compounds ET1 to ET25 or any combination thereof:

ET1

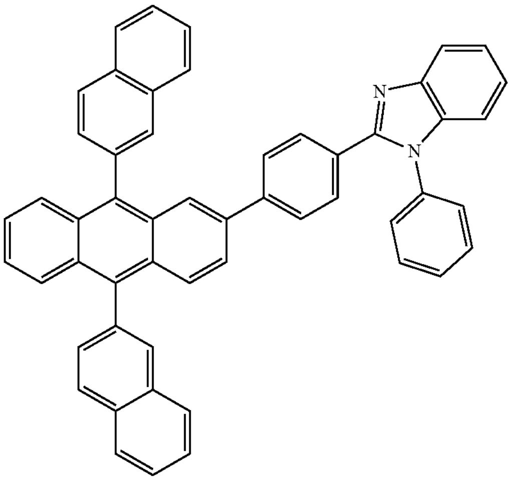

-continued
ET2
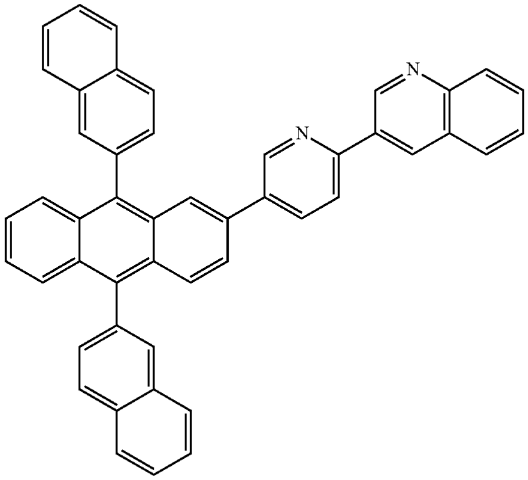
ET3
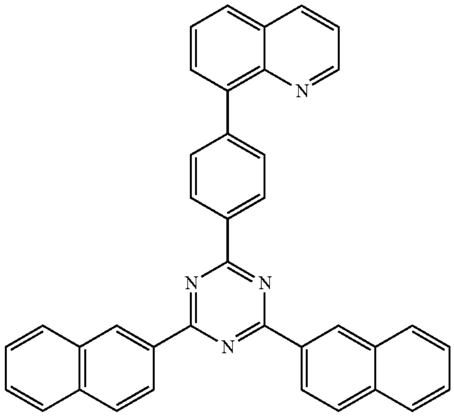
ET4
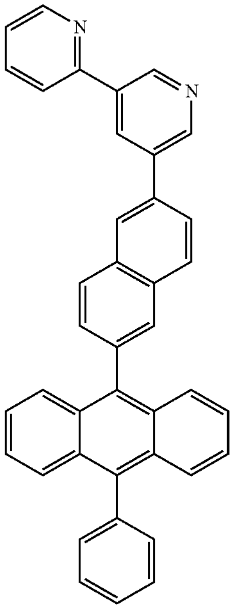
-continued
ET5
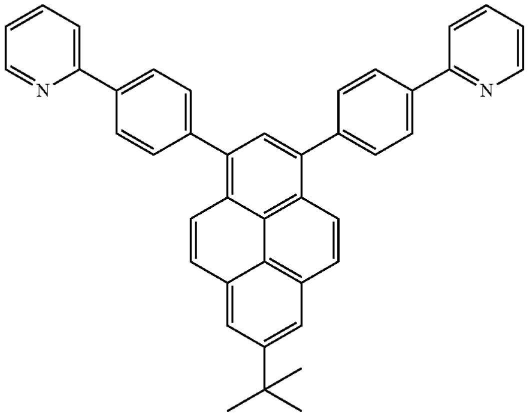
ET6
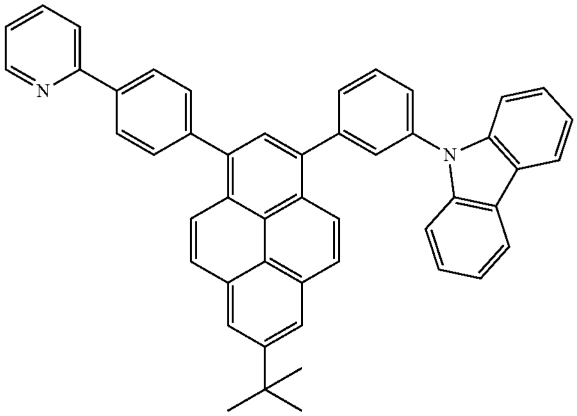
ET7
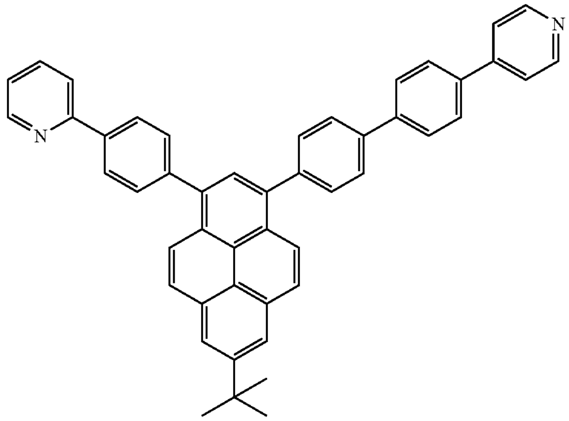

-continued
ET8
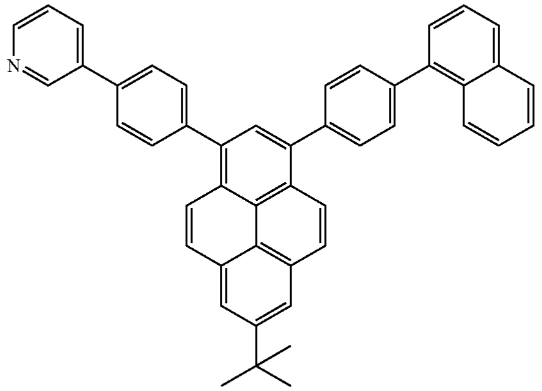
ET9
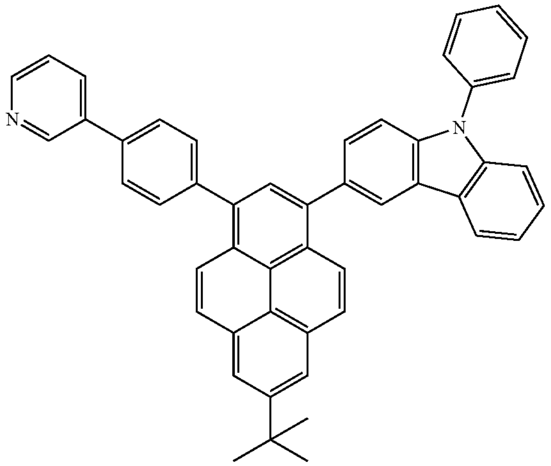
ET10
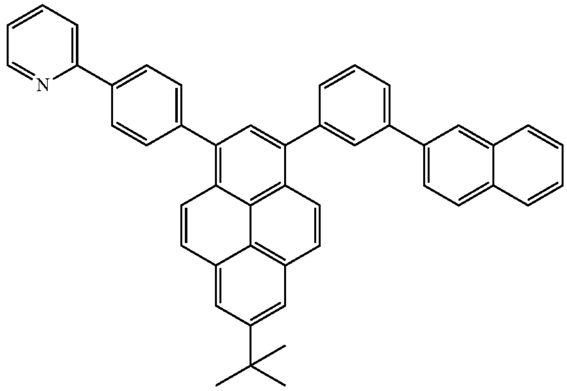
ET11
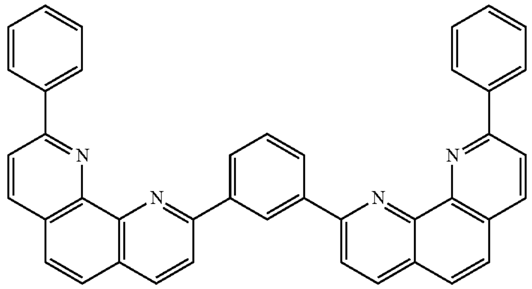
-continued
ET12
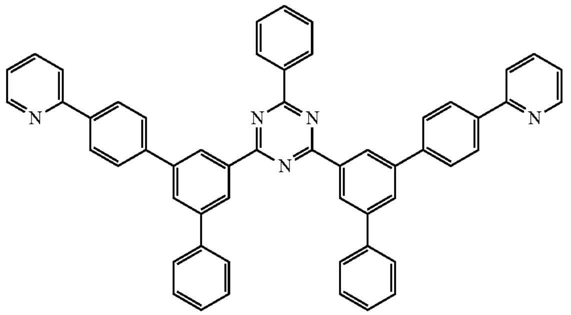
ET13
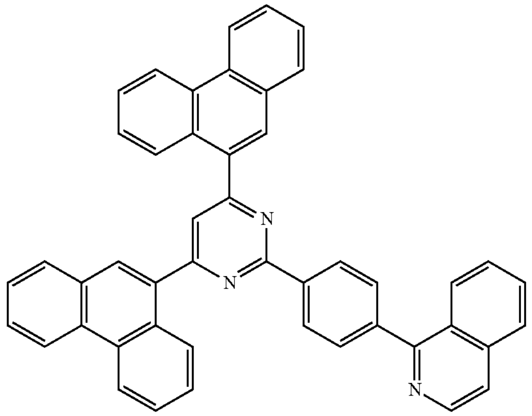
ET14
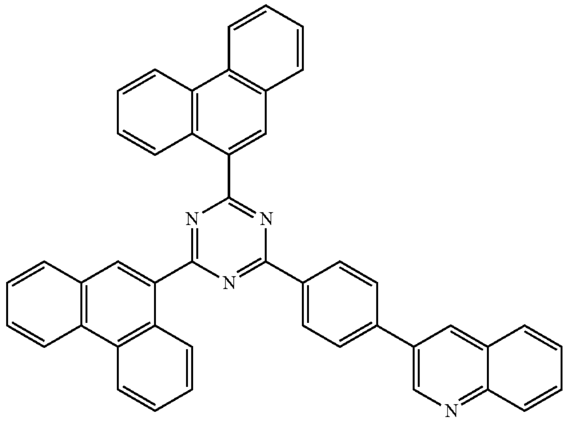
ET15
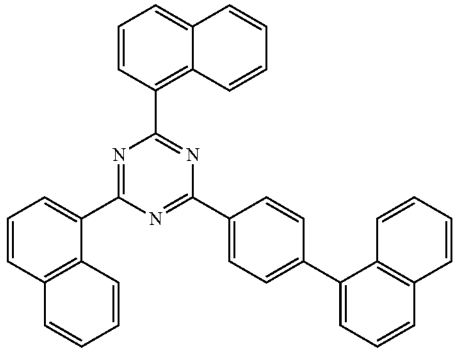

-continued
ET16
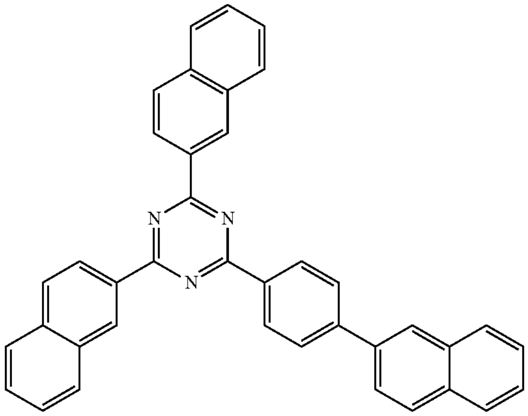
ET17
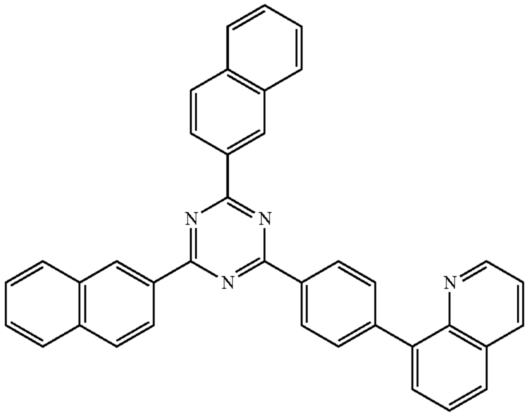
ET18
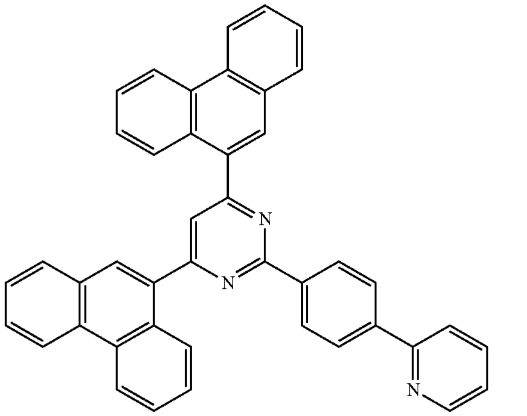
-continued
ET19
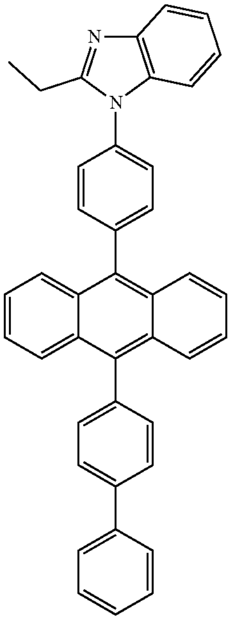
ET20
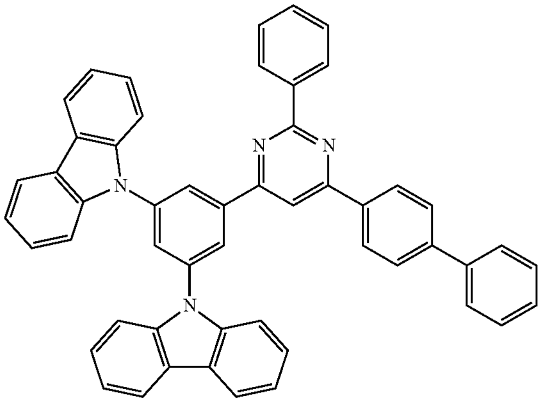
ET21
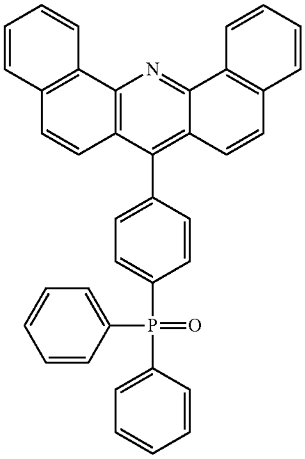

-continued

ET22

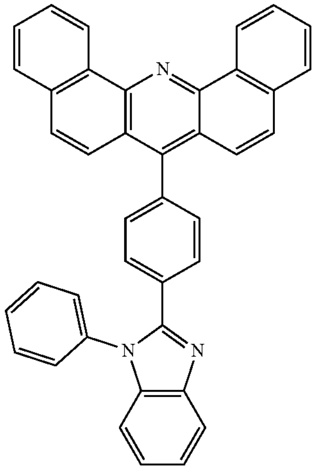

ET23

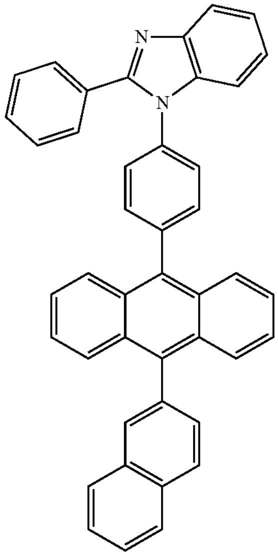

ET24

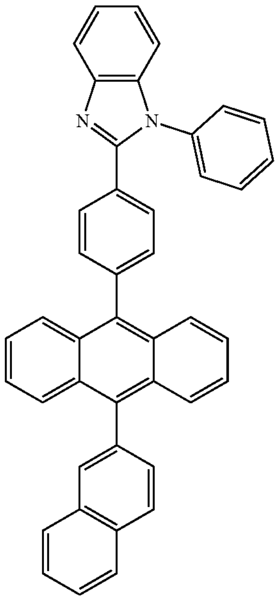

-continued

ET25

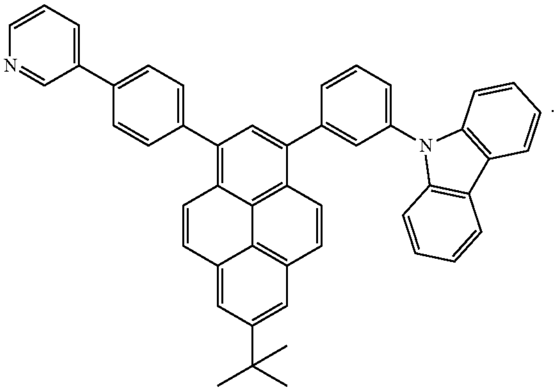

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a $L_1$ complex. The $L_1$ complex may include, e.g., Compound ET-D1 (LiQ) or Compound ET-D2:

ET-D1

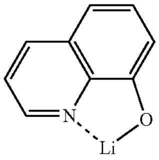

ET-D2

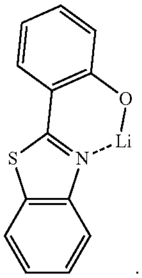

The electron transport region may include an electron injection layer that facilitates electron injection from the second electrode 19.

The electron injection layer may include LiF, NaCl, CsF, $Li_2O$, BaO, or any combination thereof.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, or any combination thereof. Examples of the material for forming the second electrode 19 may include lithium (Li), silver (Ag), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to an aspect of an embodiment, an electronic apparatus may include the organic light-emitting device. Thus, an electronic apparatus including the organic light-emitting device may be provided. The electronic apparatus may include, for example, a display, lighting, a sensor, or the like.

According to an aspect of still an embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In some embodiments, Formula 9-33 may be a branched $C_6$ alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, a propoxy group, a butoxy group, and a pentoxy group.

The term "$C_1$-$C_{60}$ alkylthio group" as used herein refers to a monovalent group represented by —$SA_{101}$ (wherein $A_{101}$ is a $C_1$-$C_{60}$ alkyl group).

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monovalent saturated cyclic group having 1 to 10 carbon atoms and at least one heteroatom of N, O, P, Si, S, Se, Ge, and B as a ring-forming atom. The term "$C_1$-$C_{10}$ heterocycloalkenylene group" as used herein refers to a divalent group having the same structure as the $C_1$-$C_{10}$ heterocycloalkenyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom of N, O, P, Si, S, Se, Ge, and B as a ring-forming atom, 1 to 10 carbon atoms, and at least one double bond in its ring, wherein the molecular structure as a whole is non-aromatic. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms.

Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_0$ alkyl aryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom of N, O, P, Si, S, Se, Ge, and B as a ring-forming atom and 1 to 60 carbon atoms. The term "$C_1$-$C_{60}$ heteroarylene group" as used herein refers to a divalent group having a heterocyclic aromatic system having at least one heteroatom of N, O, P, Si, S, Se, Ge and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom that may be N, O, P, Si, S, Se, Ge, B, or a combination thereof and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, (each unsubstituted or substituted with at least one $R_{10a}$).

The term "$C_1$-$C_{30}$ heterocyclic group" as used herein refers to saturated or unsaturated cyclic group including 1 to 30 carbon atoms and at least one heteroatom that may be N, O, P, Si, S, Se, Ge, B, or a combination thereof as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, (each unsubstituted or substituted with at least one $R_{10a}$).

Examples of the "$C_5$-$C_{30}$ carbocyclic group" and the "$C_1$-$C_{30}$ heterocyclic group" as used herein include i) a first ring, ii) a second ring, iii) a condensed ring in which at least two first rings are condensed, iv) a condensed ring in which at least two second rings are condensed, or v) a condensed ring in which at least one first ring and at least one second ring are condensed, the first ring may be a cyclopentane group, a cyclopentene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", or "fluorinated phenyl group" as used herein may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, fully fluorinated $C_1$-$C_{10}$ heterocycloalkyl group, or fully fluorinated phenyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, partially fluorinated $C_1$-$C_{10}$ heterocycloalkyl group, or partially fluorinated phenyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" as used herein may respectively be a $C_1$-$C_{60}$ alkyl group (or $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. Examples of the "deuterated $C_3$-$C_{10}$ cycloalkyl group" may include Formula 10-501. The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", or deuterated phenyl group as used herein may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, fully deuterated $C_1$-$C_{10}$ heterocycloalkyl group, or fully deuterated phenyl group, in which all hydrogen atoms are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, partially deuterated $C_1$-$C_{10}$ heterocycloalkyl group, or partially deuterated phenyl group, in which some of hydrogen atoms are substituted with deuterium atoms.

The "($C_1$-$C_{20}$ alkyl)'X' group" as used herein refers to a 'X' group substituted with at least one $C_1$-$C_{20}$ alkyl group. For example, the "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

A substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})$ ($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

For example, $Q_1$ to $Q_9$, $Q_{11}$ to $Q_{19}$, $Q_{21}$ to $Q_{29}$, and $Q_{31}$ to $Q_{39}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Synthesis Example 1 (Compound 1 or Compound 1-1)

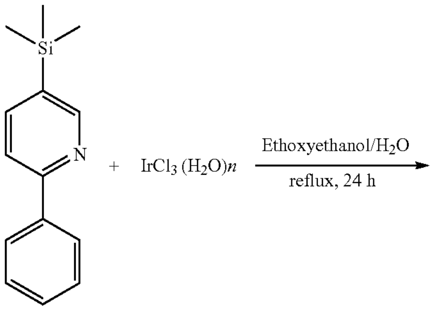

-continued

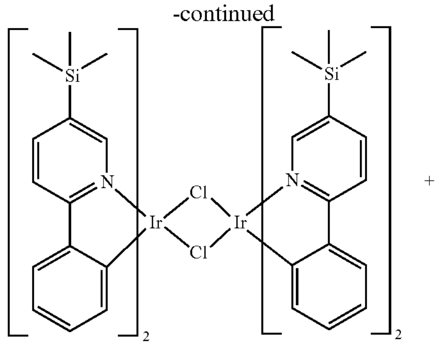

1A

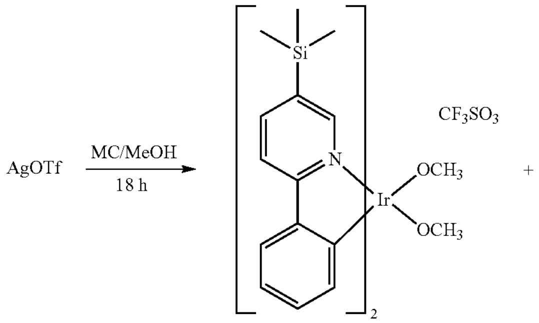

1B

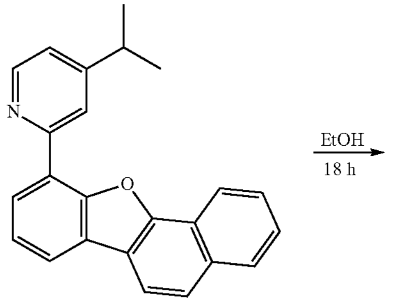

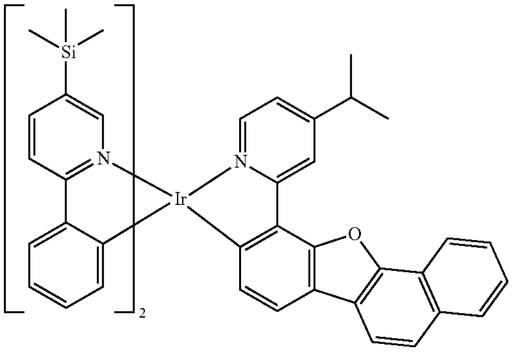

1

Synthesis of Compound 1A

An amount of 7.5 grams (g) (33.1 mmol) of 2-phenyl-5-(trimethylsilyl)pyridine and 5.2 g (14.7 mmol) of iridium chloride hydrate ($IrCl_3(H_2O)_n$) were mixed with 120 milliliters (mL) of ethoxyethanol and 40 mL of distilled water. Then, the mixture was stirred under reflux for 24 hours, and then the temperature was dropped to room temperature. A solid formed therefrom was separated by filtration. The solid was washed sufficiently with water, methanol, and hexane in the stated order and dried in a vacuum oven to thereby obtain 8.2 g of Compound 1A (yield: 82%).

Synthesis of Compound 1B

An amount of 1.60 g (1.18 mmol) of Compound 1A was mixed with 45 mL of methylene chloride (MC), and a solution, in which 0.61 g (2.35 mmol) of silver trifluoromethanesulfonate (AgOTf) was dissolved in 15 mL of methanol (MeOH), was added thereto. Then, the mixture was stirred for 18 hours at room temperature while blocking light using aluminum foil. The resultant mixture was celite-filtered to remove a solid formed therefrom and filtered under reduced pressure to thereby obtain a solid (Compound 1B). The solid was used in the following reaction without any further purification.

Synthesis of Compound 1

An amount of 1.61 g (1.94 mmol) of Compound 1B and 0.65 g (1.94 mmol) of 4-isopropyl-2-(naphtho[1,2-b]benzofuran-10-yl)pyridine were mixed with 30 mL of ethanol (EtOH) and stirred under reflux for 18 hours at a temperature of 90° C., followed by lowering the temperature. The resulting solid product was filtered and separated, followed by performing column chromatography using ethyl acetate (EA) and hexane, to thereby obtain 0.60 g of Compound 1 (yield: 30%). The synthesized material was identified by high resolution mass spectrometry (HRMS) and high performance liquid chromatography (HPLC) analysis.

HRMS(MALDI) calculated (calcd) for $C_{52}H_{50}IrN_3OSi_2$: mass divided by charge number (m/z) 981.3122 Found: 981.3123.

Synthesis Example 2 (Compound 838 or Compound 2-201)

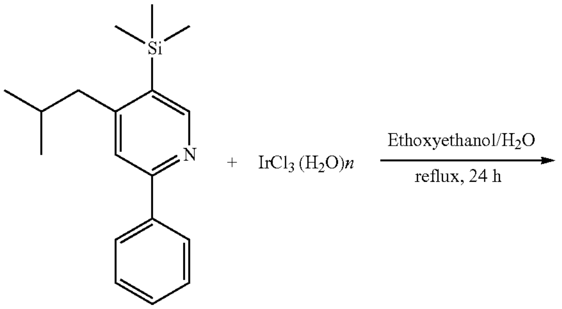

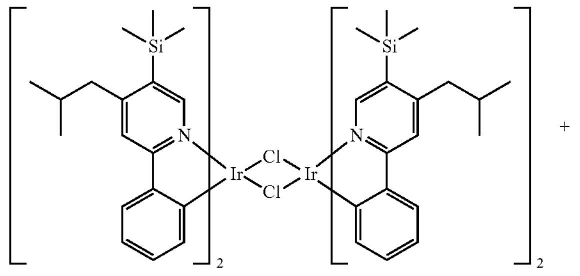

838A

-continued

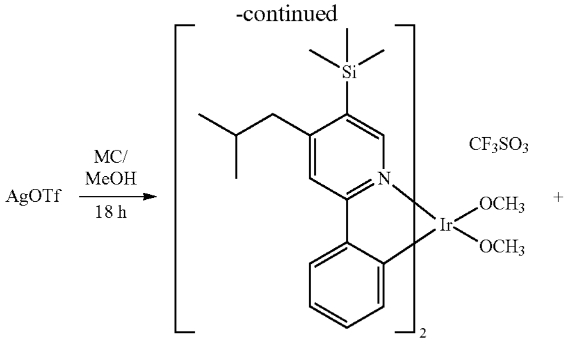

838B

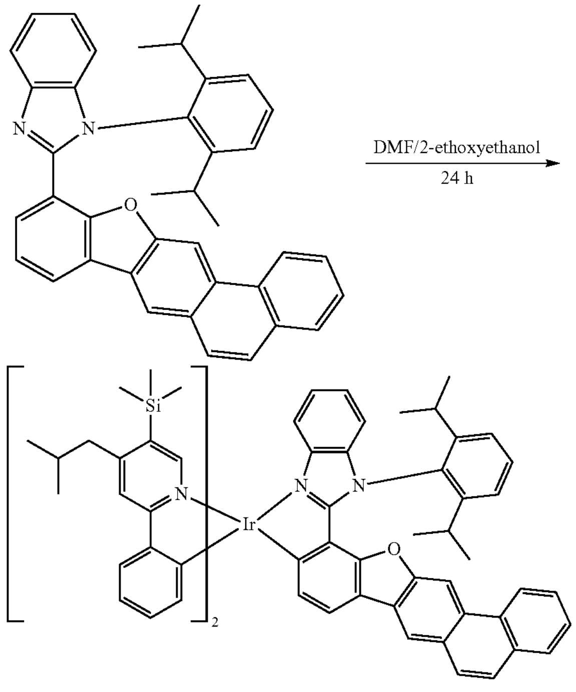

838

Synthesis of Compound 838A

An amount of 3.4 g of Compound 838A (yield: 74%) was obtained in the same manner as in Synthesis of Compound 1A in Synthesis Example 1, except that 4-isobutyl-2-phenyl-5-(trimethylsilyl)pyridine was used instead of 2-phenyl-5-(trimethylsilyl)pyridine.

Synthesis of Compound 838B

Compound 838B was obtained in the same manner as in Synthesis of Compound 1B in Synthesis Example 1, except that Compound 838A was used instead of Compound 1A. The resulting Compound 838B was used in the following reaction without any further purification.

Synthesis of Compound 838

An amount of 2.97 g (3.06 mmol) of Compound 838B and 1.66 g (3.06 mmol) of 1-(2,6-diisopropylphenyl)-2-(phenanthro[3,2-b]benzofuran-11-yl)-1H-benzo[d]imidazole were mixed with 40 mL of 2-ethoxyethanol and 40 mL of dimethyl formamide (DMF), followed by stirring under reflux at a temperature of 130° C. for 24 hours. Then, the temperature was lowered. The resulting mixture was placed under reduced pressure to obtain a solid, followed by performing column chromatography using ethyl acetate (EA) and hexane, to thereby obtain 1.1 g of Compound 838 (yield: 37%). The synthesized material was identified by HRMS and HPLC analysis.

HRMS(MALDI) calcd for $C_{75}H_{79}IrN_4OSi_2$: m/z 1300.5422 Found: 1300.5420.

Synthesis Example 3 (Compound 855 or Compound 11-366)

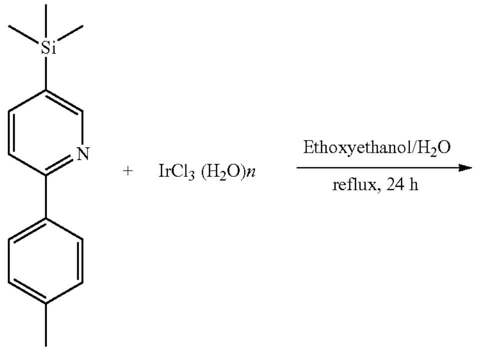

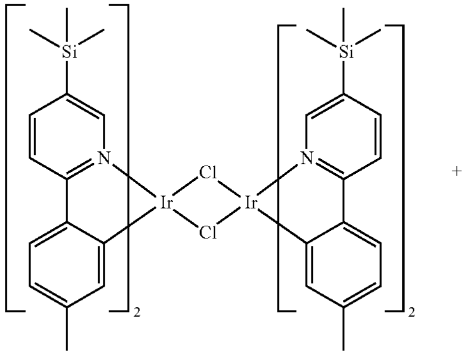

855A

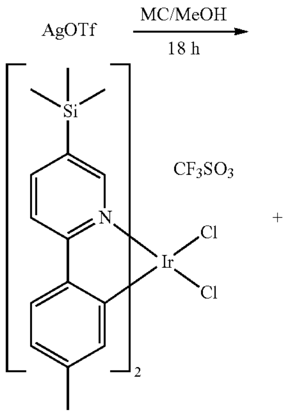

855B

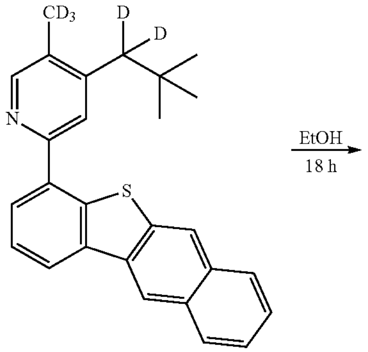

-continued

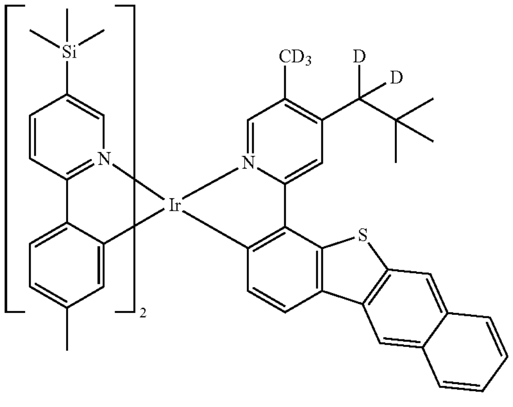

855

An amount of 5.0 g of Compound 855A (yield: 83%) was obtained in the same manner as in Synthesis of Compound 1A in Synthesis Example 1, except that 2-(p-tolyl)-5-(trimethylsilyl)pyridine was used instead of 2-phenyl-5-(trimethylsilyl)pyridine.

Synthesis of Compound 855B

Compound 855B was obtained in the same manner as in Synthesis of Compound 1B in Synthesis Example 1, except that Compound 855A was used instead of Compound 1A. The resulting Compound 855B was used in the following reaction without any further purification.

Synthesis of Compound 855

An amount of 2.48 g (2.80 mmol) of Compound 855B and 1.12 g (2.80 mmol) of 2-(benzo[b]naphtho[2,3-d]thiophen-4-yl)-4-(2,2-dimethylpropyl-1,1-d2)-5-(methyl-d3)pyridine were mixed with 30 mL of ethanol and stirred under reflux for 18 hours at a temperature of 90° C., followed by lowering the temperature. The resulting solid product was filtered and separated, followed by performing column chromatography using methylene chloride (MC) and hexane, to thereby obtain 1.16 g of Compound 855 (yield: 39%). The synthesized material was identified by HRMS and HPLC analysis.

HRMS(MALDI) calcd for $C_{57}H_{55}D_5IrN_3OSSi_2$: m/z 1072.3990 Found: 1072.3988.

Synthesis Example 4 (Compound 960 or Compound 116-48)

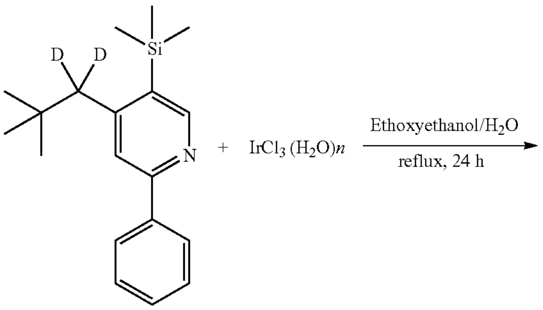

-continued

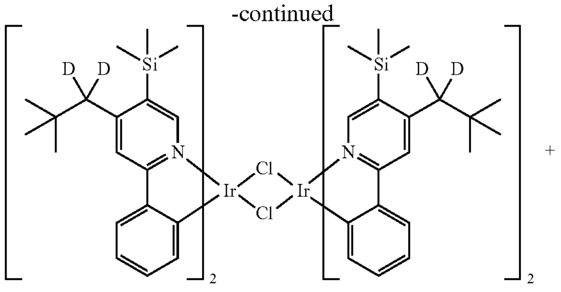

960A

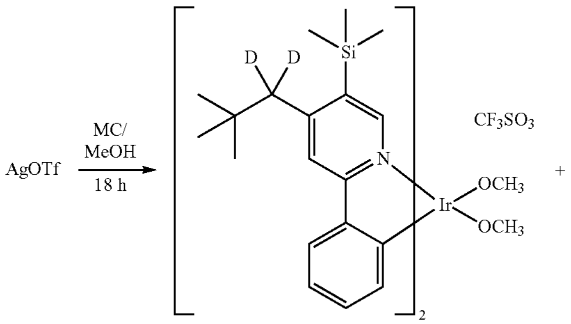

960B

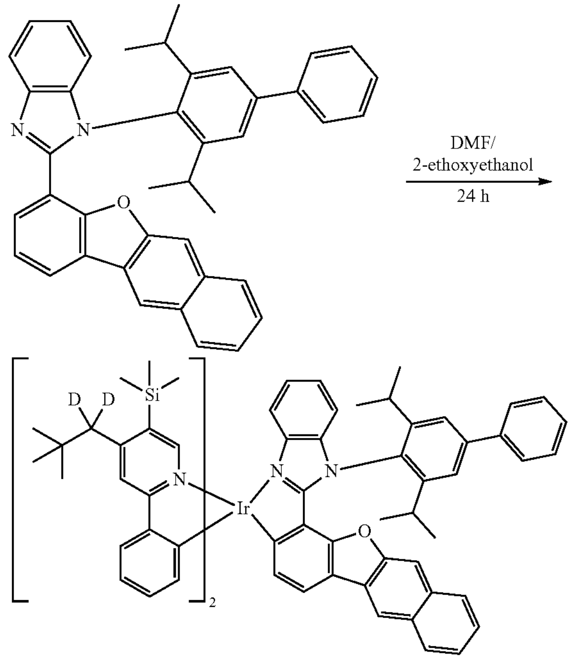

960

Synthesis of Compound 960A

An amount of 3.8 g of Compound 960A (yield: 76%) was obtained in the same manner as in Synthesis of Compound 1A in Synthesis Example 1, except that 4-(2,2-dimethylpropyl-1,1-d2)-2-phenyl-5-(trimethylsilyl)pyridine was used instead of 2-phenyl-5-(trimethylsilyl)pyridine.

Synthesis of Compound 960B

Compound 960B was obtained in the same manner as in Synthesis of Compound 1B in Synthesis Example 1, except that Compound 960A was used instead of Compound 1A. The resulting Compound 960B was used in the following reaction without any further purification.

Synthesis of Compound 960

An amount of 3.17 g (3.16 mmol) of Compound 960B and 1.81 g (3.16 mmol) of 1-(3,5-diisopropyl-[1,1'-biphenyl]-4-yl)-2-(naphtho[2,3-b]benzofuran-4-yl)-1H-benzo[d]imidazole were mixed with 40 mL of 2-ethoxyethanol and 40 mL of dimethyl formamide, followed by stirring under reflux at a temperature of 130° C. for 24 hours. Then, the temperature of lowered. The resulting mixture was placed under reduced pressure to obtain a solid, followed by performing column chromatography using EA and hexane, to thereby obtain 0.98 g of Compound 960 (yield: 23%). The synthesized material was identified by HRMS and HPLC analysis.

HRMS(MALDI) calcd for $C_{79}H_{81}IrN_4OSi_2$: m/z 1358.9874 Found: 1358.9872.

Synthesis Example 5 (Compound 962 or Compound 118-24)

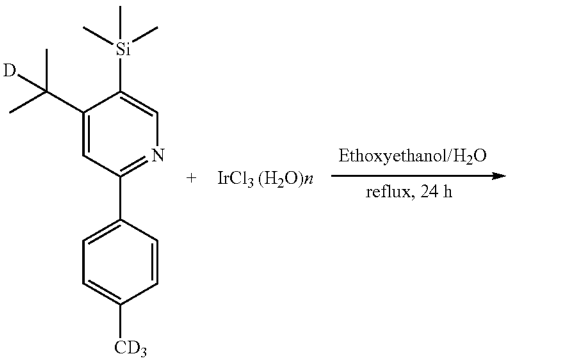

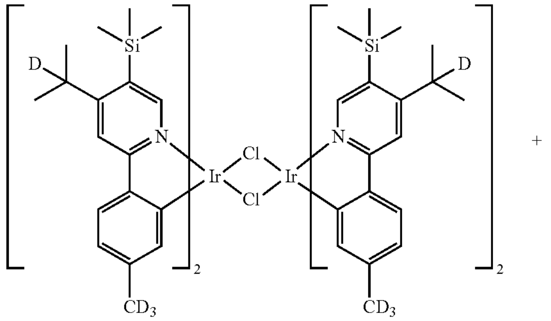

962A

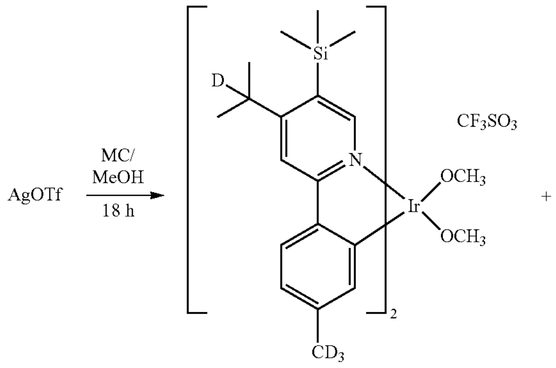

962B

-continued

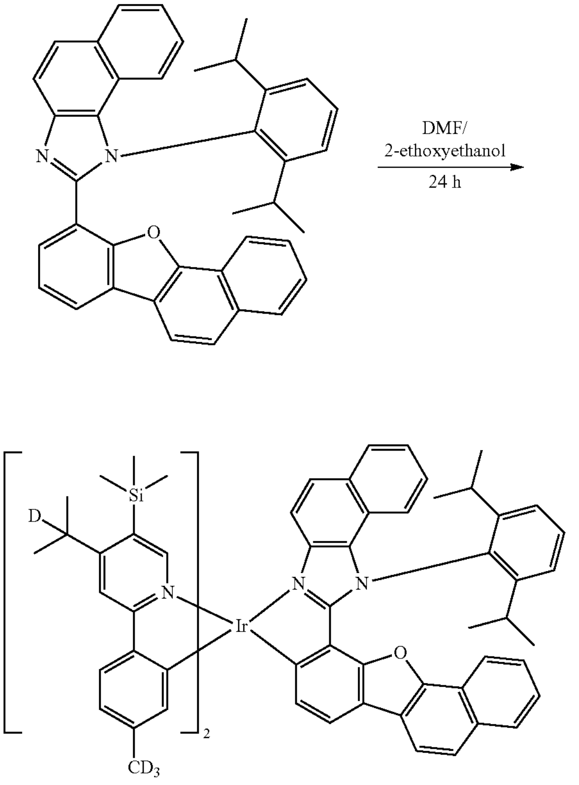

962

Synthesis of Compound 962A

An amount of 3.5 g of Compound 962A (yield: 88%) was obtained in the same manner as in Synthesis of Compound 1A in Synthesis Example 1, except that 2-(4-(methyl-d3)phenyl)-4-(propan-2-yl-2-d)-5-(trimethylsilyl)pyridine was used instead of 2-phenyl-5-(trimethylsilyl)pyridine.

Synthesis of Compound 962B

Compound 962B was obtained in the same manner as in Synthesis of Compound 1B in Synthesis Example 1, except that Compound 962A was used instead of Compound 1A. The resulting Compound 962B was used in the following reaction without any further purification.

Synthesis of Compound 962

An amount of 3.21 g (3.29 mmol) of Compound 962B and 1.37 g (3.29 mmol) of 1-(2,6-diisopropylphenyl)-2-(naphtho[1,2-b]benzofuran-10-yl)-1H-naphtho[1,2-d]imidazole) were mixed with 80 mL of 2-ethoxyethanol and 80 mL of dimethyl formamide, followed by stirring under reflux at a temperature of 130° C. for 24 hours. Then, the temperature was lowered. The resulting mixture was placed under reduced pressure to obtain a solid, followed by performing column chromatography using EA and hexane, to thereby obtain 1.62 g of Compound 962 (yield: 38%). The synthesized material was identified by HRMS and HPLC analysis.

HRMS(MALDI) calcd for $C_{75}H_{71}IrN_4OSi_2$: m/z 1308.9198 Found: 1308.9198.

Synthesis Example 6 (Compound 980 or Compound 136-309)

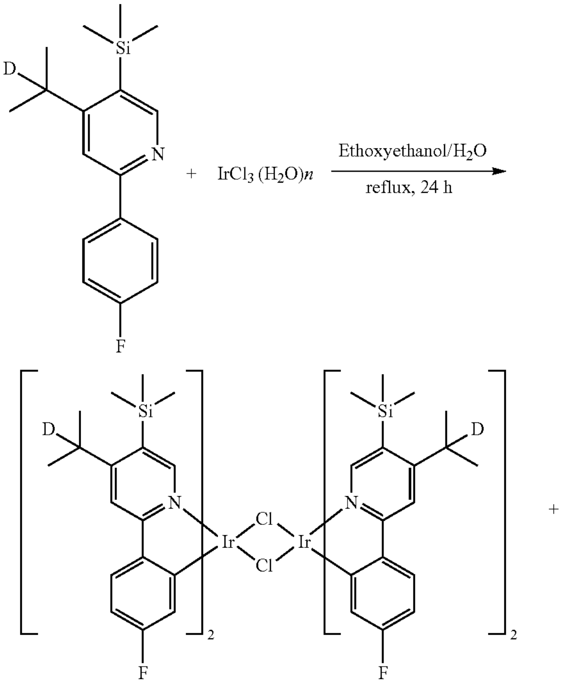

980A

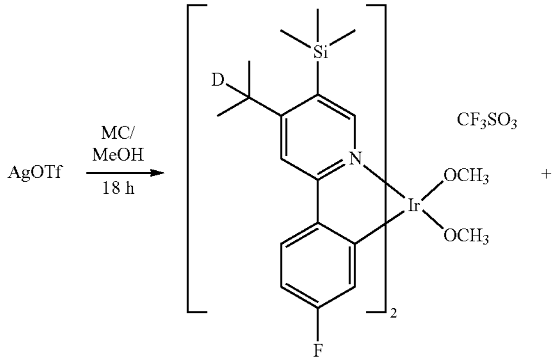

980B

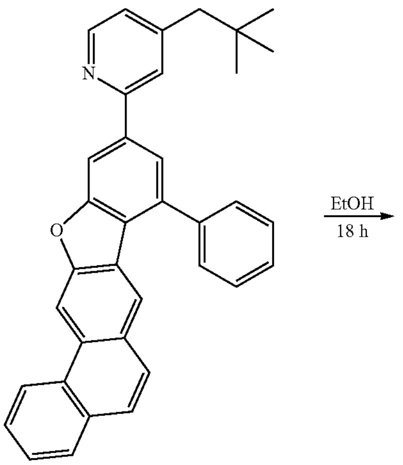

-continued

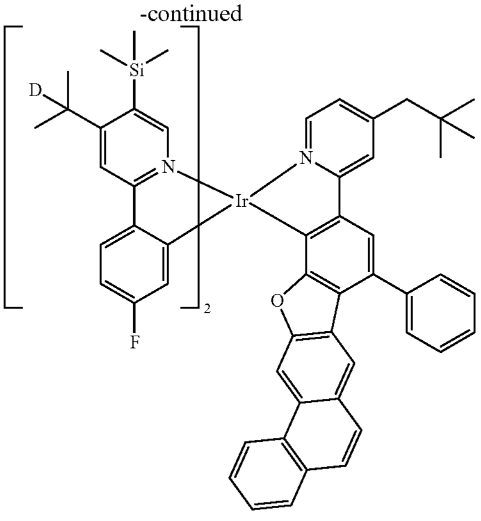

980

Synthesis of Compound 980A

An amount of 3.5 g of Compound 980A (yield: 88%) was obtained in the same manner as in Synthesis of Compound 1A in Synthesis Example 1, except that 2-(4-fluorophenyl)-4-(propan-2-yl-2-d)-5-(trimethylsilyl)pyridine was used instead of 2-phenyl-5-(trimethylsilyl)pyridine.

Synthesis of Compound 980B

Compound 980B was obtained in the same manner as in Synthesis of Compound 1B in Synthesis Example 1, except that Compound 980A was used instead of Compound 1A. The resulting Compound 980B was used in the following reaction without any further purification.

Synthesis of Compound 980

An amount of 2.73 g (2.79 mmol) of Compound 980B and 1.37 g (2.79 mmol) of 4-neopentyl-2-(8-phenylphenanthro[3,2-b]benzofuran-10-yl)pyridine were mixed with 60 mL of ethanol and stirred under reflux for 18 hours at a temperature of 90° C., followed by lowering the temperature. The resulting solid product was filtered and separated, followed by performing column chromatography using MC and hexane, to thereby obtain 1.62 g of Compound 980 (yield: 46%). The synthesized material was identified by HRMS and HPLC analysis.

HRMS(MALDI) calcd for $C_{72}H_{58}D_8IrN_3OSi_2$: m/z 1255.8558 Found: 1255.8555.

Synthesis Example 7 (Compound 1279 or Compound 151-137)

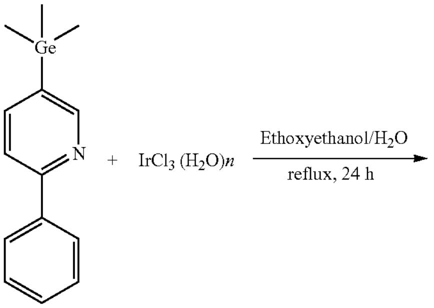

-continued

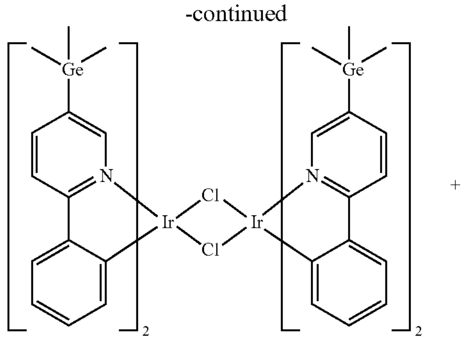

1279A

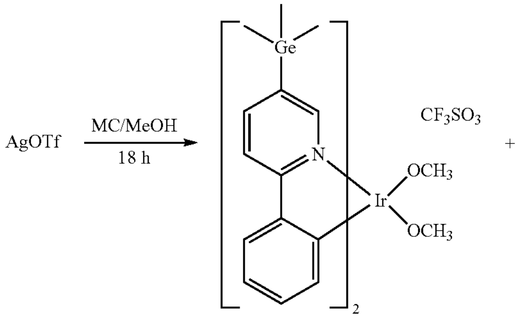

1279B

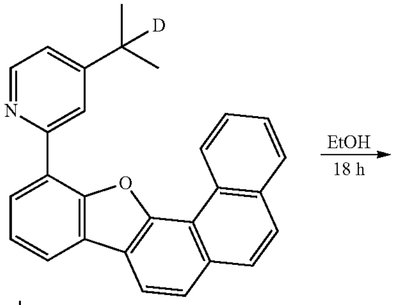

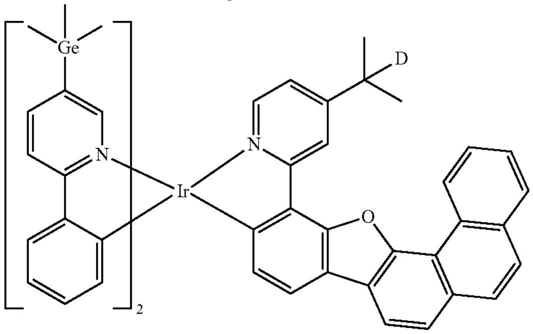

1279

Synthesis of Compound 1279A

An amount of 4.5 g of Compound 1279A (yield: 87%) was obtained in the same manner as in Synthesis of Compound 1A in Synthesis Example 1, except that 2-phenyl-5-(trimethylgermyl)pyridine was used instead of 2-phenyl-5-(trimethylsilyl)pyridine.

Synthesis of Compound 1279B

Compound 1279B was obtained in the same manner as in Synthesis of Compound 1B in Synthesis Example 1, except that Compound 1279A was used instead of Compound 1A. The resulting Compound 1279B was used in the following reaction without any further purification.

Synthesis of Compound 1279

2.96 g (3.12 mmol) of Compound 1279B and 1.21 g (3.12 mmol) of 2-(phenanthro[4,3-b]benzofuran-12-yl)-4-(propan-2-yl-2-d)pyridine were mixed with 60 mL of ethanol and stirred under reflux for 18 hours at a temperature of 90° C., followed by lowering the temperature. The resulting solid product was filtered and separated, followed by performing column chromatography using EA and hexane, to thereby obtain 1.80 g of Compound 1279 (yield: 50%). The synthesized material was identified by HRMS and HPLC analysis.

HRMS(MALDI) calcd for $C_{56}H_{51}DGe_2IrN_3O$: m/z 1121.5351 Found: 1121.5350.

Synthesis Example 8 (Compound 2206 or Compound 273-162)

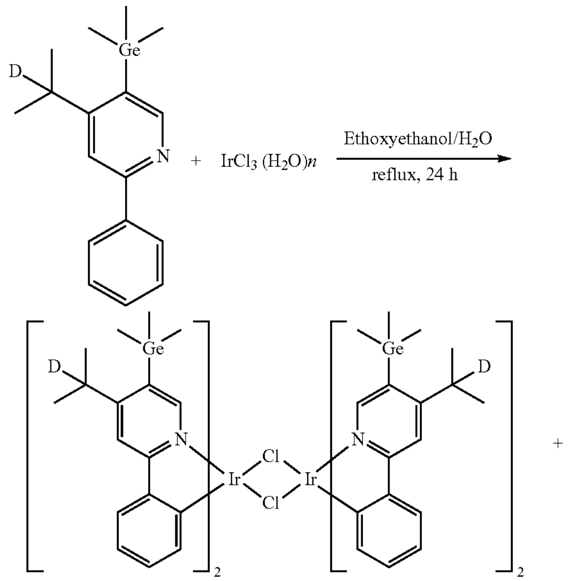

2206A

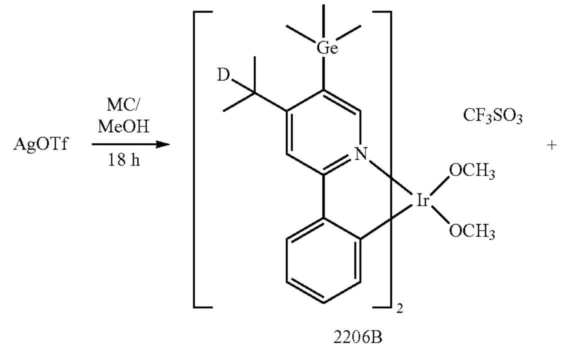

2206B

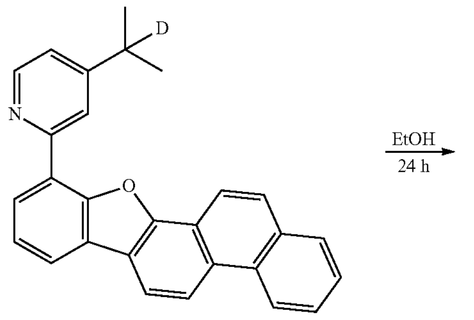

-continued

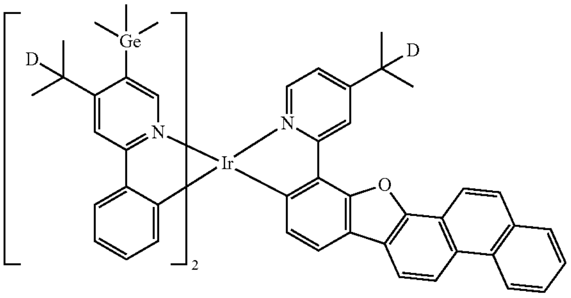

2206

Synthesis of Compound 2206A

An amount of 4.4 g of Compound 2206A (yield: 88%) was obtained in the same manner as in Synthesis of Compound 1A in Synthesis Example 1, except that 2-phenyl-4-(propan-2-yl-2-d)-5-(trimethylgermyl)pyridine was used instead of 2-phenyl-5-(trimethylsilyl)pyridine.

Synthesis of Compound 2206B

Compound 2206B was obtained in the same manner as in Synthesis of Compound 1B in Synthesis Example 1, except that Compound 2206A was used instead of Compound 1A. The resulting Compound 2206B was used in the following reaction without any further purification.

Synthesis of Compound 2206

An amount of 2.57 g (2.48 mmol) of Compound 2206B and 0.97 g (2.48 mmol) of 2-(phenanthro[1,2-b]benzofuran-12-yl)-4-(propan-2-yl-2-d)pyridine were mixed with 60 mL of ethanol and stirred under reflux for 24 hours at a temperature of 90° C., followed by lowering the temperature. The resulting solid product was filtered and separated, followed by performing column chromatography using EA and hexane, to thereby obtain 1.10 g of Compound 2206 (yield: 37%). The synthesized material was identified by HRMS and HPLC analysis.

HRMS(MALDI) calcd for $C_{62}H_{61}D_3Ge_2IrN_3O$: m/z 1210.3290 Found: 1210.3292.

Synthesis Example 9 (Compound 2543 or Compound 306-183)

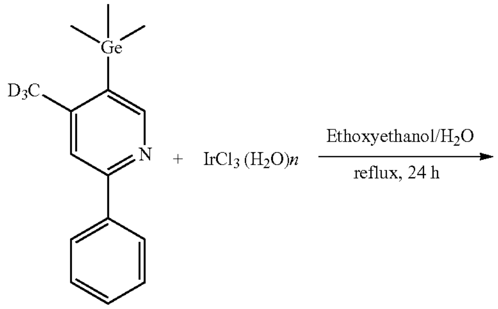

-continued

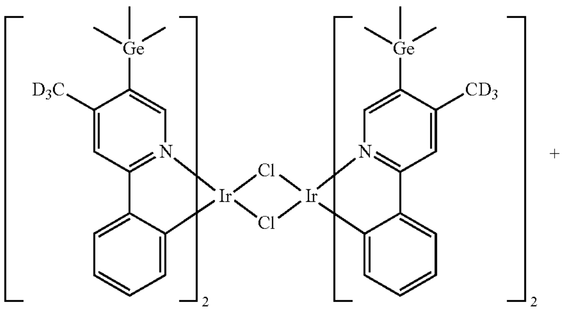

2543A

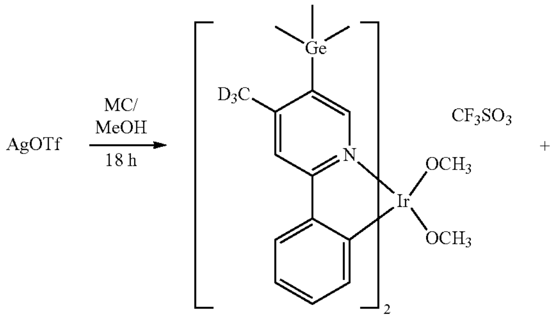

2543B

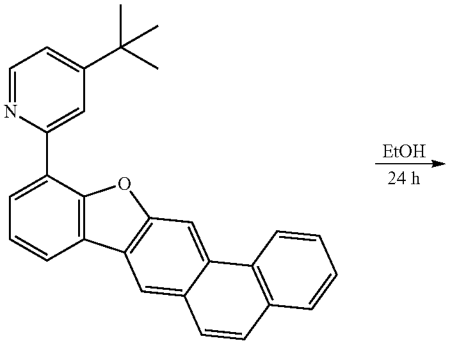

-continued

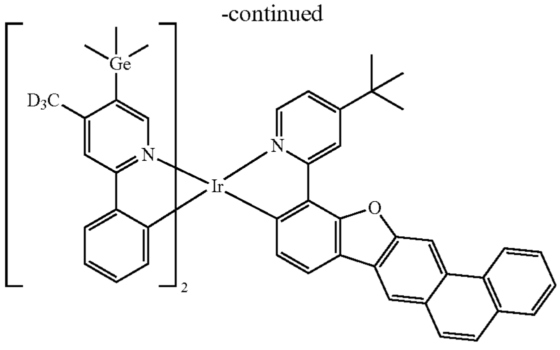

2543

Synthesis of Compound 2543A

An amount of 5.4 g of Compound 2543A (yield: 90%) was obtained in the same manner as in Synthesis of Compound 1A in Synthesis Example 1, except that 4-(methyl-d3)-2-phenyl-5-(trimethylgermyl)pyridine was used instead of 2-phenyl-5-(trimethylsilyl)pyridine.

Synthesis of Compound 2543B

Compound 2543B was obtained in the same manner as in Synthesis of Compound 1B in Synthesis Example 1, except that Compound 2543A was used instead of Compound 1A. The resulting Compound 2543B was used in the following reaction without any further purification.

Synthesis of Compound 2543

An amount of 2.77 g (2.82 mmol) of Compound 2543B and 1.13 g (2.82 mmol) of 4-(tert-butyl)-2-(phenanthro[3,2-b]benzofuran-11-yl)pyridine were mixed with 60 mL of ethanol and stirred under reflux for 24 hours at a temperature of 90° C., followed by lowering the temperature. The resulting solid product was filtered and separated, followed by performing column chromatography using EA and hexane, to thereby obtain 1.05 g of Compound 2543 (yield: 32%). The synthesized material was identified by HRMS and HPLC analysis.

HRMS(MALDI) calcd for $C_{59}H_{52}D_6Ge_2IrN_3O$: m/z 1171.3009 Found: 1171.3008.

Synthesis Example 10 (Compound 2588 or Compound 1-184N)

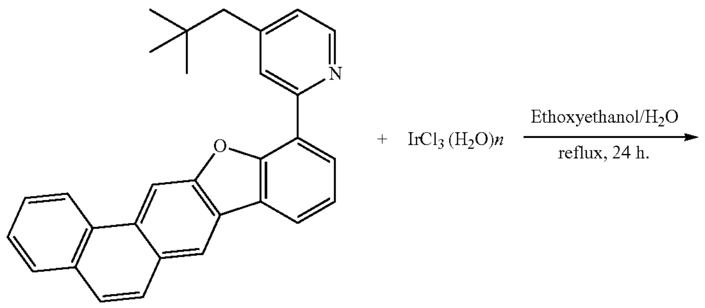

-continued

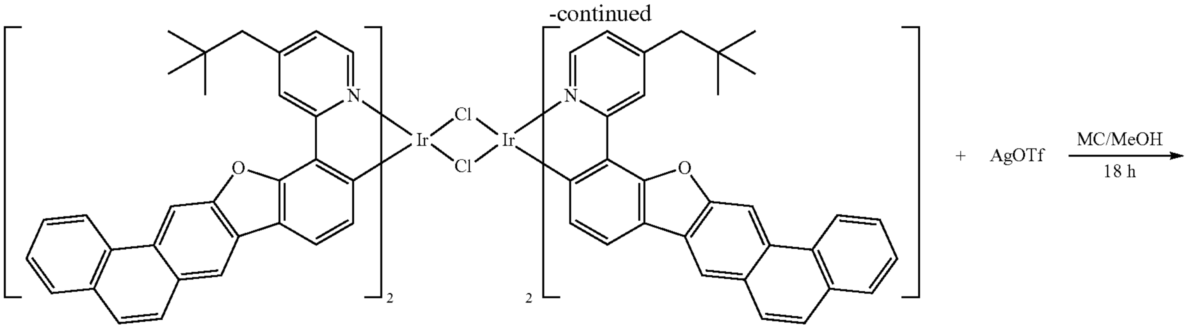

2588A

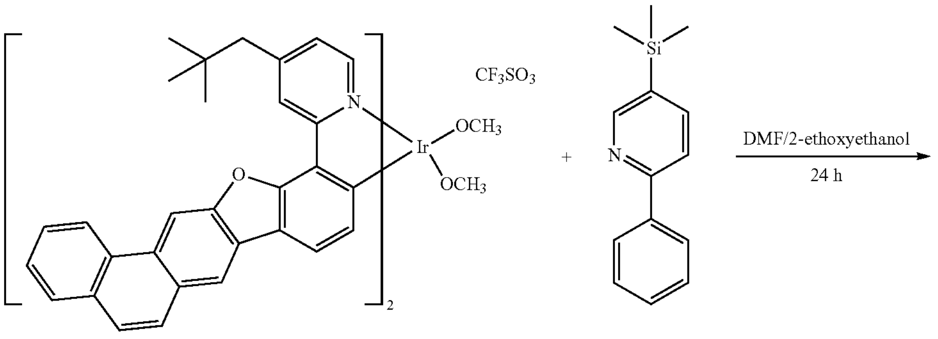

2588B

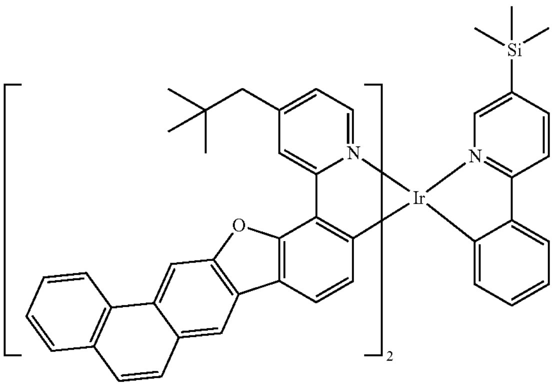

2588

Synthesis of Compound 2588A

An amount of 4.6 g of Compound 2588A (yield: 77%) was obtained in the same manner as in Synthesis of Compound 1A in Synthesis Example 1, except that 4-neopentyl-2-(phenanthro[3,2-b]benzofuran-11-yl)pyridine was used instead of 2-phenyl-5-(trimethylsilyl)pyridine.

Synthesis of Compound 2588B

Compound 2588B was obtained in the same manner as in Synthesis of Compound 1B in Synthesis Example 1, except that Compound 2588A was used instead of Compound 1A. The resulting Compound 2588B was used in the following reaction without any further purification.

Synthesis of Compound 2588

An amount of 3.261 g (2.64 mmol) of Compound 2588B and 0.60 g (2.64 mmol) of 2-phenyl-5-(trimethylsilyl)pyridine were mixed with 40 mL of 2-ethoxyethanol and 40 mL of dimethylformamide and stirred under reflux for 24 hours at a temperature of 130° C., followed by lowering the temperature. The resulting solid product was filtered and separated, followed by performing column chromatography using EA and hexane, to thereby obtain 0.94 g of Compound 2588 (yield: 28%). The synthesized material was identified by HRMS and HPLC analysis.

HRMS(MALDI) calcd for $C_{74}H_{64}IrN_3O_2Si$: m/z 1247.6470 Found: 1247.6470.

Comparative Example A (Compound A)

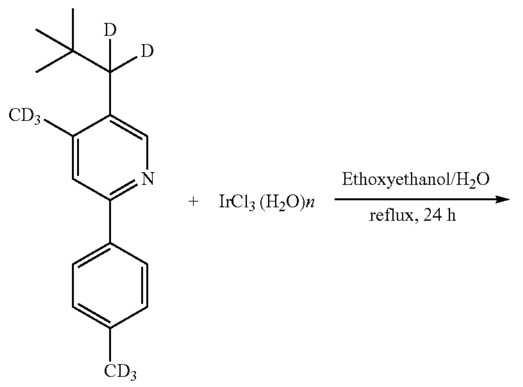

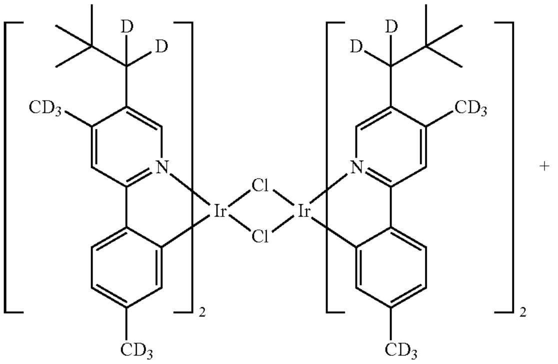

AA

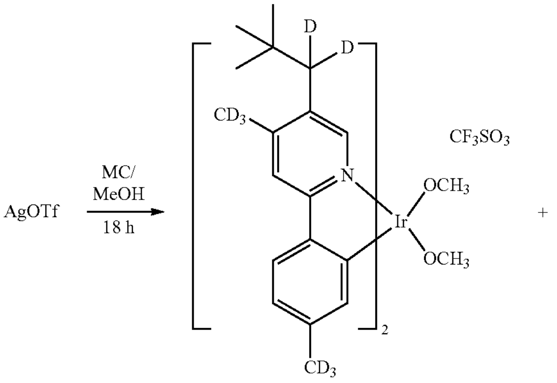

AB

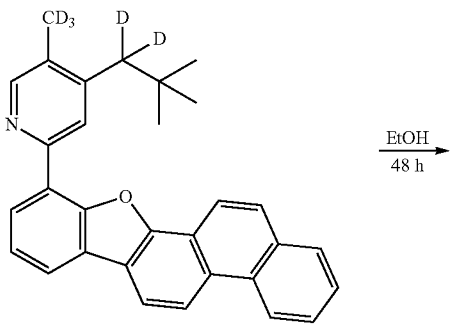

-continued

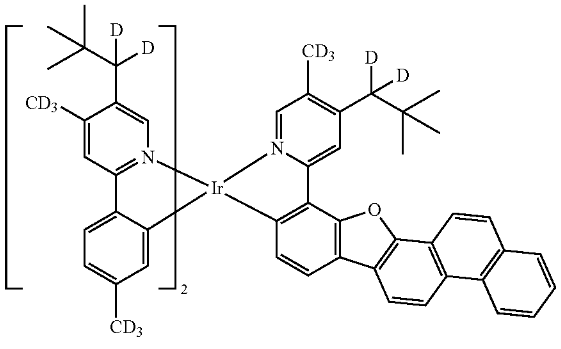

A

Synthesis of Compound AA

An amount of 4.6 g of Compound AA (yield: 77%). was obtained in the same manner as in Synthesis of Compound 1A in Synthesis Example 1, except that 5-(2,2-dimethylpropyl-1,1-d2)-4-(methyl-d3)-2-(4-(methyl-d3)phenyl)pyridine was used instead of 2-phenyl-5-(trimethylsilyl)pyridine.

Synthesis of Compound AB

Compound AB was obtained in the same manner as in Synthesis of Compound 1B in Synthesis Example 1, except that Compound AA was used instead of Compound 1A. The resulting Compound AB was used in the following reaction without any further purification.

Synthesis of Compound A

An amount of 2.83 g (3.05 mmol) of Compound AB and 1.33 g (3.05 mmol) of 4-(2,2-dimethylpropyl-1,1-d2)-5-(methyl-d3)-2-(phenanthro[1,2-b]benzofuran-12-yl)pyridine were mixed with 70 mL of ethanol and stirred under reflux for 48 hours at a temperature of 90° C., followed by lowering the temperature. The resulting solid product was filtered and separated, followed by performing column chromatography using EA and hexane, to thereby obtain 0.80 g of Compound A (yield: 23%). The synthesized material was identified by HRMS and HPLC analysis.

HRMS(MALDI) calcd for $C_{67}H_{49}D_{21}IrN_3O$: m/z 1146.6466 Found: 1146.6465.

Comparative Example B (Compound B)

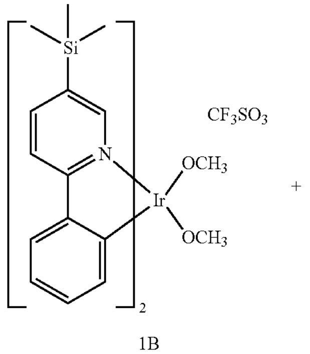

1B

-continued

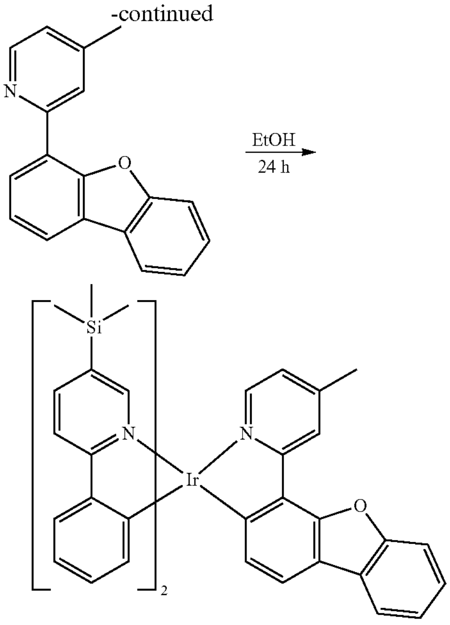

B

An amount of 2.85 g (3.32 mmol) of Compound 1B and 0.86 g (3.32 mmol) of 2-(dibenzo[b,d]furan-4-yl)-4-methylpyridine were mixed with 70 mL of ethanol and stirred at a temperature of 90° C. under reflux for 24 hours, followed by lowering the temperature. The resulting solid product was filtered and separated, followed by performing column chromatography using EA and hexane, to thereby obtain 1.12 g of Compound B (yield: 37%). The synthesized material was identified by HRMS and HPLC analysis.

HRMS(MALDI) calcd for $C_{46}H_{44}IrN_3OSi_2$: m/z 903.2652 Found: 903.2653.

Example 1

A glass substrate, on which ITO is patterned as an anode, was cut to a size of 50 millimeters (mm)×50 mm×0.5 mm, sonicated in isopropyl alcohol and water for 5 minutes each, and cleaned by exposure to ultraviolet rays and ozone for 30 minutes. Subsequently, the glass substrate was mounted on a vacuum-deposition device.

Compound HT3 and F6-TCNNQ were vacuum-co-deposited at a weight ratio of 98:2 on the anode to form a hole injection layer having a thickness of 100 Å. Compound HT3 was vacuum-deposited on the hole injection layer to form a hole transport layer having a thickness of 1,350 Å. Then, Compound H-H1 was deposited on the hole transport layer to form an electron blocking layer having a thickness of 300 Å.

Subsequently, Compound H-H1, Compound H-E43, and Compound 1 (as a dopant) were co-deposited on the electron blocking layer at a weight ratio of 57:38:5 to form an emission layer having a thickness of 400 Å.

Compound ET3 and Compound ET-D1 were co-deposited at a volume ratio of 50:50 on the emission layer to form an electron transport layer having a thickness of 350 Å, Compound ET-D1 was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

HT3

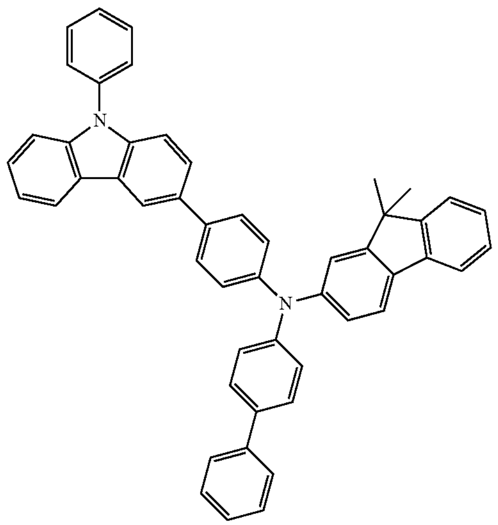

F6-TCNNQ

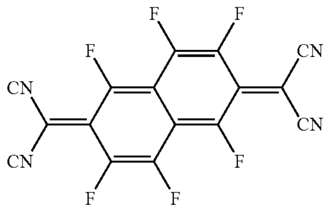

H-H1

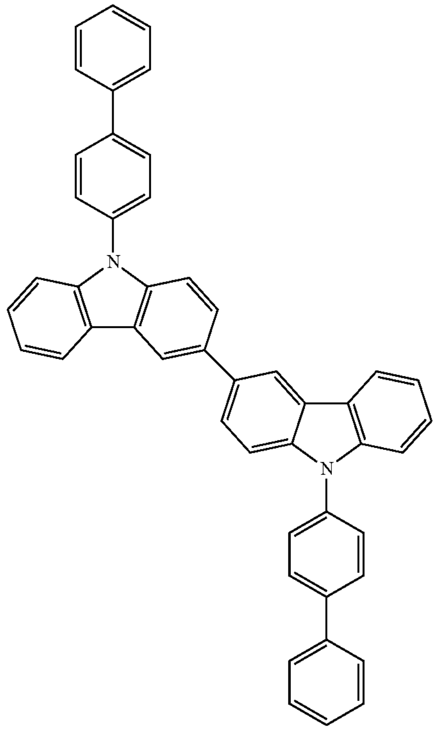

-continued

H-E43

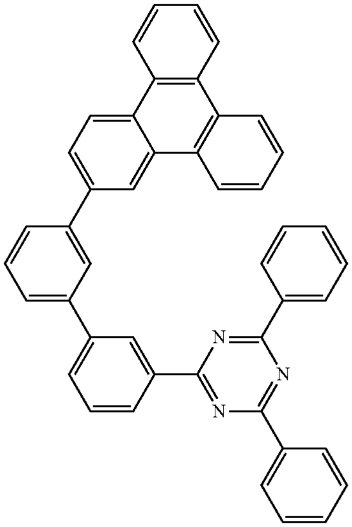

ET3

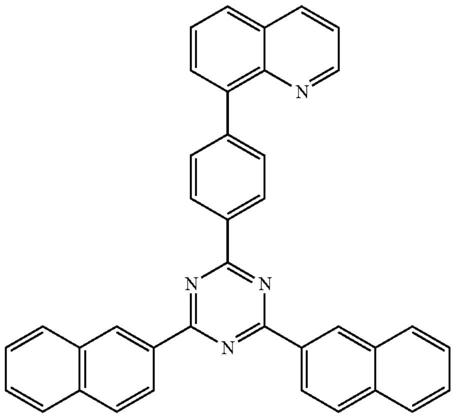

ET-D1

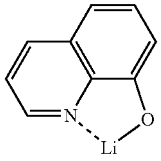

Examples 2 to 10 and Comparative Examples A and B

Organic light-emitting devices were manufactured in the same manner as in Example 1, except that the compounds shown in Table 98 were used instead of Compound 1 as a dopant in the formation of an emission layer.

Evaluation Example 1: Evaluation of Characteristics of Organic Light-Emitting Device The maximum value of external quantum efficiency (Max EQE, %), lifespan ($LT_{97}$, hours (hr)) and maximum emission wavelength of each of the organic light-emitting devices manufactured in Examples 1 to 10 and Comparative Examples A and B were evaluated. The results thereof are shown in Table 98. A Keithley 2400 current voltmeter and a luminance meter (Minolta Cs-1000A) were used in the evaluation. The lifespan ($LT_{97}$ at 6,000 nit (candela per square meter)) refers to time (hr) required for the initial luminance of the organic light-emitting device to reduce to 97%. The Max FOE and the lifespan are indicated in a relative value (%) compared to Comparative Example B.

TABLE 98

| | Dopant in emission layer Compound No. | Max EQE (relative value, %) | $LT_{97}$ (at 6,000 nit) (relative value, %) | Maximum emission wavelength (nm) |
|---|---|---|---|---|
| Example 1 | 1 | 110% | 257% | 530 |
| Example 2 | 1279 | 114% | 286% | 532 |
| Example 3 | 2206 | 118% | 443% | 526 |
| Example 4 | 960 | 117% | 215% | 538 |
| Example 5 | 855 | 115% | 171% | 534 |
| Example 6 | 962 | 120% | 193% | 526 |
| Example 7 | 838 | 121% | 357% | 530 |
| Example 8 | 980 | 113% | 186% | 522 |
| Example 9 | 2543 | 119% | 516% | 526 |
| Example 10 | 2588 | 125% | 292% | 525 |
| Comparative Example A | A | 108% | 143% | 527 |
| Comparative Example B | B | 100% | 100% | 525 |

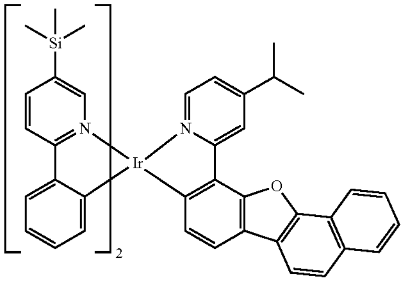

1

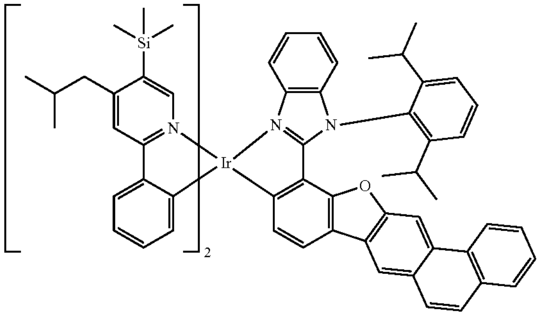

838

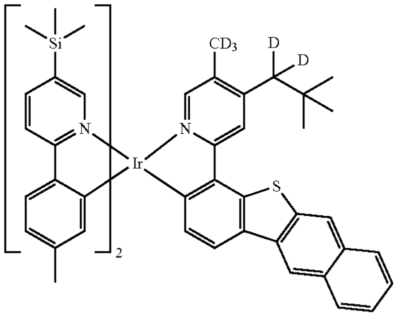

855

TABLE 98-continued
| Dopant in emission layer Compound No. | Max EQE (relative value, %) | $LT_{97}$ (at 6,000 nit) (relative value, %) | Maximum emission wavelength (nm) |
|---|---|---|---|
| 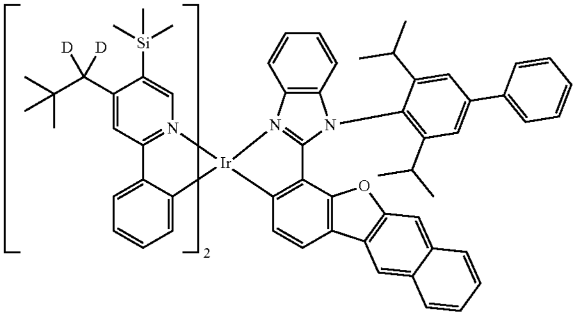 960 | | | |
| 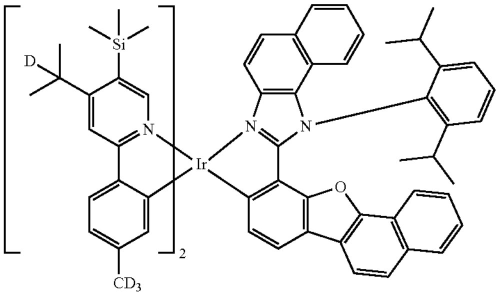 962 | | | |
| 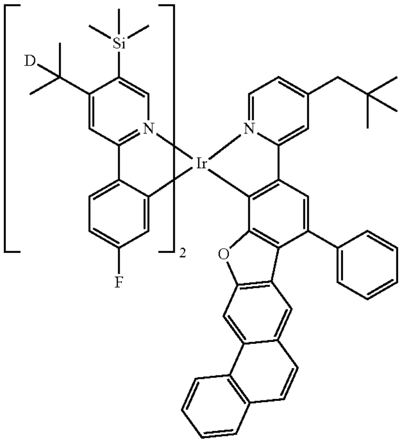 980 | | | |
| 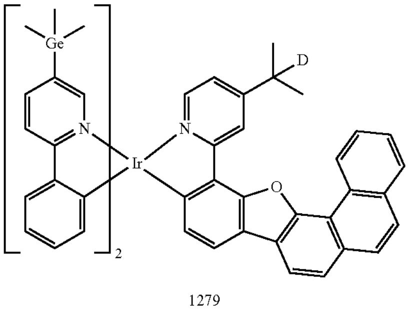 1279 | | | |
TABLE 98-continued
| Dopant in emission layer Compound No. | Max EQE (relative value, %) | $LT_{97}$ (at 6,000 nit) (relative value, %) | Maximum emission wavelength (nm) |
|---|---|---|---|
| 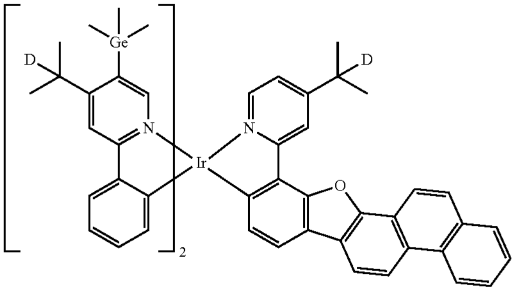 2206 | | | |
| 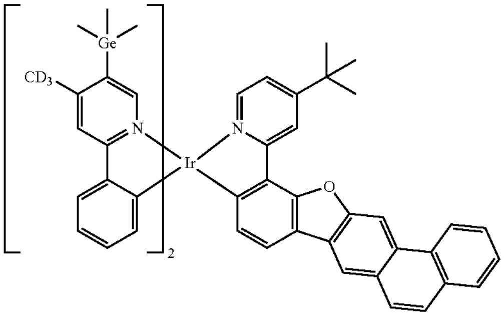 2543 | | | |
| 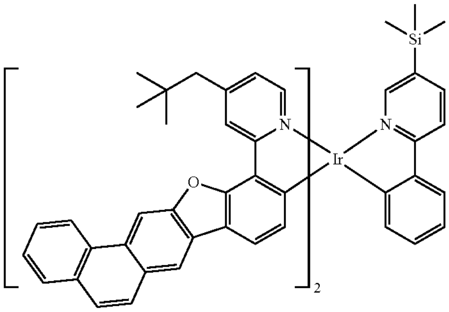 2588 | | | |
| 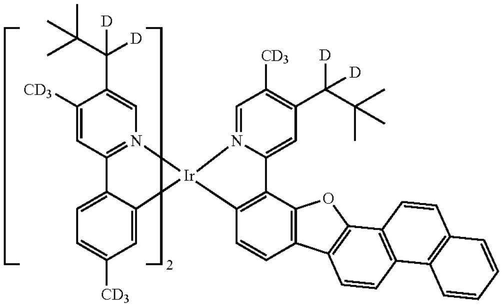 A | | | |

TABLE 98-continued

| Dopant in emission layer Compound No. | Max EQE (relative value, %) | $LT_{97}$ (at 6,000 nit) (relative value, %) | Maximum emission wavelength (nm) |
|---|---|---|---|
| 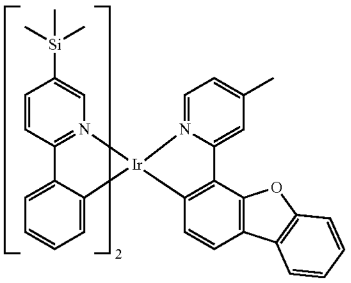 B | | | |

Referring to the results of Table 98, the organic light-emitting devices of Examples 1 to 10 were found to have improved external quantum yield and lifespan, as compared with the organic light-emitting devices of Comparative Examples A and B and to emit a green light.

As apparent from the foregoing description, the organometallic compound may have excellent thermal stability and/or electrical characteristics, and thus, an electronic device, e.g., an organic light-emitting device, including the organometallic compound may have an improved external quantum yield and improved lifespan characteristics. Therefore, a high-quality electronic apparatus may be manufactured by using the organic light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2} \quad \text{Formula 1}$$

wherein, in Formula 1,

M is iridium, $L_1$ is a ligand represented by Formula 2-1, $L_2$ is a ligand represented by Formula 2-2, n1 and n2 are each independently 1 or 2, with the proviso that when n1 is 2, the $L_1$ ligands are identical to or different from each other, and when n2 is 2, the $L_2$ ligands are identical to or different from each other, and $L_1$ is different from $L_2$:

Formula 2-1

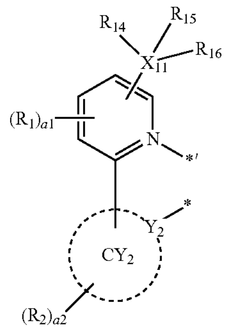

Formula 2-2

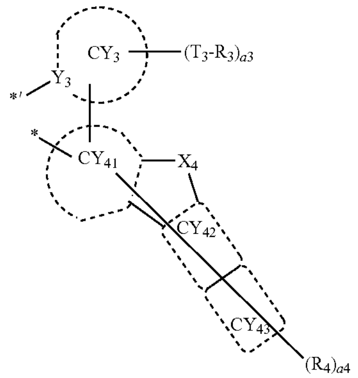

wherein, in Formulae 2-1 and 2-2, $Y_2$ is C, and $Y_3$ is N, ring $CY_2$ is a benzene group, a naphthalene group, a carbazole group, a fluorene group, a dibenzosilole group, a dibenzothiophene group, or a dibenzofuran group, ring $CY_3$ is a pyrimidine group, a triazine group, a quinoline group, an isoquinoline group, a quinoxaline group, a benzoquinoline group, a benzoisoquinoline group, a benzoquinoxaline group, a naphthoquinoline group, a naphthoisoquinoline group, a naphthoquinoxaline group, a pyridoquinoline group, a pyridoisoquinoline group, a pyridoquinoxaline group, a pyridine group condensed with a cyclohexane group, an imidazole group, a benzimidazole group, a naphthoimidazole group, a phenanthrenoimidazole group, or a pyridoimidazole group, ring $CY_{41}$, ring $CY_{42}$ and ring $CY_{43}$ are each independently i) A group, ii) a polycyclic group in which at least two A groups are condensed, or iii) a polycyclic group in which at least one A group and at least one B group are condensed, wherein A group is a benzene group, a pyridine group, a pyrimidine group, a pyridazine group, a pyrazine group, or a triazine group and B group is a norbornane group, a furan group, a thiophene group, a selenophene group, a pyrrole group, or a silole group, wherein a carbon atom in ring $CY_{41}$ in Formula 2-2 is bound to M in Formula 1 via a covalent bond, $X_{11}$ is Si or Ge, $T_3$ is a single bond, a $C_1$-$C_{20}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $X_4$ is O, S, Se, $N(R_{48})$, $C(R_{48})(R_{49})$, or $Si(R_{48})(R_{49})$, $R_1$ to $R_3$ are each independently hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $R_4$, $R_{14}$, $R_{15}$, $R_{16}$, $R_{48}$, and $R_{49}$ are each independently hydrogen, deuterium, —F, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group, a1 is an integer from 0 to 3, a2 is an integer from 0 to 8, a3 and a4 are each independently an integer from 0 to 10, when a1 is 2 or 3, at least two of the $R_1$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, when a2 is 2 to 8, at least two of the $R_2$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, when a3 is 2 to 10, at least two of the $R_3$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, when a4 is 2 to 10, at least two of the $R_4$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, $R_{10a}$ has a same definition as $R_2$,

* and *' each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

2. The organometallic compound of claim 1, wherein ring $CY_2$ is a benzene group a naphthalene group.

3. The organometallic compound of claim 1, wherein ring $CY_3$ is a pyrimidine group, a quinoline group, an isoquinoline group, a benzoquinoline group, a benzoisoquinoline group, group, a pyridine group condensed with a cyclohexane group, an imidazole group, a benzimidazole group, a naphthoimidazole group, group, or a pyridoimidazole group.

4. The organometallic compound of claim 1, wherein ring $CY_{41}$ and ring $CY_{42}$ are each independently a benzene group, a naphthalene group, or a benzene group condensed with a norbornane group, and ring $CY_{43}$ is:

a benzene group, a naphthalene group, a phenanthrene group, an anthracene group, or a chrysene group; or a benzene group, a naphthalene group, a phenanthrene group, an anthracene group, or a chrysene group, each condensed with a norbornane group.

5. The organometallic compound of claim 1, wherein $T_3$ is:

a single bond; or a $C_1$-$C_{20}$ alkylene group, a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

6. The organometallic compound of claim 1, wherein $R_1$ to $R_4$, $R_{48}$, and $R_{49}$ are each independently:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or any combination thereof, and $R_{14}$ to $R_{16}$ are each independently a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated a phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

7. The organometallic compound of claim 1, wherein the organometallic compound comprises deuterium, a fluoro group, or any combination thereof and at least one of Conditions 3 to 8 is satisfied:

Condition 1 at least one of the $R_1$ moieties, the number a1 representing a count of the $R_1$ moieties, may not be hydrogen and may include at least one deuterium, Condition 2 at least one of the $R_2$ moieties, the number a2 representing a count of the $R_2$ moieties, may not be hydrogen and may include at least one deuterium, Condition 3 at least one of the *-$T_3$-$R_3$ moieties, the number a3 representing a count of the *-$T_3$-$R_3$ moieties, may not be hydrogen and may include at least one deuterium, Condition 4 at least one of the $R_4$ moieties, the number a4 representing a count of the $R_4$ moieties, may not be hydrogen and may include at least one deuterium, Condition 5 at least one of the $R_1$ moieties (the number a1 representing a count of the $R_1$ moieties) may not be hydrogen and may include at least one fluoro group, Condition 6 at least one of the $R_2$ moieties, the number a2 representing a count of the $R_2$ moieties, may not be hydrogen and may include at least one fluoro group, Condition 7 at least one of the *-$T_3$-$R_3$ moieties, the number a3 representing a count of the *-$T_3$-$R_3$ moieties, may not be hydrogen and may include at least one fluoro group, and Condition 8 at least one of $R_4$ moieties, the number a4 representing a count of the $R_4$ moieties, may not be hydrogen and may include at least one fluoro group.

8. The organometallic compound of claim 1, wherein a group represented by

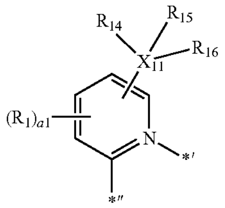

in Formula 2-1 is represented by one of Formulae CY1-1 or CY1-2:

CY1-1

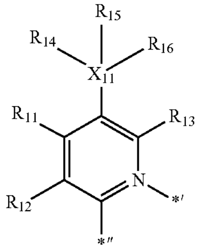

CY1-2

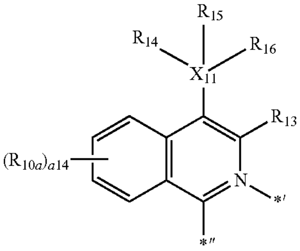

wherein, in Formulae CY1-1 and CY1-2, $X_{11}$, $R_{14}$ to $R_{16}$, and $R_{10a}$ are respectively understood by referring to the descriptions of $X_{11}$, $R_{14}$ to $R_{16}$, and $R_{10a}$ in claim 1, $R_{11}$ to $R_{13}$ each has a same definition as $R_1$, a14 is an integer from 0 to 4,

*' indicates a binding site to M in Formula 1, and

*" indicates a binding site to an adjacent atom in Formula 2-1.

9. The organometallic compound of claim 1, wherein a group represented by

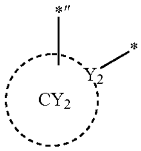

in Formula 2-1 is represented by one of Formulae CY2-1, CY2-11, CY2-14, CY2-17, and CY2-20 to CY2-25:

CY2-1

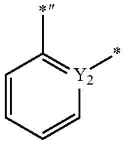

-continued

CY2-11

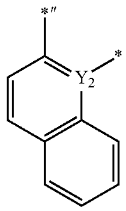

CY2-14

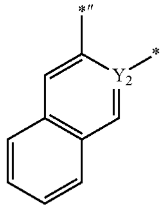

CY2-17

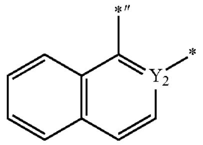

CY2-20

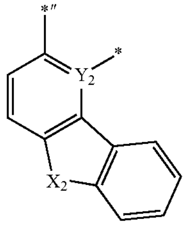

CY2-21

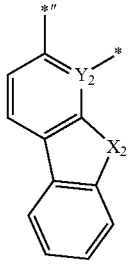

CY2-22

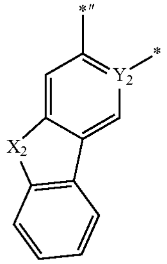

CY2-23

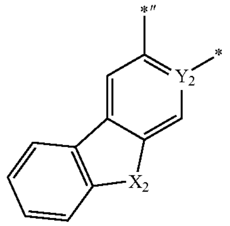

-continued

CY2-24

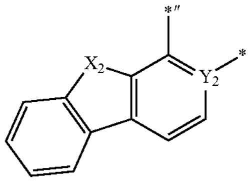

CY2-25

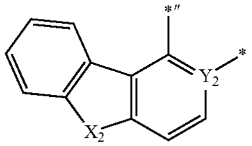

wherein, in Formulae CY2-1, CY2-11, CY2-13, CY2-14, CY2-16, CY2-17, CY2-19, and CY2-20 to CY2-25, $Y_2$ is understood by referring to the description of $Y_2$ in claim 1, $X_2$ is O, S, Se, $N(R_{28})$, $C(R_{28})(R_{29})$, or $Si(R_{28})(R_{29})$, $R_{28}$ and $R_{29}$ are each understood by referring to the description of $R_2$ claim 1,

*" indicates a binding site to an adjacent atom in Formula 2-1, and

*indicates a binding site to M in Formula 1.

10. The organometallic compound of claim 1, wherein a group represented by

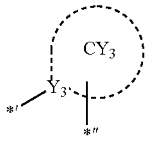

in Formula 2-2 is represented by one of Formulae CY3-3, CY3-5 to CY3-11, CY3-14, CY-17, CY-20 to CY3-34, CY3-37, CY3-38, CY3-40 to CY3-42, CY3-44 to CY3-46 and CY3-48:

CY3-3

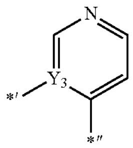

CY3-5

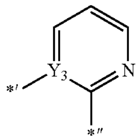

CY3-6

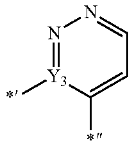

-continued

CY3-7

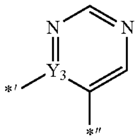

CY3-8

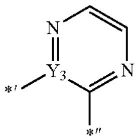

CY3-9

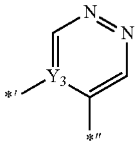

CY3-10

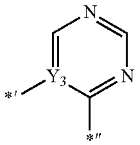

CY3-11

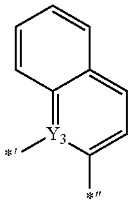

CY3-14

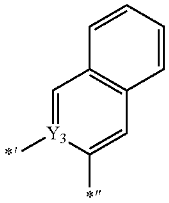

CY3-17

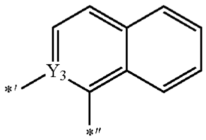

CY3-20

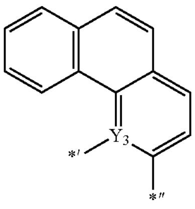

-continued
CY3-21
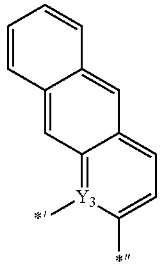
CY3-22
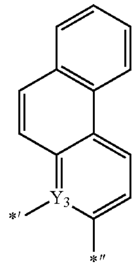
CY3-23
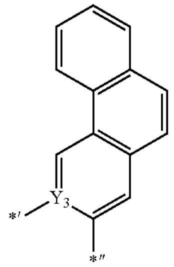
CY3-24
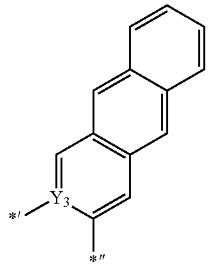
CY3-25
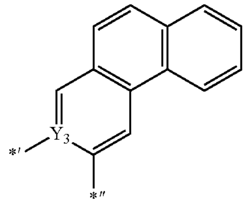
CY3-26
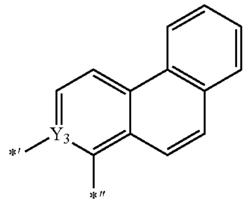
-continued
CY3-27
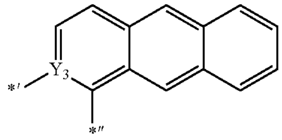
CY3-28
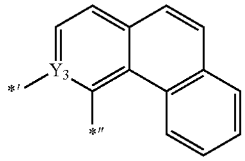
CY3-29
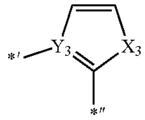
CY3-30
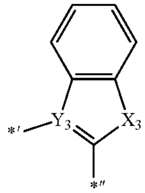
CY3-31
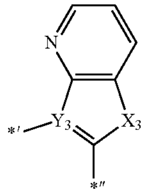
CY3-32
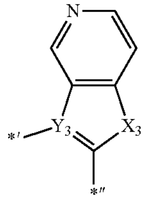
CY3-33
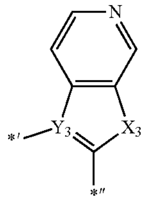
CY3-34
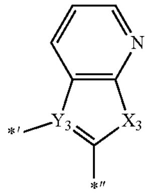

-continued

CY3-37

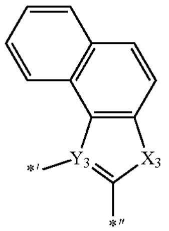

CY3-38

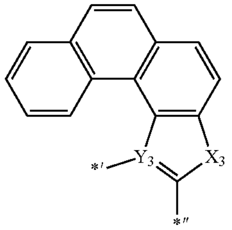

CY3-40

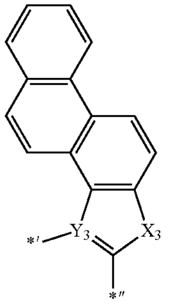

CY3-41

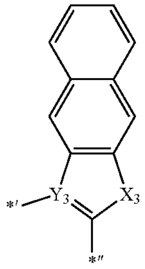

CY3-42

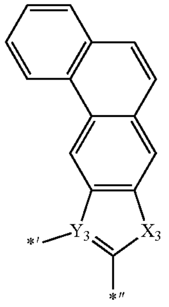

-continued

CY3-44

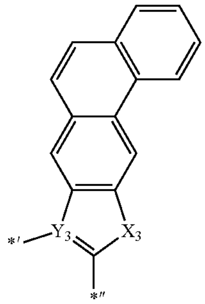

CY3-45

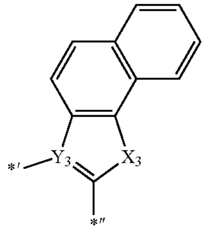

CY3-46

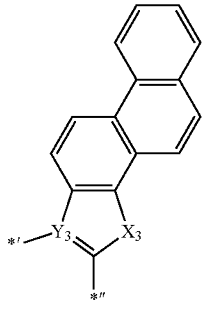

CY3-48

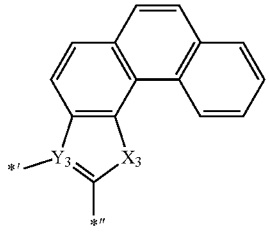

wherein, in Formulae CY3-3, CY3-5 to CY3-11, CY3-13, CY3-14, CY3-16 to CY3-34, CY3-37, CY3-38, CY3-40 to CY3-42, CY3-44 to CY3-46 and CY3-48, $X_3$ is $N(T_3-R_3)$, $Y_3$, $T_3$, and $R_3$ are respectively understood by referring to the descriptions of $Y_3$, $T_3$, and $R_3$ in claim 1,

*' indicates a binding site to M in Formula 1, and

*" indicates a binding site to an adjacent atom in Formula 2-2.

11. The organometallic compound of claim 1, wherein a group represented by

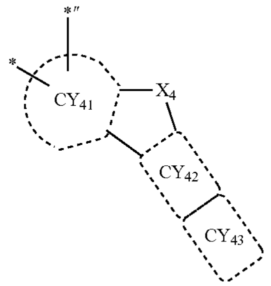

in Formula 2-2 is represented by one of Formulae CY4-1 to CY4-6:

CY4-1

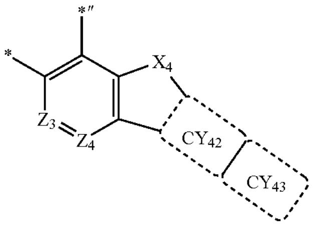

CY4-2

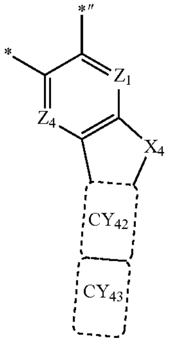

CY4-3

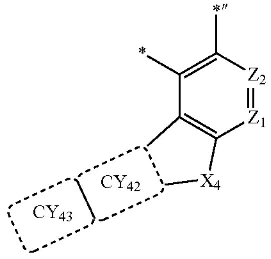

CY4-4

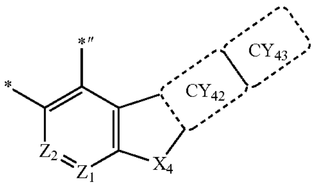

-continued

CY4-5

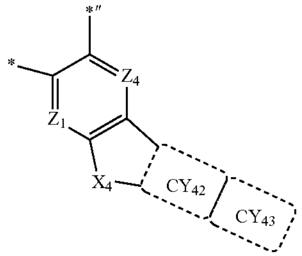

CY4-6

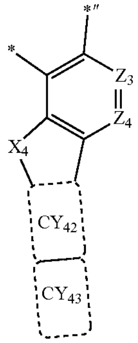

wherein, in Formulae CY4-1 to CY4-6, $X_4$, ring $CY_{42}$, and ring $CY_{43}$ are respectively understood by referring to the descriptions of $X_4$, ring $CY_{42}$, and ring $CY_{43}$ in claim 1, $Z_1$ to $Z_4$ are each independently N or C,

* indicates a binding site to M in Formula 1, and

*" indicates a binding site to ring $CY_3$ in Formula 2-2.

12. The organometallic compound of claim 1, wherein a group represented by

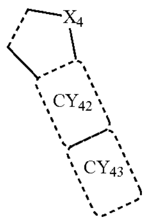

in Formula 2-2 is represented by one of Formulae CY401 to CY412:

CY401

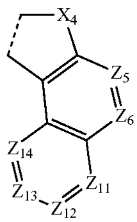

-continued

CY402

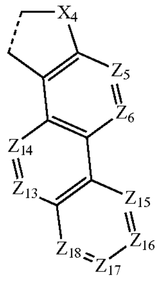

CY403

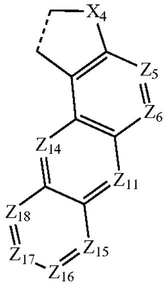

CY404

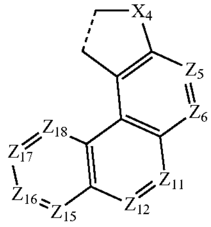

CY405

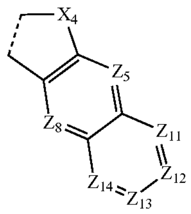

CY406

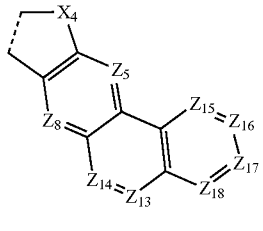

CY407

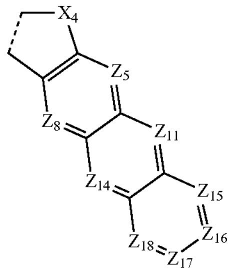

-continued

CY408

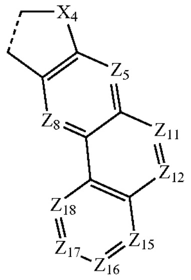

CY409

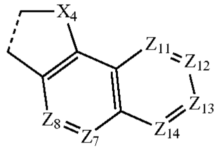

CY410

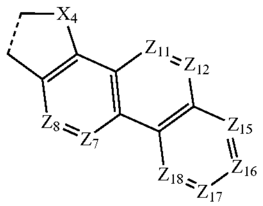

CY411

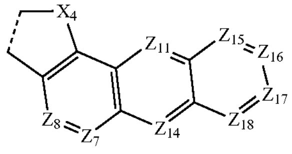

CY412

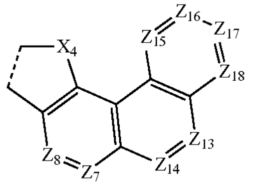

wherein, in Formulae CY401 to CY412, $X_4$ is understood by referring to the description of $X_4$ in claim 1, $Z_5$ to $Z_8$ and $Z_{11}$ to $Z_{18}$ are each independently N or C, and an $X_4$-containing 5-membered ring is condensed to an adjacent ring $CY_{41}$.

13. An organic light-emitting device comprising:

a first electrode;

a second electrode; and an organic layer disposed between the first electrode and the second electrode and comprising an emission layer, wherein the organic layer comprises the organometallic compound of claim 1.

14. The organic light-emitting device of claim 13, wherein the first electrode is an anode, the second electrode is a cathode, the organic layer further comprises a hole transport region between the first electrode and the emission layer, and an electron transport region between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

15. The organic light-emitting device of claim 13, wherein the emission layer comprises the organometallic compound.

16. The organic light-emitting device of claim 15, wherein the emission layer is configured to emit green light.

17. The organic light-emitting device of claim 15, wherein the emission layer further comprises a host in an amount greater than an amount of the organometallic compound.

18. An electronic apparatus comprising the organic light-emitting device of claim 13.

19. An organometallic compound represented by Formula 1:

$M(L_1)_{n1}(L_2)_{n2}$ Formula 1 wherein, in Formula 1,

M is iridium, $L_1$ is a ligand represented by Formula 2-1, $L_2$ is a ligand represented by Formula 2-2, n1 and n2 are each independently 1 or 2, with the proviso that when n1 is 2, the $L_1$ ligands are identical to or different from each other, and when n2 is 2, the $L_2$ ligands are identical to or different from each other, and $L_1$ is different from $L_2$:

Formula 2-1

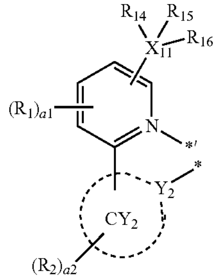

Formula 2-2

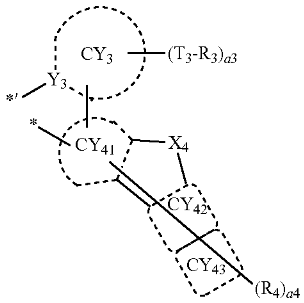

wherein, in Formulae 2-1 and 2-2, $Y_2$ is C, and $Y_3$ is N, ring $CY_2$ is a benzene group, a naphthalene group, a carbazole group, a fluorene group, a dibenzosilole group, a dibenzothiophene group, or a dibenzofuran group, ring CY3 is a pyridine group, ring $CY_{41}$, ring $CY_{42}$, and ring $CY_{43}$ are each independently i) A group, ii) a polycyclic group in which at least two A groups are condensed, or iii) a polycyclic group in which at least one A group and at least one B group are condensed, wherein A group is a benzene group, a pyridine group, a pyrimidine group, a pyridazine group, a pyrazine group, or a triazine group and B group is a norbornane group, a furan group, a thiophene group, a selenophene group, a pyrrole group, or a silole group, wherein a carbon atom in ring $CY_{41}$ in Formula 2-2 is bound to M in Formula 1 via a covalent bond, wherein a group represented by

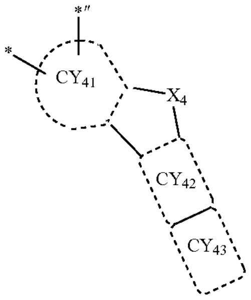

in Formula 2-2 is represented by one of Formulae CY4-1 to CY4-3, CY4-5 and CY4-6:

CY4-1

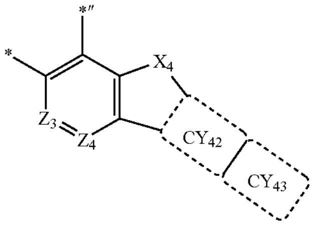

CY4-2

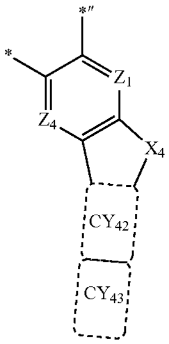

CY4-3

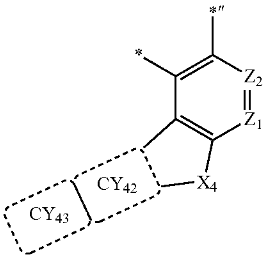

-continued

CY4-5

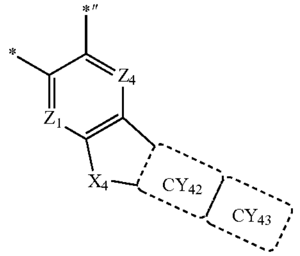

CY4-6

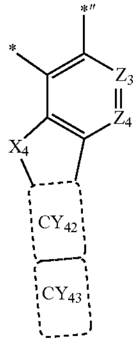

wherein, in Formulae CY4-1 to CY4-3, CY4-5 and CY4-6, $Z_1$ to $Z_4$ are each independently N or C,

* indicates a binding site to M in Formula 1, and *" indicates a binding site to ring $CY_3$ in Formula 2-2, $X_{11}$ is Si or Ge, $T_3$ is a single bond, a $C_1$-$C_{20}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $X_4$ is O, S, Se, $N(R_{48})$, $C(R_{48})(R_{49})$, or $Si(R_{48})(R_{49})$, $R_1$ to $R_3$ are each independently hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, $R_4$, $R_{14}$, $R_{15}$, $R_{16}$, $R_{48}$, and $R_{49}$ are each independently hydrogen, deuterium, —F, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group, a1 is an integer from 0 to 3, a2 is an integer from 0 to 8, a3 and a4 are each independently an integer from 0 to 10, when a1 is 2 or 3, at least two of the $R_1$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, when a2 is 2 to 8, at least two of the $R_2$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, when a3 is 2 to 10, at least two of the $R_3$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, when a4 is 2 to 10, at least two of the $R_4$ moieties are optionally bound to each other to form a $C_5$-$C_{30}$ unsaturated carbocyclic group unsubstituted or substituted with at least one $R_{10a}$ or a $C_1$-$C_{30}$ heterocyclic group unsubstituted or substituted with at least one $R_{10a}$, $R_{10a}$ has a same definition as $R_2$,

* and *' each indicate a binding site to M in Formula 1, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, $P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, a $C_1$-$C_{60}$ alkyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

20. The organometallic compound of claim 19, wherein a group represented by

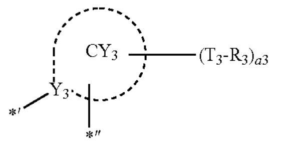

in Formula 2-2 is represented by one of Formulae CY3(1) to CY3(16):

CY3(1)

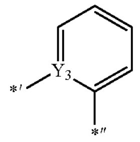

CY3(2)

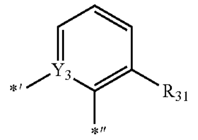

CY3(3)

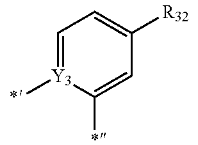

CY3(4)

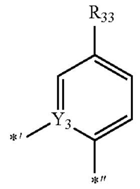

CY3(5)

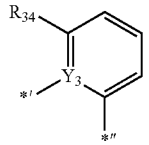

CY3(6)

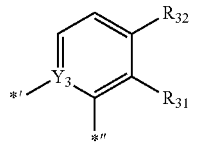

CY3(7)

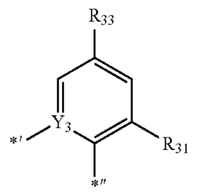

CY3(8)

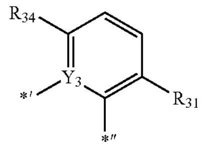

CY3(9)

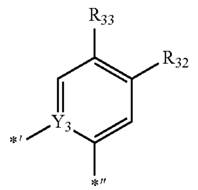

-continued

CY3(10)

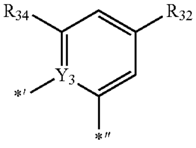

CY3(11)

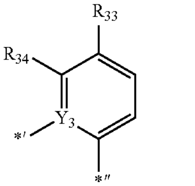

CY3(12)

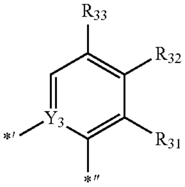

CY3(13)

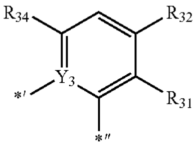

CY3(14)

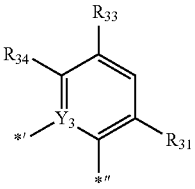

-continued

CY3(15)

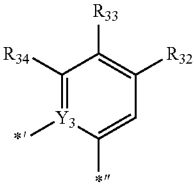

CY3(16)

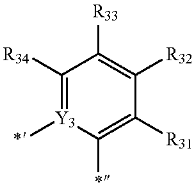

wherein, in Formulae CY3(1) to CY3(16), $Y_3$ is understood by referring to the description of $Y_3$ in claim 19, $R_{31}$ to $R_{34}$ each has a same definition as $R_3$, with the proviso that $R_{31}$ to $R_{34}$ are each not hydrogen,

*' indicates a binding site to M in Formula 1, and

*" indicates a binding site to an adjacent atom in Formula 2-2.

21. An organic light-emitting device comprising:

a first electrode;

a second electrode; and an organic layer disposed between the first electrode and the second electrode and comprising an emission layer, wherein the organic layer comprises the organometallic compound of claim 19.

* * * * *